United States Patent
Hirose et al.

(10) Patent No.: US 6,591,495 B2
(45) Date of Patent: Jul. 15, 2003

(54) MANUFACTURING METHOD OF A MULTILAYERED PRINTED CIRCUIT BOARD HAVING AN OPENING MADE BY A LASER, AND USING ELECTROLESS AND ELECTROLYTIC PLATING

(75) Inventors: Naohiro Hirose, Ibi-gun (JP); Kouta Noda, Ibi-gun (JP); Hiroshi Segawa, Ibi-gun (JP); Honjin En, Ibi-gun (JP); Kiyotaka Tsukada, Ogakishi (JP); Naoto Ishida, Ogakishi (JP); Kouji Asano, Ogakishi (JP); Atsushi Shouda, Ogakishi (JP)

(73) Assignee: IBIDEN Co., Ltd., Gifu (JP)

( * ) Notice: Subject to any disclaimer, the term of this patent is extended or adjusted under 35 U.S.C. 154(b) by 50 days.

(21) Appl. No.: 09/797,916

(22) Filed: Mar. 5, 2001

(65) Prior Publication Data

US 2001/0042637 A1 Nov. 22, 2001

Related U.S. Application Data

(63) Continuation of application No. PCT/JP99/04142, filed on Jul. 30, 1999.

(51) Int. Cl.$^7$ .............................. H05K 3/02; H05K 3/10
(52) U.S. Cl. ............................. 29/846; 29/831; 29/852; 174/264
(58) Field of Search ................................ 174/255, 262, 174/263, 264, 265, 266; 29/831, 846, 847, 852; 361/792, 793, 794, 795

(56) References Cited

U.S. PATENT DOCUMENTS

| | | | | | |
|---|---|---|---|---|---|
| 4,978,639 A | * | 12/1990 | Hua et al. | .......... | 148/DIG. 135 |
| 5,055,321 A | * | 10/1991 | Enomoto et al. | ............. | 427/96 |
| 5,260,518 A | * | 11/1993 | Tanaka et al. | .............. | 174/255 |
| 5,826,330 A | * | 10/1998 | Isoda et al. | .............. | 219/121.7 |
| 6,217,987 B1 | * | 4/2001 | Ono et al. | .................. | 174/250 |
| 6,242,079 B1 | * | 6/2001 | Mikado et al. | ............. | 174/250 |
| 6,251,502 B1 | * | 6/2001 | Yasue et al. | ................. | 174/255 |
| 6,376,049 B1 | * | 4/2002 | Asai et al. | .................. | 174/250 |
| 6,410,858 B1 | * | 6/2002 | Sasaki et al. | ............... | 174/200 |
| 6,418,615 B1 | * | 7/2002 | Rokugawa et al. | ........... | 29/830 |

FOREIGN PATENT DOCUMENTS

| | | |
|---|---|---|
| JP | 03032100 A | 2/1991 |
| JP | 05283866 A | 10/1993 |
| JP | 06120139 A | 4/1994 |
| JP | 06215623 | 8/1994 |
| JP | 06338687 A | 12/1994 |
| JP | 07292483 A | 11/1995 |
| JP | 08186376 A | 7/1996 |
| JP | 08316642 A | 11/1996 |
| JP | 09083146 A | 3/1997 |
| JP | 09186456 | 7/1997 |
| JP | 09186460 A | 7/1997 |
| JP | 09321432 A | 12/1997 |

OTHER PUBLICATIONS

Patents Abstracts of Japan, Publication No. 11–186739 published Jul. 9, 1999, Application No. 10–104300 filed Apr. 15, 1998.
Patents Abstracts of Japan, Publication No. 9–321432 published Dec. 12, 1997, Application No. 8–133075 filed May 28, 1996.

* cited by examiner

Primary Examiner—Albert W. Paladini
Assistant Examiner—Jose H. Alcala
(74) Attorney, Agent, or Firm—Pillsbury Winthrop LLP Intellectual Property

(57) ABSTRACT

An opening is formed in resin by a laser beam so that a via hole is formed. Copper foil, the thickness of which is reduced to 3 μm by etching to lower the thermal conductivity, is used as a conformal mask. Therefore, an opening is formed in the resin and the number of irradiation of pulse-shape laser beam is reduced. Thus, occurence of undercut of the resin, which forms an interlayer insulating resin layer, can be prevented and the reliability of the connection of the via holes can be improved.

5 Claims, 60 Drawing Sheets

Fig. 6
(Q)
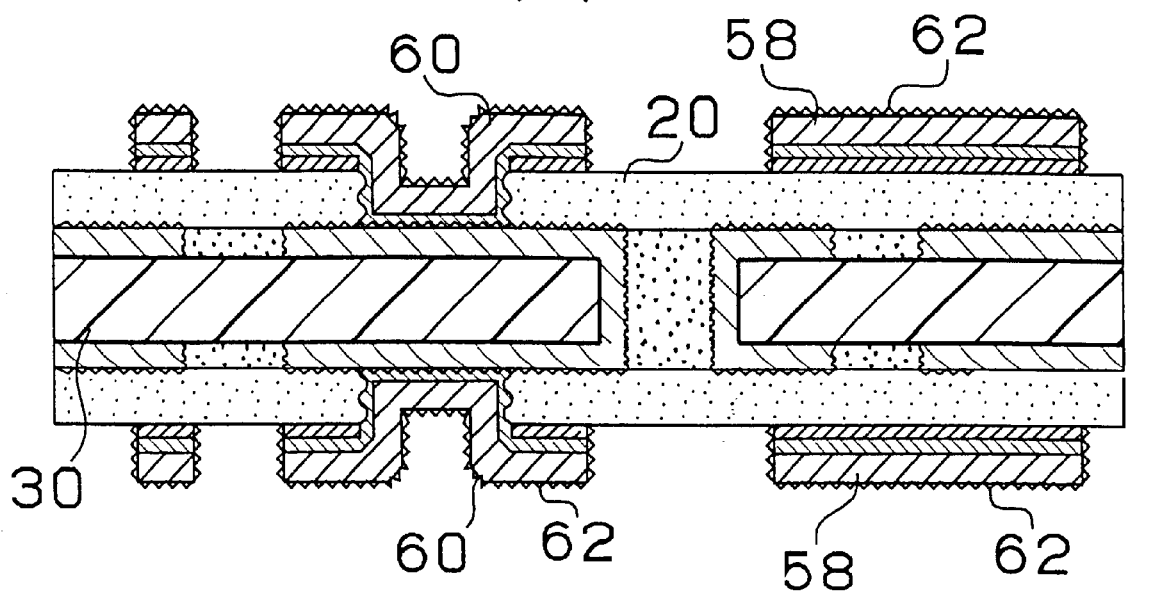
(R)
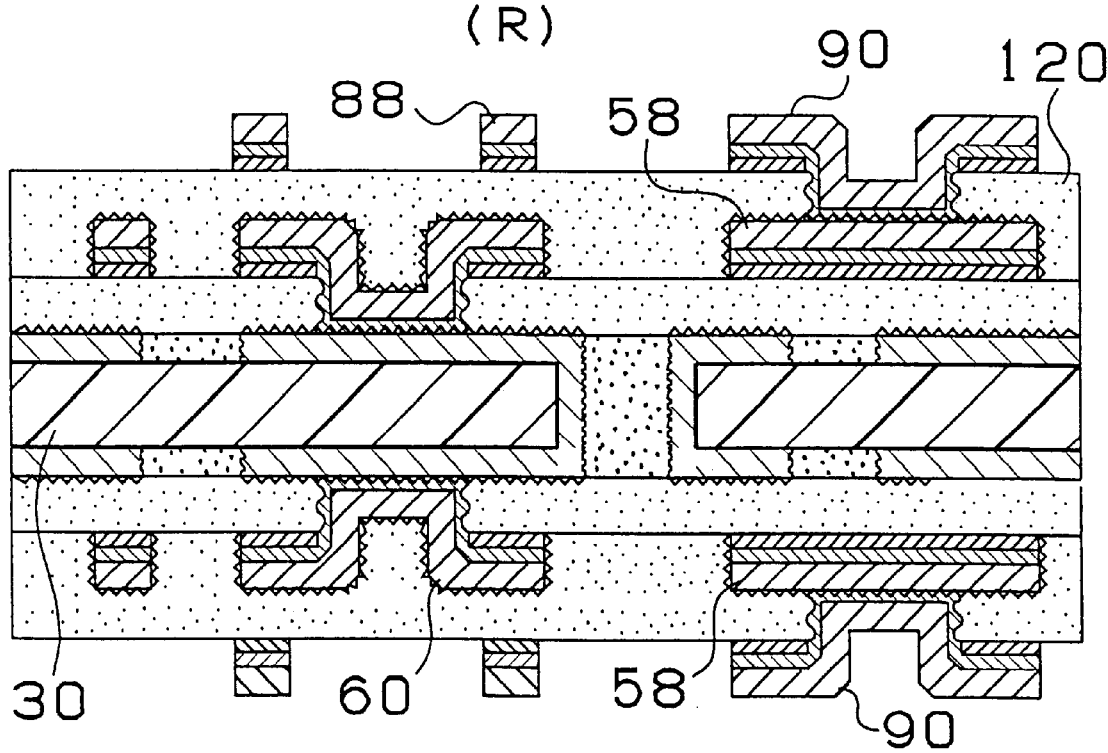

Fig. 8
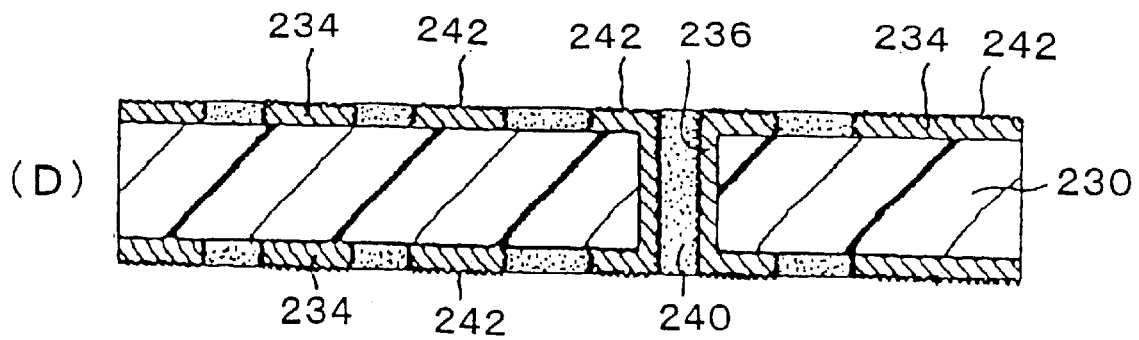
(D)
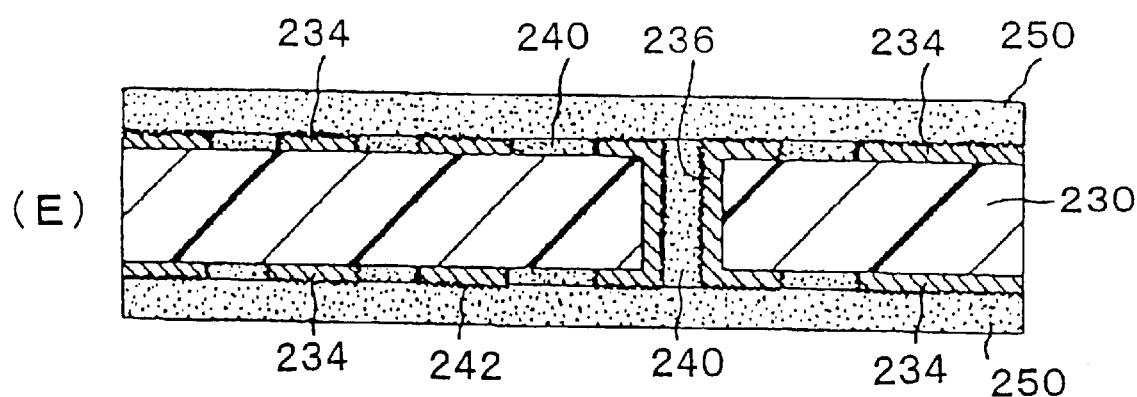
(E)
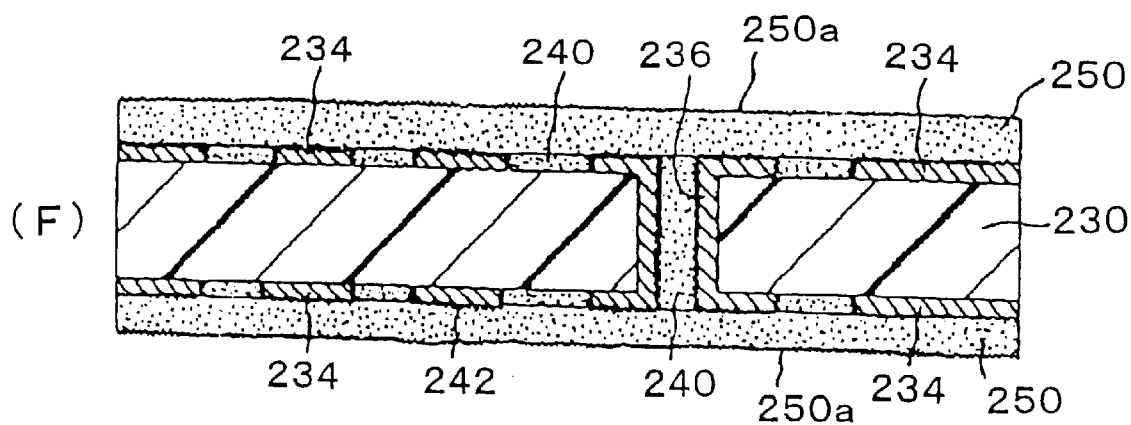
(F)

Fig. 9
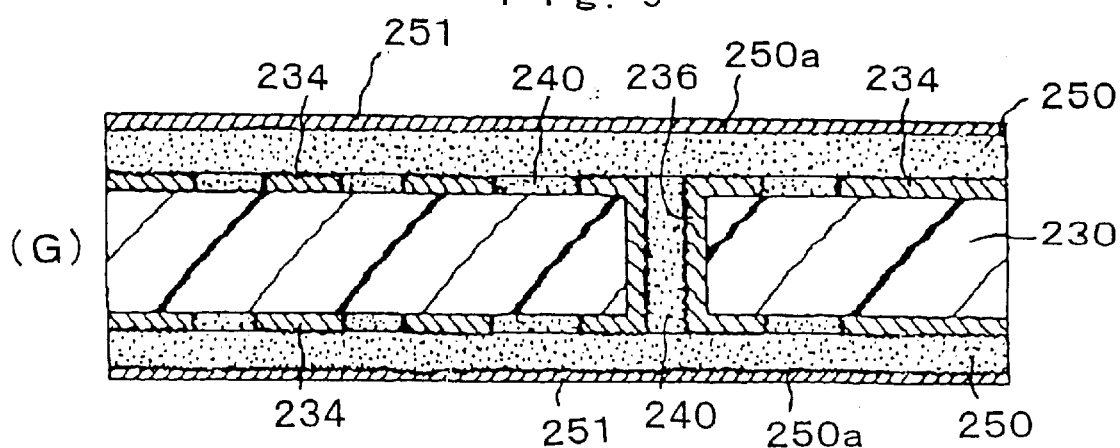
(G)
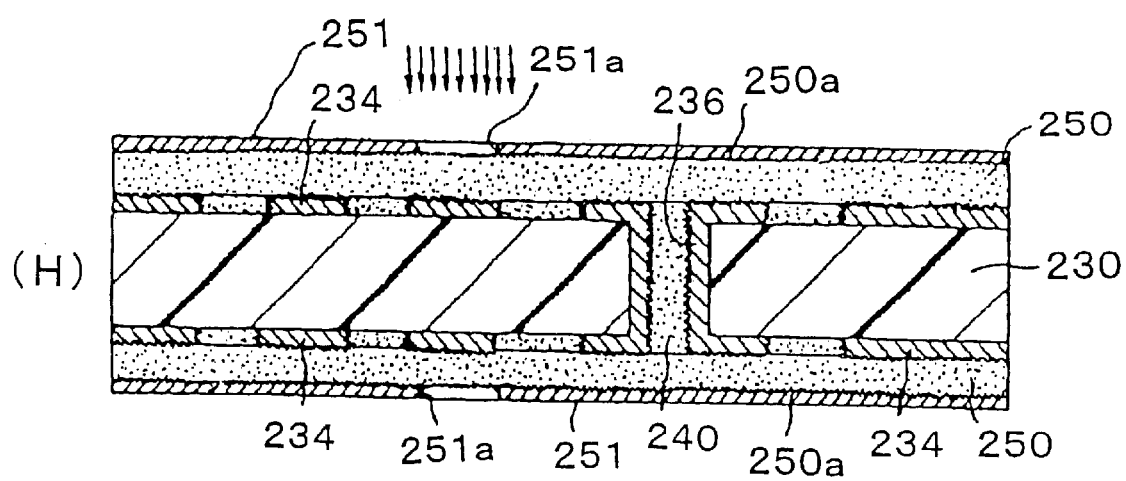
(H)
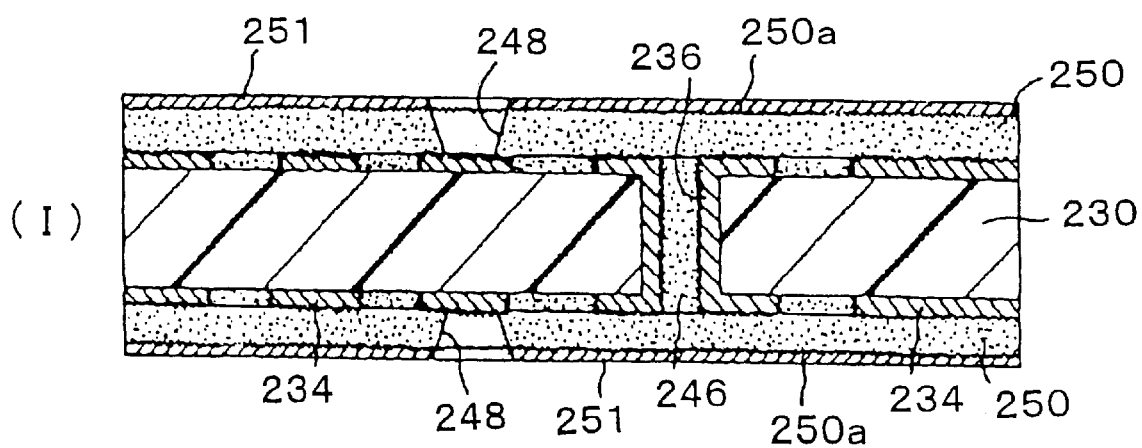
(I)

Fig. 10
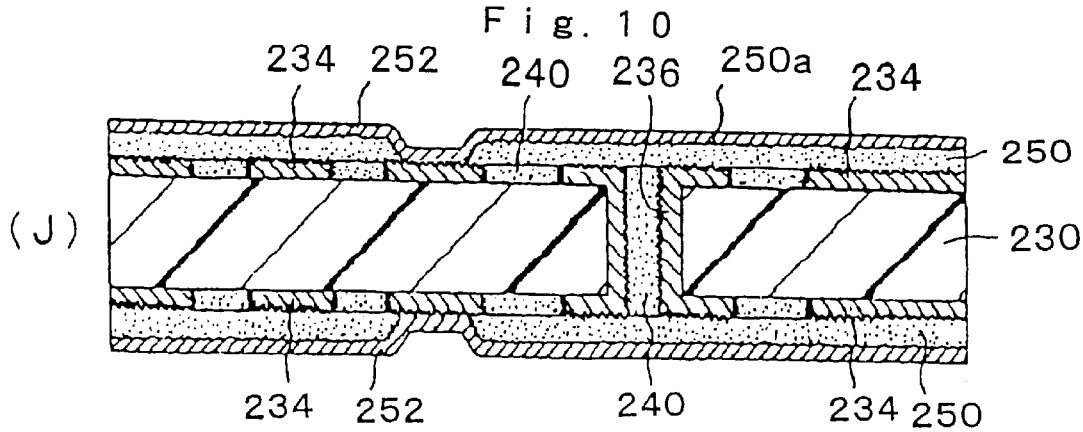
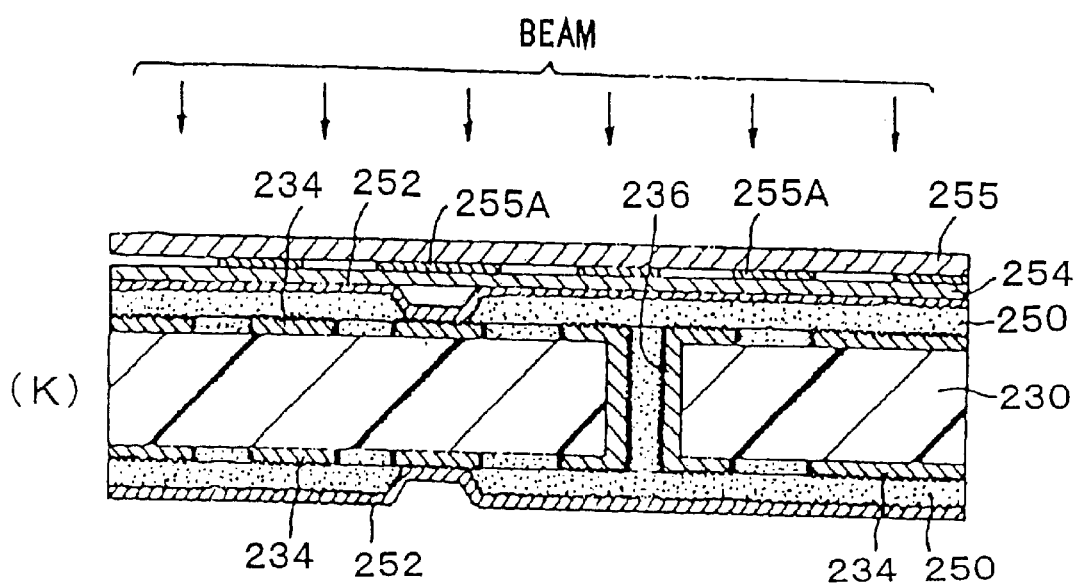
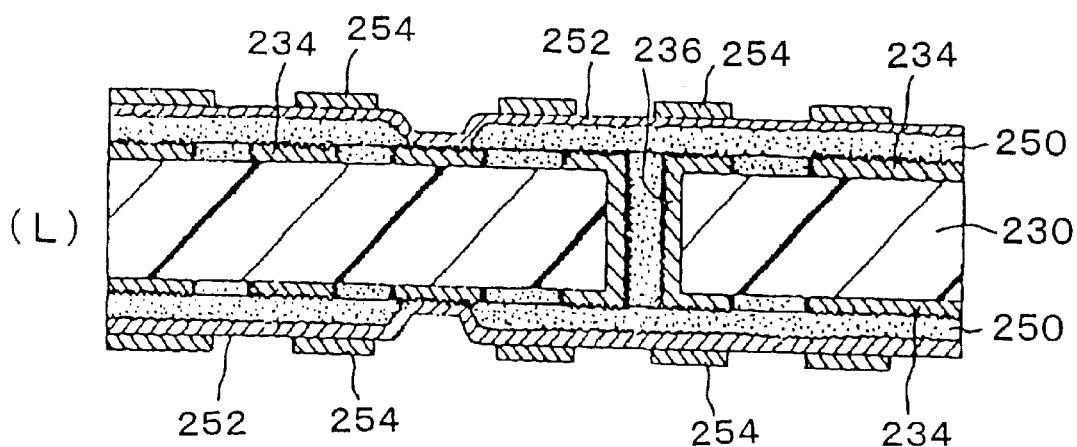

Fig. 11
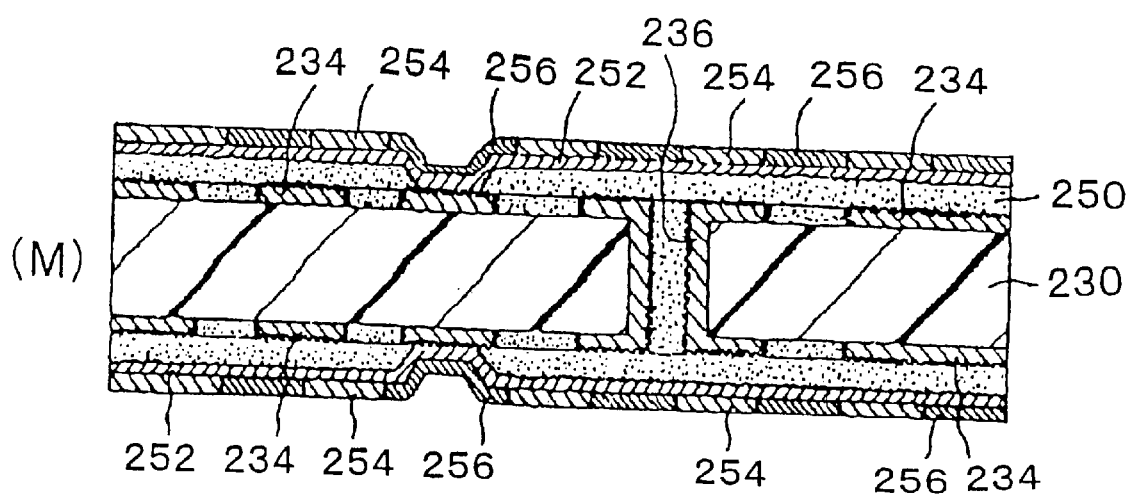
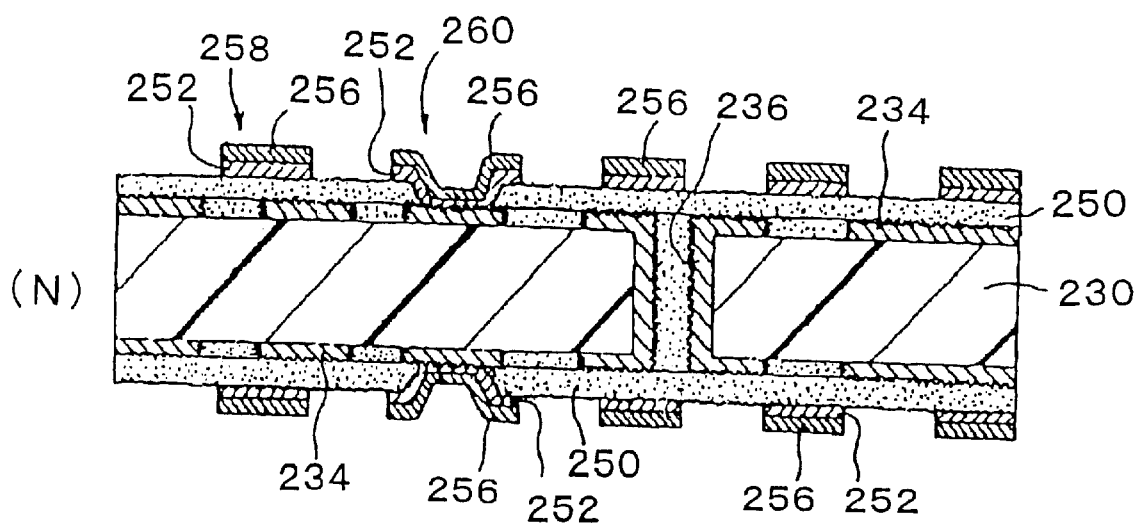

10 μm

Fig. 23
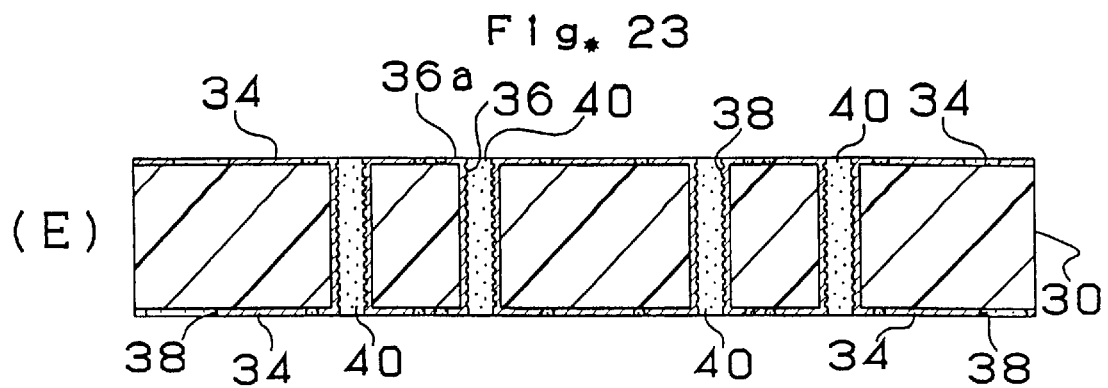
(E)
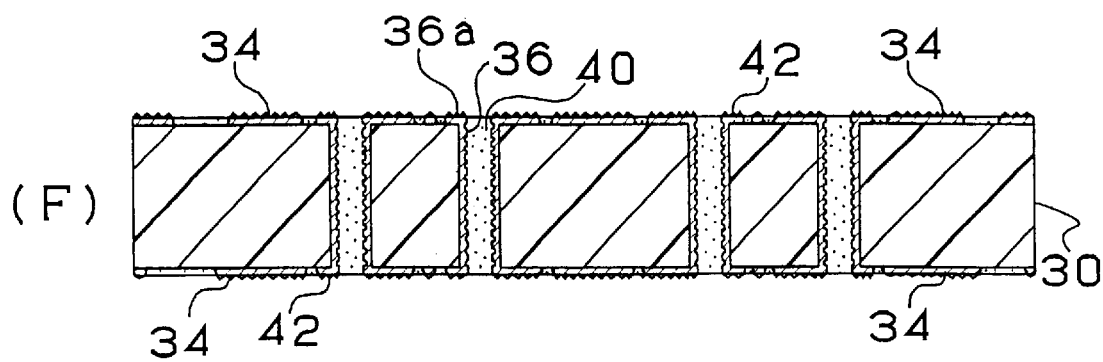
(F)
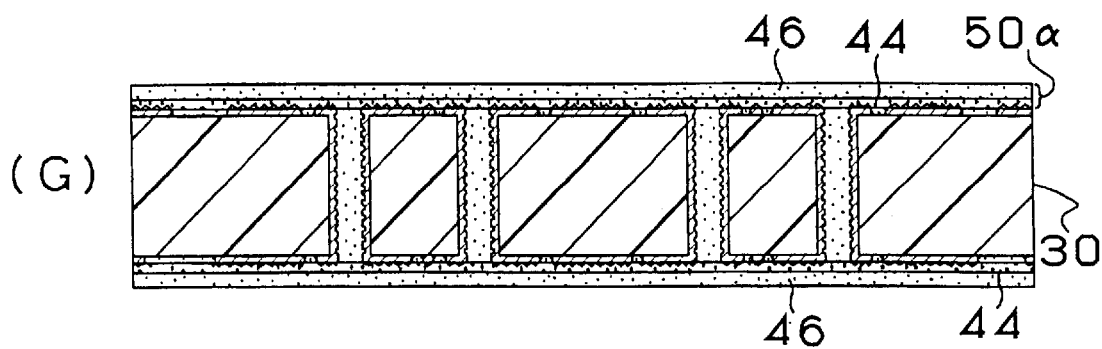
(G)
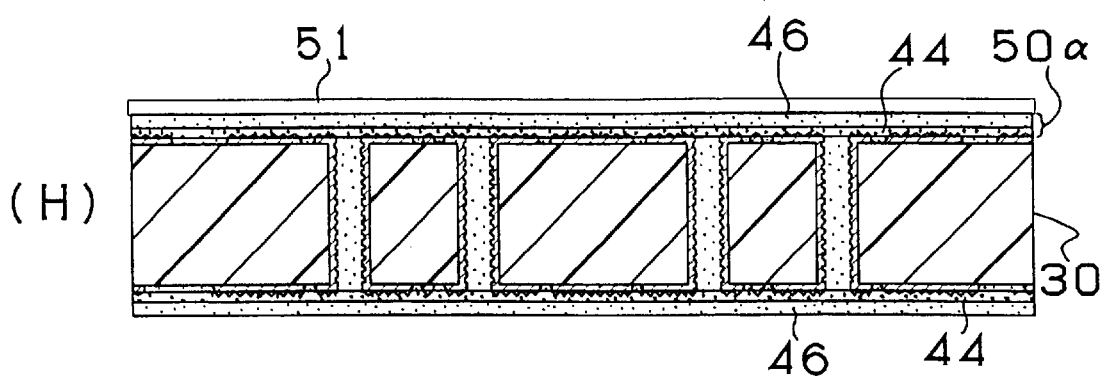
(H)

Fig.26
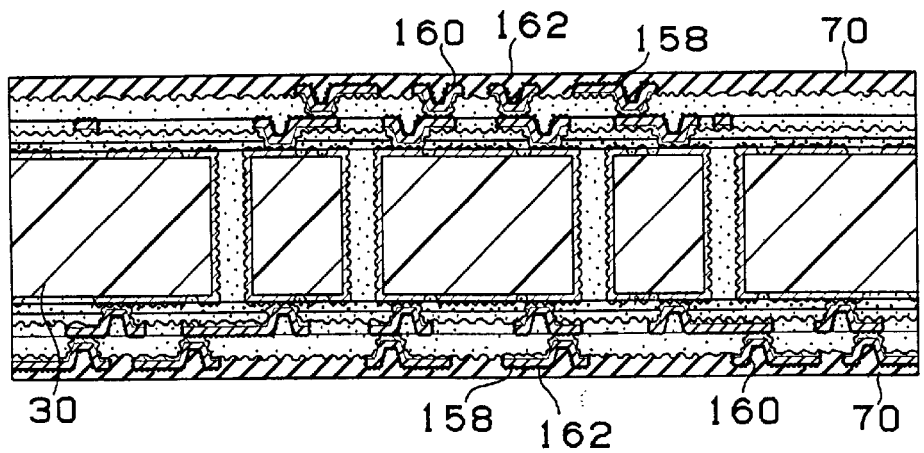
(Q)
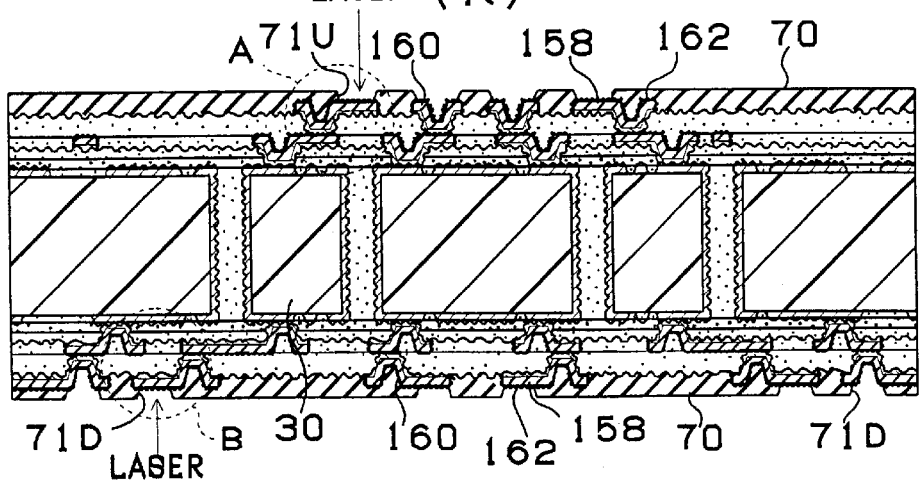
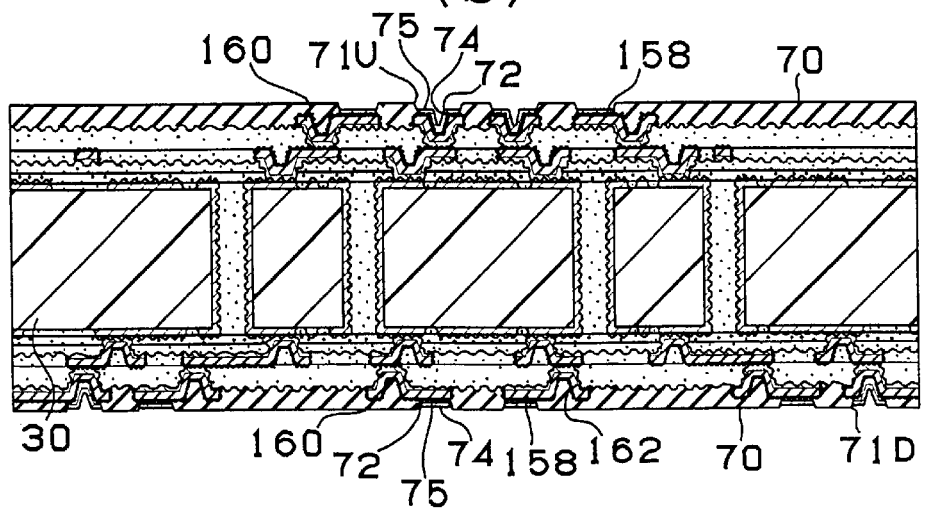

Fig. 30
(A)
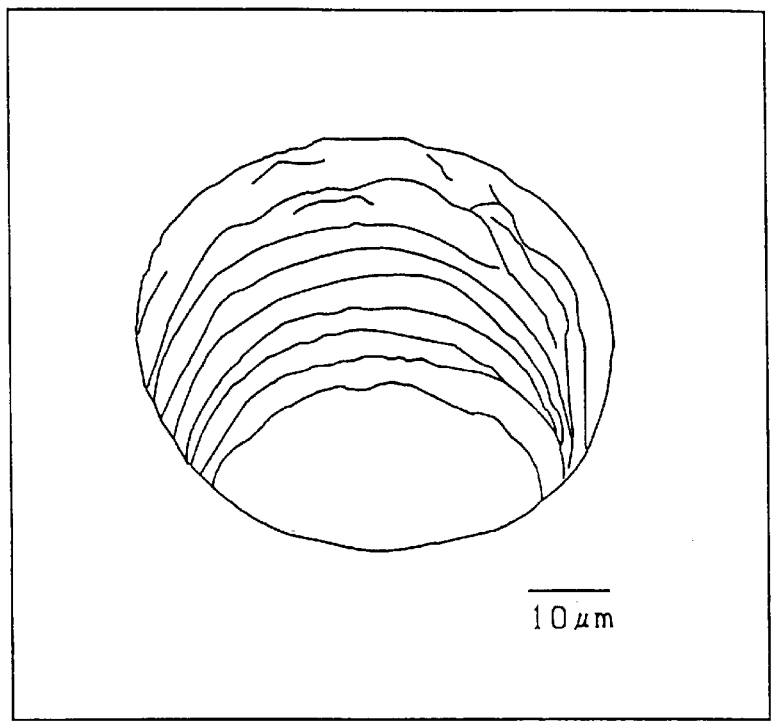
(B)
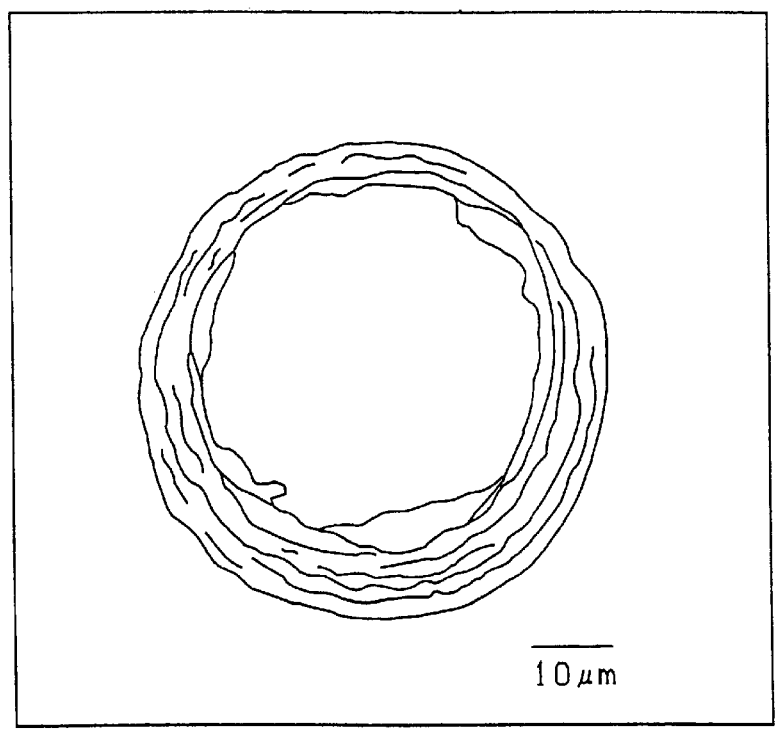

Fig. 31
(A)
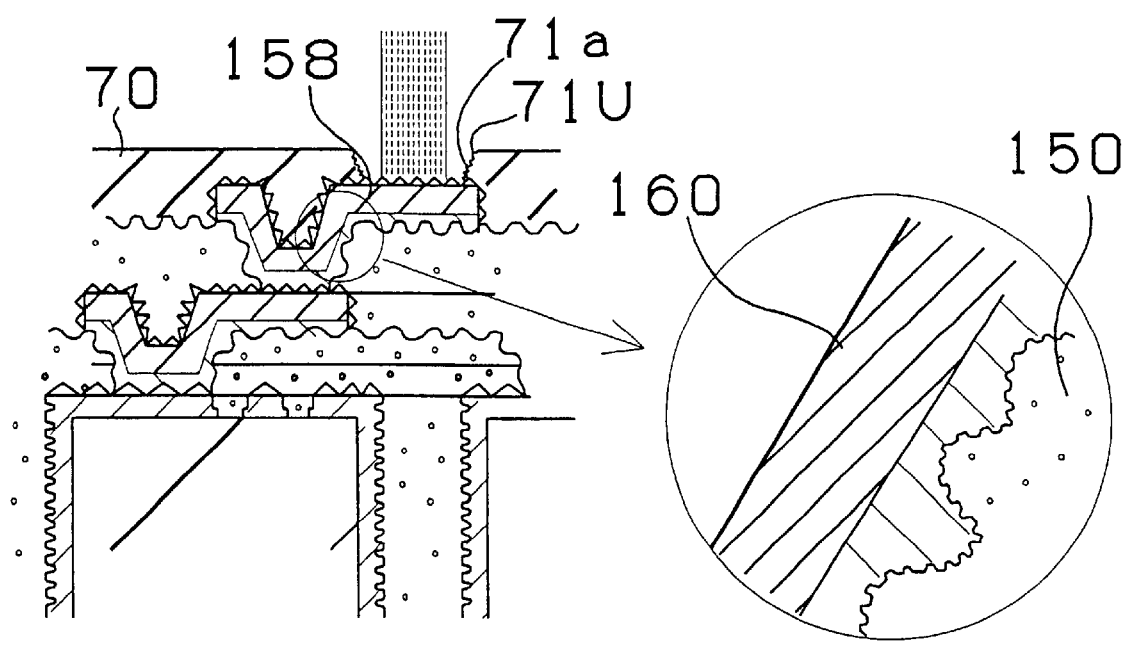
(B)
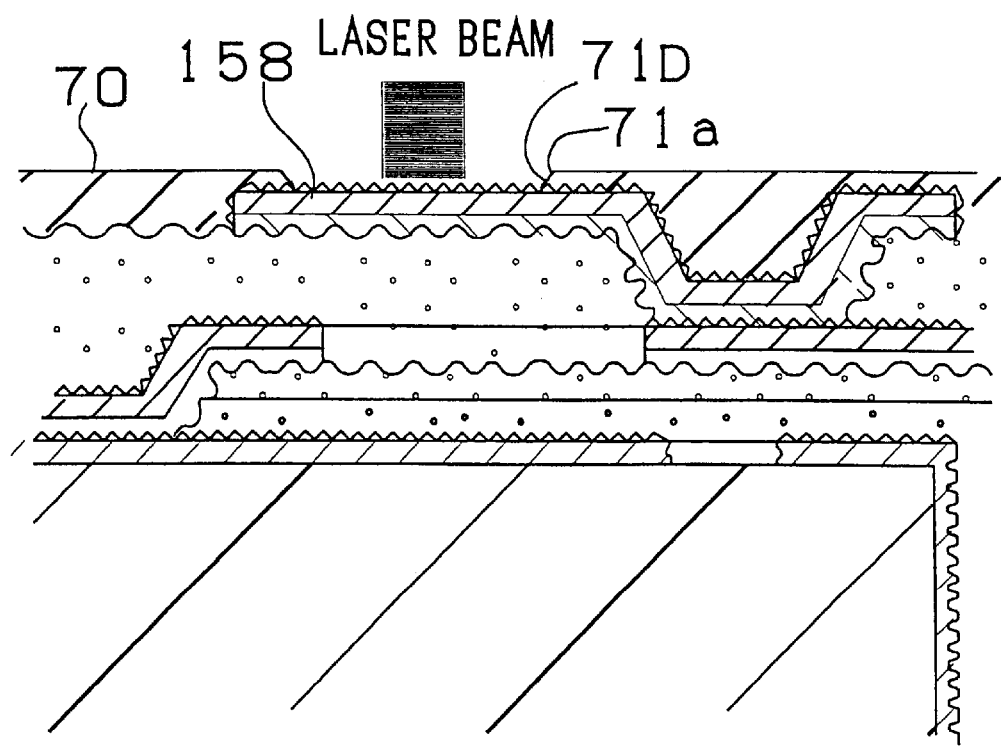

Fig. 32
(A)
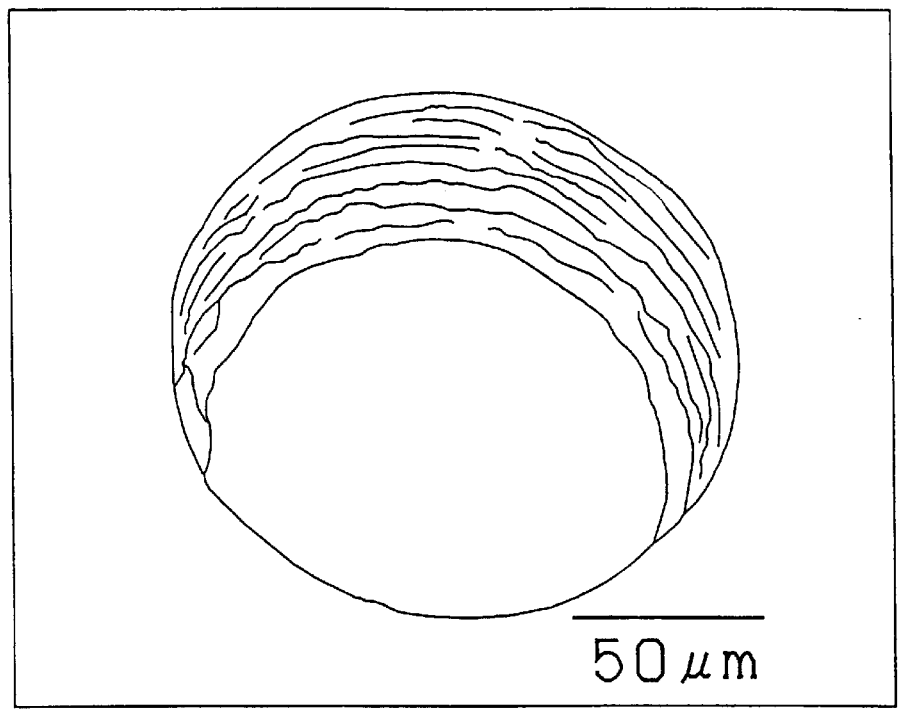
(B)
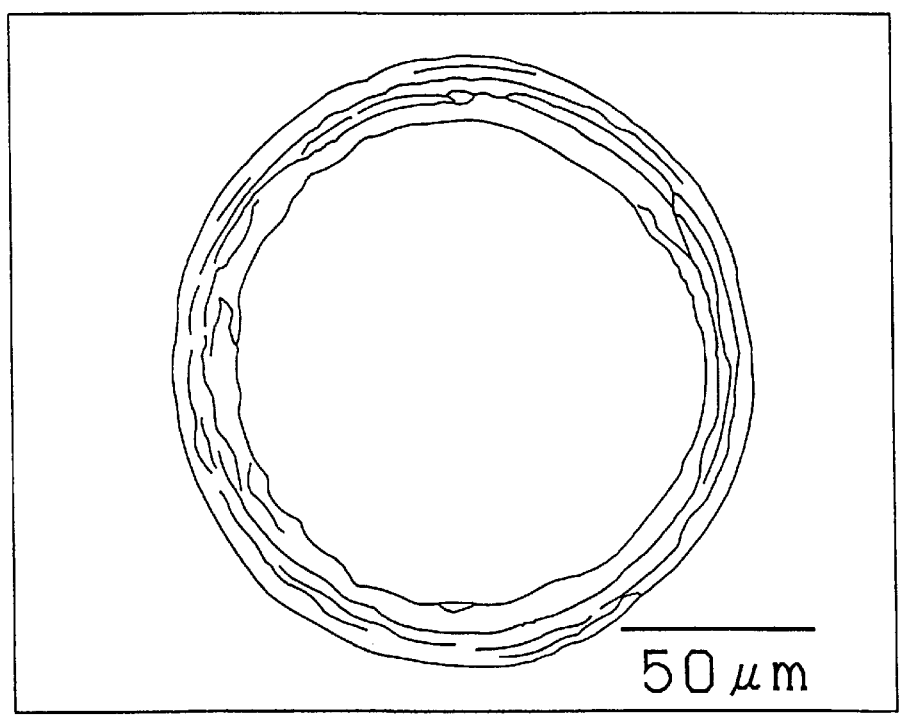

Fig. 33
(A)
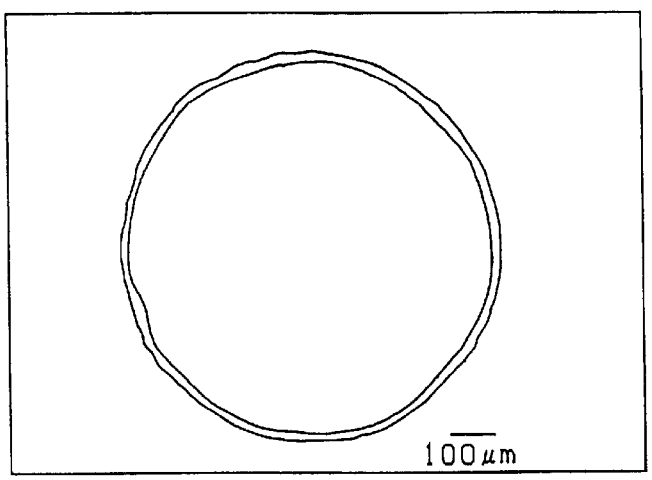
(B)
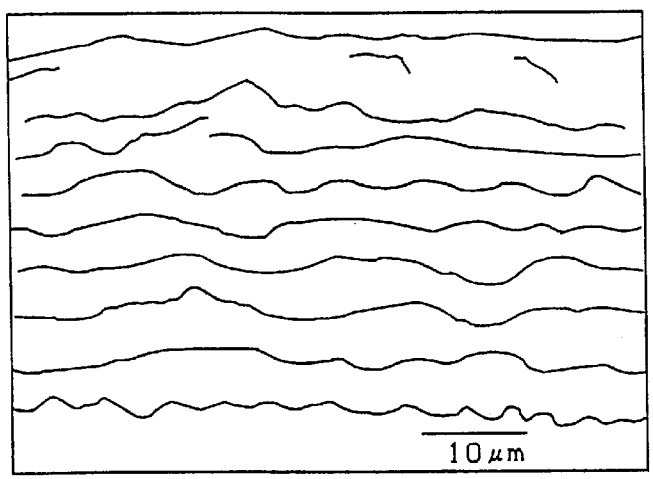
(C)
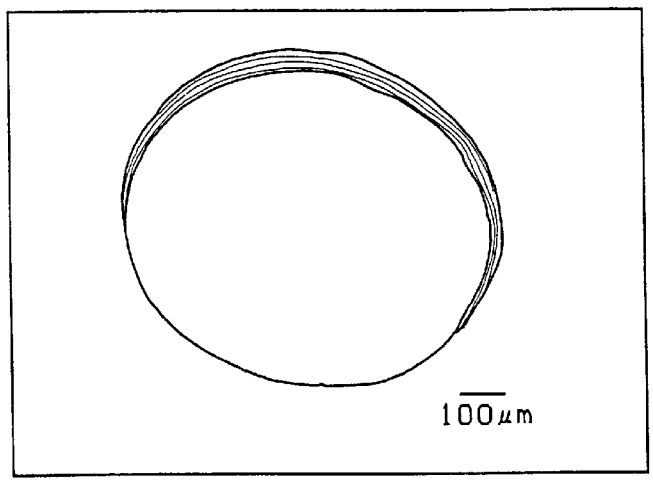

Fig. 35
(A)
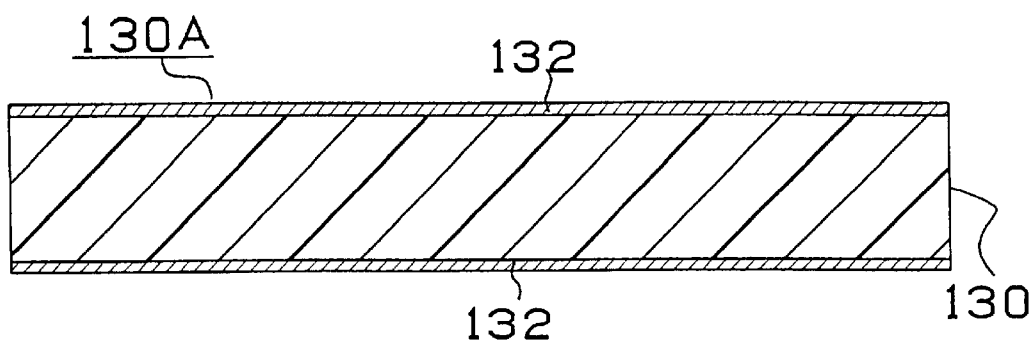
(B)
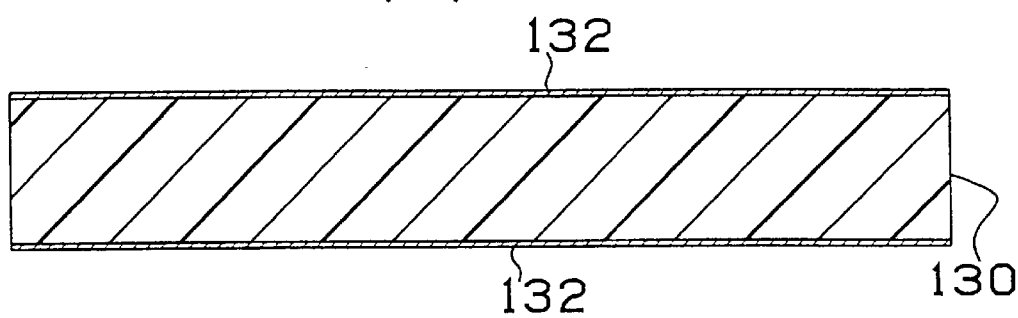
(C)
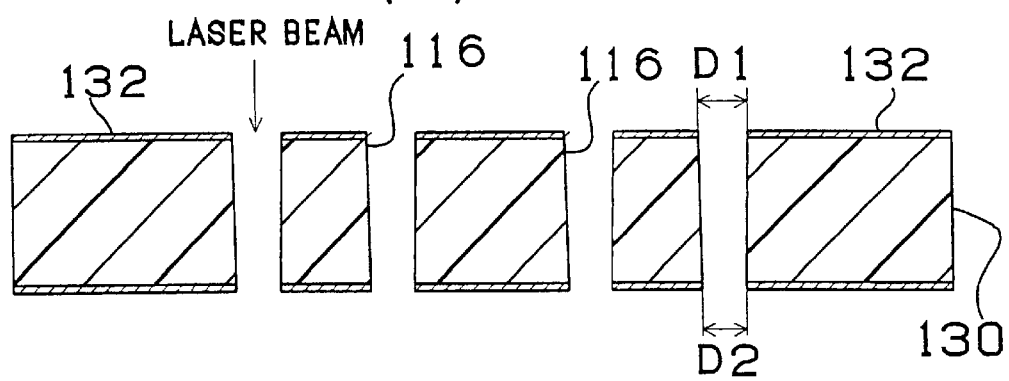
(D)
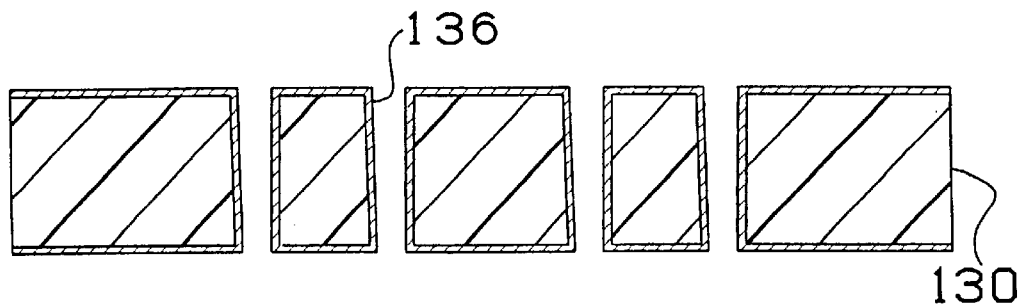

Fig. 36
(A)
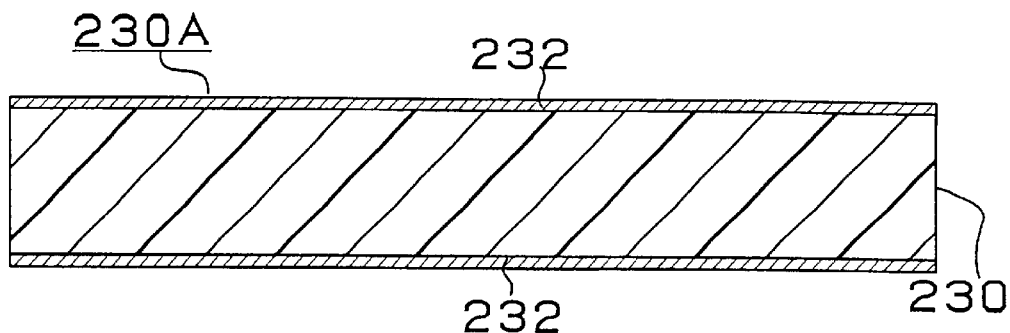
(B)
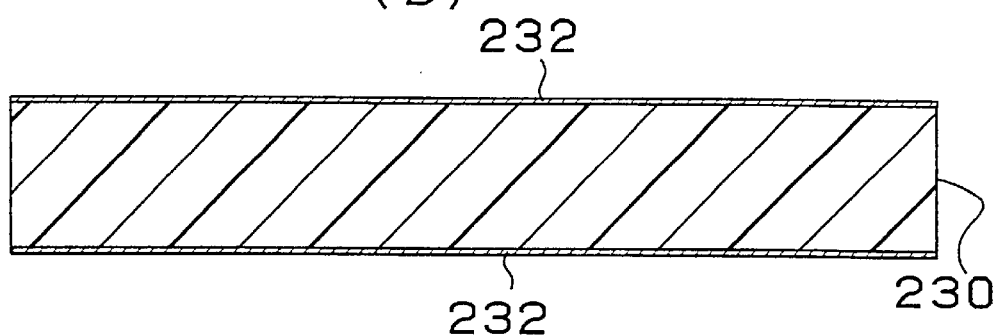
(C)
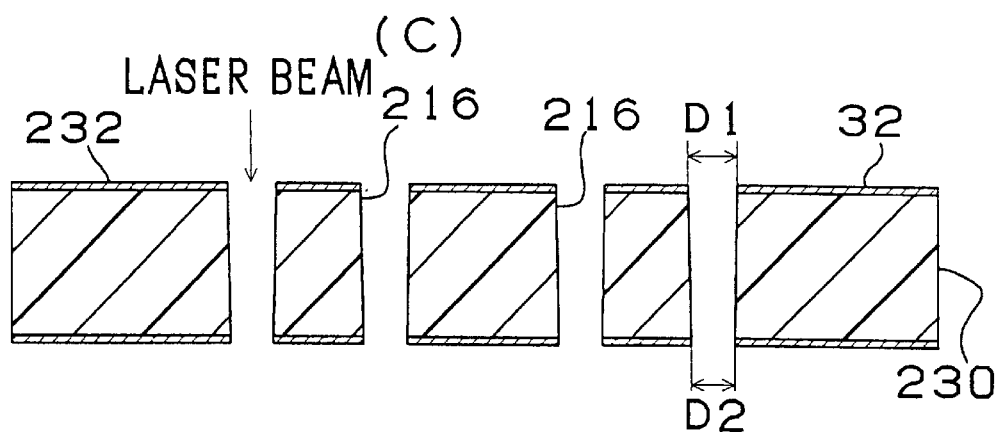
(D)
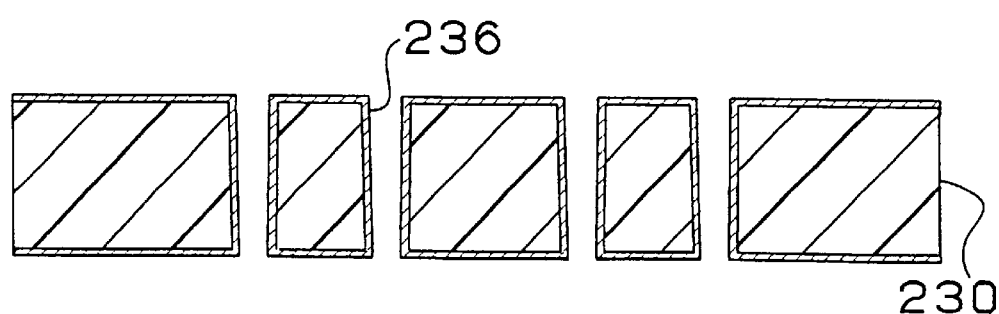

Fig. 37
(A)
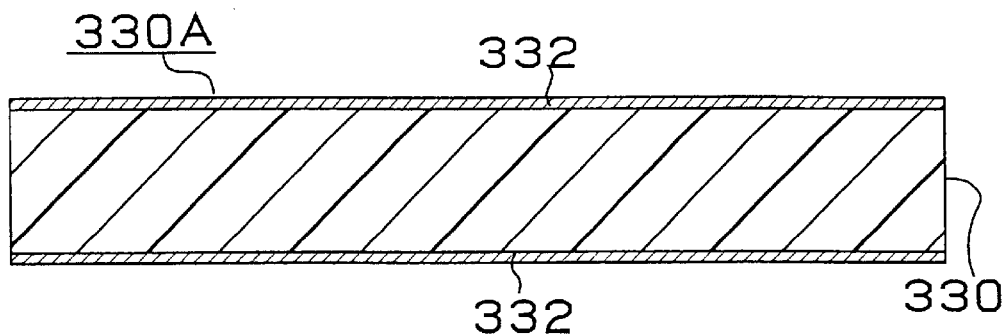
(B)
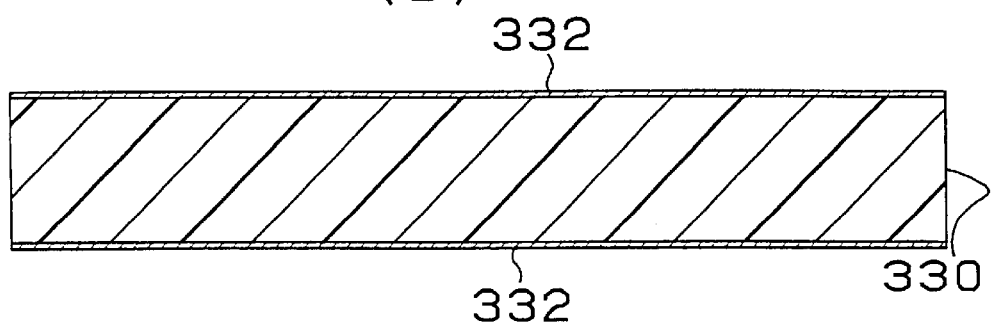
(C)
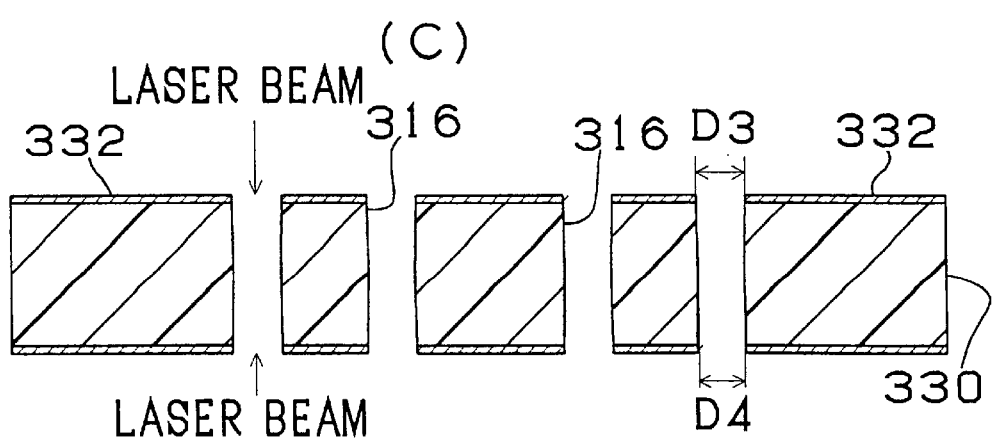
(D)
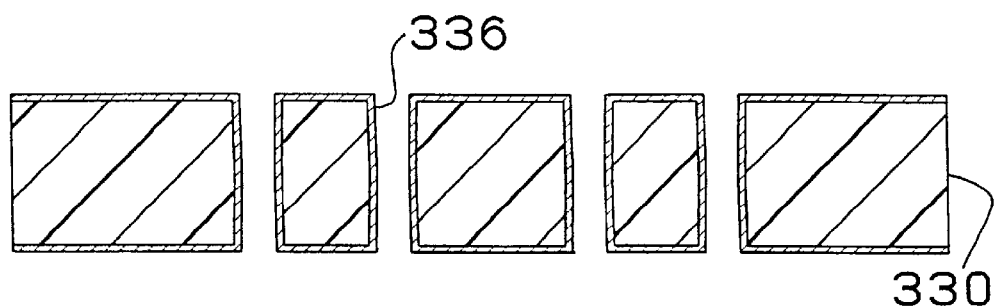

Fig. 42
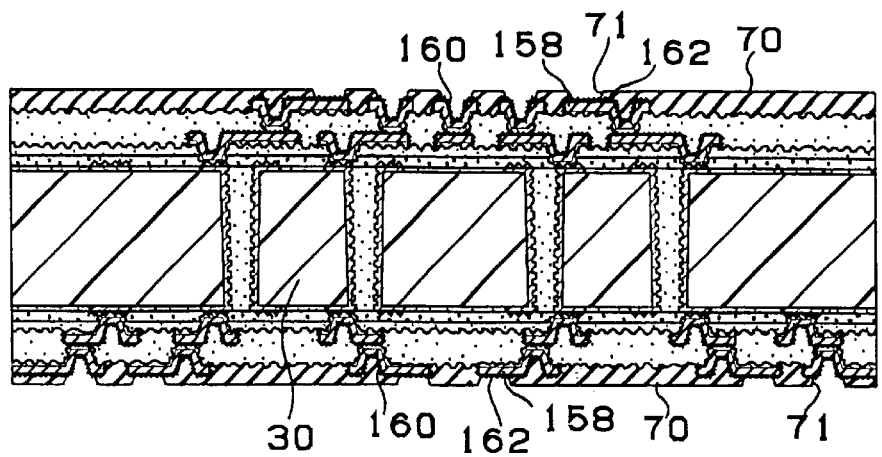
(U)
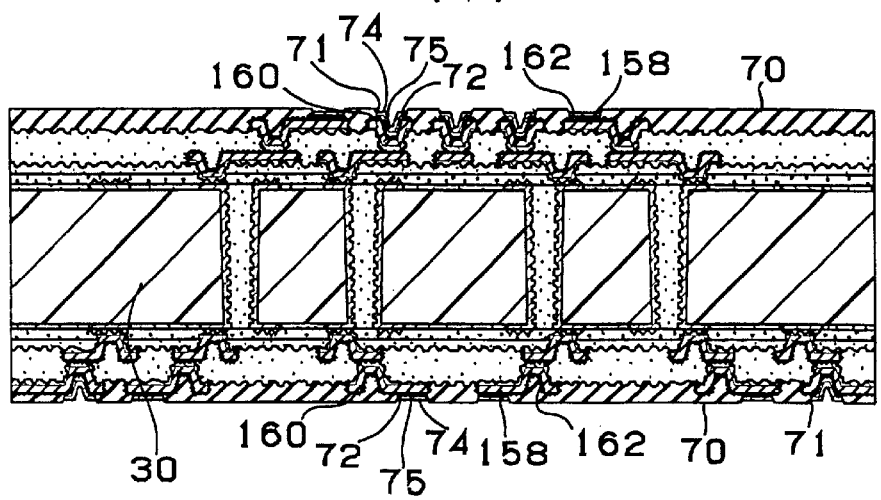
(V)
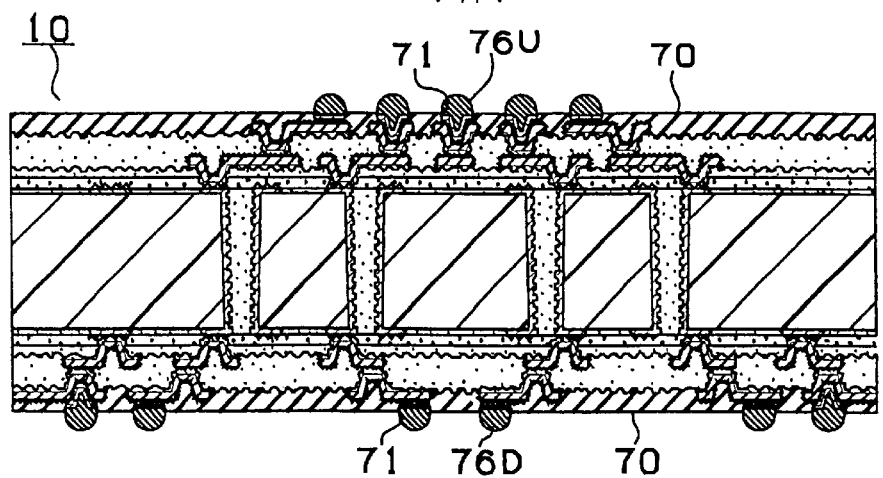
(W)

Fig.49
(U)
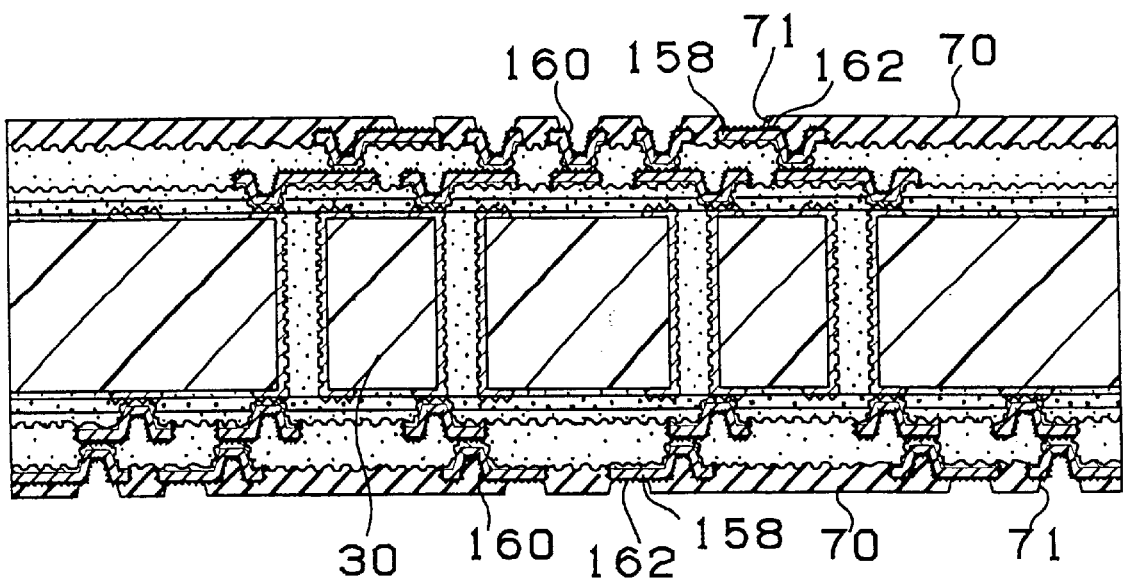
(V)
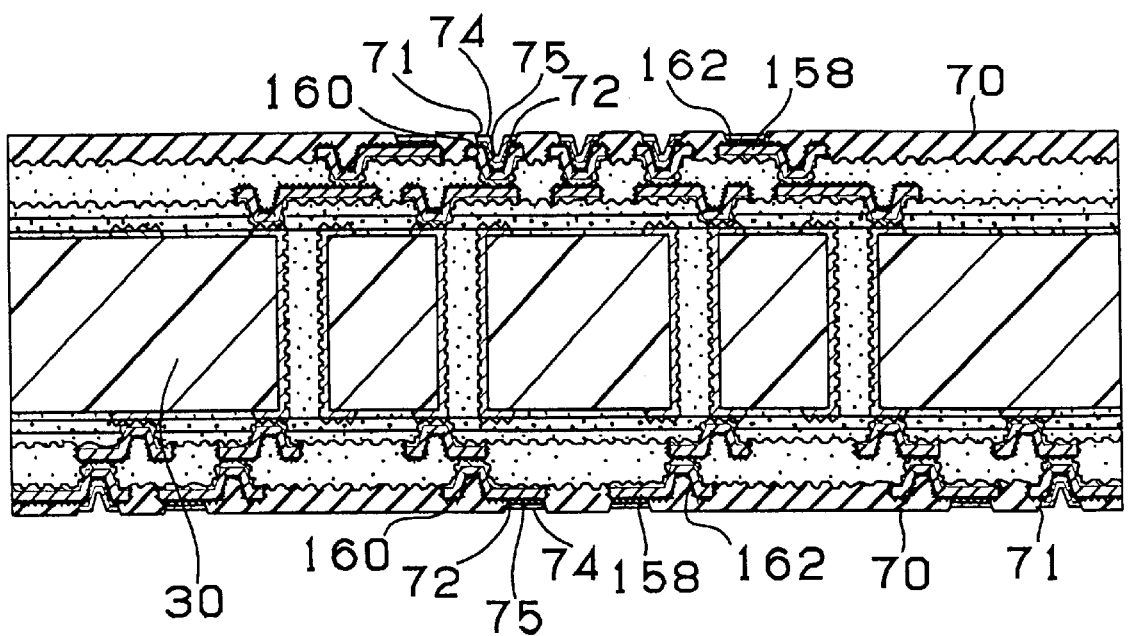

Fig. 52
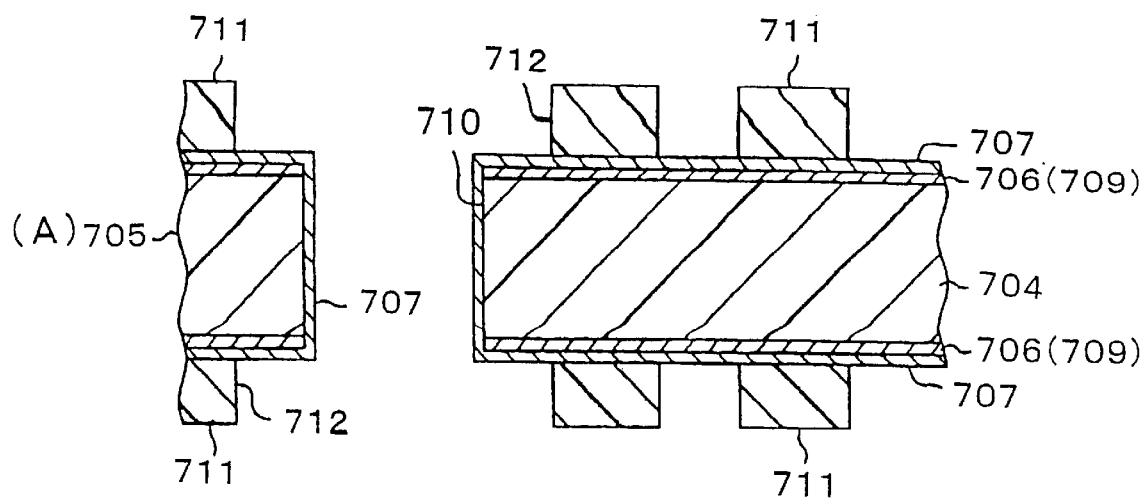
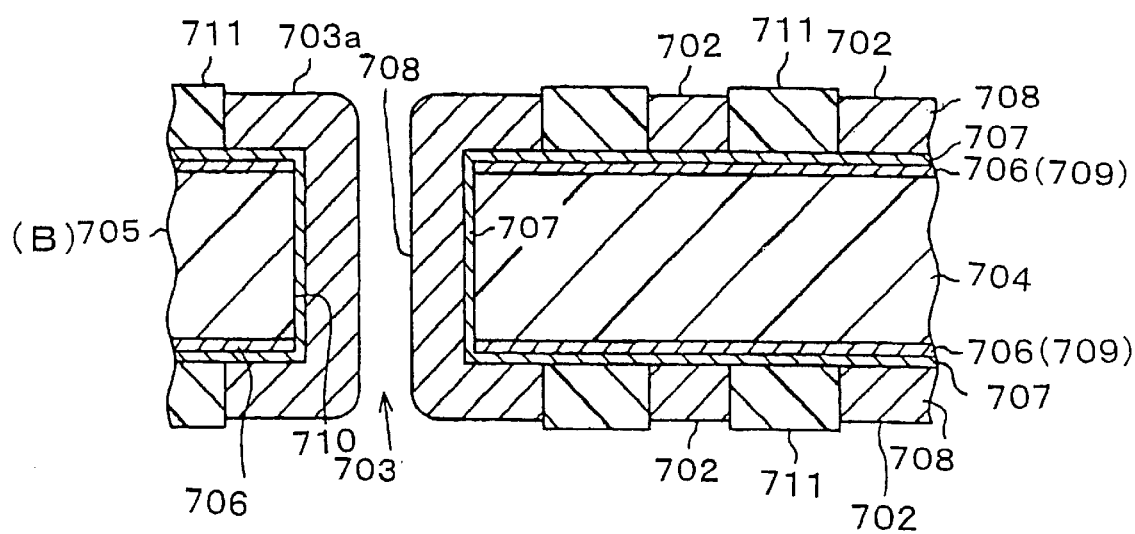

Fig. 53
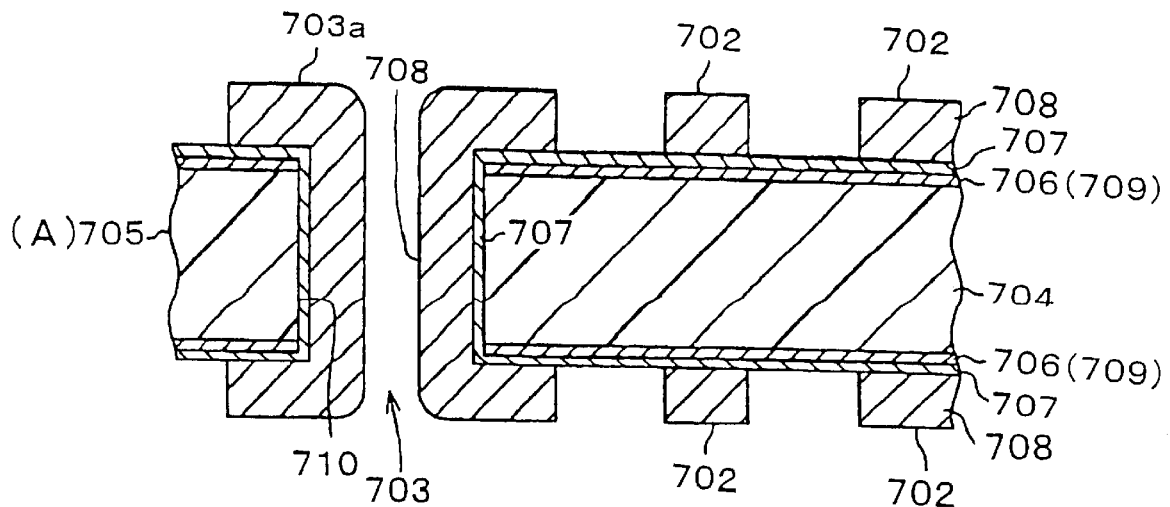
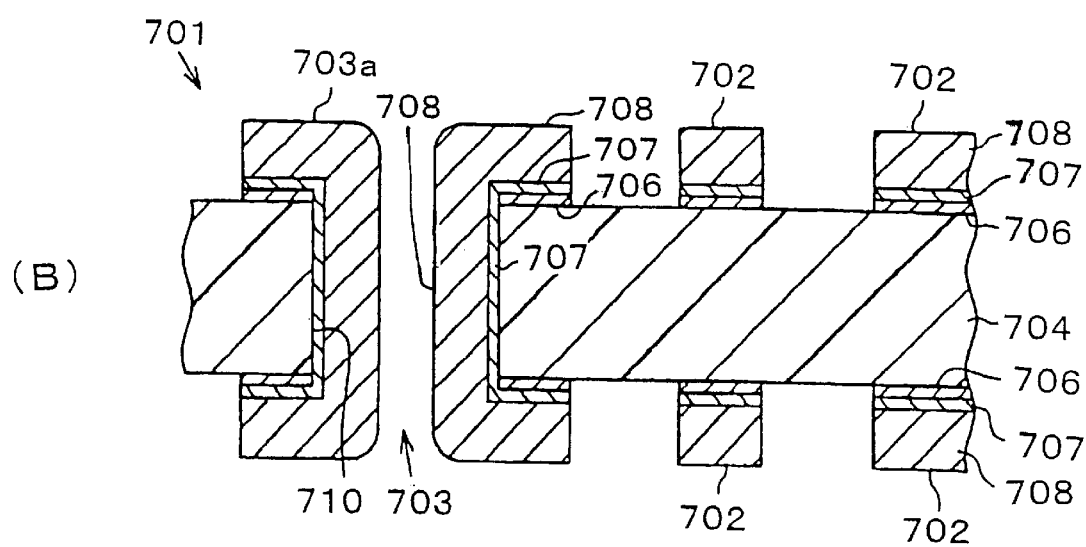

Fig. 56

|  | EXPANSION OF PERIPHERY OF OPENING | HEAT CYCLE TEST |
|---|---|---|
| SECOND EMBODIMENT | FREE FROM EXPANSION | 5% |
| FIRST MODIFICATION | FREE FROM EXPANSION | 5% |
| COMPARATIVE EXAMPLE 1 | EXPANSION OBSERVED | 10% |
| COMPARATIVE EXAMPLE 2 | EXPANSION OBSERVED | 11% |

Fig. 57

|  | HEATING TEST | HEAT CYCLE TEST |
|---|---|---|
| THIRD EMBODIMENT | NO SEPARATION<br>CHANGE RATE OF RESISTANCE<br>1 % | NO SEPARATION<br>CHANGE RATE OF RESISTANCE<br>5 % |
| FIRST MODIFICATION | NO SEPARATION<br>CHANGE RATE OF RESISTANCE<br>1 % | NO SEPARATION<br>CHANGE RATE OF RESISTANCE<br>5 % |
| COMPARATIVE EXAMPLE 3 | NO SEPARATION<br>CHANGE RATE OF RESISTANCE<br>5 % | NO SEPARATION<br>CHANGE RATE OF RESISTANCE<br>1 0 % |
| COMPARATIVE EXAMPLE 4 | SPARTAN OBSERVED<br>CHANGE RATE OF RESISTANCE<br>2 0 % | SPARTAN OBSERVED<br>CHANGE RATE OF RESISTANCE<br>3 0 % |
| COMPARATIVE EXAMPLE 5 | SPARTAN OBSERVED<br>CHANGE RATE OF RESISTANCE<br>1 5 % | SPARTAN OBSERVED<br>CHANGE RATE OF RESISTANCE<br>3 0 % |
| COMPARATIVE EXAMPLE 6 | SPARTAN OBSERVED<br>CHANGE RATE OF RESISTANCE<br>4 0 % | SPARTAN OBSERVED<br>CHANGE RATE OF RESISTANCE<br>6 0 % |

Fig. 58

| | HAST | STEAM | TS TEST |
|---|---|---|---|
| SIXTH EMBODIMENT | $1 \times 10^8 \, \Omega$ | $1 \times 10^8 \, \Omega$ | RESISTANCE CHANGED BY 5% |
| COMPARATIVE EXAMPLE 8 | $1 \times 10^6 \, \Omega$ | $1 \times 10^6 \, \Omega$ | RESISTANCE CHANGED BY 10% |

Fig. 59
CHEMICAL FORMULA 1
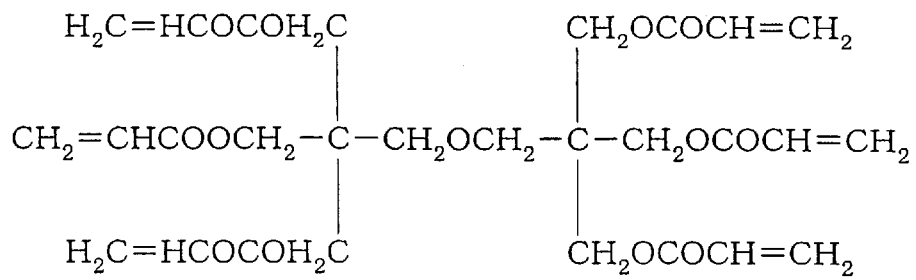
CHEMICAL FORMULA 2
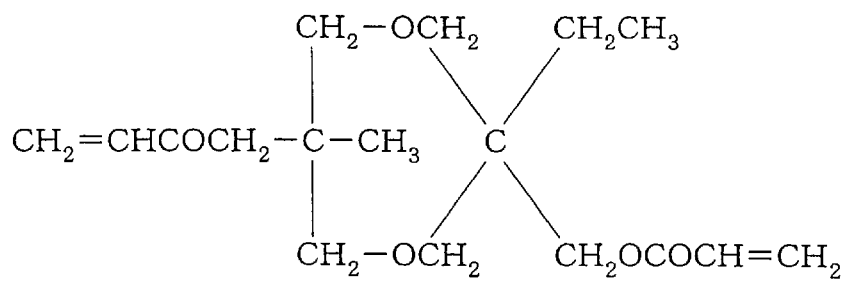
CHEMICAL FORMULA 3
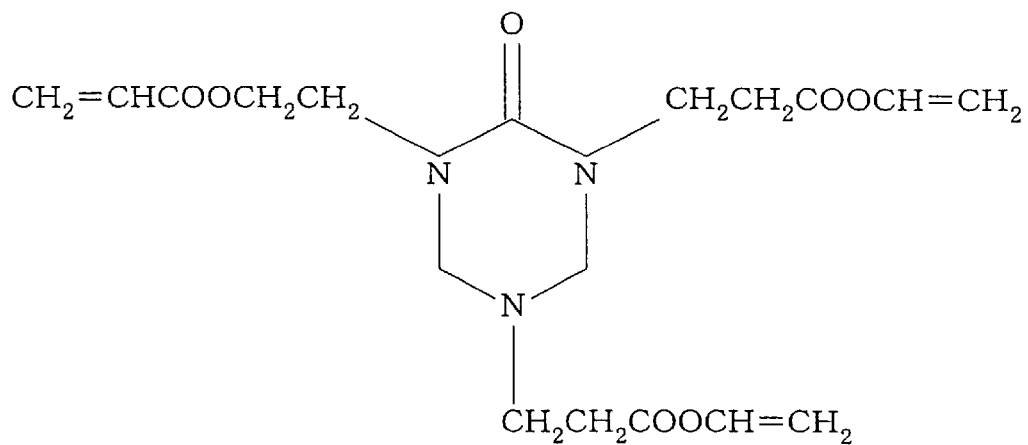

Fig. 60
CHEMICAL FORMULA 4
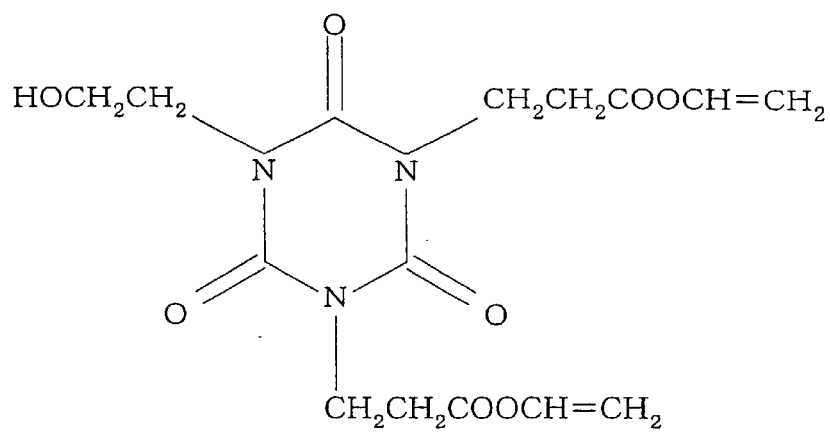
CHEMICAL FORMULA 5
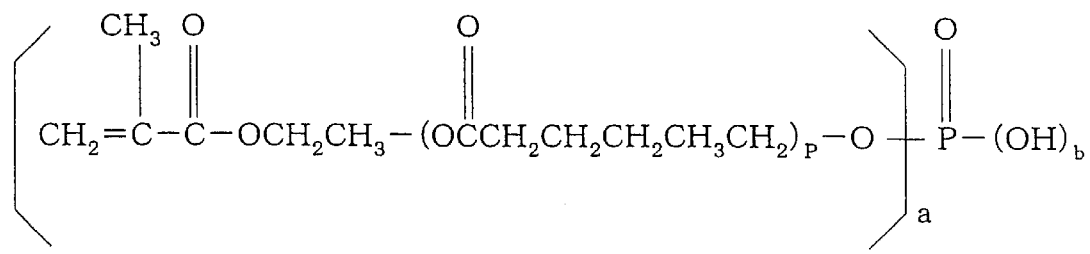
P-2
n=0
a=1~2
b=1~2
P-21
n=1
a=1~2
b=1~2

MANUFACTURING METHOD OF A MULTILAYERED PRINTED CIRCUIT BOARD HAVING AN OPENING MADE BY A LASER, AND USING ELECTROLESS AND ELECTROLYTIC PLATING

This is a continuation of International Appln. No. PCT/JP99/04142 filed Jul. 30, 1999 which designated the U.S., and that International Application was not published under PCT Article 21(2) in English.

BACKGROUND OF THE INVENTION

1. Field of the Invention

The present invention relates to a multilayered printed circuit board and a manufacturing method therefor, and more particularly to a method of manufacturing a multilayered printed circuit board with which an opening is formed by using laser beam and by forming a plated film in the opening to form a via hole, an opening in a solder-resist layer and an opening for forming a through hole. The present invention relates to the structure of a substrate which is a core.

2. Background Art

A method of manufacturing a multilayered printed circuit board has been suggested in Japanese Patent Laid-Open No. 9-130038 which uses a so-called conformal mask such that a conductive layer is formed on the surface of an insulating resin layer. Moreover, an opening is formed in a portion of the conductive layer by etching, followed by irradiating the opening with a laser beam to form an opening in the insulating resin layer.

The foregoing technique, which uses a thick copper film having a thickness of 12 mm to 18 mm as the conformal mask, encounters a large thermal conductivity, causing heat to easily be dispersed. Hence it follows that a high output laser beam or a pulse-shape laser beam must be applied a multiple of times. Therefore, when the opening is formed in the insulating resin layer, undercut occurs with which the opening is widened in the lateral. If a via hole is formed by applying an electrolytic copper plated film and an electroless copper plated film to the opening, separation of the electrolytic copper plated film and the electroless copper plated film easily occurs. As a result, reliability in the connection has been unsatisfactory.

To a worse extent, the foregoing technique cannot form a conductive circuit having fine pitch. In the manufacturing process, the electroless copper plated film (0.1 $\mu$m to 5 $\mu$m) and the copper foil (12 $\mu$m to 18 $\mu$m) under the resist must be removed after the electrolytic copper plated film has been performed. Therefore, the width of the conductive circuit cannot be reduced.

Since the thick copper foil is employed as the conformal mask, a via hole having a small diameter cannot be formed. In the manufacturing process, the electroless copper plated film (2 $\mu$m) and the copper foil (12 $\mu$m to 18 $\mu$m) under the resist must be removed, the diameter of the via hole cannot easily be reduced.

To solve the foregoing problems, an object of the present invention is to suggest a multilayered printed circuit board which is capable of preventing occurrence of undercut if a conformal mask is employed.

A method disclosed in Japanese Patent Publication No. 4-3676 and using a "conformal mask" has the steps of previously forming a metal layer on an insulating resin layer; etching and removing the metal layer in the portion in which a via hole will be formed; and irradiating the opening with a laser beam so that only the insulating resin layer exposed through the opening is removed. The foregoing technique, which is capable of forming a plurality of via holes in the insulating resin layer, exhibits satisfactory productivity.

However, studies performed by the inventor of the present invention have resulted in resin which is left in the opening for forming the via hole, causing the residual resin to expand and unsatisfactorily move the via hole in the upward direction. Thus, there arises a problem in that the upper and lower layers are electrically insulated from each other.

Another problem has been detected as a result of the studies performed by the inventor of the present invention in that the resin in the periphery of the opening is raised excessively and, thus, the via hole is disconnected.

A still further object of the present invention is to obtain a multilayered printed circuit board having furthermore improved reliability in the connection in the via hole portion.

On the other hand, a multilayer forming technique which employs so-called RCC (RESIN COATED COPPER: Copper film having resin) as the built-up multilayered printed circuit board has been suggested. The foregoing technique has the steps of laminating RCC on a circuit substrate; etching the copper foil to form a through hole in a portion in which the via hole will be formed; irradiating the resin layer in the through hole portion with a laser beam to remove the resin layer opening as to form an opening; and filling the opening with plating so that the via hole is formed.

Another technique has been developed as disclosed in Japanese Patent Laid-Open No. 9-36551 with which one-side circuit substrates each having a through hole filled with a conductive substance are laminated through adhesive layers so that a multilayered structure is formed.

The foregoing multilayered printed circuit board is subjected to a process for coarsening the surface of the lower conductive circuit to maintain the adhesiveness between the surface of the lower conductive circuit and the interlayer insulating resin layer.

The coarsening method is exemplified by a method (hereinafter called a "Cu—Ni—P plating method") of covering and coarsening the surface of the conductive circuit with a needle shape or porous plating layer made of a Cu—Ni—P alloy; a coarsening method (hereinafter called a "blackening and reducing method") with which the surface of the conductive circuit is blackened (oxidized) and reduced; a coarsening method (hereinafter called a "soft etching method") which uses mixed solution of peroxide and sulfuric acid to soft-etch the surface of the conductive circuit; and a coarsening method (hereinafter called a "scratching method") with which the surface of the conductive circuit is scratched with a sandpaper or the like.

However, if the conductive circuit is coarsened by the Cu—Ni—P plating method of the blackening and reducing method, followed by forming an interlayer insulating resin layer, and followed by applying a laser beam to form an opening for forming the via hole in the interlayer insulating resin layer, the coarsened surface of the conductive circuit is undesirably removed and flattened owing to the irradiation with the laser beam. Thus, there arises a problem in that the adhesiveness with the via hole formed above the coarsened surface becomes defective.

The reason for this lies in that the coarsened surface formed by the above-mentioned process is colored and, thus, the colored surface undesirably absorbs the laser beam.

When the coarsened surface has been provided for the conductive circuit by the soft etching method or the scratching method, the coarsened surface does not absorb the laser beam. Since the coarsened surface has not sufficiently been coarsened, there arises a problem in that satisfactory adhesiveness cannot be realized between the conductive circuit and the interlayer insulating resin layer.

To solve the above-mentioned problems experienced with the conventional technique, a still further object of the present invention is to provide a multilayered printed circuit board and a manufacturing method each of which is able to realize satisfactory adhesiveness with the interlayer insulating resin layer which is formed on the conductive circuit, with which flattening of the coarsened surface of the surface of the conductive circuit can be prevented when a laser beam is applied to form the via hole in the interlayer insulating resin layer and which has a via hole (conductive circuit) having satisfactory adhesiveness.

With the conventional technique, the via hole is formed by drilling a through hole in the interlayer insulating resin layer and by disposing a metal film in the through hole. Hitherto, the through hole has been formed by employing photosensitive resin to constitute the interlayer insulating resin layer and by exposing a position corresponding to the through hole through a mask on which a black circle has been drawn to sensitize the interlayer insulating resin layer so as to dissolve the non-sensitized portion corresponding to the position of the black circle.

The foregoing photolithography method, however, encounters a limitation of the smallest diameter of the through hole, the limitation being a diameter of about 80 $\mu$m. Therefore, the foregoing method cannot meet a requirement for raising the density of the multilayered printed circuit board. Therefore, the inventor of the present invention has come up with an idea that the through hole is formed by using a laser beam and performed experiments. As a result, a through hole having a diameter not larger than 80 $\mu$m can be formed.

However, a fact has been detected that the reliability of the via hole is unsatisfactory when the via hole has been formed by using the through hole having a diameter not larger than 80 $\mu$m. The cause of the foregoing fact has been studied, thus resulting in a problem of insufficient adhesiveness between the through hole and the electroless copper plated film. That is, the via hole is formed by depositing the electroless copper plated film. Satisfactory adhesiveness cannot be realized between the through hole formed by using a laser beam and having a small diameter and the electroless copper plated film. As a result, separation of the electroless copper plated film from the through hole causes disconnection to occur.

On the other hand, the conventional photolithography technique has been performed such that the through hole is formed by performing exposure and development. Therefore, only photosensitive materials are permitted to be used. Hence it follows that the performance required for the multilayered printed circuit board cannot sometimes be satisfied.

The conventional multilayered printed circuit board suffers from unsatisfactory reliability of solder bumps. The cause has been studied, thus resulting in the insufficient adhesiveness between the through hole and the metal film. That is, the solder bump is formed by enclosing solder in a portion on a nickel plated film deposited on the surface of the conductive circuit below the opening. The adhesiveness between the conductive circuit and the nickel plated film has been unsatisfactory, causing the nickel plated film to be separated. It leads to a fact that disconnection of the solder bump occurs.

To solve the above-mentioned problems, a still further object of the present invention is to provide a multilayered printed circuit board and a manufacturing method therefor each of which is capable of forming a via hole exhibiting satisfactory reliability and having a small diameter.

To solve the above-mentioned problems, a still further object of the present invention is to provide a multilayered printed circuit board and a manufacturing method therefor each of which permits selection of high-performance material for the solder resist.

A still further object of the present invention is to provide a multilayered printed circuit board and a manufacturing method therefor each of which is capable of forming a reliable solder bump.

On the other hand, the through hole provided for a core substrate must precisely be formed. Thus, a through hole having a diameter smaller than 100 $\mu$m cannot easily be formed by drilling. Therefore, the through hole is formed in a copper-plated laminated board by using a laser beam.

An optimum laser beam is a carbon dioxide laser because of a low cost from the viewpoint of industrial production. However, the carbon dioxide laser is undesirably reflected by the surface of the copper foil. Therefore, it is technical common sense that the through hole cannot be formed directly in the copper-plated laminated board by the laser machining. Thus, a technique has been disclosed in Japanese Patent Laid-Open No. S61-99596 with which the surface of the copper foil of the copper-plated laminated board is subjected to a blackening process (an oxidizing process), followed by applying a laser beam.

The foregoing technique, however, requires the blackening process to be performed first, causing a problem to arise in that a long manufacturing process is required.

As a result of energetic studies performed by the inventors of the present invention, an unexpected fact has been found that reduction in the thickness of the copper foil enables an opening to be formed in the copper foil in spite of the reflection by the surface.

To solve the above-mentioned problems, a still further object of the present invention is to realize a technique which is capable of directly forming an opening in a copper-plated laminated board and provide a substrate having the through hole formed by the foregoing method and a multilayered printed circuit board.

Since a high density and multilayered structure has been required in recent years, a built-up multilayered printed circuit board has attracted attention. The multilayered circuit board is a multilayered circuit board having a core substrate on which conductive circuits and interlayer insulating resin layers are alternately formed. The conductive circuits in the layers are connected to one another through a via hole.

As the core substrate of the foregoing built-up multilayered printed circuit board, a glass epoxy resin substrate of FR-4 grade has been employed.

However, the glass epoxy resin substrate of the FR-4 grade encounters a problem in that the insulation resistance between the through holes is reduced in a HAST test and a steam test. Another problem arises in that the resistance of the through hole chain was excessively changed as a result of the heat cycle test. That is, the reliability realized after use for a long time has been unsatisfactory.

To solve the above-mentioned problem, a core substrate which employs BT (Bis maleimide-Triazine) resin has been suggested. The foregoing substrate is, however, a costly substrate.

Inventors of the present invention have considered probability of preventing reduction in the insulation resistance between the through holes and change in the resistance of the conductive circuit for connecting the through holes to each other by using low-cost resin such as epoxy resin in place of the costly resin, such as the BT resin. As a result, an unexpected fact was found that the foregoing problem is caused from the Tg point of the resin.

According to the present invention, a low-cost multilayered printed circuit board is suggested which is free from reduction in the insulation resistance between through holes as a result of the HAST test and the steam test and change in the resistance of the conductive circuit for connecting the through holes to each other as a result of a heat cycle test.

The method of manufacturing the printed circuit board is broadly divided into a subtractive method (a Subtractive Process) and an additive method (an Additive Process). The subtractive method is also called an etching method which is characterized by chemically corroding the surface copper foil of a copper-plated laminated board. A method of manufacturing a printed circuit board (a double-side board) by the subtractive process will now briefly be described.

Initially, a copper-plated laminated board is prepared which incorporates an insulating substrate having two sides each of which is coated with copper foil having tens of $\mu$m. Then, an opening for forming a through hole is formed at a predetermined position of the copper-plated laminated board by drilling or the like. If a drilling step is performed, smears occurs in the opening for forming the through hole, desmear solution is used to process the copper-plated laminated board to dissolve and remove the smears. After the desmear process has been completed, electroless copper plating of the overall ground layer constituted by copper foil and the inner surface of an opening for forming the through hole is performed so that a thin plated layer is formed. After the foregoing plating process has been completed, a mask is formed on the thin plated layer. Then, thick plated layers are formed in the portions exposed through openings of the mask by electrolytic copper plating. After the foregoing plating process has been completed, the mask is separated. Then, etching is performed in a state in which an etching resist has been formed on the thick plated layer by solder plating or the like. The etching process is so performed as to remove the thin plated layer and the ground layer so as to divide the conductive pattern. Finally, the etching resist is separated so that a required printed circuit board is manufactured.

The foregoing method, however, is impossible to accurately form a fine pattern having a satisfactory shape. The characteristics of the etching causes a so-called divergent conductive pattern having a bottom which is longer than the top to easily be formed. Therefore, a pattern cannot easily be formed in a portion (for example, a bonding pad portion) which must have a fine and precise structure.

In view of the foregoing, a still further object of the present invention is to provide a method of manufacturing a printed circuit board with which a fine conductive pattern having a satisfactory shape can be formed.

SUMMARY OF THE INVENTION

A method of manufacturing a multilayered printed circuit board according to claim 1 comprising the steps (1) to (5):

(1) pressing resin to form an interlayer insulating resin layer having a metal film formed thereon against a substrate for forming a conductor circuit;

(2) reducing the thickness of a whole surface of the metal film by etching;

(3) forming an opening in the metal film so as to expose the interlayer insulating resin layer;

(4) applying a laser beam from the formed opening of the metal film side to remove the resin forming the interlayer insulating resin layer exposed through the opening so as to provide an opening for a via hole; and (5) depositing a plating conductor in the formed opening to form the via hole.

The present invention according to claim 1 employs a metal film thinned by etching and thus having a lowered thermal conductivity as a conformal mask. Therefore, an opening can be formed by a small output laser. Hence it follows that generation of undercut of resin for forming an interlayer insulating resin layer can be prevented.

A method of manufacturing a multilayered printed circuit board according to claim 2 comprising the steps (1) to (8):

(1) pressing resin to form an interlayer insulating resin layer having a metal film formed thereon against a substrate forming a conductor circuit;

(2) reducing the thickness of a whole surface of the metal film by etching;

(3) forming an opening in the metal film so as to expose the interlayer insulating resin layer;

(4) applying a laser beam from the formed opening of the metal film side to remove the resin forming the interlayer insulating resin layer exposed through the opening to provide an opening for a via hole;

(5) forming an electroless plated film on the substrate forming the conductor circuit;

(6) forming a plating resist on the substrate forming the conductor circuit;

(7) electrolytic-plating a portion in which the plating resist is not formed; and (8) removing the plating resist to remove the metal film and the electroless plated film below the plating resist by etching so as to form the via hole and the conductor circuit.

The present invention according to claim 2 employs a metal film thinned by etching and thus having a lowered thermal conductivity as a conformal mask. Therefore, an opening can be formed by a small output laser. Hence it follows that generation of undercut of resin for forming an interlayer insulating resin layer can be prevented.

After an opening for forming a via hole has been formed, an electroless copper plated film is formed on the metal film. Then, an electrolytic copper plated film is formed on the electroless copper plated film. When the conductive circuit and the via hole are formed, the electroless copper plated film lower than the resist layer is removed by etching. Since the metal film and the electroless copper plated film, which are thin films, can easily be removed, the electrolytic copper plated film constituting the conductive circuit and the via hole is not corroded during the etching process. As a result, a circuit having a fine pitch and a via hole having a precise diameter can be formed.

The present invention in claim 3 according to claim 1 or 2, the metal film is copper foil.

The present invention in claim 4 according to claim 1 or 2, the thickness of the metal film is made to be 5 $\mu$m to 0.5 $\mu$m in the step for reducing the thickness of the metal film by performing etching.

In accordance with claim 4, the thickness of the metal film is made to be 5 $\mu$m to 0.5 $\mu$m. The reason for this lies in that undercut occurs if the thickness of the metal film is larger than 5 $\mu$m. If the thickness is not larger than 0.5 $\mu$m, the function of the conformal mask cannot be obtained.

In accordance with claim 5, an interlayer insulating resin layer incorporating a metal film having a thickness of 5 $\mu$m to 0.5 $\mu$m is pressed against a substrate having a conductive circuit formed thereon.

In the present invention, the resin film having a metal film formed previously is pressed. Therefore, satisfactory flexibility can be realized which permits the resin film to easily be pressed against the substrate having the conductive circuit formed thereon.

According to the present invention, a method of manufacturing a multilayered printed circuit board is provided, incorporating a substrate on which a lower conductive circuit is formed, an insulating resin layer and an upper conductive circuit formed on the lower conductive circuit and having a structure that the lower conductive circuit and the upper conductive circuit are connected to each other through a via hole, the method of manufacturing a multilayered printed circuit board comprising the steps of: forming the lower conductive circuit on the substrate; forming the insulating resin layer on the lower conductive circuit; forming a coarsened surface on the surface of the insulating resin layer; forming, on the coarsened surface, a metal layer having an opening through which a portion of the coarsened surface is exposed; irradiating the coarsened surface exposed through the opening with a laser beam to remove the insulating resin layer to form an opening for the via hole; and forming the upper conductive circuit and the via hole.

According to the present invention, a method of manufacturing a multilayered printed circuit board is provided, incorporating a substrate on which a lower conductive circuit is formed, an insulating resin layer and an upper conductive circuit formed on the lower conductive circuit and having a structure that the lower conductive circuit and the upper conductive circuit are connected to each other through a via hole, the method of manufacturing a multilayered printed circuit board comprising the steps of: forming the lower conductive circuit on the substrate; laminating, heating and compressing metal foil having a coarsened surface formed either surface thereof and the insulating resin layer formed on the coarsened surface such that the insulating resin layer makes contact with the lower conductive circuit so that the metal foil is integrated; etching a portion of the metal foil to form an opening to expose the coarsened surface of the insulating resin layer; irradiating the coarsened surface exposed through the opening with a laser beam to remove the insulating resin layer so as to form an opening for forming the via hole; and forming the upper conductive circuit and the via hole.

As a result of energetic studies performed by the inventors of the present invention, a fact has been found that the cause of residues produced in the operation for forming the opening for forming the via hole is the structure that the surface which is irradiated with the laser beam is a mirror surface which reflects the laser beam to inhibit complete removal of the insulating resin layer.

The present invention uses the detected fact such that the surface irradiated with the laser beam is formed into the coarsened surface to prevent reflection of the laser beam.

In the present invention, the resist against the laser beam is metal layer or metal foil. Moreover, the opening is formed in the metal layer or the metal foil. The opening is irradiated with a laser beam capable of realizing a diameter of a spot light which is larger than the diameter of the opening so that the opening for forming the via hole is formed in the insulating resin layer.

In the present invention, the surface of the insulating resin layer exposed through the opening in the metal layer or the like is formed into the coarsened surface. Therefore, reflection of the laser beam can be prevented and the insulating resin layer can completely be removed. Since upward expansion of the periphery of the insulating resin layer can be prevented, also disconnection of the via hole can be prevented.

Although the reason why the expansion can be prevented cannot clearly be detected, an estimation can be made that the coarsened surface has a high absorption with respect to a laser beam and the resin is easily formed into plasma.

The inventors of the present invention have energetically studied in order to realize the foregoing object. As a result, etching solution containing a cupric complex and organic acid is used to etch the conductive circuit. Thus, flattening can be prevented when the surface of the conductive circuit is irradiated with a laser beam. Moreover, a coarsened surface exhibiting satisfactory adhesiveness with the interlayer insulating resin layer formed on the conductive circuit and the via hole can be formed. The foregoing detected fact is used to establish the present invention having the following essential portion.

A multilayered printed circuit board according to claim 12 comprising: a substrate on which a conductive circuit is formed; an interlayer insulating resin layer formed on the conductive circuit; an opening for forming a via hole formed in the interlayer insulating resin layer; and another conductive circuit including a via hole and formed on the interlayer insulating resin layer, wherein the surface of the conductive circuit is subjected to a coarsening process using etching solution containing cupric complex and organic acid, and stripe pits and projections are formed on the inner wall of the opening for forming the via hole.

According to claim 13, a method of manufacturing a multilayered printed circuit board including (1) a step of forming a conductive circuit; (2) a step of forming an interlayer insulating resin layer on the conductive circuit; (3) a step of applying a laser beam to form an opening for forming a via hole in the interlayer insulating resin layer; and (4) a step of forming another conductive circuit including a via hole on the interlayer insulating resin layer, wherein the surface of the conductive circuit is subjected to a coarsening process by using etching solution containing cupric complex and organic acid.

It is preferable that the method of manufacturing the multilayered printed circuit board has the step of spraying etching solution containing the cupric complex and the organic acid to the surface of the conductive circuit or the conductive circuit is immersed in the etching solution under a bubbling condition so that the surface of the conductive circuit is subjected to the coarsening process.

In claim 15, a multilayered printed circuit board incorporating interlayer insulating resin layers and conductive layers laminated alternately and structured such that the conductive layers are connected to one another through via holes each of which is formed by forming a metal film in a through hole formed in each of the interlayer insulating resin layers, said multilayered printed circuit board according to the present invention comprising:

stripe pits and projections formed on the side wall of the through hole.

An aspect of the present invention according to claim 15 has the structure that stripe pits and projections are provided for the side wall of the through hole. Thus, the area of connection with the metal film can be enlarged, causing the adhesiveness to be improved. Thus, a reliable via hole can be formed.

Since the stripe pits and projections are formed in the direction of the opening, separation of the via hole can be prevented if force is exerted in the vertical direction of the via hole. Therefore, if the resin is left in the through hole for forming the via hole and the residue is expanded owing to heat to upwards move the via hole, separation can be prevented and reliability can be maintained in the connection.

The bump is provided for the via hole. If an element, such as an IC chip, having a different coefficient of thermal expansion is mounted, force is exerted in the vertical direction of the via hole owing to the heat cycle. Also in the foregoing case, the stripe pits and projections in the direction of the opening prevent separation of the via hole.

It is preferable that the stripe pits and projections have the structure that the intervals between projections (or pits) are 1 μm to 20 μm. If the interval is too long or too short, the adhesiveness effect with the metal film deteriorates. The foregoing interval is substantially the same as ½ of the wavelength of the laser beam.

It is preferable that the metal film for forming the via hole is formed such that the electroless copper plated film and the electrolytic copper plated film are formed in this order from a position adjacent to the side wall of the through hole. The electroless copper plated film is harder than the electrolytic copper plated film. Moreover, the stripe pits and projections are formed into a pseudo coarsened surface. Therefore, if separating force is exerted, breakage of the metal film does not cause the via hole to be separated from the through hole.

It is most preferable that a coarsened surface having an average surface roughness Ra of about 0.05 μm to about 5 μm is formed (FIG. 31(A) which is an enlarged view) on the surface of the stripe pits and projections. The reason for this lies in that the adhesiveness can furthermore be improved.

When the coarsened surface of the sidewall of the through hole is complicated, transmission of a high-frequency signal causes delay in transmission to occur and noise to be produced owing to the skin effect. The stripe pits and projections according to the present invention are formed at the intervals of 1 μm to 20 μm. Therefore, the skin effect does not raise a critical problem. Moreover, the adhesiveness can be improved.

It is most preferable that the surface of the conductive circuit to which the through hole reaches is made of an electrolytic copper plated film. The electrolytic copper plated film has small crystal particles as compared with those of the electroless copper plated film. Moreover, the electrolytic copper plated film exhibits excellent glossiness to easily reflect a laser beam. Therefore, the electrolytic copper plated film is an optimum film in a case where incident light of the laser beam and reflected light are caused to interfere with each other as described later.

It is preferable that the surface of the conductive circuit to which the through hole reaches has a metal coarsened layer.

When the metal coarsened layer is formed on the surface of the conductive circuit, the laser beam is reflected by the surface of the metal coarsened layer to enable the laser beam to be reflected by the surface of the metal coarsened layer to cause the incident light of the laser beam and the reflected wave to interfere with each other. Thus, the stripe pits and projections formed in the direction of the opening can be provided for the surface of the wall of the through hole of the interlayer insulating resin layer.

Since the coarsened layer enables the reflection of the laser beam to be prevented to a level not higher than a predetermined level, residual resin on the surface of the conductive circuit can be prevented. Since the coarsened layer enables the adhesiveness with the interlayer insulating resin layer to be maintained, separation of the interlayer insulating resin layer owing to deterioration in the thermal shock of the laser beam can be prevented.

When the coarsened layer is not provided, the reflection is raised excessively, causing residue of the resin to easily occur. If an oxidizing (a blackening) process is performed to form the coarsened layer, the laser beam is undesirably absorbed. Thus, the laser beam cannot be reflected.

It is preferable that Rj of the coarsened layer is 0.05 μm to 20 μm. If Rj is 0.05 μm or smaller, the reverse side is blackened. Thus, the laser beam is undesirably absorbed. If Rj is larger than 20 μm, the laser beam scatters. In either of the two cases, incident light a reflected wave cannot cause to interfere with each other.

It is preferable that the coarsened layer is a coarsened layer obtained by non-acidic chemical coarsening process, such as physical coarsening including a polishing process, an oxidizing (a blackening) and reducing process, a process using sulfuric acid and hydrogen peroxide solution or a coarsening process using etching solution composed of cupric complex and organic acid under coexistence of oxygen. As an alternative to this, it is preferable that the coarsened layer is a coarsened layer obtainable from a plating process using an alloy, such as Cu—Ni—P or Cu—Co—P. The reason for this lies in that the foregoing coarsened layer is able to reflect the laser beam.

Plating of Cu—Ni—P may be performed by using electroless plating bath, the pH of which is 9 and which is water solution of, for example, copper sulfate ($0.1 \times 10^{-2}$ to $25 \times 10^{-2}$ mol/l), nickel sulfate ($0.1 \times 10^{-3}$ to $40 \times 10^{-3}$ mol/l), citric acid ($1 \times 10^{-2}$ to $20 \times 10^{-2}$ mol/l), sodium hypophosphite ($1 \times 10^{-1}$ to $10 \times 10^{-1}$ mol/l), boric acid ($1 \times 10^{-1}$ to $10.0 \times 10^{-1}$ mol/l) or a surface active agent (Surfinol 465 manufactured by Nissin Chemical Industry) (0.1 g/l to 10 g/l).

It is preferable that the cupric complex according to the present invention is a cupric complex of azole. The cupric complex of azole is employed as an oxidizer for oxidizing metal copper. The azole may be diazole, triazole or tetra azole. Among the foregoing materials, it is preferable that any one of the following material is employed: imidazole, 2-methyl imidazole, 2-ethyl imidazole, 2 ethyl-4-methyl imidazole, 2-phenyl imidazole or 2-undecyl imidazole. It is preferable that the quantity of cupric complex of azole which must be added is 1 wt % to 15 wt %. The reason for this lies in that noble metal, such as Pd, exhibiting satisfactory solubility, stability and constituting crystal core can be dissolved.

To dissolve copper oxide, organic acid is mixed with the cupric complex of azole.

Specifically, it is preferable that the organic acid is at least one type of material selected from a group consisting of formic acid, acetic acid, propionic acid, butyric acid, valerianic acid, capronic acid, acrylic acid, crotonic acid, oxalic acid, malonic acid, succinic acid, glutaric acid, maleic acid, benzoic acid, glycollic acid, lactic acid, malic acid and sulfamic acid. It is preferable that the content of the organic acid is 0.1 wt % to 30 wt % to maintain the solubility of oxidized copper and dissolution stability.

The produced cuprous complex is dissolved owing to an action of the acid so as to be combined with oxygen so that cupric complex is produced which is again contributed to the oxidation of copper.

To assist the dissolution of copper and oxidation of azole, halogen ions, for example, fluorine ions, chlorine ions or bromine ions, may be added to the etching solution. In the present invention, hydrochloric acid or sodium chloride may be added to supply halogen ions. It is preferable that the quantity of halogen ions is 0.01 wt % to 20 wt % to improve the adhesiveness between the formed coarsened surface and the interlayer insulating resin layer.

The cupric complex of azole and the organic acid (and halogen ions if necessary) are dissolved in water to adjust the etching solution.

The oxidizing and reducing process may be performed by using an oxidizing bath of 1 g/l to 100 g/l NaOH, 1 g/l to 100 g/l $NaClO_2$ and 1 g/l to 50 g/l $Na_3PO_4$ and a reducing bath of 1 g/l to 100 g/l NaOH to 1 g/l to 50 g/l $NaBH_4$.

The metal coarsened layer may be coated with at least one type of metal materials selected from a group consisting of Ti, Al, Cr, Zn, Fe, In, Tl, Co, Ni, Sn, Pb, Bi and noble metal to maintain glossiness and improve adhesiveness with the solder resist. It is preferable that the thickness of the selected metal material is 0.01 $\mu$m to 10 $\mu$m.

In the present invention, it is preferable that the diameter of the through hole for forming the via hole is 80 $\mu$m or smaller. The foregoing precise via hole has a small area of contact between the metal film for forming the via hole and the side wall of the through hole for forming the via hole. Therefore, separation considerably easily occurs. Therefore, the formation of the conventional coarsened surface cannot satisfactorily prevent the separation. If the coarsened surface is made to be excessively complicated, the foregoing skin effect problem of delay in transmission and production of noise arises. The present invention is able to overcome the foregoing problems.

The present invention in claim 16 according to claim 15, the interlayer insulating resin layer is made of thermosetting resin or a composite material of the thermosetting resin and thermoplastic resin.

An aspect of the present invention according to claim 16 has a structure that the interlayer insulating resin layer is made of thermosetting resin or a composite material of thermosetting resin and thermoplastic resin. Therefore, stripe pits and projections can easily be formed owing to interference of the laser beam. Note that only the thermosetting resin, which encounters dissolution of resin, cannot form clear stripe pits and projections.

The present invention in claim 17 according to claim 15, the interlayer insulating resin layer contains acrylic monomer.

It is preferable that an aspect of the present invention according to claim 17 is structured such that the interlayer insulating resin layer contains acrylic monomer. The reason for this lies in that residues of the resin can be reduced.

The acrylic monomer crosslinks monomer or oligomer of the thermosetting resin (including the thermosetting resin, a portion of which has been sensitized).

The acrylic monomer can be decomposed relatively easily. Therefore, the acrylic monomer is contained in the molecular chain, the acrylic monomer is decomposed owing to a laser beam, causing the thermosetting resin to have low molecular weight. Moreover, the resin having the low molecular weight is decomposed by the laser beam. Therefore, formation into plasma can easily be formed, causing residue of resin to substantially be eliminated.

The acrylic monomer may be any one of a variety of commercial products. For example, DPE-6A KAYAMAER PM-2 or PM-21 manufactured by Nihon Kayaku, R-604 manufactured by Kyoei or Aronix M-315, M-325 or M-215 manufactured by Toa may be employed.

DPE-6A is expressed by chemical formula 1 shown in FIG. 59, R-604 is expressed by chemical formula 2, Aronix M-315 is expressed by chemical formula 3, M215 is expressed by chemical formula 4 shown in FIG. 60 and KAYAMAER PM-2 and PM-21 is expressed by chemical formula 5.

A method of manufacturing a multilayered printed circuit board according to claim 18 comprising at least the steps (a) to (d):
  (a) forming a conductive circuit;
  (b) coating the conductive circuit with resin;
  (c) irradiating the resin with a carbon-dioxide gas laser beam to form a through hole which reaches the conductive circuit such that the carbon-dioxide gas laser beam is vertically applied to the conductive circuit below the resin to cause interference of reflected wave from the conductive circuit and incident wave to occur so that stripe pits and projections are formed on the side wall of the through hole; and
  (d) coating the through hole with metal to form a via hole.

In claim 18, an aspect has a structure that the conductive circuit below the resin is vertically irradiated with a carbon-dioxide-gas laser beam to cause interference between reflected wave from the conductive circuit and incident wave to occur. Therefore, the stripe pits and projections can be formed on the side wall of the through hole. Therefore, the adhesiveness with metal can be improved so that a reliable via hole can be formed.

The present invention in claim 19 according to claim 18, the resin is thermosetting resin or a composite material of the thermosetting resin and thermoplastic resin.

An aspect of claim 19 has a structure that the interlayer insulating resin layer is made of the thermosetting resin or a composite of the thermosetting resin and thermoplastic resin. Therefore, the stripe pits and projections can easily be formed by the laser beam.

The present invention in claim 20 according to claim 18, the step of forming the via hole includes a step of forming a resist after an electroless copper plated film has been formed in the through hole and supplying electric power through the electroless plated film to form an electrolytic plated film in a portion in which the resist is not formed.

An aspect of claim 20 has a structure that an electroless copper plated film is formed on the surface of the through hole, followed by forming a resist. Then, electric power is supplied through the electroless copper plated film to form an electrolytic copper plated film in a portion in which no resist is formed. Thus, the via hole is formed. Since the stripe pits and projections are formed on the side wall of the through hole by using the interference of the laser beam and then the electroless plated film is formed, the adhesiveness between the electroless copper plated film and the through hole in the interlayer insulating resin layer can be improved. As a result, a reliable via hole can be formed.

The present invention in claim 21 according to claim 18, the interlayer insulating resin layer contains acrylic monomer.

A method of manufacturing a printed circuit board according to claim 22 comprising at least the steps (a) and (b):
  (a) forming a solder-resist layer on the surface of a substrate on which a conductive circuit has been formed; and
  (b) irradiating the solder-resist layer with a laser beam to form a through hole which reaches the conductive circuit.

An aspect claim 22 has a structure that the through hole is formed in the solder resist layer by using the laser beam. Therefore, the material is not limited to the photosensitive material. As a material of the solder-resist layer, any one a variety of materials may be employed.

Moreover, defective conduction owing to residue of the solder-resist resin can be prevented.

It is most preferable that the surface of the conductive circuit is constituted by the electrolytic plated film. The electrolytic plated film has large crystal particles as compared with those of the electroless plated film. Moreover, the electrolytic plated film exhibits excellent glossiness to easily reflect a laser beam. Therefore, the electrolytic plated film is an optimum film in a case where incident light of the laser beam and reflected light are caused to interfere with each other as described later.

The present invention in claim 23 according to claim 22, the surface of the conductive circuit has a metal coarsened layer.

An aspect of claim 23 is characterized in that the surface of the conductive circuit has a metal coarsened layer.

Since the metal coarsened layer is formed on the surface of the conductive circuit, the laser beam can be reflected by the surface of the metal coarsened layer. Thus, as described later, incident waves of the laser beam and reflected waves can be caused to interfere with each other. Thus, the stripe pits and projections formed in the direction of the opening can be provided for the wall of the through hole of the solder-resist layer.

The present invention in claim 24 according to claim 22, (c) a step of forming a bump made metal having a low melting point in the through hole is performed after the step (b).

An aspect claim 24 has a structure that a bump made of a low-melting-point metal is provided for the through hole in the solder-resist layer. Thus, an electrode of an IC chip can be connected to the foregoing bump or the foregoing bump may be used to mount the printed circuit board to another printed circuit board.

The present invention in claim 25 according to claim 22, a laser beam in a single mode is applied in the step of forming the through hole so that a through hole having a diameter of 300 µm to 650 µm is formed.

An aspect of claim 25 has a structure that a single-mode laser beam, the diameter of a spot light of which can be enlarged is applied. Therefore, a through hole for forming a through hole having a diameter of 300 µm to 650 µm, that is, a through hole for forming a bump for establishing the connection with another printed circuit board (for example, a mother board) can be formed in the solder-resist layer.

The present invention in claim 26 according to claim 22, a laser beam in a multi mode is applied in the step of forming the through hole so that a through hole having a diameter of 50 µm to 300 µm is formed.

An aspect of claim 26 has a structure that a multimode laser beam, the diameter of which can be reduced is applied. Therefore, a through hole for forming a through hole having a diameter of 50 µm to 300 µm, that is, a through hole for forming a bump for establishing the connection with an IC chip can be formed in the solder-resist layer.

The present invention in claim 27 according to any of claims 22 to 26, the step of forming the through hole is performed such that the carbon-dioxide gas laser beam is vertically applied to the conductive circuit below the resin to cause interference of reflected wave from the conductive circuit and incident wave to occur so that stripe pits and projections are formed on the side wall of the through hole.

An aspect claim 27 has a structure that a step for forming the through hole is arranged such that reflected wave of the carbon-dioxide gas laser beam and the incident wave are caused to interfere with each other. Thus, the stripe pits and projections are formed on the side wall of the through hole. Therefore, when the metal film is provided for the through hole, the metal film can be brought into hermetic contact with the through hole.

The present invention in claim 28 according to claim 27, the step of forming the bump is performed such that a metal film is provided for the through hole having the side wall provided with the stripe pits and projections, and then metal having a low melting point is enclosed.

An aspect of claim 28 has a structure that the metal film is provided for the through hole having the side wall. Then, low-melting-point metal is enclosed to form the bump. The metal film is brought into hermetic contact with the through hole having the stripe pits and projections so that the bump is strongly connected to the conductive circuit.

In claim 29, a printed circuit board incorporating a substrate provided with a conductive circuit and having a surface on which a solder-resist layer is formed, said printed circuit board according to the present invention comprising:

stripe pits and projections formed on the side wall of a through hole formed in the solder-resist layer.

An aspect of claim 29 has a structure that the stripe pits and projections are formed on the side wall of the through hole formed in the solder-resist layer. Therefore, when the metal film is formed on the surface of the through hole, the metal film can strongly be brought into hermetic contact with the through hole.

A heat cycle sometimes causes a crack to sometimes occur in the solder-resist layer owing to the difference between the coefficiency of thermal expansion of the metal film and that of the solder-resist layer. However, the present invention causes the metal film and the wall of the through hole of the solder-resist layer to be brought into hermetic contact to each other. Therefore, a crack cannot easily be formed.

Since the stripe pits and projections are provided for the wall of the through hole in the direction of the opening, the contact between the wall and the low-melting-point metal is made to be line contact in place of the plane contact. Therefore, a phenomenon (migration) that the low-melting-point metal is ionized and diffused under hot and high humidity conditions can be prevented. The employed low-melting-point metal and the metal film are the same as those described above. It is most preferable that the surface of the conductive circuit is constituted by an electolytically plated film. The electolytically plated film has smaller crystal particles as compared with the electroless platted film and exhibiting excellent glossiness. Moreover, discoloration, called "color change owing to plating" can be prevented. Thus, the laser beam can easily be reflected. Thus, the stripe pits and projections can be formed on the surface of the wall in the direction of the opening.

It is preferable that the stripe pits and projections have the structure that the intervals between projections (or pits) are 1 µm to 20 µm. If the interval is too long or too short, the adhesiveness effect with the metal film deteriorates. A similar state is realized to that realized by the plane contact and, therefore, the foregoing effect cannot be obtained. The foregoing interval is substantially the same as ½ of the wavelength of the laser beam.

The low-melting-point metal may be solder, such as Sn/Pb, Ag/Sn or Ag/Sn/Cu. The foregoing bump can be formed through a metal film made of Ni/Au, Ni/Pd/Au, Cu/Ni/Au or Cu/Ni/Pd/Au. Adjustments are performed such that the thickness of the Cu layer and that of the Ni layer is 0.1 µm to 10 µm and that of each of the Pd layer and the Au layer is 0.01 µm to 10 µm.

The present invention in claim 30 according to claim 29, a bump made of metal having a low melting point is formed in the through hole through a metal film.

An aspect of claim 30 has a structure that the low-melting-point metal is enclosed to form the bump. When the metal film is brought into hermetic contact with the through hole having the stripe pits and projections, the bump can strongly be connected to the conductive circuit.

The present invention in claim 31 according to claim 29 or 30, the solder-resist layer is made of thermosetting resin or a composite material of the thermosetting resin and thermoplastic resin.

An aspect of claim 31 has a structure that the solder-resist layer is constituted by thermosetting resin or a composite of the thermosetting resin and the thermoplastic resin. Therefore, the stripe pits and projections can easily be formed on the side surface of the through hole by the laser beam. When only the thermoplastic resin is employed, the resin is undesirably dissolved. Thus, clear pits and projections cannot be formed.

The present invention in claim 32 according to any of claims 29 to 31, a coarsened layer is formed on the surface of the conductive circuit.

An aspect of claim 32 is characterized in that the surface of the conductive circuit has a metal coarsened layer.

Since the metal coarsened layer is formed on the surface of the conductive circuit, the laser beam can be reflected by the surface of the metal coarsened layer. Thus, the incident wave and the reflected wave of the laser beam can be caused to interfere with each other. Thus, the stripe pits and projections can be formed on the surface of the wall of the through hole in the solder-resist layer in the direction of the opening.

In the present invention, it is desirable to use an adhesive for electroless plating as the above interlayer resin insulating layer. In this adhesive for electroless plating, it is optimal that heat resisting resin particles soluble to a hardened acid or oxidizing agent are dispersed into unhardened heat resisting resin difficult to be soluble to an acid or an oxidizing agent.

The heat resisting resin particles are dissolved and removed by processing these resin particles using an acid or an oxidizing agent and a coarsened face constructed by an anchor formed in the shape of an octopus trap can be formed on a layer surface.

In the above adhesive for electroless plating, the above heat resisting resin particles particularly hardened are desirably constructed by using ① heat resisting resin powder having an average particle diameter equal to or smaller than 10 μm, ② cohesive particles formed by aggregating heat resisting resin powder having an average particle diameter equal to or smaller than 2 μm, ③ a mixture of heat resisting powder resin powder having an average particle diameter from 2 to 10 μm and heat resisting resin powder having an average particle diameter equal to or smaller than 2 μm, ④ pseudo-particles in which at least one kind of heat resisting resin powder or inorganic powder having an average particle diameter equal to or smaller than 2 μm is attached to the surface of heat resisting resin powder having an average particle diameter from 2 to 10 μm, ⑤ a mixture of heat resisting powder resin powder having an average particle diameter from 0.1 to 0.8 μm and heat resisting resin powder having an average particle diameter greater than 0.8 μm and smaller than 2 μm, and ⑥ heat resisting powder resin powder having an average particle diameter from 0.1 to 1.0 μm. This is because these materials can form a more complicated anchor.

A depth of the coarsened face is preferably set to secure a close attaching property such that Rj=0.01 to 20 μm. In particular, Rj preferably ranges from 0.1 to 5 μm in the semi-additive method since an electroless plating film can be removed while the close attaching property is secured.

The heat resisting resin difficult to be soluble to an acid or an oxidizing agent mentioned above is desirably constructed by "a resin complex constructed by thermosetting resin and thermoplastic resin", or "a resin complex constructed by photosensitive resin and thermoplastic resin". The former has a high heat resisting property. The latter is desirable since the opening for the via hole can be formed by photolithography.

The above thermosetting resin can be constructed by using epoxy resin, phenol resin, polyimide resin, etc. When the thermosetting resin is photosensitized, a thermosetting group acrylic-reacts on methacrylic acid, acrylic acid, etc. Acrylate of the epoxy resin is particularly optimal.

The epoxy resin can be constructed by using epoxy resin of novolak type such as phenol novolak type, cresol novolak type, etc., dicyclopentadiene-modified alicyclic epoxy resin, etc.

The thermoplastic resin can be constructed by using polyether sulfone (PES), polysulfone (PSF), polyphenylene sulfone (PPS), polyphenylene sulfide (PPES), polyphenyl ether (PPE), polyether imide (PI), etc.

A mixing ratio of the thermosetting resin (photosensitive resin) and the thermoplastic resin is preferably set such that thermosetting resin (photosensitive resin)/thermoplastic resin=95/5 to 50/50. This is because a high toughness value can be secured without reducing a heating resisting property.

A mixing weight ratio of the above heat resisting resin particles is preferably set to range from 5 to 50 weight % and desirably range from 10 to 40 weight % with respect to the solid content of a heat resisting resin matrix.

The heat resisting resin particles are preferably constructed by amino resin (melamine resin, urea resin, guanamine resin), epoxy resin, etc. A acrylic-system monomer can be used.

The adhesive may be constructed by two layers having different compositions.

Various kinds of resins can be used as a solder resist layer added to a surface of the multilayer build-up wiring board. For example, it is possible to use bisphenol A-type epoxy resin, acrylate of bisphenol A-type epoxy resin, novolak type epoxy resin, resin formed by hardening acrylate of novolak type epoxy resin by an amine-system hardening agent, an imidazole hardening agent, etc.

There is a case in which such a solder resist layer is separated since the solder resist layer is constructed by resin having a stiff skeleton. Therefore, the separation of the solder resist layer can be also prevented by arranging a reinforcing layer.

The above acrylate of the novolak type epoxy resin can be constructed by using epoxy resin in which glycidyl ether of phenol novolak and cresol novolak reacts with acrylic acid, methacrylic acid, etc.

The above imidazole hardening agent is desirably formed in a liquid state at 25° C. since the imidazole hardening agent can be uniformly mixed in the liquid state.

Such a liquid state imidazole hardening agent can be constructed by using 1-benzyl-2-methylimidazole (product name: 1B2MZ), 1-cyanoethyl-2-ethyl-4-methylimidazole (product name: 2E4MZ-CN) and 4-methyl-2-ethylimidazole (product name: 2E4MZ).

An adding amount of this imidazole hardening agent is desirably set to range from 1 to 10 weight % with respect to a total solid content of the above solder resist composition substance. This is because the imidazole hardening agent is easily. uniformed and mixed if the adding amount lies within this range.

A composition substance prior to the hardening of the above solder resist is desirably constructed by using a solvent of a glycol ether system as a solvent.

In the solder resist layer using such a composition substance, no free acid is caused and no copper pad surface is oxidized. Further, a harmful property with respect to a human body is low.

Such a solvent of the glycol ether system is constructed by using the following structural formula, particularly desirably using at least one kind selected from diethylene glycol dimethyl ether (DMDG) and triethylene glycol dimethyl ether (DMTG). This is because these solvents can perfectly dissolve benzophenone and Michler's ketone as reaction starting agents at a heating temperature from about 30 to 50° C.

(n=1 to 5)

This solvent of the glycol ether system preferably has 10 to 70 wt % with respect to a total weight amount of the solder resist composition substance.

As explained above, various kinds of antifoaming and leveling agents, thermosetting resin for improving a heat resisting property and an antibasic property and giving a flexible property, a photosensitive monomer for improving resolution, etc. can be further added to the solder resist composition substance.

For example, the leveling agent is preferably constructed by monomer of acrylic ester. A starting agent is preferably constructed by Irugacure 1907 manufactured by CHIBA-GAIGI. A photosensitizer is preferably constructed by DETX-S manufactured by NIHON KAYAKU.

Further, a coloring matter and a pigment may be added to the solder resist composition substance since a wiring pattern can be hidden. This coloring matter is desirably constructed by using phthalocyaline green.

Bisphenol type epoxy resin can be used as the above thermosetting resin as an adding component. In this bisphenol type epoxy resin, there are bisphenol A-type epoxy resin and bisphenol F-type epoxy resin. The former is preferable when an antibasic property is seriously considered. The latter is preferable when low viscosity is required (when a coating property is seriously considered).

A polyhydric acrylic-system monomer can be used as the above photosensitive monomer as an adding component since the polyhydric acrylic-system monomer can improve resolution. For example, DPE-6A manufactured by NIHON KAYAKU and R-604 manufactured by KYOEISYA KAGAKU can be used as the polyhydric acrylic-system monomer.

These solder resist composition substances preferably have 0.5 to 10 Pa·s in viscosity at 25° C. and more desirably have 1 to 10 Pa·s in viscosity since these solder resist composition substances are easily coated by a roll coater in these cases.

In claim 34, a method of manufacturing a multilayered printed circuit board such that a through hole is formed in a double-side copper-plated laminated board by performing a laser machining and the through hole is made to be conductive to form a through hole so that a core substrate is manufactured, and an interlayer insulating resin layer and a conductive circuit are formed on the core substrate, said method of manufacturing a multilayered printed circuit board comprising the step of:

making the thickness of copper foil of the double-side copper-plated laminated board to be smaller than 12 $\mu$m.

In claim 37, a substrate for forming a through hole such that a through hole is formed in a double-side copper-plated laminated board and the through hole is made to be conductive so that a through hole is formed, said substrate comprising:

taper provided for the through hole.

In claim 40, a multilayered printed circuit board incorporating a substrate in the form of a double-side copper-plated laminated board in which a through hole is formed such that the through hole is made to be conductive so that a through hole is formed and an interlayer insulating resin layer and a conductive circuit are formed on at least either side of the substrate, said multilayered printed circuit board comprising:

taper provided for the through hole.

As a result of energetic studies performed by the inventors of the present invention, the following fact was detected: the reason why an opening cannot be formed in copper foil having a thickness of 12 $\mu$m by the carbon-dioxide gas laser beam is not reflection at the surface. The foregoing fact is caused from the large thickness of the copper foil with which thermal conduction easily occurs. Thus, the energy of the laser beam is converted into heat which is undesirably conducted.

The thickness of the copper foil is smaller than 12 $\mu$m, preferably about 1 $\mu$m to about 10 $\mu$m. Thus, conversion of the energy of the laser beam into heat which is conducted as described above can be prevented. Thus, formation of an opening using the laser beam can be realized.

The copper-plated laminated board according to the present invention may be a copper-plated laminated board obtained by bonding copper foil to prepreg, such as glass-cloth epoxy resin, glass-cloth bis maleimide-triazine resin or glass-cloth fluororesin.

It is preferable that the thickness of the copper foil is 1 $\mu$m to 10 $\mu$m. The reason for this lies in that an opening can easily be formed by the laser beam if the thickness is 10 $\mu$m or smaller. If the thickness is smaller than 1 $\mu$m, blister or the like occurs.

The thickness of the copper foil is adjusted by etching. Specifically, chemical etching is employed which uses sulfuric acid and hydrogen peroxide solution, ammonium persulfate solution, cupric chloride solution or ferric chloride solution; or physical etching, such as ion-beam etching is employed.

It is preferable that the thickness of the copper-plated laminated board is 0.5 mm to 1.0 mm. If the thickness is too large, the opening cannot be formed. If the thickness is too small, warp or the like occurs.

It is preferable that the carbon-dioxide gas laser beam for use in the present invention is a short-pulse laser of 20 mJ to 40 mJ and $10^{-4}$ second to $10^{-8}$ second.

The number of shots of the laser beams is 5 shots to 100 shots.

It is preferable that the diameter of the through hole which must be formed is 50 $\mu$m to 150 $\mu$m. If the thickness is smaller than 50 $\mu$m, the surface of the wall cannot be made to be conductive by plating or the like. If the thickness is larger than 150 $\mu$m, a drill work enables an advantage to be realized.

If the diameter of the through hole is larger than 100 $\mu$m, the through hole encounters taper. Taper occurs on the side on which the laser beam is made incident such that the diameter of the through hole is enlarged.

When the laser beam is applied from the right side or the reverse side, a through hole having a cross section formed into a concave shape is undesirably formed.

The foregoing through hole is made to be conductive by electric plating, electroless plating, sputtering, evaporation or enclosure of conductive paste.

When the conductive paste is enclosed, it is preferable that taper is provided for the through hole to easily enclose the paste.

Also in a case where the through hole is formed by metalizing the surface of the inner wall by electric plating, electroless plating, sputtering or evaporation, the through hole can be filled with a filler.

The inner wall of the metalized through hole may be coarsened.

When the inner wall of the through hole is metalized, it is preferable that each of the thickness of the copper foil and that of the metalized layer (for example, the electroless plated layer) is 10 $\mu$m to 30 $\mu$m.

The filler may be any one of a variety of materials including a filler constituted by inorganic particles made of bis phenol F epoxy resin, silica or alumina, metal particles and resin.

The conductive circuit is provided for the substrate having the through hole structured as described above. The conductive circuit is formed by an etching process.

It is preferable that the surface of the conductive circuit is subjected to a coarsening process in order to improve the adhesiveness.

Then, the interlayer insulating resin layer made of insulating resin is formed.

The insulating resin may be thermosetting resin, thermoplastic resin or their composite resin. In the present invention, the interlayer insulating resin layer may be adhesive agent for electroless plating. The opening can be formed in the foregoing interlayer insulating resin layer by a laser beam, exposure or a development process.

In claim 45, a built-up multilayered printed circuit board according to comprising: a substrate having a through hole and a conductive circuit and structured such that interlayer insulating resin layers and conductive circuits are alternately formed and the conductive circuits in the different layers are electrically connected to one another through via holes formed in the interlayer insulating resin layers, wherein the substrate is a glass epoxy resin substrate made of epoxy resin having Tg point of 190° C. or higher.

As a result of energetic studies performed by the inventors of the present invention, the following fact was detected: the reason why the insulation resistance between the through holes is reduced during the HAST test and the steam test is that metal, such as copper, which forms the through hole is ionized and ions are moved (migration) between the through holes, causing the insulation resistance to be reduced.

Another fact was found that the resistance of the conductive circuit which connects the through holes to each other after the heat cycle test lies in that thermal expansion and contraction result in the conductive circuit resist the plated through hole being broken.

A fact was detected that the migration and thermal expansion and contraction can be prevented by raising the crosslinking density of the epoxy resin to raise the Tg point.

If the Tg point of the epoxy resin is not lower than 190° C., the foregoing problems can be prevented. As a result, the ionization of the metal which forms the through hole and ions are moved (migration) as described above to reduce the insulation resistance between the plated through holes during the HAST test and the steam test can be prevented. Moreover, the thermal expansion and contraction occurring in the heat cycle test resulting in the conductive circuit or the through hole being broken and thus the resistance is changed, can be prevented.

Note that the epoxy resin is low-cost resin as compared with BT resin.

As the glass epoxy resin substrate having a Tg point of 190° C. or higher (a DMA method (temperature rise rate: 2° C./minute)), a known substrate developed for a mass-lamination type multilayered printed circuit board may be used.

For example, any one of the foregoing materials may be employed: HL830 (Tg point: 217° C.) or HL830FC (Tg point: 212° C.) manufactured by Mitsubishi Gas Chemical, MCL-E-679LD (Tg point: 205° C. to 215° C.) or MCL-E-679F (Tg point: 205° C. to 217° C.) manufactured by Hitachi Chemical or R-5715 (Tg point: 190° C.) manufactured by Matsushita Electric Works.

An opening is, by a laser beam or drilling, formed in the foregoing glass epoxy resin substrate or the copper-plated laminated board, followed by metalizing the surface of the inner wall by electric plating, electroless plating, sputtering or evaporation. Thus, the through hole is formed. A filler may be enclosed in the foregoing through hole.

The metalized inner wall of the through hole may be coarsened.

The filler may be made of any one of a variety of materials including inorganic particles made of bis phenol F epoxy resin, silica or alumina; or metal particles; and resin.

The conductive circuit is provided for the thus-formed substrate having the through hole formed therein. The conductive circuit is formed by an etching process.

It is preferable that the surface of the conductive circuit is subjected to the coarsening process.

Then, the interlayer insulating resin layer is formed. The insulating resin may be thermosetting resin, thermoplastic resin or their composite resin.

To solve the problem, in claim 46, a method of manufacturing a printed circuit board incorporating through holes and conductor patterns formed by a subtractive method, said method of manufacturing a printed circuit board according to the present invention comprising:

an opening forming step for forming an opening for forming a through hole at a predetermined position of a metal-applied board formed by applying conductive metal foil having a thickness of 0.5 $\mu$m to 7.0 $\mu$m to each of two sides of an insulating substrate;

a desmear step for dissolving and removing smear existing in the opening for forming the through hole;

a first plating step for forming a thin plated layer on a ground layer caused from the conductive metal foil and the surface of the inner wall of the opening for forming the through hole;

a second plating step for forming a mask on the thin plated layer and forming a thick plated layer on a portion exposed through an opening of the mask; and performing etching after the mask has been separated so that the thin plated layer and the ground layer below the mask are removed so as to divide the conductor patter.

An aspect of claim 46 enables smear taken place during an opening forming process to be dissolved and removed by performing a desmear process. Also the conductive metal foil is dissolved and removed at this time. Thus, the conductive metal foil is thinned. A first plating process is performed so that a thin plated layer is formed. Then, a second plating process is performed so that a thick plated layer is formed. As a result, only portions which will be formed into the conductive pattern are selectively thickened. Then, etching is performed so that the thin plated layer below the mask and the ground layer are removed. Thus, the conductive pattern is divided. In the present invention, both of the thin plated layer and the ground layer are thin layers. Therefore, the thickness which must be removed by etching performed in the conductive pattern dividing step is very small. Therefore, formation of a divergent shape of the conductive pattern formed by dividing does not easily occur. Thus, a fine pattern having a satisfactory shape can accurately be formed.

The conductive metal foil can be made with copper s aluminum, gold, silver, platinum or nickel. Specifically, the copper or the metal mainly comprising the copper is desirable.

The present invention in claim 48 according to claim 48, the first plating step uses an electroless plating bath, and the second plating step uses an electrolytic plating bath.

An aspect of claim 48 has a structure that the electroless plating bath is employed only when the plated layer is formed on the inner wall of the opening for forming the through hole. Then, the low-cost electrolytic plating bath which exhibits high speed plating deposition speed is employed. As a result, the cost reduction can be realized and the productivity can be improved.

The present invention in claim 49 according to claim 47, the first plating step uses an electroless copper plating bath to form a copper plated layer having a thickness of 0.2 μm to 2.5 μm, and the second plating step uses an electrolytic copper plating bath to form a copper plated layer having a thickness of 8.0 μm or greater.

An aspect of claim 49 has a structure that the electroless plating bath is employed only when the plated layer is formed on the inner wall of the opening for forming the through hole. Then, the low-cost electrolytic plating bath which exhibits high speed plating deposition speed is employed. As a result, the cost reduction can be realized and the productivity can be improved. Since a very-thin copper plated layer is formed in the first plating step, the thickness which must be removed by etching in the conductive pattern dividing step is very small. Therefore, a fine pattern having a satisfactory shape can furthermore accurately be formed.

The present invention in claim 50 according to any of claims 47 to 49, the step for dividing the conductor pattern by performing etching is performed in a state in which no etching resist is provided for the thick plated layer formed in the second plating step.

An aspect of claim 50 has a structure that the step for forming and separating the etching resist in the conductive pattern dividing step can be omitted. Thus, the number of manufacturing steps can be reduced and the productivity can be improved. Moreover, the thickness of the thick plated layer which is removed when the etching process is performed is very small. Thus, no adverse influence is exerted on the accuracy of the formed pattern.

According to another aspect of the present invention in claim 51, a printed circuit board incorporating a conductive pattern is provided which is formed by, for example, subtractive method, wherein the conductive pattern includes a metal ground layer provided for an insulating substrate and having a thickness of 0.2 μm to 3.0 μm and a plated layer formed on the metal ground layer.

According to another aspect of the present invention in claim 52, there is a printed circuit board provided, wherein the conductive pattern includes a metal ground layer provided for an insulating substrate and having a thickness of 0.2 μm to 2.5 μm, a plated layer formed on the metal ground layer and having a thickness of 0.2 μm to 2.5 μm and a plated layer formed on the plated layer and having a thickness of 8.0 μm or greater.

BRIEF DESCRIPTION OF DRAWINGS

FIGS. 6(Q) and 6(R) are diagrams showing a process for manufacturing the printed circuit board according to the first embodiment of the present invention;

FIGS. 8(D), 8(E) and 8(F) are diagrams showing a process for manufacturing the multilayered printed circuit board according to the second embodiment;

FIGS. 9(G), 9(h) and 9(I) are diagrams showing a process for manufacturing the multilayered printed circuit board according to the second embodiment of the present invention;

FIGS. 10(J), 10(K) and 10(L) are diagrams showing a process for manufacturing the multilayered printed circuit board according to the second embodiment of the present invention;

FIGS. 11(M) and 11(N) are diagrams showing a process for manufacturing the multilayered printed circuit board according to the second embodiment of the present invention;

FIGS. 23(E), 23(F), 23(G) and 23(H) are diagrams showing a process for manufacturing the multilayered printed circuit board according to the fourth embodiment of the present invention;

FIGS. 26(Q), 26(R) and 26(S) are diagrams showing a process for manufacturing the multilayered printed circuit board according to the fourth embodiment of the present invention;

FIG. 30(A) is a sketch of an enlarged photograph of a through hole formed in an interlayer insulating resin layer when the through hole is viewed from a diagonally upper position, and FIG. 30(B) is a sketch when the through hole is viewed from a position directly above the through hole;

FIG. 31(A) is an enlarged view showing portion A shown in FIG. 26(R), and FIG. 31(B) is an enlarged view showing a portion B shown in FIG. 26(R);

FIG. 32(A) is a sketch of an enlarged photograph of the through hole (upper portion) formed in a solder resist in a state in which the through hole is viewed from a diagonally upper position, and FIG. 32(B) is a sketch of a state when the through hole is viewed from a position directly above the through hole;

FIG. 33(A) is a sketch of an enlarged photograph of the through hole (lower portion) formed in the solder resist in a state in which the through hole is viewed from a position directly above the through hole, FIG. 33(B) is a sketch of a state when the side wall of the through hole is viewed from a side position, and FIG. 33(C) is a sketch of a state when the through hole is viewed from a diagonally upper position;

FIGS. 35(A), 35(B), 35(C) and 35(D) are diagrams showing a process for manufacturing a substrate having a through hole formed therein according to a first modification of a fifth embodiment;

FIGS. 36(A), 36(B), 36(C) and 36(D) are diagrams showing a process for manufacturing a substrate having a through hole formed therein according to a second modification of the fifth embodiment;

FIGS. 37(A), 37(B), 37(C) and 37(D) are diagrams showing a process for manufacturing a substrate having a through hole formed therein according to a third modification of the fifth embodiment;

FIGS. 42(U), 42(V) and 42(W) are diagrams showing a process for manufacturing a multilayered printed circuit board according to the fourth modification of the fifth embodiment;

FIGS. 45(A), 45(B), 45(C), 45(D), 45(E) and 45(E') are diagrams showing a process for manufacturing a multilayered printed circuit board according to a sixth embodiment of the present invention;

FIGS. 49(U) and 49(V) are cross sectional views showing the multilayered printed circuit board according to the sixth embodiment of the present invention;

FIGS. 52(A) and 52(B) are partial and schematic cross sectional views showing the copper-plated laminated board for use to manufacture the printed circuit board according to the seventh embodiment;

FIGS. 53(A) and 53(B) are partial and schematic cross sectional views showing the copper-plated laminated board for use to manufacture the printed circuit board according to the seventh embodiment;

FIG. 56 is a graph showing a result of a comparison between the second embodiment and a comparative example;

FIG. 57 is a graph showing a result of a comparison between the third embodiment and a comparative example;

FIG. 58 is a graph showing a result of a comparison between the sixth embodiment and a comparative example;

FIG. 59 is a diagram showing a chemical formula; and

FIG. 60 is a diagram showing a chemical formula.

BEST MODE FOR CARRYING OUT THE INVENTION

Detailed Description

A method of manufacturing a multilayered printed circuit board according to a first embodiment of the present invention will now be described with reference to the drawings.

Figure 1:
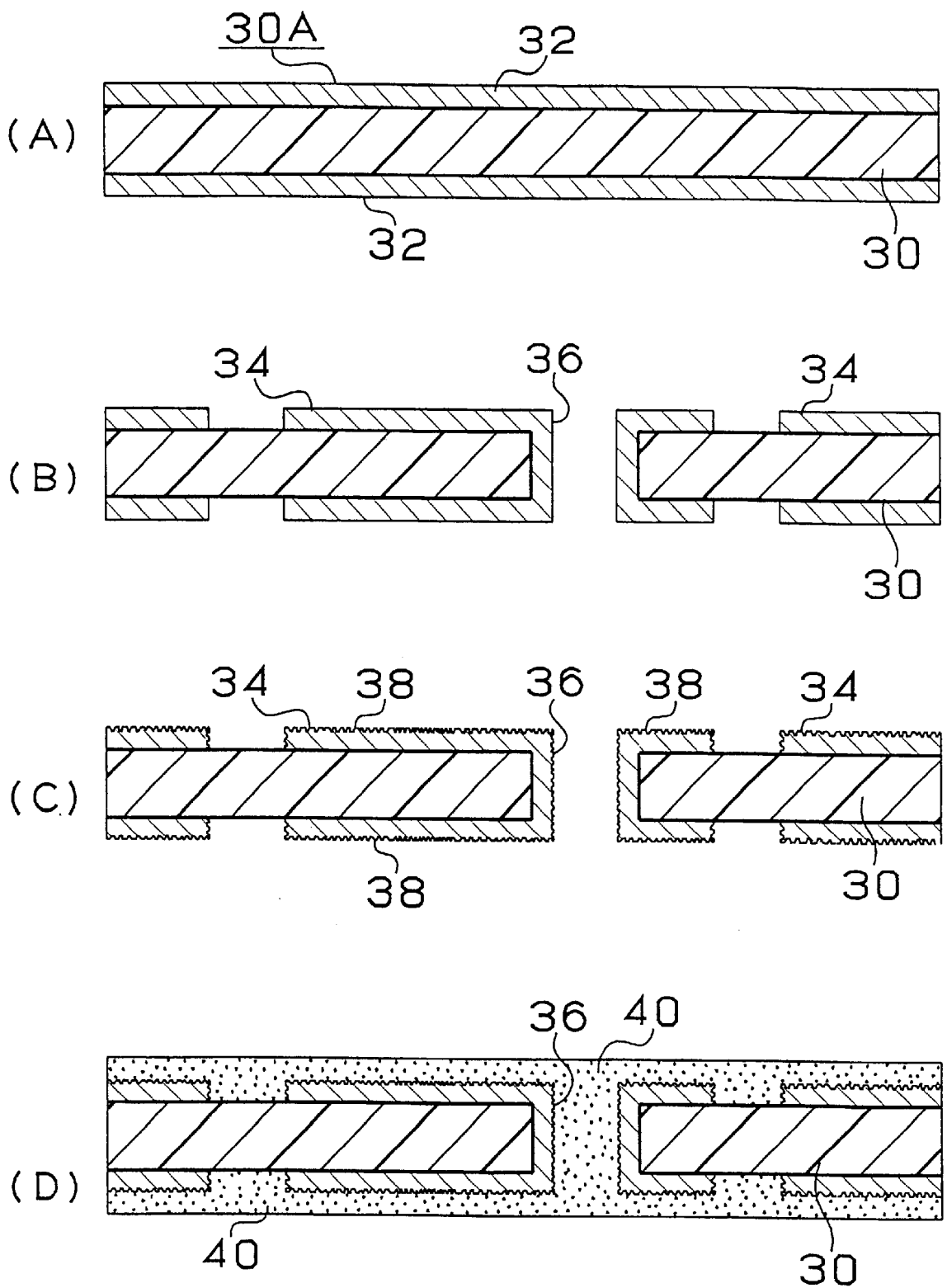
FIGS. 1(A), 1(B), 1(C) and 1(D) are diagrams showing a process for manufacturing a printed circuit board according to a first embodiment of the present invention.

(1) A copper-plated laminated board 30A is used as a start material (see FIG. 1(A)) incorporating a substrate 30 having a thickness of 1 mm and made of glass epoxy resin or BT (bis maleimide-triazine) resin and copper foil 32 having a thickness of 18 $\mu$m laminated on the two sides of the substrate 30. Initially, an opening is formed in the copper-plated laminated board 30A by drilling, followed by subjecting the same to an electroless plating process, and followed by etching the same in accordance with the pattern. Thus, an inner layer copper pattern 34 and a through hole 36 are provided for the two sides of the substrate 30 (see FIG. 1(B)).

(2) The substrate 30 having the inner-layer copper pattern 34 and the through hole 36 is cleaned with water, and then dried. Then, an oxidizing bath composed of NaOH (10 g/l), NaClO$_2$ (40 g/l) and Na$_3$PO$_4$ (6 g/l) and a reducing bath composed of NaOH (10 g/l) and NaBH$_4$ (6 g/l) are used to perform an oxidizing and reducing process so that a coarsened layer 38 is formed on the surface of each of the inner-layer copper pattern 34 and the through hole 36 (see FIG. 1(C)).

(3) The following raw-material compositions for preparing a resin filler are mixed and kneaded so that a resin filler is obtained.

Resin Composition (1)

100 parts by weight of Bis phenol F epoxy monomer (YL983U manufactured by Yuka Shell and having a molecular weight of 310), 170 parts by weight of SiO$_2$ spherical particle (CRS1101-CE and the size of the maximum particle is smaller than the thickness (15 $\mu$m) of an inner-layer copper pattern to be described later) each having a surface coated with a silane coupling agent and an average particle size of 1.6 $\mu$m and 1.5 parts by weight of a leveling agent (Pelenol S4 manufactured by Sunnopko) are mixed and stirred. Thus, the viscosity of the mixture is adjusted to be 45,000 cps to 49,000 cps at 23±1° C. Thus, the foregoing composition is obtained.

Hardener Composition (2)

6.5 parts by weight of imidazole hardener (2E4MZ-CN manufactured by Shikoku Kasei)

(4) The resin filler 40 obtained in the process (3) is applied to the two sides of the substrate 30 by using a roll coater within 24 hours after the adjustment. Thus, the resin filler 40 is enclosed between the conductive circuit (the inner-layer copper pattern) 34 and the conductive circuit 34 and in the through hole 36. Then, the resin filler 40 is dried at 70° C. for 20 minutes. Another side is similarly processed. Thus, the resin filler 40 is enclosed between the conductive circuits 34 or in the through hole 36, and then heated and dried at 70° C. for 20 minutes (see FIG. 1(D)).

Figure 2:
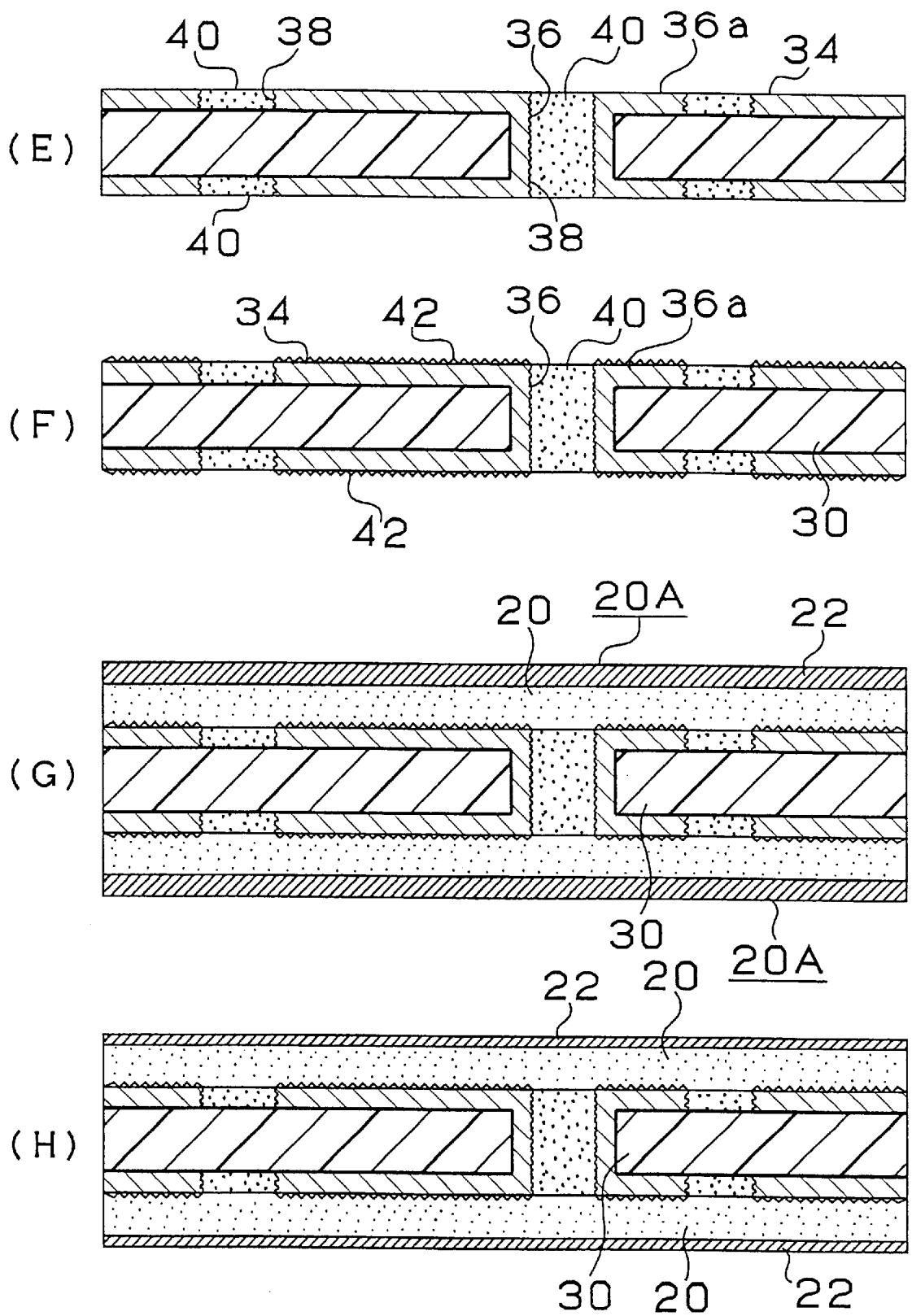
FIGS. 2(E), 2(F), 2(G) and 2(H) are diagrams showing a process for manufacturing the printed circuit board according to the first embodiment of the present invention.

(5) Either side of the substrate 30 subjected to the process (4) is belt-sander-polished by using #600 belt polishing paper (manufactured by Sankyo). Thus, polishing is performed such that the resin filler 40 is not left on the surface of the inner-layer copper pattern 34 and the surfaces of lands 36a of the through hole 36. Then, flaws caused from the belt-sander-polishing were removed by performing buff polishing. The foregoing sequential polishing process is performed for another surface (see FIG. 2(E)).

Then, heat treatment was performed at 100° C. for 1 hour, 120° C. for 3 hours, 150° C. for 1 hour and 180° C. for 7 hours. Thus, the resin filler 40 was hardened.

(6) The substrate 30 having the conductive circuit 34 was degreased by using alkali material, and soft etching was performed. Then, a process using a catalyst composed of palladium chloride and organic acid was performed so that a Pd catalyst was imparted. Then, the catalyst was activated, and then the substrate was immersed in electroless plating solution composed of $3.2 \times 10^{-2}$ mol/l copper sulfate, $3.9 \times 10^{-3}$ mol/l nickel sulfate, $5.4 \times 10^{-2}$ mol/l complexing agent, $3.3 \times 10^{-1}$ mol/l sodium hypophosphite, $5.0 \times 10^{-1}$ mol/l boric acid and a 0.1 g/l surface active agent (Surfil 465 manufactured by Nissin Chemical Industry) having PH=9. After a lapse of one minute from the immersion, the substrate was vertically and laterally vibrated one time at intervals of four seconds. Thus, a coating layer made of a needle alloy composed of Cu—Ni—P and a coarsened layer 42 were: formed on the surface of the conductive circuit 34 and the land 36a of the through hole 36 (see FIG. 2(F)).

Then, 0.1 mol/l tin borofluoride and 1.0 mol/l thiourea were used at a temperature of 35° C. and PH=1.2 so that Cu—Sn substitution reactions were performed. Thus, a Sn layer (not shown) having a thickness of 0.3 $\mu$m was formed on the surface of the coarsened layer.

(7) Then, copper foil having resin (MCF-6000E manufactured by Hitachi Kasei and including resin 20 having a thickness of 60 $\mu$m and copper foil 22 having a thickness of 12 $\mu$m) 20A is pressed against to the two sides of the substrate 30 having the thickness of 0.8 mm by operating a vacuum pressing machine (see FIG. 2(G)), the vacuum pressing operation being performed under conditions that the temperature is 175° C. for 90 minutes, the pressure is 30 Kg/cm2 and the degree of vacuum<50 torr).

(8) Then, the overall surface of the surface copper foil 22 is etched to make the thickness to be 3 μm by using etching solution (SE-07 manufactured by Mitsubishi Gas) (see FIG. 2(H)).

Figure 3:
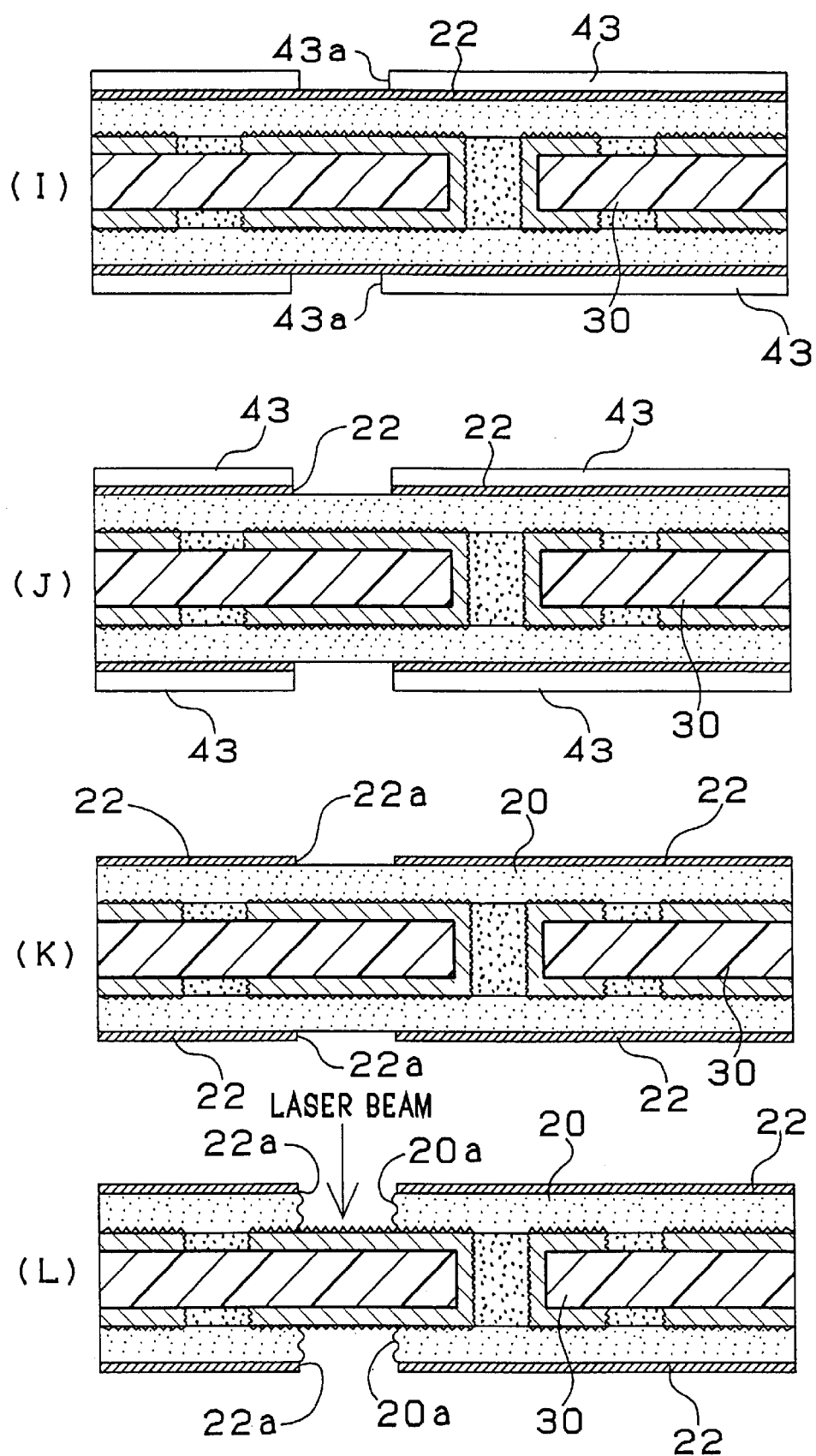
FIGS. 3(I), 3(J), 3(K) and 3(L) are diagrams showing a process for manufacturing the printed circuit board according to the first embodiment of the present invention.

(9) A dry-film resist (NIT-215 manufactured by NichigoMoton) is applied to the copper foil 22, and then a mask is placed. Then, exposure is performed with 100 mJ/cm2 and a development process is performed by using 0.8% sodium carbonate. Thus, an etching resist 43 having an opening 43a formed in a portion in which the via hole will be formed is provided (see FIG. 3(I)).

(10) The copper foil 22 in the opening 43a is removed by cupric chloride etching solution (see FIG. 3(J)), and then the etching resist 43 is separated by sodium hydroxide solution so that copper foil 22 serving as the conformal mask is completed (see FIG. 3(K)).

(11) A carbon-dioxide gas laser irradiating apparatus (605GTX manufactured by Mitsubishi Electric) is operated to irradiate each opening 22a of the copper foil with a two-shot and short-pulse laser beam so that a through hole 20a having a diameter of 60 μm is formed in the interlayer insulating resin layer (resin) 20 (see FIG. 3(L)). That is, the copper foil 22 having the thickness of 3 μm is used as the conformal mask to form the opening 22a by applying the laser beam. The irradiation with the carbon-dioxide gas laser may be performed for each opening 22a of the copper foil 22 or the overall portion of the printed circuit board is irradiated and scanned with the laser beam to remove the resin 20 in the lower portion of each opening 22a of the copper foil 22.

It is preferable that the diameter of the laser beam is 1.3 times or more the diameter of the opening. After the opening 20a has been formed, residues may be removed. For example, immersion in solution of, for example, chromic acid, permanganic acid or potassium or use of $O_2$ plasma, $CF_4$ plasma or plasma of mixture gas of $O_2$ and $CF_4$ enables the residues to be removed. When fluorine resin is employed to form the interlayer insulating resin layer, the plasma process is an optimum process.

Figure 4:
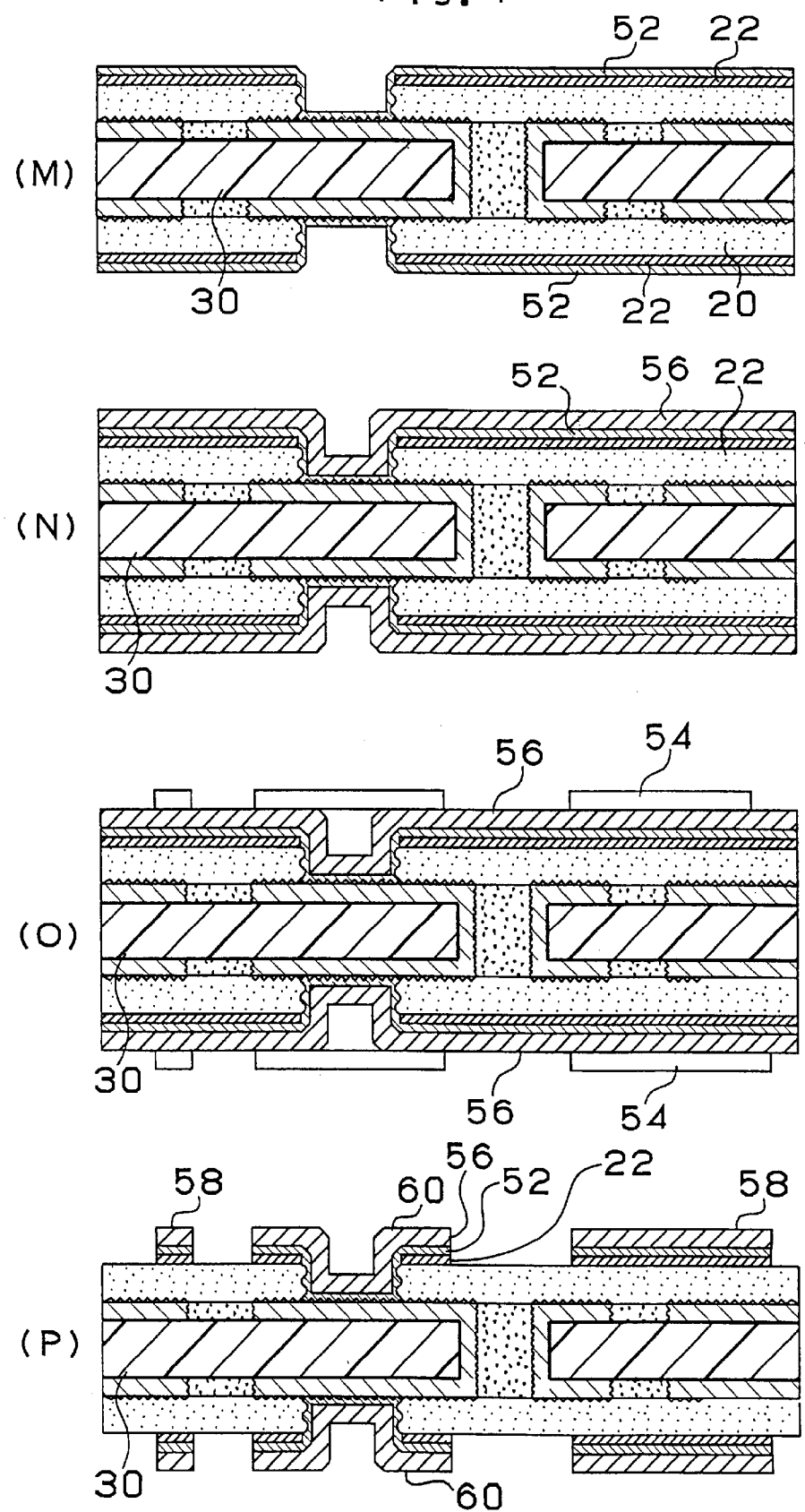
FIGS. 4(M), 4(N), 4(O) and 4(P) are diagrams showing a process for manufacturing the printed circuit board according to the first embodiment of the present invention.

(12) Usual electroless plating of the surface of the substrate 30 is performed so that an electroless copper plated film 52 was formed on the surface of the substrate 30 (see FIG. 4(M)). Then, copper sulfate plating is performed so that an electrolytic copper plated film 56 having a thickness of 10 μm is formed (see FIG. 4(N)).

(13) A dry film resist (NIT-215 manufactured by NichigoMorton) is applied to the copper foil 22, and then a mask (not shown) having a pattern formed at a predetermined position thereof is placed. Then, exposure is performed with 100 mJ/cm2. Then, a development process is performed by using 0.8% sodium carbonate so that an etching resist 54 for covering the portion in which the via hole will be formed and a portion in which a circuit will be formed and having a structure of Line/Space: 30/30 μm is formed (see FIG. 4(O)).

(14) Then, cupric chloride is used to perform pattern etching. Then, 2% NaOH s used to separate the etching resist 54 so that a via hole 60 and a conductive circuit 58 are formed (see FIG. 4(P)).

As an alternative to the foregoing procedure in the processes (12) to (14) that the resist 54 is formed after the electrolytic copper plating 56 has been formed, the electrolytic copper plating 56 may be formed after the resist 54 has been formed. A manufacturing process according to a first modification will now be described with reference to FIG. 5.

Figure 5:
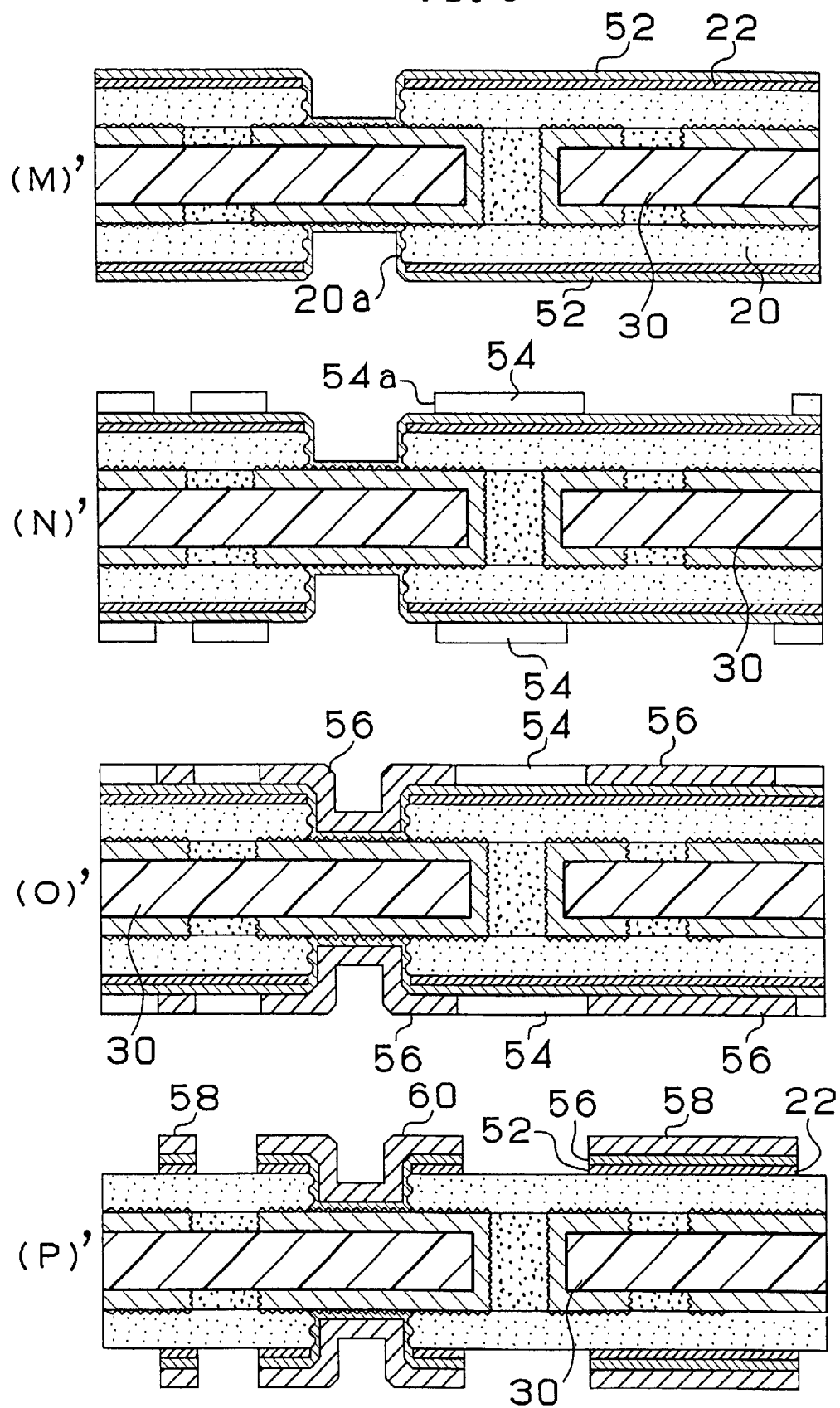
FIGS. 5(M'), 5(N'), 5(O') and 5(P') are diagrams showing a process for manufacturing the printed circuit board according to a first modification of the first embodiment of the present invention.
Figure 7:
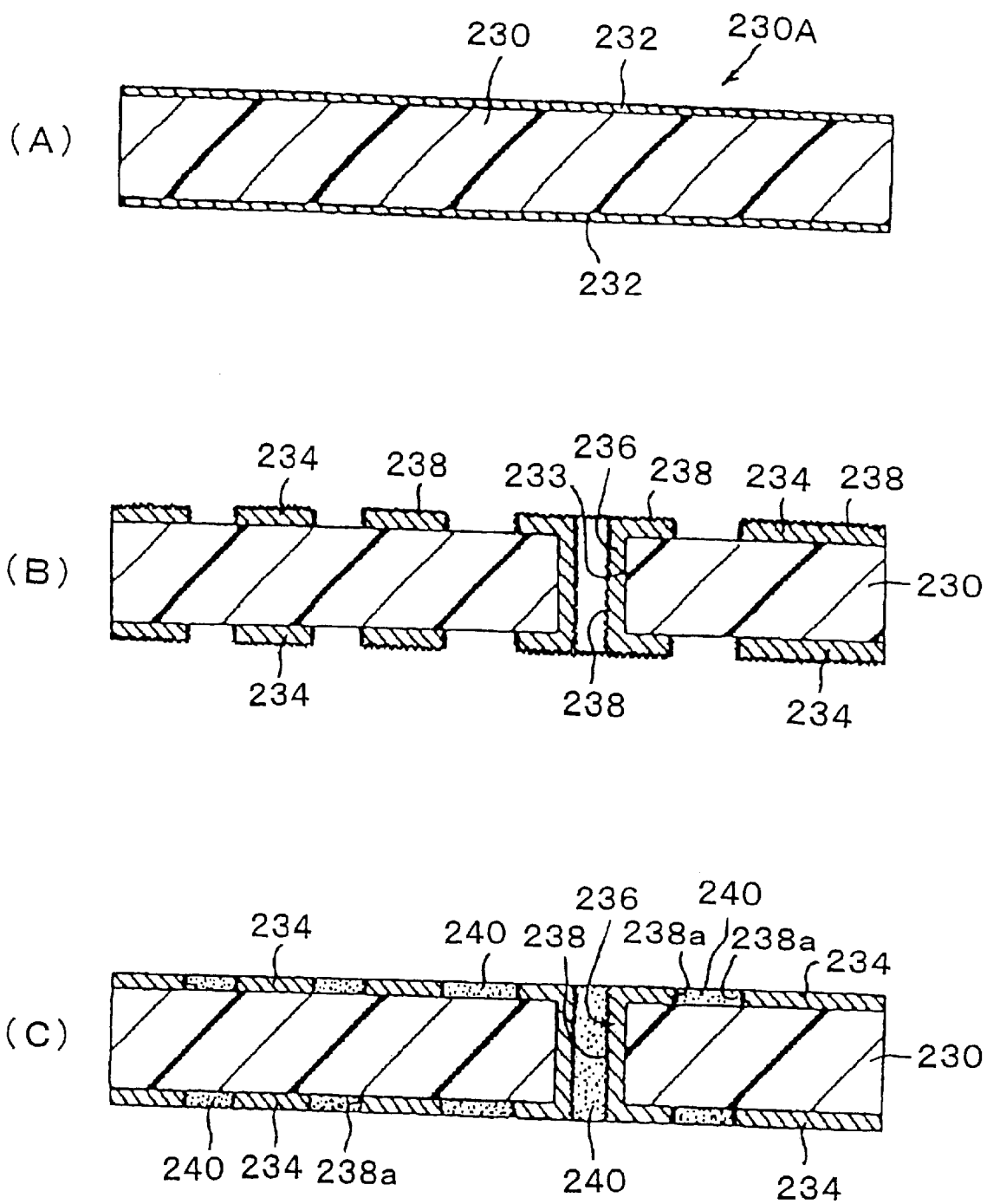
FIGS. 7(A), 7(B) and 7(C) are diagrams showing a process for manufacturing a multilayered printed circuit board according to a second embodiment of the present invention.

Initially, the substrate 30 having the resin 20 having the opening 20a and shown in FIG. 3(L) is immersed in the electroless copper plating bath having the following solution so that an electroless copper plated film 52 having a thickness of 0.5 μm is formed (see FIG. 5(M')).

| Electroless Plating Solution | |
|---|---|
| EDTA | 150 g/l |
| Copper Sulfate | 20 g/l |
| HCHO | 30 ml/l |
| NaOH | 40 g/l |
| a, a'-Bipyridyl | 80 mg/l |
| PEG | 0.1 g/l |
| Conditions of Electroless Plating | |
| 30 minutes when the temperature of the solution is 70° C. | |

A dry-film resist (NIT-215 manufactured by NichigoMoton) is applied to the copper foil 22, and then a mask (not shown) is placed. Then, exposure is performed with 100 mJ/cm$^2$ and a development process is performed by using 0.8% sodium carbonate. Thus, an etching resist 54 having an opening 54a formed in a portion in which the via hole will be formed and a portion in which the circuit will be formed is provided (see FIG. 5(N')).

Then, electrolytic copper plating is performed under the following conditions so that an electrolytic copper plating film 56 is formed which has a thickness of 20 μm (see FIG. 5(O')).

| Electrolytic Plating Solution | |
|---|---|
| Sulfuric Acid | 180 g/l |
| Copper Sulfate | 80 g/l |
| Additive (Capalacid GL manufactured by Attech Japan) | 1 ml/l |
| Conditions of Electrolytic Plating | |
| Density of Current | 1 A/dm$^2$ |
| Time | 30 minutes |
| Temperature | room temperature |

The plating resist 54 is removed by using 5% KOH, and then mixed solution of sulfuric acid and hydrogen peroxide is used to perform etching so that the electroless copper plated film 52 and the copper foil 22 under the plating resist 54 are dissolved and removed. Thus, a conductive circuit 58 composed of the copper foil 20, the electroless copper plated films 30 and 40 and the electrolytic copper plated film 44 and having a thickness of 18 μm and the via hole 60 are formed (see FIG. 5(P')).

(15) Finally, a process similar to the process (6) is performed so that a coarsened surface 62 made of Cu—Ni—P is formed on the surface of each of the conductive circuit 58 and the via hole 60. Then, the Sn substituting of the surface is performed (see FIG. 6(Q)).

(16) The foregoing processes (7) to (15) are repeated so that an upper conductive circuit 88 and a via hole 90 are formed. Thus, a multilayered printed circuit board is obtained (see FIG. 6(R)). Note the Sn substitution of the coarsened surface formed on the surfaces of the conductive circuit 88 and the via hole 90 is not performed.

In the first embodiment, the metal film (the copper foil) 22, the thickness of which has been reduced (3 mm) by etching and the thermal conductivity of which has been lowered is used as the conformal mask. Therefore, the opening 20a can be formed by a small-output laser. Specifically, the conventional manufacturing method is required to apply a short pulse laser beam three times to form one opening 20a in the resin 20 by the foregoing carbon-dioxide gas laser apparatus. On the other hand, the first embodiment is able to form the opening 20a by applying two short-pulse laser beams.

The first embodiment is able to form the opening 20a with the small-output laser or such that the number of operations for applying the pulse laser beams is reduced. Therefore, occurrence of undercut in the resin 20 for forming interlayer insulating resin layer can be prevented (see FIG. 3(L)). Therefore, the reliability of the connection of the via hole can be improved. It is preferable that the thickness of the metal film is reduced to 5 $\mu$m to 0.5 $\mu$m by etching. If the thickness of the metal film is larger than 5 $\mu$m, undercut occurs. If the thickness is not larger than 0.5 $\mu$m, the function of the conformal mask cannot be realized.

When the interlayer insulating resin layer forming resin having the metal film formed thereon is pressed against the substrate on which the conductive circuit will now be formed and then etching is performed, the thick metal film exists as a reinforcing member until the pressing operation is performed. Therefore, an excellent handling characteristic can be obtained.

In this embodiment, the interlayer insulating resin layer forming resin having the metal film formed thereon is pressed, and then etching is performed. Note that the interlayer insulating resin layer forming resin having a thin metal film having a thickness of 5 $\mu$m to 0.5 $\mu$m may be pressed.

In the first embodiment, the metal film which is used as the conformal mask is etched so as to be thinned. When the conductive circuit 58 and the via hole 60 are formed, the conformal mask 30 in an unnecessary portion is removed by etching. Since the conformal mask 30 has a small thickness, it can easily be reduced. Therefore, the foregoing etching operation does not result in excessive corrosion of the electrolytic copper plated film 56 for forming the conductive circuit 58 and the via hole 60. Therefore, a circuit having a fine pitch and a via hole having a precise diameter can be formed. The conventional manufacturing method has been able to form a circuit having a size of 75 $\mu$m. On the other hand, the first embodiment is able to improve the performance to 50 $\mu$m. The conventional technique has been able to form the conformal mask having a diameter of 50 $\mu$m. On the other hand, the first embodiment is able to form an opening having a diameter of 13 $\mu$m. Therefore, a via hole having a small diameter can be formed.

A method of manufacturing a multilayered printed circuit board according to a second modification of the first embodiment will now be described. The second modification employs similar process to that of the manufacturing method according to the first embodiment except for employed base member. Therefore, the description will be made with reference to FIGS. 1 to 6.

The foregoing processes (1) to (6) are performed so that a core substrate 30 structured as shown in FIG. 2(F) and having a thickness of 0.4 mm is formed. Then, copper foil with resin (ARCC R-0880 manufactured by Matsushita Electronics, the thickness of the resin 20 is 60 $\mu$m and the thickness of the copper foil is 12 $\mu$m) 20A is pressed against the two sides of the substrate 30 by operating a vacuum pressing machine (see FIG. 2(G)), the vacuum pressing operation being performed under conditions that the temperature is 130° C. for 30 minutes and 175° C. for 90 minutes, the pressure is 30 Kg/cm$^2$ and the degree of vacuum<50 torr.

Then, the overall surface of the surface copper foil 22 is etched to make the thickness to be 3 mm by using etching solution (SE-07 manufactured by Mitsubishi Gas) (see FIG. 2(H))

A dry-film resist (NIT-215 manufactured by NichigoMoton) is applied to the copper foil 22, and then a mask is placed. Then, exposure is performed with 100 mJ/cm$^2$ and a development process is performed by using 0.8% sodium carbonate. Thus, an etching resist 44 having an opening 44a formed in a portion in which the via hole will be formed is provided (see FIG. 3(I)).

The copper foil 22 in the opening 44a is removed by cupric chloride etching solution (see FIG. 3(J)), and then the etching resist 44 is separated by sodium hydroxide solution so that copper foil 22 serving as the conformal mask is completed (see FIG. 3(K)).

A carbon-dioxide gas laser irradiating apparatus (605GTX manufactured by Mitsubishi Electric) is operated to irradiate each opening 22a of the copper foil with a two-shot and short-pulse laser beam so that a through hole 20a having a diameter of 60 $\mu$m is formed in the interlayer insulating resin layer (resin) 20 (see FIG. 3(L)).

An electroless copper plated film 52 is formed on the surface of the substrate 30 by usual electroless plating (see FIG. 4(M)). Then, copper sulfate plating is performed so that an electrolytic copper plated film 56 having a thickness of 10 $\mu$m is formed (see FIG. 4(N)).

A dry film resist (NIT-215 manufactured by NichigoMorton) is applied to the copper foil 22, and then a mask (not shown) having a pattern formed at a predetermined position thereof is placed. Then, exposure is performed. Then, a development process is performed by using 0.8% sodium carbonate so that an etching resist 54 for covering the portion in which the via hole will be formed and a portion in which a circuit will be formed and having a structure of Line/Space: 50/50 $\mu$m is formed (see FIG. 4(O)).

Then, cupric chloride is used to perform pattern etching. Then, 2% NaOH is used to separate the etching resist 54 so that a via hole 60 and a conductive circuit 58 are formed (see FIG. 4(P)). Then, similar processes are repeated so that a printed circuit board having six layers formed on the two sides is manufactured (see FIG. 6(R)).

A method of manufacturing a multilayered printed circuit board according to a third modification of the first embodiment will now be described. The third modification employs similar processes to those of the manufacturing method according to the first embodiment except for the employed base member. Therefore, the description will be made with reference to FIGS. 1 to 6.

The foregoing processes (1) to (6) are performed so that a core substrate 30 shown in FIG. 2(F) and a thickness of 0.6 mm is formed. Then, copper foil with resin including glass cloth (CCL-HL830LS manufactured by Mitsubishi Gas, the thickness of the glass cloth/resin 20 is 60 $\mu$m and the thickness of the copper foil 22 is 12 $\mu$m) 20A is pressed to each of the two sides of the substrate 30 by a vacuum pressing machine (see FIG. 2(G)). The vacuum pressing operation is performed under conditions that the temperature is 150° C. for 30 minutes and the temperature is 175° C. for 90 minutes, the pressure is 30 Kg/cm$^2$ and the degree of vacuum<50 torr.

Then, the overall surface of the surface copper foil 22 is etched to make the thickness to be 3 mm by using etching solution (SE-07 manufactured by Mitsubishi Gas) (see FIG. 2(H)).

A dry-film resist (NIT-215 manufactured by NichigoMoton) is applied to the copper foil 22, and then a mask is placed. Then, exposure is performed with 100 mJ/cm$^2$ and a development process is performed by using 0.8% sodium carbonate. Thus, an etching resist 44 having an opening 44a formed in a portion in which the via hole will be formed is provided (see FIG. 3(I)).

The copper foil 22 in the opening 44a is removed by cupric chloride etching solution (see FIG. 3(J)), and then the etching resist 44 is separated by sodium hydroxide solution so that copper foil 22 serving as the conformal mask is completed (see FIG. 3(K)).

A carbon-dioxide gas: laser irradiating apparatus (605GTX manufactured by Mitsubishi Electric) is operated to irradiate each opening 22a of the copper foil with a two-shot and short-pulse laser beam so that a through hole 20a having a diameter of 60 μm is formed in the interlayer insulating resin layer (resin) 20 (see FIG. 3(L)).

An electroless copper plated film 52 is formed on the surface of the substrate 30 by usual electroless plating (see FIG. 4(M)). Then, copper sulfate plating is performed so that an electrolytic copper plated film 56 having a thickness of 10 μm is formed (see FIG. 4(N)).

A dry film resist (NIT-215 manufactured by NichigoMorton) is applied to the copper foil 22, and then a mask (not shown) having a pattern formed at a predetermined position thereof is placed. Then, exposure is performed. Then, a development process is performed by using 0.8% sodium carbonate so that an etching resist 54 for covering the portion in which the via hole will be formed and a portion in which a circuit will be formed and having a structure of Line/Space: 50/50 μm is formed (see FIG. 4(O))

Then, cupric chloride is used to perform pattern etching. Then, 2% NaOH is used to separate the etching resist 54 so that a via hole 60 and a conductive circuit 58 are formed (see FIG. 4(P)). Then, similar processes are repeated so that a printed circuit board having six layers formed on the two sides is manufactured (see FIG. 6(R)).

In the foregoing embodiment, the resin to which the copper foil has been allowed to adhere to is employed. Note that a metal film, such as copper foil, may afterwards be bonded to the resin. In the first and second modification, the resin to which the copper foil has been allowed to adhere to is employed. In the third modification, the resin including glass cloth to which the copper foil has been allowed to adhere to is employed. Resin to which any one of a variety of materials (for example, unwoven fabric) has been added may be employed.

As described above, according to the first embodiment, the opening for forming the via hole can be formed by using a small-output laser or by reducing the number of the irradiation operations of the pulse laser beams. Therefore, occurrence of undercut of the resin for forming the interlayer insulating resin layer can be prevented. Therefore, the reliability of the connection of the via hole can be improved.

Second Embodiment

A multilayered printed circuit board and a manufacturing method therefor according to a second embodiment of the present invention will now be described.

As the substrate for use in the second embodiment may be a resin substrate, such as a glass-cloth epoxy resin substrate, a glass-cloth bis maleimide-triazine resin, glass-cloth fluorine resin substrate; a copper-plated laminated board obtained by bonding copper foil to the foregoing resin substrate, a metal substrate or a ceramic substrate.

A conductive circuit is provided for the upper surface of the substrate. The conductive circuit can be formed by electroless plating or electrolytic plating. When the copper-plated laminated board is employed, the conductive circuit can be formed by an etching process.

Then, an insulating resin layer is formed. In the second embodiment, the insulating resin layer is irradiated with a laser beam so that an opening for forming the via hole is formed. Therefore, the foregoing insulating resin layer is made of a material with which the opening can be formed by applying the laser beam.

The foregoing material is thermosetting resin, thermoplastic resin or their composite resin.

For example, an adhesive agent for electroless plating may be employed, the basic material of which is thermosetting resin. The thermosetting resin is any one of epoxy resin, phenol resin and polyimide resin. The thermoplastic resin may be any one of polyether sulfone (PES), polysulfone (PSF), polyphenylene sulfone (PPS); polyphenylene sulfide (PPES), polyphenyl ether (PPE), polyetherimide (PI) and fluorine resin.

In the second embodiment, the coarsened surface of the metal layer or the insulating resin layer exposed over the metal foil is formed by the following method.

Specifically, particles which can be dissolved with acid or an oxidizing agent is previously contained in the insulating resin layer, followed by dissolving the particles with the acid or the oxidizing agent. Thus, the coarsened surface can be formed on the insulating resin layer. In the foregoing case, a metal layer must be formed after the coarsened surface has been formed.

The foregoing heat-resisting resin particles may be heat-resisting resin particles made of amino resin (melamine resin, urea resin or guanamine resin), epoxy resin (an optimum material is a resin obtained by hardening bisphenol type epoxy resin with an amine hardener) or bis maleimide-triazine resin.

The foregoing adhesive agent for electroless plating may contain hardened heat-resisting resin particles, inorganic particles or a fiber filler, if necessary.

The above heat resisting resin particles particularly hardened are desirably constructed by using ① heat resisting resin powder having an average particle diameter equal to or smaller than 10 μm, ② cohesive particles formed by aggregating heat resisting resin powder having an average particle diameter equal to or smaller than 2 μm, ③ a mixture of heat resisting powder resin powder having an average particle diameter from 2 to 10 μm and heat resisting resin powder having an average particle diameter equal to or smaller than 2 μm, ④ pseudo-particles in which at least one kind of heat resisting resin powder or inorganic powder having an average particle diameter equal to or smaller than 2 μm is attached to the surface of heat resisting resin powder having an average particle diameter from 2 to 10 μm, ⑤ a mixture of heat resisting powder resin powder having an average particle diameter from 0.1 to 0.8 μm and heat resisting resin powder having an average particle diameter greater than 0.8 μm and smaller than 2 μm, and ⑥ heat resisting powder resin powder having an average particle diameter from 0.1 to 1.0 μm. This is because these materials can form a more complicated anchor.

The coarsened surface of the insulating resin layer according to the second embodiment may be formed by using a metal foil having a coarsened layer, such as so-called RCC (RESIN COATED COPPER: copper foil with resin). In the foregoing case, the coarsened layer is formed on either side of the metal foil, and the insulating resin layer is formed on the coarsened layer. Thus, the metal foil is formed.

The coarsened layer on the metal surface can be formed by any one of a variety of coarsening processes. The coarsening process is exemplified by an etching process including a matting process, an oxidizing process, an oxidizing and reducing process, a blackening and reducing process, a sulfuric acid and hydrogen peroxide process and a process using cupric complex and organic acid or a plating process, such as a needle alloy plating using copper, nickel and phosphorus.

The thus-formed metal foil is laminated on a lower conductive circuit provided for the core substrate. At this time, the surface of the insulating resin layer and the lower conductive circuit is brought into contact with each other. Moreover, the core substrate and the metal foil are heated and compressed so as to be integrated with each other.

When the metal foil is removed by etching, the coarsened surface caused from the coarsened layer can be transferred to the surface of the exposed insulating resin layer.

As the etching solution which is employed in a case of the copper foil, sulfuric acid-hydrogen peroxide solution, ammonium persulfate solution or ferric chloride may be employed.

It is preferable that the coarsened surface which is formed on the surface of the insulating resin layer or the coarsened layer which is formed on the surface of the copper foil has a maximum roughness (Rj) of 0.01 $\mu$m to 5 $\mu$m. If the maximum roughness is smaller than 0.01 $\mu$m, the coarsened surface which is formed on the surface of the insulating resin layer or the coarsened surface which is transferred to the surface of the insulating resin layer can easily reflect the laser beam. As a result, the insulating resin layer cannot sufficiently be removed. If the maximum roughness is larger than 5 $\mu$m, the coarsened layer cannot easily be removed by etching.

In the second embodiment, the thus-formed coarsened surface is irradiated with a laser beam to remove the insulating resin layer. Thus, an opening for forming the via hole is formed. When the opening is plated, the via hole can be formed.

The foregoing laser beam may be a carbon dioxide gas laser beam, an ultraviolet laser beam or an eximer laser beam. In particular, the carbon dioxide gas laser beam is a preferred laser beam because it can be generated by a low-cost apparatus.

In the second embodiment, to improve the adhesiveness between the lower conductive circuit and the insulating resin layer and that between the lower conductive circuit and the via hole conductor, it is preferable that the coarsened surface is formed on the surface of the lower conductive circuit.

The foregoing coarsened surface can be formed by any one of a variety of coarsening processes. The coarsening process is exemplified by an etching process including an oxidizing process, an oxidizing and reducing process, a blackening and reducing process, a sulfuric acid and hydrogen peroxide process and a process using cupric complex and organic acid or a plating process, such as a needle alloy plating using copper, nickel and phosphorus.

The lower conductive circuit easily encounters leaving of the resin on the coarsened surface when the opening for forming the via hole is formed. The method according to the second embodiment is arranged to provide the coarsened surface for the surface of the insulating resin layer. Therefore, irradiation of the coarsened surface with the laser beam enables the insulating resin layer to be removed without leaving of the resin on the coarsened surface of the lower conductive circuit.

Then, a catalyst, such as Pd catalyst, for electroless plating is added to plate the inside portion of the opening for forming the via hole so that the via hole is formed. Moreover, the conductive circuit is provided for the surface of the insulating resin layer. The electroless plated film is formed to the inner wall of the opening and the overall surface of the insulating resin layer. Then, a plating resist is formed, and then electric plating is performed. The plating resist is removed so that the conductive circuit is formed by etching.

A method of manufacturing the multilayered printed circuit board according to the second embodiment will now be described with reference to FIGS. 7 to 11.

Raw Material Composition Substance for Adjusting and Manufacturing an Adhesive for Electroless Plating (1) A resin composition substance is obtained by stirring and mixing 35 weight parts of a resin liquid, 3.15 weight parts of a photosensitive monomer (manufactured by TO-A GOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration.

(2) A resin composition substance is obtained by mixing 12 weight parts of polyether sulfone (PES), 7.2 weight parts of epoxy resin particles (manufactured by SANYO KASEI, polymer pole) having an average particle diameter of 1.0 $\mu$m, and 3.09 weight parts of epoxy resin particles having an average particle diameter of 0.5 $\mu$m, and then adding 30 weight parts of NMP to the mixed material and stirring and mixing these materials by a beads mill.

(3) A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

(4) The raw material composition substances (1) to (3) are adjusted to manufacture the adhesive for electroless plating.

Preparation of Resin Filler (1) 100 parts by weight of Bis phenol F epoxy monomer (YL983U manufactured by Yuka Shell and having a molecular weight of 310), 170 parts by weight of $SiO_2$ spherical particle (CRS1101-CE and the size of the maximum particle is smaller than the thickness (15 $\mu$m) of an inner-layer copper pattern to be described later) each having a surface coated with a silane coupling agent and an average particle size of 1.6 $\mu$m and 1.5 parts by weight of a leveling agent (Pelenol S4 manufactured by Sunnopko) are kneaded by the three-rod roll. Thus, the viscosity of the mixture is adjusted to be 45,000 cps to 49,000 cps at 23±1° C. Thus, the foregoing composition is obtained.

(2) 6.5 parts by weight of imidazole hardener (2E4MZ-CN manufactured by Shikoku Kasei)

(3) The mixture (1) and (2) are mixed with each other so that the resin filler was adjusted.

Manufacturing of Printed Circuit Board (1) As shown in FIG. 7(A), the second embodiment is structured such that a copper-plated laminated board 230A incorporating a substrate 230 having a thickness of 1 mm and made of glass epoxy resin or bis maleimide-triazine (BT) resin. The two sides of the substrate 230 are laminated with copper foil 232 having a thickness of 18 µm. The substrate 230A was employed as the start material.

(2) Initially, a drill opening 233 as shown in FIG. 7(B) is formed in the copper-plated laminated board 230A, and then electroless plating and electrolytic plating are performed. Moreover, the copper foil 232 is etched into a predetermined pattern by a known method. Thus, an inner-layer copper pattern (a lower conductive circuit) 234 having a thickness of 25 µm and a through hole 236 were formed on the two sides of the substrate 230.

Then, a coarsened surface 238 was provided for each of the surface of the inner-layer copper pattern 234, the surface of the land of the through hole 236 and the inner wall. Thus, a circuit board 230 as shown in FIG. 7(B) was manufactured. The coarsened surface 238 was formed by cleaning the foregoing substrate with water, by drying the substrate, by spraying etching solution to the two sides of the substrate and by etching the surface of the inner-layer copper pattern 234, the surface of the land of the through hole 236 and the inner wall. The etching solution was a mixture of 10 parts by weight of imidazole copper (II) complex, 7 parts by weight of glycollic acid, 5 parts by weight of potassium chloride and 78 parts by weight of ion exchange water.

(3) Then, a resin layer 240 as shown in FIG. 7(C) was provided for a space between the inner-layer copper patterns 234 of the circuit board 230 and the inside portion of the through hole 236. The resin layer 240 was formed by coating the two sides of the circuit board 230 with a resin filler which has been prepared by using a roll coater and enclosed between the inner-layer copper patterns 234 and the inside portion of the through hole 236 and by performing heat treatment at 100° C. for 1 hour, 120° C. for 3 hours, 150° C. for 1 hour and 180° C. for 7 hours. Thus, the resin filler was hardened.

(4) Either side of the substrate obtained in the process (3) was belt-sander-polished by using #600 belt polishing paper (manufactured by Sankyo). Thus, leaving of the resin filler on the coarsened surface of the inner-layer copper pattern 234 and the surface of the land of the through hole 236 was prevented. Then, flaws caused from the belt-sander-polishing were removed by performing buff polishing. The foregoing sequential polishing process is performed for another surface so that a circuit board 230 shown in FIG. 7(C) was obtained.

The obtained circuit board 230 has the resin layer 240 formed between the inner-layer copper patterns 234. Moreover, the resin layer 240 is provided for the inside portion of the through hole 236. The coarsened surface 238 of the inner-layer copper pattern 234 and the coarsened surface 238 of the surface of the land of the through hole 236 have been removed. Both of the sides of the substrate have been flattened by the resin filler. The resin layer 240 is brought into hermetic contact with the coarsened surface 238a of the side surface of the inner-layer copper pattern 234 or the coarsened surface 238a of the side surface of the land portion of the through hole 236. The resin layer 240 is brought into hermetic contact with the coarsened surface 238 on the inner wall of the through hole 236.

(5) As shown in FIG. 8(D), the exposed inner-layer copper pattern 234 and the upper surface of the land of the through hole 236 are coarsened by the etching process (2). Thus, a coarsened surface 242 having a depth of 3 µm was formed.

The coarsened surface 242 was tin-substituted so that a Sn layer having a thickness of 0.3 µm was formed. The sub-stitutional plating was performed under conditions that 0.1 mol/L of tin borofluoride and 1.0 mol/L of thiourea were used at a temperature of 50° C. and pH was 1.2. Thus, the coarsened surface 242 was Cd—Sn-substituted (the Sn layer is omitted from illustration).

(6) The two sides of the obtained circuit board were coated with adhesive agent for electroless plating by using a roll coater. The substrate coated with the adhesive agent was allowed to stand in a horizontal state for 20 minutes, followed bump drying the substrate at 60° C. for 30 minutes. Thus, an adhesive layer 250 structured as shown in FIG. 8 (E) and having a thickness of 35 µm was formed.

(7) The two sides of the obtained circuit board were exposed to light by using an extra high tension mercury lamp with 500 mJ/cm$^2$, that is, heated at 150° C. for 5 hours.

(8) The obtained substrate was immersed in chromic acid for one minute so that epoxy resin particles existing on the surface of the adhesive layer 250 were dissolved and removed. As a result of the foregoing process, a coarsened surface 250a in the form as shown in FIG. 8(F) was formed on the surface of the adhesive layer 250. Then, the obtained substrate was immersed in neutral solution (manufactured by Syplay), followed by cleaning the same with water.

(9) Then, as shown in FIG. 9(G), an electroless copper plated film 251 having a thickness of 0.6 µm was formed on the overall surface of the substrate.

(10) An etching resist was provided for the obtained substrate, and etching was performed by using sulfuric acid-hydrogen peroxide solution. Thus, an opening 251a having a diameter of 50 µm was formed in a portion in which via hole can be formed, as shown in FIG. 9(H).

(11) The surface of the opening 251a is irradiated with a short pulse ($10^{-4}$ second) laser beam (ML605GTL manufactured by Mitsubishi Electric). Thus, as shown in FIG. 9(I), an opening 248 was formed in the adhesive layer 250.

Then, a palladium catalyst (manufactured by Atotech) was attached to the surface of the circuit board subjected to the coarsened process. Thus, a catalyst core was joined to each of the surface of the electroless plated film 251 and the coarsened surface of the opening 248 for forming the via hole.

(12) The obtained substrate was immersed in the electroless copper plating bath under the same conditions as those according to the first embodiment. Thus, an electroless copper plated film 252 as shown in FIG. 10(J) and having a thickness of 1.6 µm was formed on the overall area of the coarsened surface.

(13) Then, a commercial photosensitive dry film 254 was applied to the electroless copper plated film 252, as shown in FIG. 10(K). Then, a mask film 255 having a pattern 255A printed thereon was placed. The substrate was exposed to light with 100 mJ/cm$^2$, and then a development process was performed by using 0.8% sodium carbonate. Thus, a resist 254 having a thickness of 15 µm was formed, as shown in FIG. 10(L).

(14) The obtained substrate was electrolytic copper plated under the same conditions as those according to the first embodiment. Thus, an electrolytic copper plated film 256 having a thickness of 15 µm was formed.

(15) The plating resist 254 was removed by using 5% KOH, and then mixed solution of sulfuric acid and hydrogen peroxide was used to perform etching so that the electroless copper plated film 252 under the plating resist 254 was dissolved and removed. Thus, a conductive circuit 258 (including the via hole 260) formed as shown in FIG. 11(N), composed of the electroless copper plated film 252 and the electrolytic copper plated film 25 and having a thickness of 18 μm was obtained.

Then, the substrate was immersed in 80 g/L chromic acid at 70° C. for 3 minutes to etch the surface of the adhesive layer 250 for electroless plating between the conductive circuits 258 by a depth opening 1 μm so as to remove the palladium catalyst on the surface. Thus, a multilayered printed circuit board structured as shown in FIG. 11(N) was manufactured.

Figure 12:
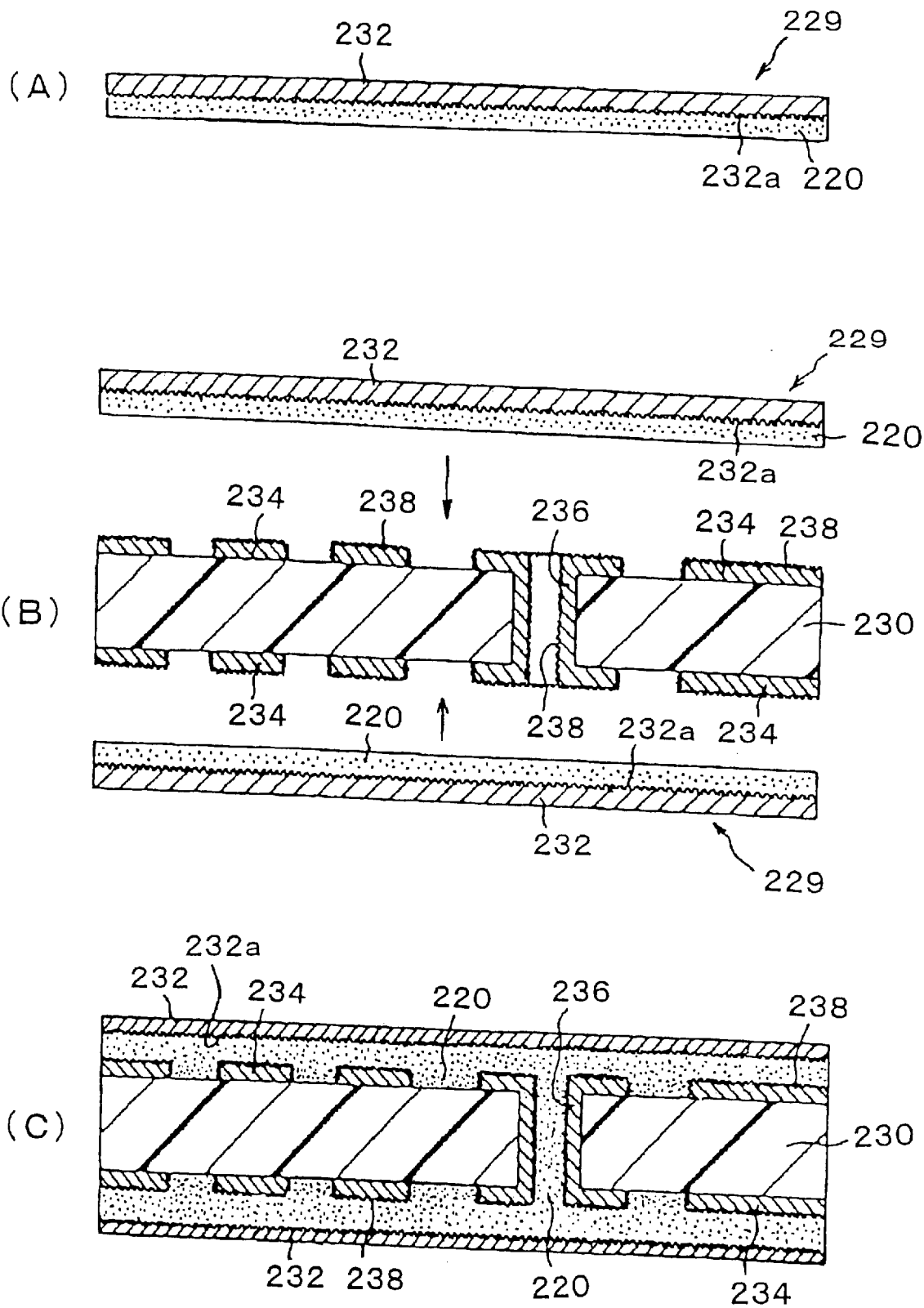
FIGS. 12(A), 12(B) and 12(C) are diagrams showing a process for manufacturing a multilayered printed circuit board according to a first modification of the second embodiment of the present invention.
Figure 13:
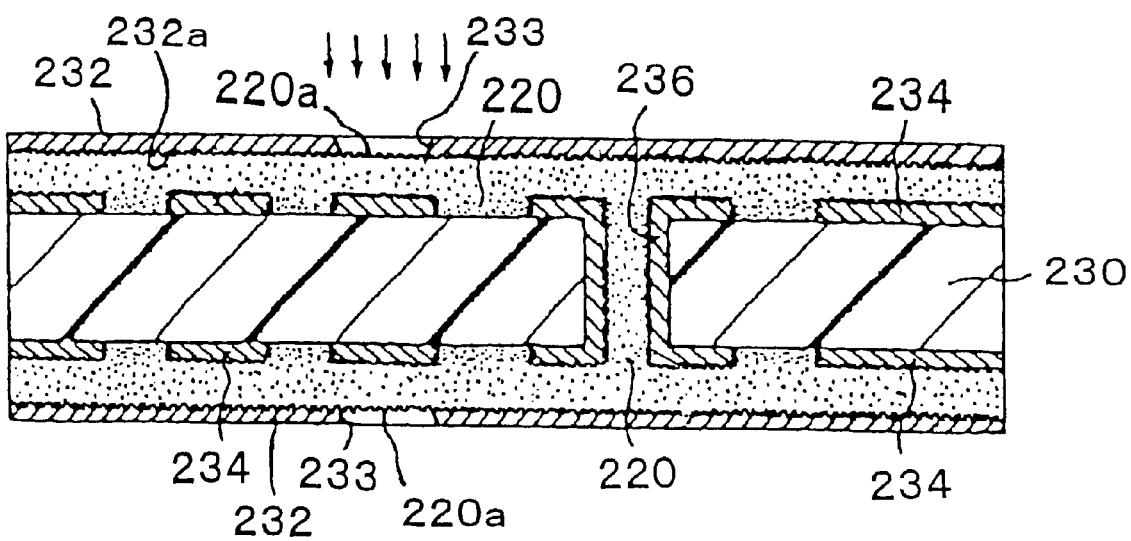
FIG. 13 is a diagram showing a process for manufacturing the multilayered printed circuit board according to the first modification of the second embodiment of the present invention.

A first modification of the second embodiment will now be described with reference to FIGS. 12 and 13.

The processes (1) and (2) of the first embodiment were prevented so that a core substrate 230 having the lower conductive circuit shown in FIG. 7(B) and the surface which has been coarsened was manufactured. On the other hand, copper foil 229 having resin structured as shown in FIG. 12(A) was manufactured.

The copper foil 229 having resin was processed such that either side of the copper foil 232 having a thickness of 12 μm was etched similarly to the process (2) of the second embodiment so as to be coarsened. Thus, a coarsened layer 232a having a depth of 3 μm was formed. The coarsened surface was coated with epoxy resin 220, and then heated at 60° C. for 3 hours. Thus, a B stage was obtained.

Figure 22:
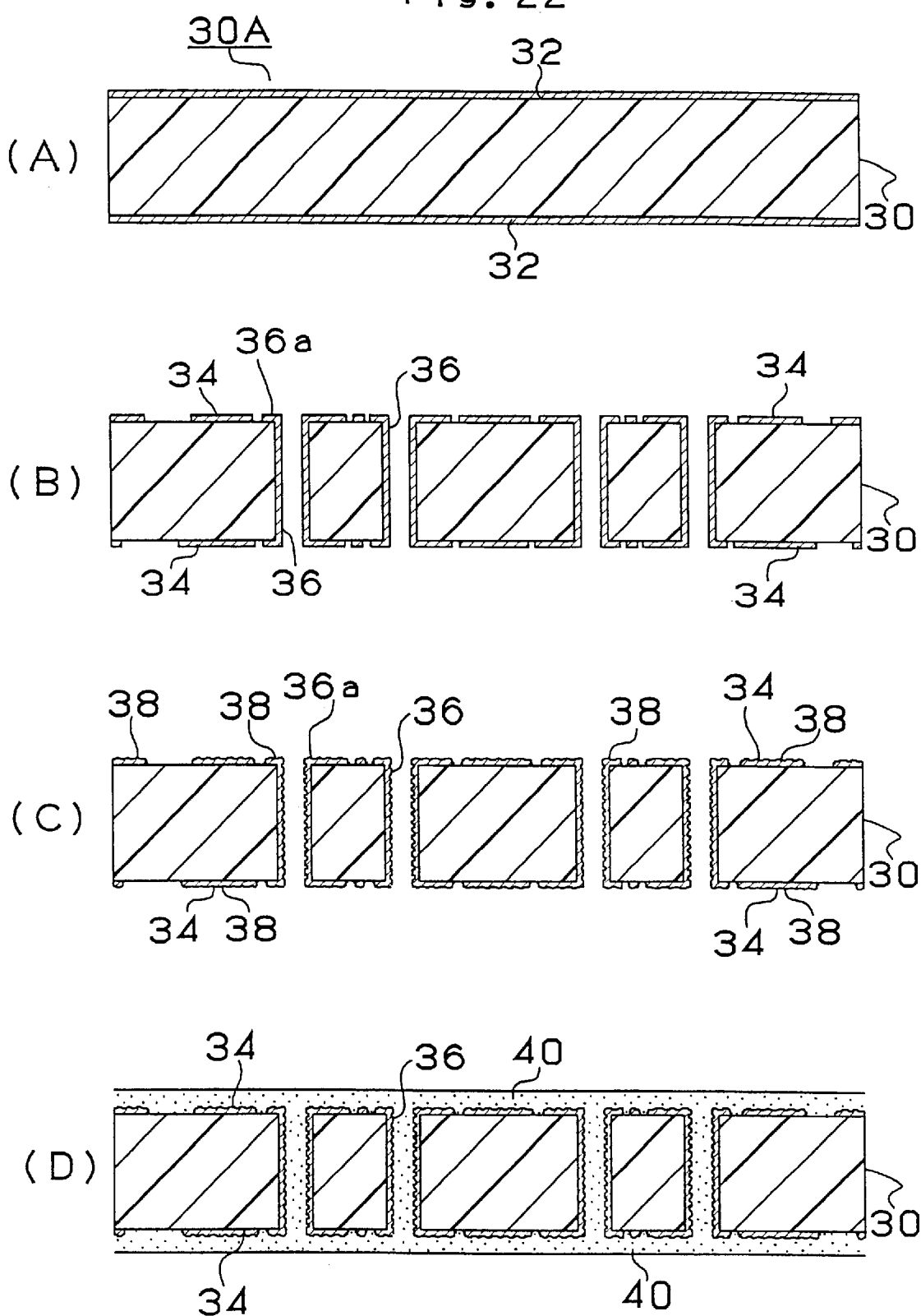
FIGS. 22(A), 22(B): 22(C) and 22(D) are diagrams showing a process for manufacturing a multilayered printed circuit board according to a fourth embodiment of the present invention.
Figure 24:
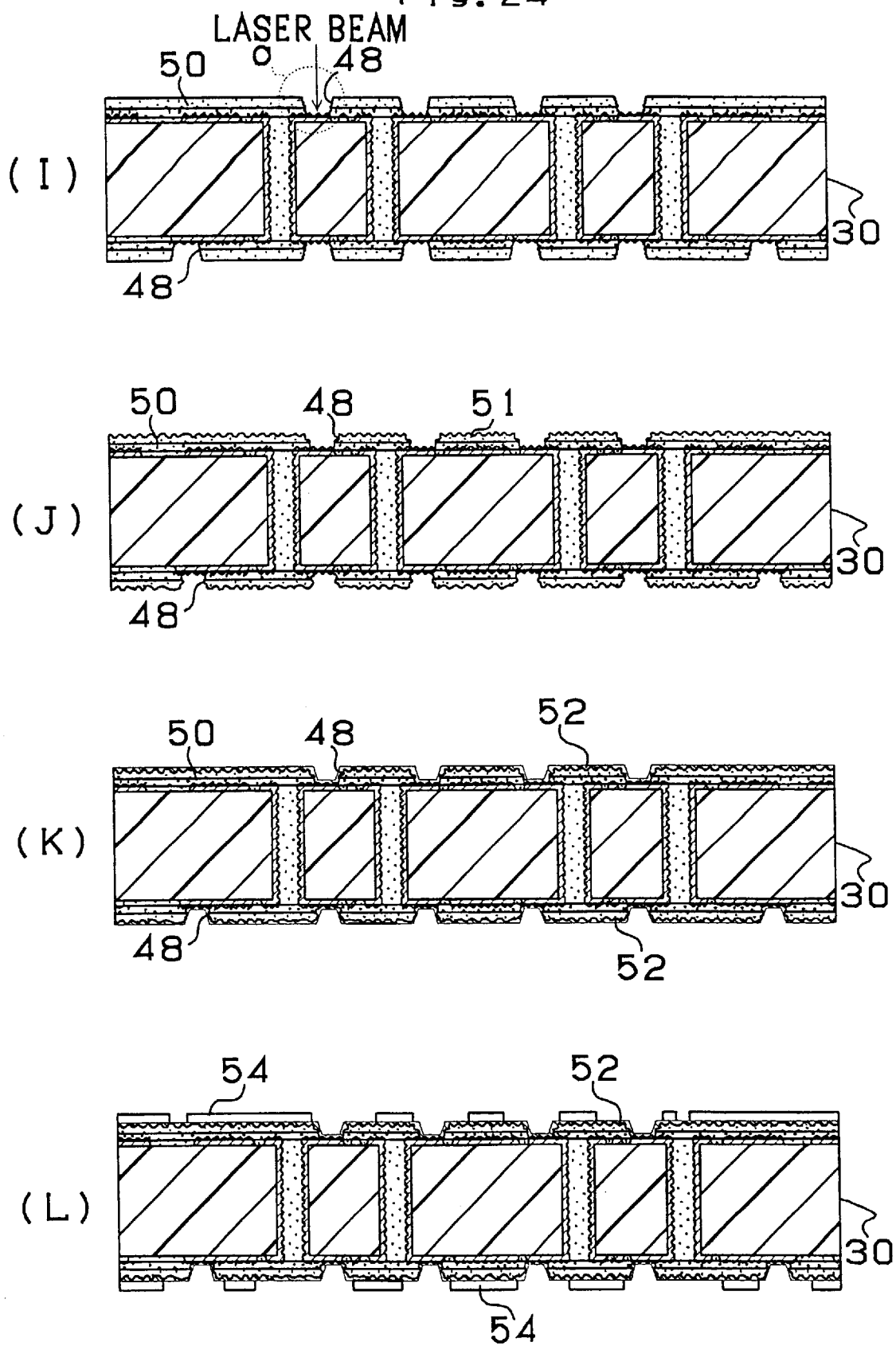
FIGS. 24(I), 24(J), 24(K) and 24(L) are diagrams showing a process for manufacturing the multilayered printed circuit board according to the fourth embodiment of the present invention.
Figure 25:
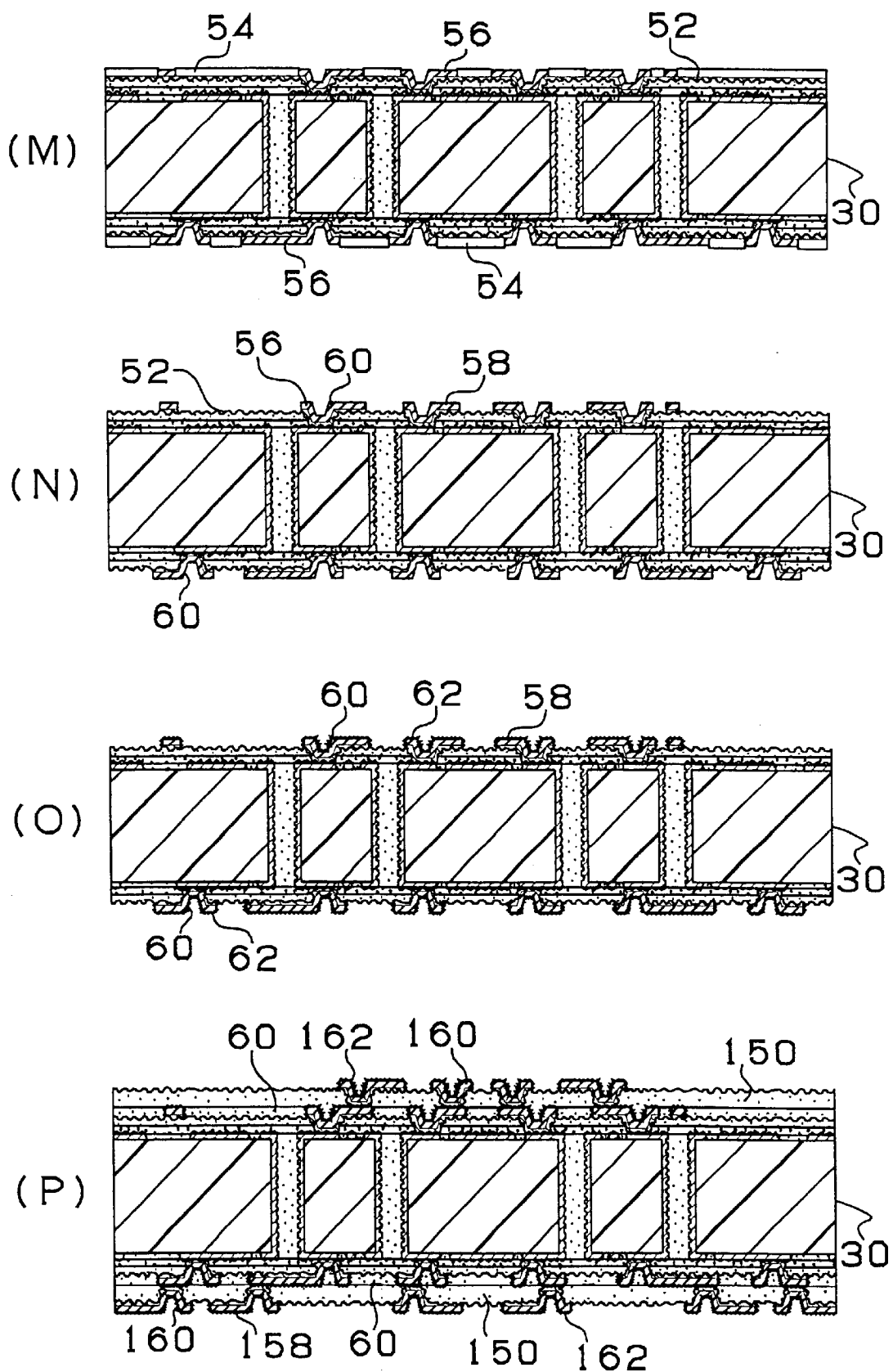
FIGS. 25(M), 25(N), 25(O) and 25(P) are diagrams showing a process for manufacturing the multilayered printed circuit board according to the fourth embodiment of the present invention.

As shown in FIG. 12(B), two copper foil 229 with resin were placed on the two sides of the core substrate 230, followed by applying pressure of 10 kg/cm$^2$ at 150° C. so as to be integrated with each other. Thus, a substrate structured as shown in FIG. 22(C) was obtained. At this time, the epoxy-resin adhesive layer 220 of the copper foil having the resin as shown in FIG. 12(A) was made contact with the lower conductive circuit 234 of the core substrate 230.

Then, the substrate 230 was processed similarly to the process (10) of the second embodiment so that a dry film was bonded to the surface of the copper foil 232. Then, exposure and development processes were performed by using an ultraviolet ray so that an etching resist was provided. Then, solution composed of sulfuric acid and hydrogen peroxide was used to perform etching so as to remove the copper foil 232 in which the via hole would be formed. Thus, an opening 233 as shown in FIG. 13 was formed. Thus, a coarsened surface 220a obtained by transferring the shape of the coarsened layer 232a of the copper foil 232 was exposed over the surface of the adhesive layer 220.

The coarsened surface was irradiated with the carbon-dioxide gas laser beam similar to the process (11) of the second embodiment so that an opening having a diameter of 50 μm and arranged to use to form the via hole was formed. Then, an electroless plated film and an electrolytic plated film were formed on the surface of the laminated substrate under conditions similar to those in the processes (13) to (15). Then the electroless plated film was dissolved and removed in accordance with the pattern. Thus, a multilayered printed circuit board composed of the electroless copper plated film and the electrolytic copper plated film was manufactured.

Comparative Example 1

A similar process to that according to the second embodiment was performed except for the coarsened surface which was not provided for the surface of the adhesive layer which was irradiated with the laser beam so that a multilayered printed circuit board was manufactured.

Comparative Example 2

The coarsened layer was not formed on the surface of the copper foil having resin.

Heating Test and Heat Cycle Test

The circuit boards obtained in the second embodiment, the modification of the second embodiment and comparative example 1 were subjected to heat cycle tests which were performed at −55° C. to 125° C. and in which the cycle was repeated 500 times. In the tests, change rates of the resistance of the via hole portion were measured. Whether or not the resin in the periphery of the opening was expanded was confirmed by using an optical microscope. Results were shown in table shown in FIG. 56.

The manufacturing method according to the second embodiment is able to prevent leaving of resin on the surface of the lower conductive circuit in the portion in which the via holes are connected to each other. Therefore, separation between the lower conductive circuit and the via hole conductor can be prevented even during the heat cycle. Thus, defective connection in the via hole portion can be prevented. Thus, a multilayered printed circuit board exhibiting reliably of connection can be obtained.

Third Embodiment

A multilayered printed circuit board and a manufacturing method therefor according to a third embodiment of the present invention will now be described. The method of manufacturing the multilayered printed circuit board according to the third embodiment has the steps of (1) forming a conductive circuit; (2) forming an interlayer insulating resin layer on the conductive circuit; (3) applying a laser beam to form an opening for forming a via hole in the interlayer insulating resin layer; and (4) forming another conductive circuit having a via hole on the interlayer insulating resin layer, wherein a solution containing cupric complex and organic acid is used to coarsen the surface of the conductive circuit before the process (2).

The multilayered printed circuit board obtained by the foregoing manufacturing method incorporates the conductive circuit, the surface of which is coarsened by the etching solution containing the cupric complex and the organic acid. Moreover, the interlayer insulating resin layer is formed on the conductive circuit. In addition, the opening frequency forming the via hole is formed in the interlayer insulating resin layer. Moreover, a stripe pits and projections are formed on the inner wall of the opening.

Figure 14:
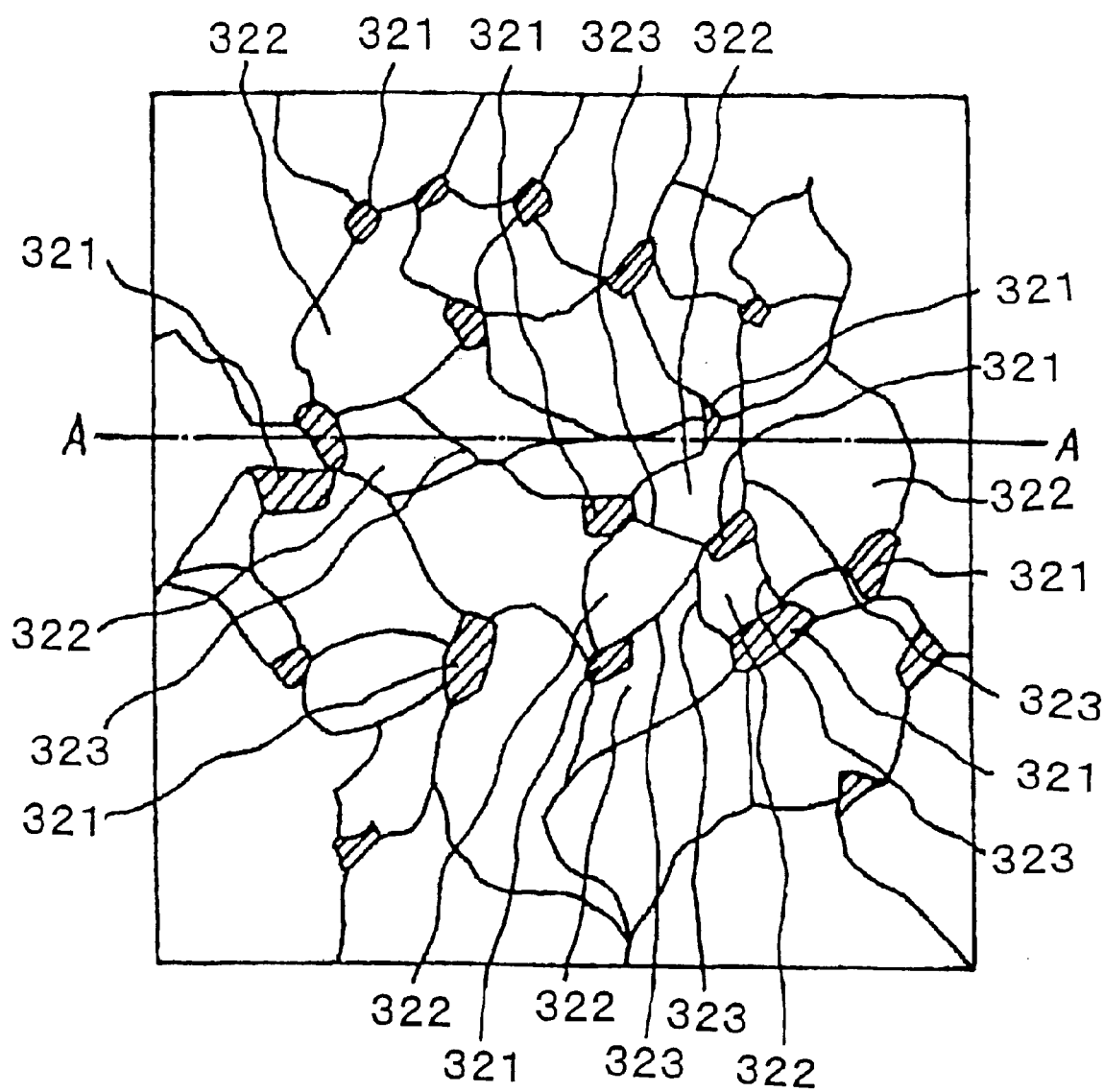
FIG. 14 is a plan view showing an example of a coarsened surface formed on a substrate according to a third embodiment of the present invention by a coarsening method according to the present invention.
Figure 15:
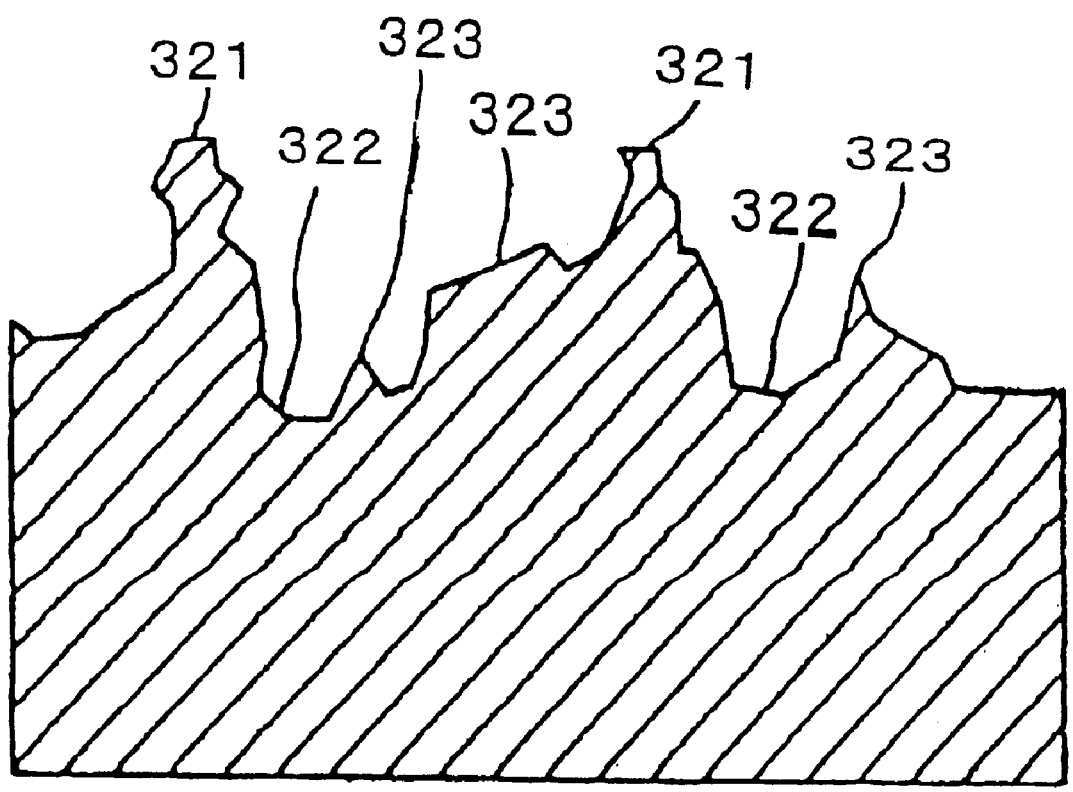
FIG. 15 is a vertical cross sectional view taken along line A—A and showing the surface of the (D) shown in FIG. 14.
Figure 16:
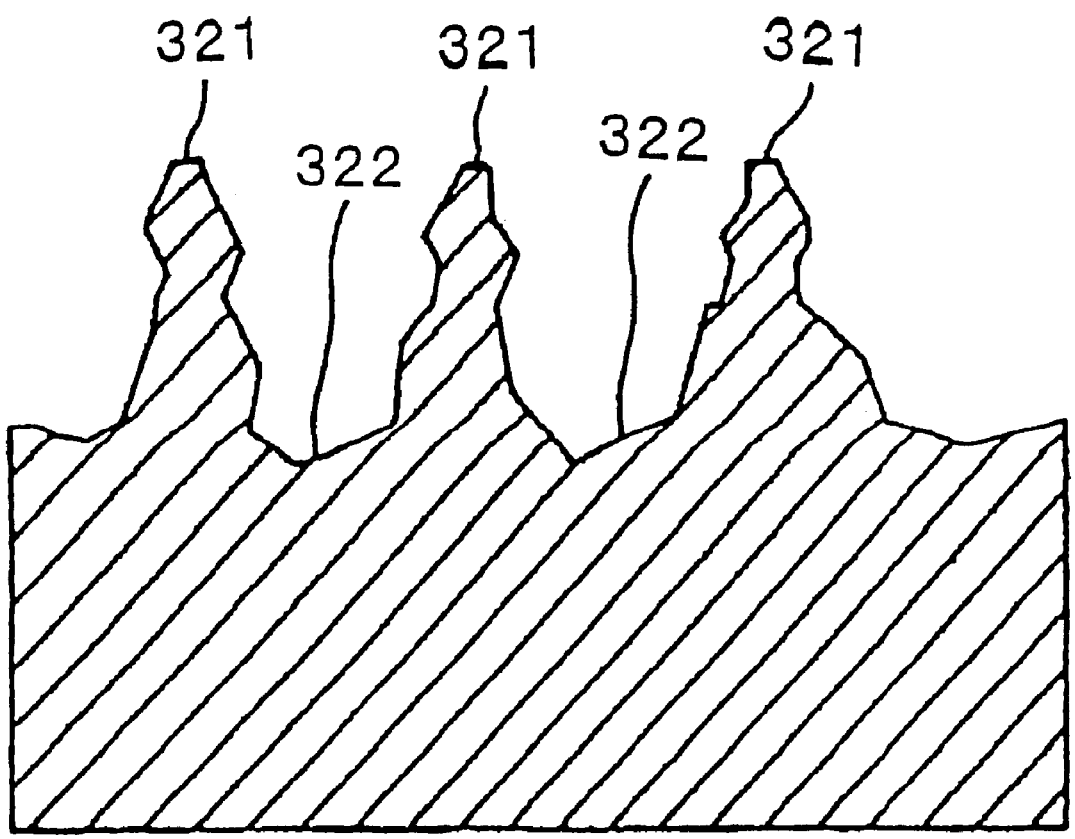
FIG. 16 is a vertical cross sectional view showing another portion of the surface of the (D) shown in FIG. 14.

According to the third embodiment, the surface of the conductive circuit is coarsened by using the etching solution containing the cupric complex and the organic acid. Thus, a complicated coarsened surface as shown in FIGS. 14 to 16 is formed on the surface of the conductive circuit. The coarsened surface exhibits excellent adhesiveness with the interlayer insulating resin layer which is formed on the coarsened surface. In addition, the coarsened surface is arranged to be irradiated with a laser beam. Even after the laser beam is applied, the shape of the coarsened surface is not changed, that is, the coarsened surface is not flattened. Therefore, after the interlayer insulating resin layer has been formed on the conductive circuit, the laser beam is applied so that the opening for forming the via hole can be formed without flattening of the conductive circuit.

The coarsened surface formed by using the etching solution containing the cupric complex and the organic acid is free from a large quantity of residual resin if the opening is formed by the laser beam. Therefore, expansion of the resin left owing to the heating process which breaks the connection with the via hole can be prevented.

Since the laser beam can easily be reflected, the incident light and reflected light of the laser beam can be allowed to interfere with each other. Thus, an advantage can be obtained in that the stripe pits and projections can easily be formed on the inner wall of the opening for forming the via hole.

When the stripe pits and projections are formed on the inner wall of the opening, all of the surface with the metal which constitutes the via hole are made contact have the anchoring effect. Therefore, the reliability of the connection of the via holes can be improved.

Therefore, the multilayered printed circuit board according to the third embodiment exhibits excellent adhesiveness between the conductive circuit including the via hole portion and the interlayer insulating resin layer. Moreover, also excellent adhesiveness can be realized between the conductive circuit and the via hole (the conductive circuit) formed on the conductive circuit.

FIG. 14 is a plan view schematically showing a coarsened surface of the conductive circuit formed by the coarsening process according to the third embodiment. FIG. 15 is a vertical cross sectional view taken along line A—A shown in FIG. 14. FIG. 16 is a vertical cross sectional view showing another portion. In the drawings, reference numeral 321 represents an opening (hereinafter called an "anchor portion") in which a surface portion which has not been etched is left. Reference numeral 322 represents a recess portion. Reference numeral 323 represents a ridge formed between the recess portions 322.

When the coarsening method according to the third embodiment is employed, a coarsened surface having a shape, for example, as shown in FIGS. 14 to 16 is formed. That is, the anchor portion 321 includes a multiplicity of portions each having an upper portion, the width of which is larger than the width of the lower portion.

Figure 20:
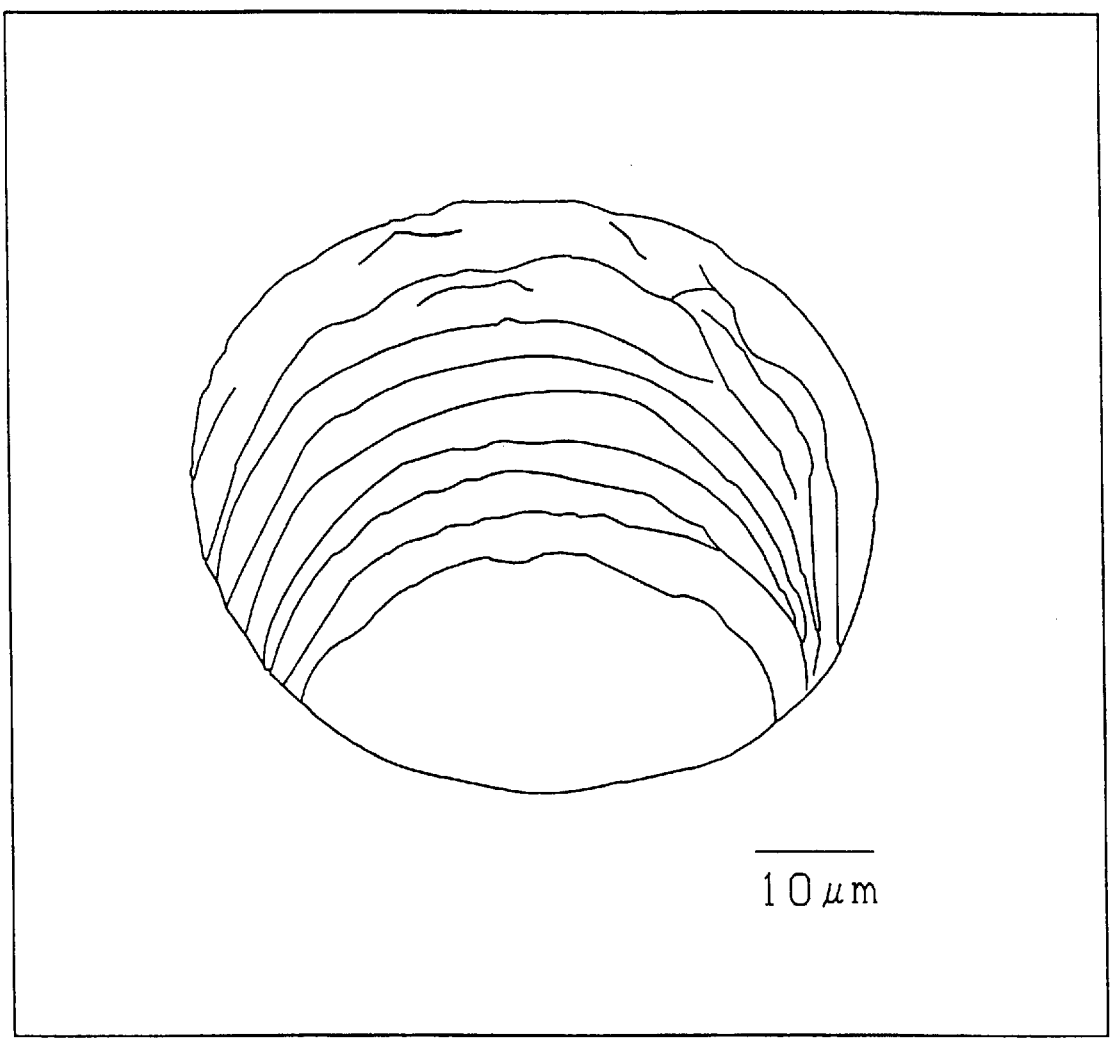
FIG. 20 is a perspective view showing an opening for forming a via hole which is formed in the printed circuit board according to the third embodiment of the present invention.

The inner wall of the opening for forming the via hole according to the third embodiment has the stripe pits and projections, as shown in FIG. 20.

It is preferable that the depth of the pits and projections in the direction of the surface of the wall is 0.1 $\mu$m to 5 $\mu$m and the intervals between pits and projections are 1 $\mu$m to 20 $\mu$m. If the dimensions do not satisfy the foregoing requirements, the adhesiveness with the metal which constitutes the via hole deteriorates.

Figure 21:
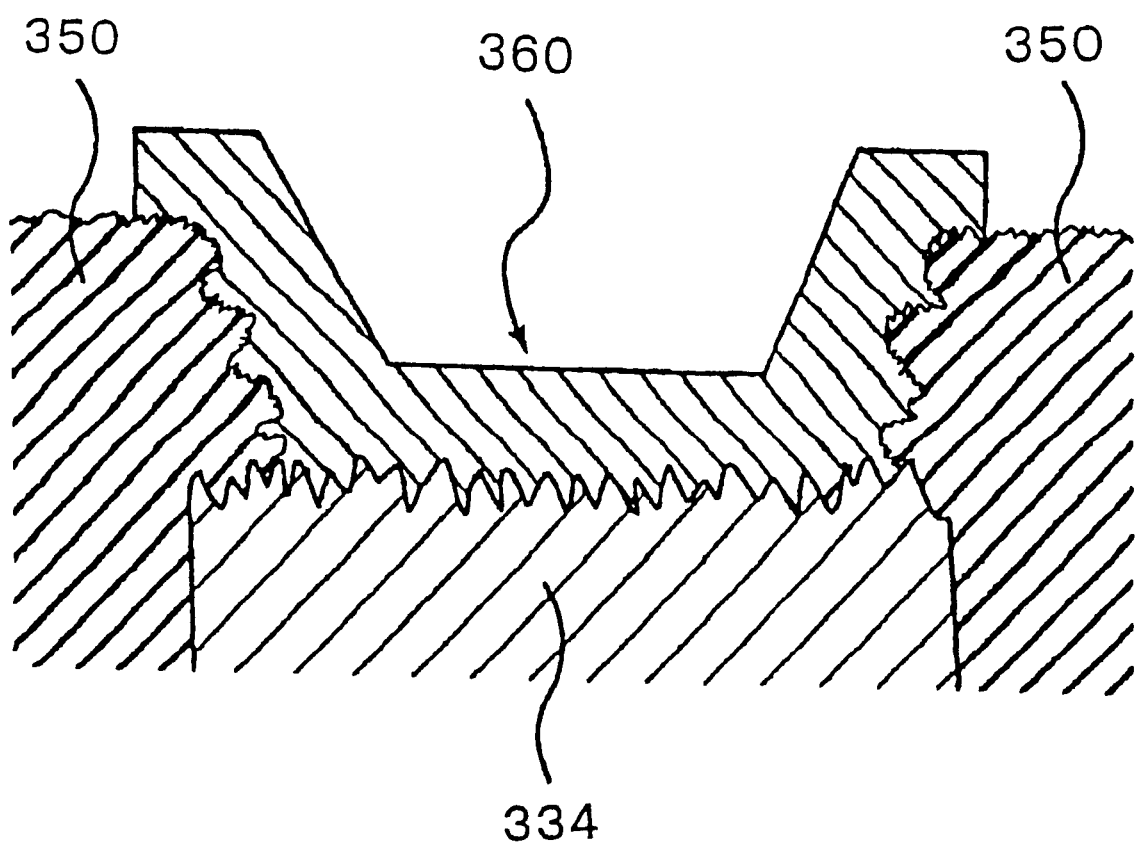
FIG. 21 is a cross sectional view showing the opening for forming the via hole which is formed in the printed circuit board according to the third embodiment of the present invention realized after a coarsening process has been performed.

As shown in FIG. 21, a coarsened surface having an average roughness Ra of about 0.05 $\mu$m to 5 $\mu$m is formed on the surfaces of the stripe pits and projections. The reason for this lies in that the anchor effect is improved and, therefore, the adhesiveness with the via hole can be improved.

When the via hole is formed on the conductive circuit having the coarsened surface, the anchor effect connection can be obtained from the anchor portion 321 of the coarsened surface. As a result, a via hole exhibiting excellent adhesiveness with the lower conductive circuit can be formed. When the via hole is formed by plating, plating can be allowed to sufficiently adhere to the coarsened surface. Therefore, the plated layer can reliably be formed on the recess portion 322 and the anchor portion 321. As a result, a via hole exhibiting excellent adhesiveness with the lower conductive circuit can be formed.

When the opening is formed by using the laser beam, the quantity of the residual resin can be reduced owing to the coarsened structure. Therefore, the reliability of the connection with the via hole can be improved.

A method of coarsening the surface of the conductive circuit by using the etching solution containing cupric complex and organic acid will now be described.

The cupric complex is not limited particularly. It is preferable that cupric complex of azole is employed. The cupric complex serves as an oxidizer for oxidizing metal copper or the like.

The azole may be diazole, triazole or tetra azole. Among the foregoing materials, it is preferable that any one of the following material is employed: imidazole, 2-methyl imidazole, 2-ethyl imidazole, 2-ethyl-4-methyl imidazole, 2-phenyl imidazole or 2-undecyl imidazole. It is preferable that the quantity of cupric complex of azole which must be added is 1 wt % to 15 wt %. The reason for this lies in that solubility and stability of the cupric complex can be improved.

The organic acid is as well as mixed with the cupric complex to dissolve copper oxide. When cupric complex of azole is employed, it is preferable that the organic acid is selected from a group consisting of formic acid, acetic acid, propionic acid, butyric acid, valerianic acid, capronic acid, acrylic acid, crotonic acid, oxalic acid, malonic acid, succinic acid, glutaric acid, maleic acid, benzonic acid, glycollic acid, lactic acid, malic acid and sulfamic acid. It is preferable that the content of the organic acid is 0.1 wt % to 30 wt %. The reason for this lies in that the solubility of the oxidizd copper must be maintained and stability of the solubility must be kept.

To assist the dissolution of copper and oxidation of azole, halogen ions, for example, fluorine ions chlorine ions or bromine ions, may be added to the etching solution. The halogen ions can be supplied as hydrochloric acid, sodium chloride resist and the like. It is preferable that the quantity of halogen ions which must be added is 0.01 wt % to 20 wt %. In this case, a coarsened surface exhibiting excellent adhesiveness with the interlayer insulating resin layer can be formed.

The foregoing etching solution can be prepared by dissolving cupric complex, the organic acid and, if necessary halogen ions in water. As a commercial etching solution, for example, "Mech Etch Bond" manufactured by Mech may be employed.

When the foregoing etching solution is used to coarsen the conductive circuit, the etching solution is sprayed to the surface of the conductive circuit (hereinafter called a "spraying method"). As an alternative to this, the conductive circuit is immersed in the etching solution under a bubbling condition (hereinafter called a "bubbling method") As a result of the foregoing process, oxygen coexists in the etching solution. Chemical reactions expressed by the following formulas (1) and (2) occur so that etching proceeds.

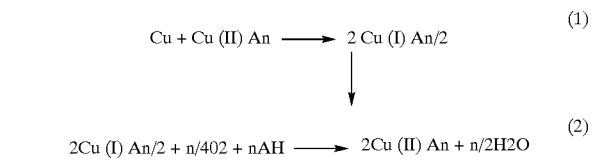

where A is a complexing agent (serving as a chelate agent) and n is the coordination number.

As expressed by the foregoing chemical formulas, the prepared cuprous complex is dissolved owing to the action of the acid and oxidized with oxygen so as to be cupric complex so as to again contribute to the oxidation of copper.

It is preferable that the etching using the foregoing etching solution is performed such that the depth of the etched portion is about 1 $\mu$m to 10 $\mu$m. If the etching is performed excessively, defective connection occurs between the formed coarsened surface and the via hole conductor.

The coarsening process of the surface of the conductive circuit is performed by the foregoing method, and then an interlayer insulating resin layer is formed on the conductive circuit.

It is preferable that the interlayer insulating resin layer which is formed in the third embodiment is composed of thermosetting resin, thermoplastic resin or their composite resin.

It is preferable that the foregoing thermosetting resin is selected from a group consisting of thermosetting or thermoplastic polyolefine resin, epoxy resin, polyimide resin, phenol resin and bis maleimide-triazine resin.

It is preferable that the thermoplastic resin may be any one of the following engineering plastic materials: polymethylpentenne (PMP), polystyrene (PS), polyethersulfone (PES), polyphenylene ether (PPF) and polyphenylene sulfide (PPS).

In the third embodiment, it is preferable that the interlayer insulating resin layer is made of the thermosetting or thermoplastic polyolefine resin.

The thermosetting or thermoplastic polyolefine resin maybe, for example, polyethylene, polypropylene, isobutylene, polybutadiene, polyisoprene or their copolymer.

As a commercial product of the polyolefine resin, it is exemplified by 1592 which is a trade name of Sumitomo 3M. Commercial thermoplastic polyolefine resin having a melting point of 200° C. is exemplified by TPX (melting point: 240° C.) which is a trade name of Mitsui Petrochemical and SPS (melting point: 270° C.) which is a trade name of Idemitus Petrochemical.

The interlayer insulating resin layer is formed by applying non-hardened solution or by thermally pressing film-shape resin and by laminating the layers.

Then, the interlayer insulating resin layer is irradiated with a laser beam so that an opening for forming the via hole is formed. As the laser beam for use in the foregoing operation, for example, a carbon-dioxide gas (CO2) laser beam, an ultraviolet laser beam -and eximer laser beam are exemplified. Among the foregoing laser beams, it is preferable that short-pulse carbon-dioxide gas laser beam is employed. The short-pulse carbon-dioxide gas laser beam is free from a large quantity of residual resin in the opening. Moreover, resin in the periphery of the opening is not considerably damaged.

It is preferable that the intervals of the carbon-dioxide gas laser beam pulses are $10^{-4}$ seconds to $10^{-8}$ seconds. It is preferable that time for which the laser beam is applied to form the opening is 10 μs to 500 μs.

It is preferable that the diameter of the beam is 1 mm to 20 mm and the laser beam is applied one to ten shots in a multi-mode (a so-called "top-hat mode"). The multi-mode is able to uniform energy density of the surface which is irradiated with the laser beam. Although a large aperture cannot be obtained, an opening for forming a via hole similar to a complete round and free from considerable residues of resin.

To make the shape of the laser spot to be a complete round, the laser beam is allowed to pass through an opening called a mask and formed into a complete round. It is preferable that the diameter of the opening is about 0.1 mm to about 2 mm.

When the opening is formed by the carbon-dioxide gas laser beam, it is preferable that a desmear process is performed.

The desmear process can be performed by using an oxidizer in the form of solution of chromic acid or permanganate. The process may be performed by using oxygen plasma or mixture plasma of CF4 and oxygen or by performing corona discharge. A low-pressure mercury lamp may be employed to apply ultraviolet rays to modify the surface.

Then, the electroless plating and electric plating to be described later are performed so that an upper conductive circuit having the via hole is formed on the conductive circuit.

An example of a method of manufacturing a multilayered printed circuit board according to the third embodiment will now be described.

(1) Initially, a circuit board having a lower conductive circuit formed on the surface of a resin substrate is manufactured. It is preferable that the resin substrate is a resin substrate containing resin fibers. The resin substrate is exemplified by a glass-cloth epoxy resin substrate, a glass-cloth polyimide substrate, a glass-cloth bis maleimide-triazine resin substrate and a glass-cloth fluororesin substrate.

As an alternative to this, a copper-plated laminated board obtained by bonding copper foil on each of the two sides of the resin substrate may be employed.

Usually, a through hole is formed in the resin substrate by drilling, and then the surface of the wall of the through hole and the surface of the copper foil are electroless-plated so that a through hole is formed. It is preferable that the electroless plating is copper plating. To form thick copper foil, electric plating may be performed. It is preferable that the electric plating is copper plating.

Then, a process may be employed in which the inner wall of the through hole and so forth are subjected to a coarsening process. Then, the through hole is filled with resin paste or the like, followed by forming a conductive layer for forming the surface by electroless plating or electric plating.

After the foregoing process has been completed, a photolithography method is employed to form an etching resist on a copper solid pattern formed on the overall surface of the substrate. Then, etching is performed so that the lower conductive circuit is formed.

(2) Then, the lower conductive circuit is subjected to a coarsening process. That is, etching solution containing cupric complex and organic acid is used to form a coarsened surface on the lower conductive circuit by the spraying method or the bubbling method.

(3) Then, the interlayer insulating resin layer made of the foregoing polyolefine resin and so forth is formed on each of the two sides of the circuit substrate having the lower conductive circuit manufactured in the process (2) by applying non-hardened solution or by thermally pressing film-shape resin and by laminating the layers. To establish the electric connection with the lower conductive circuit, an opening for forming the via hole is formed in the formed interlayer insulating resin layer by applying a laser beam.

(4) Then, the interlayer insulating resin layer is subjected to a plasma process or a process using acid or the like so that the surface of the interlayer insulating resin layer is coarsened.

When the plasma process has been performed, an intermediate layer may be formed which is composed of a metal material, such as Ni, Ti or Pd, which exhibits excellent adhesiveness with the interlayer insulating resin layer in order to maintain the adhesiveness between the conductive circuit, which is the upper layer, and the interlayer insulating resin layer. It is preferable that the intermediate layer made of metal is formed by physical vaporization method (PVD), such as sputtering. It is preferable that the thickness of the intermediate layer is about 0.1 μm to about 2.0 μm.

(5) The substrate subjected to the process (4) is electroless-plated.

As the electroless plating, copper plating is an optimum plating. It is preferable that the thickness of electroless plating is 0.1 μm to 5 μm. The reason why the foregoing thickness is employed is that the function as a conductive layer for electric plating which is performed later must be maintained and removal by etching must be permitted. The electroless plating is not always required. The electroless plating may be omitted.

(6) A plating resist is formed on the electroless plated film formed in the process (5). The plating resist is formed by laminating a photosensitive dry film and by performing exposure and development processes.

(7) Then, electric plating is performed by using the electroless plated film or the like as the lead so that the conductive circuit is thickened. It is preferable that the thickness of the electrically plated film is 5 μm to 30 μm.

At this time, the opening for forming the via hole may be charged to form a filled via structure.

(8) After the electrically plated film has been formed, the plating resist is separated. Then, the electroless plated film existing below the plating resist and the foregoing intermediate layer are removed by etching so that independent conductive circuits are realized. The foregoing electric plating may be copper plating.

The etching solution is exemplified by persulfate solution, such as sulfuric acid-hydrogen peroxide solution, ammonium persulfate, sodium persulfate or potassium persulfate; solution of ferric chloride or cupric chloride, hydrochloric acid; nitric acid; and hot dilute sulfuric acid. Etching solution containing the foregoing cupric complex and organic acid may be employed to form a coarsened surface simultaneously with etching between the conductive circuits.

(9) Then, similarly to the process (2), the etching solution containing the cupric complex and the organic acid is used to form the coarsened surface on the upper conductive circuit by the spraying method or the bubbling method.

(11) The processes (3) to (9) are repeated so that the upper conductive circuit is formed. Thus, for example, a multilayered printed circuit board formed into a 6-layered structure such that each side has three layers is obtained.

Referring to the drawings, a method of manufacturing the multilayered printed circuit board according to the third embodiment will now be described.

Figure 17:
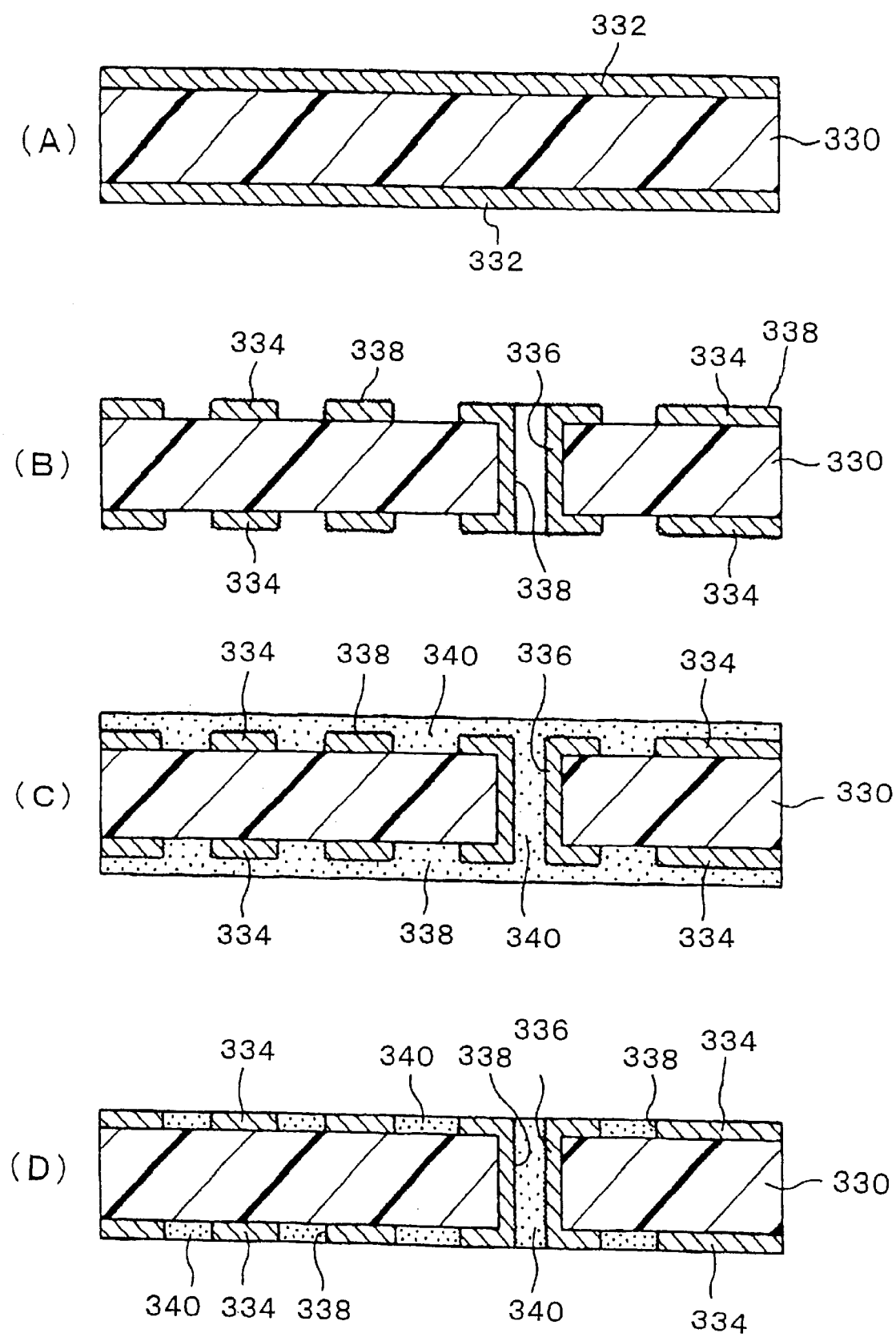
FIGS. 17(A), 17(B), 17(C) and 17(D) are vertical cross sectional views showing a portion of a process for manufacturing a multilayered printed circuit board according to a third embodiment of the present invention.

(1) A copper-plated laminated board is used as a start material (see FIG. 17(A)) incorporating a substrate 330 having a thickness of 1 mm and made of glass epoxy resin or BT (bis maleimide-triazine) resin and copper foil 332 having a thickness of 18 μm laminated on the two sides of the substrate 330. Initially, an opening is formed in the copper-plated laminated board by drilling, followed by forming a plating resist. Then, the substrate is subjected to an electroless copper plating process so that a through hole 336 is formed. Then, the copper foil is etched in accordance with the pattern by a usual method so that an inner-layer copper pattern (the lower conductive circuit) 334 was formed on each of the two sides of the substrate.

(2) The substrate having the lower conductive circuit 334 was cleaned with water, followed by drying the substrate. Then, etching solution was sprayed to the two sides of the substrate to etch the surface of the lower conductive circuit 334, the surface of the land of the through hole 336 and the inner wall. Thus, a coarsened surface 338 was formed on the overall surface of the lower conductive circuit 334 (see FIG. 17(B)). The etching solution was a mixture of 10 parts by weight of imidazole copper (II) complex, 7 parts by weight of glycollic acid, 5 parts by weight of potassium chloride and 78 parts by weight of ion exchange water.

(3) A resin filler 340 mainly composed of epoxy resin was applied to the two sides of the substrate by operating a printer so as to be enclosed between the lower conductive circuits 334 or in the through hole 336. Then, the substrate was heated and dried. That is, the foregoing process causes the resin filler 340 to been closed between the lower conductive circuits 334 or in the through hole 336 (see FIG. 17(C))

(4) Either side of the substrate subjected to the process (3) was belt-sander-polished by using belt sander paper (manufactured by Sankyo) in such a manner that leaving the resin filler 340 can be prevented on the surface of the lower conductive circuit 334 and the surface of the land of the through hole 336. Then, flaws caused from the belt-sander-polishing were removed by performing buff polishing. The foregoing sequential polishing process is performed for another surface. The enclosed resin filler 340 was heated and hardened (see FIG. 17(D)).

(5) The etching solution which is the same as that used in the process (2) was sprayed to the two sides of the substrate subjected to the process (4). The surface of the lower conductive circuit 334 which has been temporarily flattened and the surface of the land of the through hole 336 were etched. Thus, a coarsened surface 342 was formed on the overall surface of the lower conductive circuit 334 (see FIG. 18(A)). Then, the coarsened surface 342 was tin-substituted so that a Sn layer having a thickness of 0.3 μm was formed on the surface. Note that the Sn layer is omitted from illustration.

(6) Then, a thermosetting resin polyolefine resin sheet (1592 trade name of Sumitomo 3M) having a thickness of 50 μm was laminated to each of the two sides of the substrate subjected to the foregoing process by heating and pressing the sheet with pressure of 10 kg/cm$^2$ while the temperature was being raised to 50° C. to 180° C. Thus, an interlayer insulating resin layer 350 made of polyolefine resin was formed (see FIG. 18(B)).

Figure 18:
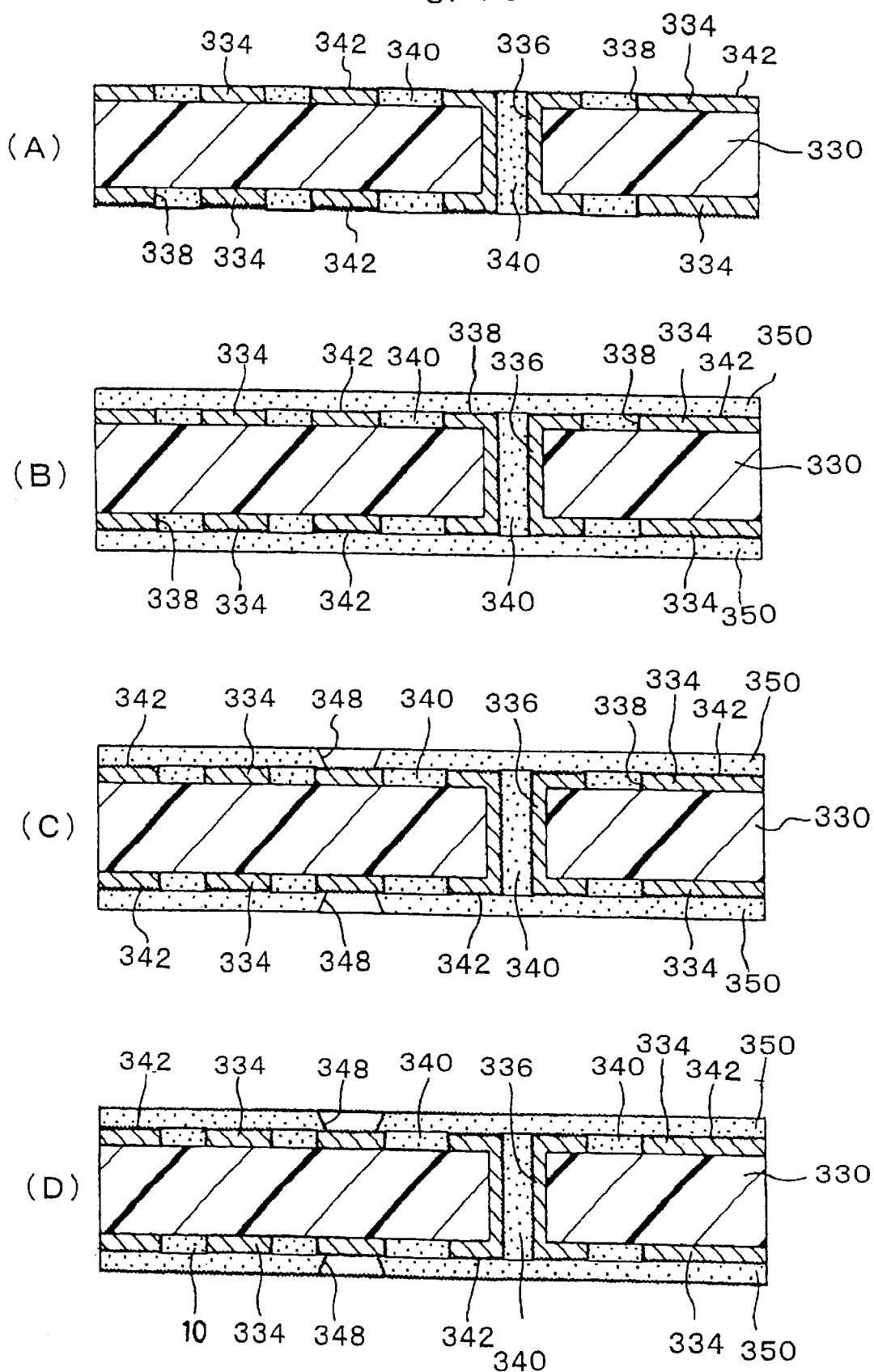
FIGS. 18(A), 18(B), 18(C) and 18(D) are vertical cross sectional views showing a portion of a process for manufacturing the multilayered printed circuit board according to the third embodiment of the present invention.

(7) Then, CO2 gas laser having a wavelength of 10.4 μm was used to form an opening 348 having a diameter of 80 μm and arranged to form the via hole in the interlayer insulating resin layer 350 made of the polyolefine resin under conditions that the diameter of the laser beam was 5 mm, the mode was the top-hat mode, the pulse width was 50 μs, the diameter of the opening of the mask was 0.5 mm and the number of shots was three (see FIG. 18(C)). Then, oxygen plasma was used to perform a desmear process.

(8) Then, SV-4540 manufactured by Nihon Vacuum was used to perform a plasma process to coarsen the surface of the interlayer insulating resin layer 350 (see FIG. 18(D)) In the foregoing process, inert gas was argon gas to perform the plasma process for two minutes under conditions that the electric power was 200 W, the pressure of the gas was 0.6 Pa and the temperature was 70° C.

(9) Then, the same apparatus was operated to exchange internal argon gas. Then, sputtering was performed by using Ni as a target under conditions that the atmospheric pressure was 0.6 Pa, the temperature was 80° C., the electric power was 200 W and time was 5 minutes. Thus, a Ni metal layer 351 was formed on the interlayer insulating resin layer 350 made of polyolefine resin. The thickness of the formed Ni metal layer 351 was 0.1 μm. A copper metal layer 352 having a thickness of 0.1 μm was, by sputtering, formed on the Ni metal layer 351 under similar conditions.

Figure 19:
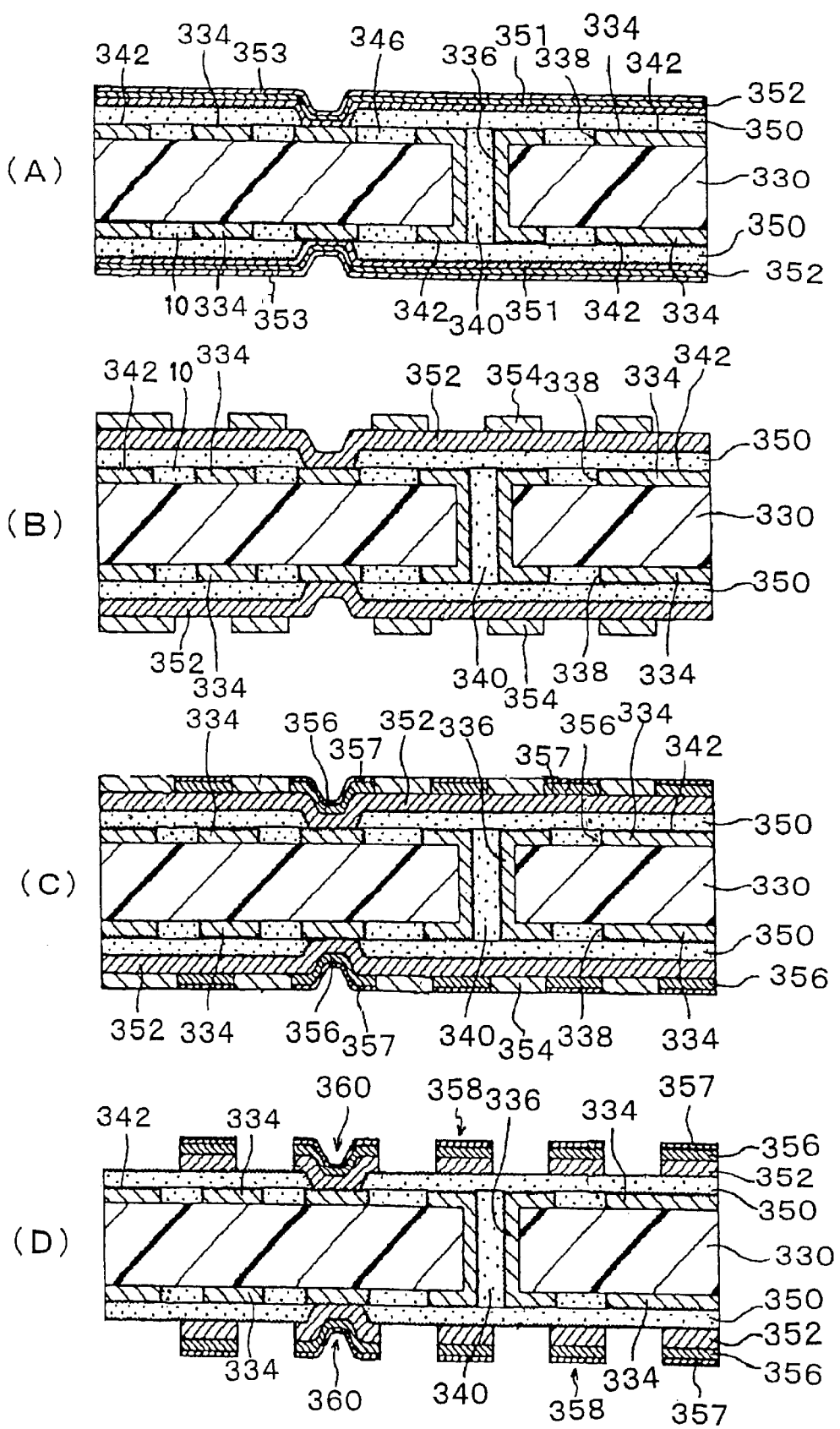
FIGS. 19(A), 19(B), 19(C) and 19(D) are vertical cross sectional views showing a portion of the process for manufacturing the multilayered printed circuit board according to the third embodiment of the present invention.

(10) The substrate having the metal layer 351 and the metal intermediate layer 352 formed in the process (9) was electroless-plated under similar conditions to those described in the process (1). Thus, an electroless plated film 353 having a thickness of 0.7 μm was formed (see FIG. 19(A)). Since the Ni metal layer 351, the metal intermediate layer 352 and the electroless plated film 253 cannot clearly be shown from FIG. 19(B), the three layers are shown as one layer to which reference numeral 352 is given.

(11) A commercial photosensitive dry film was applied to each of the two sides of the substrate subjected to the foregoing process. Then, a photomask film was placed to perform exposure with 100 mJ/cm$^2$, and then a development process was performed by using 0.8% sodium carbonate. Thus, the pattern of the resist 354 having a thickness of 15 μm was formed (see FIG. 19(B))

(12) Then, electric plating was performed under the same conditions as those of the first embodiment so that an electrically plated film 356 having a thickness of 15 μm was formed. Note that the electrically plated film 356 caused thickening of the portion which would be formed in a conductive circuit 358 in the following process and enclosure of plating into the portion which would be formed into a via hole 360 to be completed.

(13) Then, the substrate was immersed in electroless nickel bath which is solution (90° C.) containing nickel chloride (30 g/l), sodium hypochlorite (10 g/l), sodium citrate (10 g/l). Thus, a nickel film 357 having a thickness of 1.2 μm was formed on the electrolytic copper plated film (see FIG. 19(C)).

(14) The plating resist 3 was separated and removed by 5% NaOH, and then Ni metal layer 351, the intermediate metal layer 352 and the electroless plated film 353 existing below the resist 3 were dissolved and removed by an etching process which used a mixture solution of nitric acid, sulfuric acid and hydrogen peroxide. Thus, a conductive circuit 358 (including a via hole 360) constituted by the electrolytic copper plated film 356 and so forth and having a thickness of 16 μm was formed (see FIG. 19(D)).

(15) Then, the processes (5) to (14) are repeated (not shown) so that a multilayered structure that each side has three layers was formed. Then, formation of a solder-resist layer having an opening, that of a nickel-plated film and that of a gold-plated film was performed. Then, a solder bump was formed so that a multilayered printed circuit board having a solder bump was obtained.

Heating Test and Heat Cycle Test

The obtained multilayered printed circuit board was subjected to a heating test set to 128° C. for 48 hours and a heat cycle test at −55° C. to 125° C. to perform cycles 1,000 times. After the tests were performed, separation between the interlayer insulating resin layer and the lower conductive circuit and change in the resistance of the via hole portion were evaluated. Results are shown in a table shown in FIG. 57.

A first modification of the third embodiment will now be described.

A process similar to that according to the third embodiment was performed except for a bubbling method employed in the processes (2) and (5) and a coarsened surface formed on the surface of the lower conductive circuit 334 under the following conditions so that a multilayered printed circuit board was manufactured. The obtained multilayered printed circuit board was subjected to the heating test and the heat cycle test. Results are shown in the table shown in FIG. 57.

When the coarsened layer was formed, the conductive circuit was immersed in the etching solution employed in the processes (2) and (5). Then, the coarsening process was performed while air was being bubbled.

Comparative Example 3

A process similar to that according to the third embodiment was performed except for employment of a Cu—Ni—P plating method and a coarsened layer made of a Cu—Ni—P alloy and formed on the surface of the lower conductive circuit 334 in the processes (2) and (5) so that a multilayered printed circuit board was manufactured. The obtained multilayered printed circuit board was subjected to the heating test and the heat cycle test. Results are shown in the table shown in FIG. 57.

When the coarsened layer was formed, the substrate was degreased with an alkali material, followed by performing soft etching. Then, a process using catalyst solution composed of palladium chloride and organic acid was performed so that a Pd catalyst was imparted to activate the catalyst.

Then, the substrate was electroless-plated by using electroless plating bath, the pH of which was 9, the bath being water solution of, for example, copper sulfate ($3.2 \times 10^{-2}$ mol/l), nickel sulfate ($2.4 \times 10^{-3}$ mol/l), citric acid ($5.2 \times 10^{-2}$ mol/l), sodium hypophosphite ($2.7 \times 10^{-1}$ mol/l), boric acid ($5.0 \times 10^{-1}$ mol/l) and a surface active agent (Surfinol 465 manufactured by Nissin Chemical Industry) (1.0 g/l). Thus, a coarsened layer made of Cu—Ni—P alloy was formed on the overall surface of the conductive circuit.

Comparative Example 4

A process similar to that according to the third embodiment was performed except for employment of a blackening and reducing process and a coarsened surface formed on the surface of the conductive circuit in the processes (2) and (5) so that a multilayered printed circuit board was manufactured. The obtained multilayered printed circuit board was subjected to the heating test and the heat cycle test. Results are shown in the table shown in FIG. 57.

When the coarsening process was performed by blackening and reducing process was performed such that solution containing NaCH (10 g/l), NaClO$_2$ (40 g/l) and Na$_3$PO$_4$ (6 g/l) was employed as an oxidizing bath (a blackening bath) and solution containing NaOH (10 g/l) and NaBH$_4$ (6 g/l) was employed as a reducing bath. Thus, a coarsened surface having a depth of 3 μm was formed.

Comparative Example 5

A process similar to that according to the third embodiment was performed except for employment of a soft etching method using mixed solution of hydrogen peroxide and sulfuric acid as etching solution to form a coarsened surface on the surface of the conductive circuit in the processes (2) and (5) so that a multilayered printed circuit board was manufactured. The obtained multilayered printed circuit board was subjected to the heating test and the heat cycle test. Results are shown in the table shown in FIG. 57.

Comparative Example 6

A process similar to that according to the third embodiment was performed except for the following conditions for forming the coarsened surface on the surface of the conductive circuit in the processes (2) and (5) so that a multilayered printed circuit board was manufactured. The obtained multilayered printed circuit board was subjected to the heating test and the heat cycle test. Results are shown in the table shown in FIG. 57.

When the coarsening process was performed such that an alumina polishing material (having an average particle size 5 µm) was used under pressure of 1 kg/mm². Thus, a coarsened surface having a depth of 2 µm to 6 µm was formed.

As can be understood from the results shown in the foregoing table, the multilayered printed circuit board according to the third embodiment was free from a great change rate of the resistance between the conductive circuit and the via hole even after the heating test and the heat cycle test. Thus, no separation between the conductive circuit and the interlayer insulating resin layer was observed. On the other hand, the multilayered printed circuit board according to the comparative example encountered an excessively great rate of change of the resistance or separation observed after the test.

As described above, according to the method of manufacturing the multilayered printed circuit board according to the third embodiment, a multilayered printed circuit board can be manufactured with which satisfactory adhesiveness is realized between the conductive circuit and the interlayer insulating resin layer which is formed on the conductive circuit and also satisfactory adhesiveness with the via hole which is formed on the conductive circuit is realized even after the opening for forming the via hole is formed in the interlayer insulating resin layer by the laser beam.

The multilayered printed circuit board according to the third embodiment exhibits excellent adhesiveness between the conductive circuit including the via hole portion and the interlayer insulating resin layer. Moreover, excellent adhesiveness can be realized between the conductive circuit and the via hole which is formed on the conductive circuit.

Fourth Embodiment

A multilayered printed circuit board and a manufacturing method therefor according to a fourth embodiment of the present invention will now be described.

The structure of a multilayered printed circuit board 10 according to the fourth embodiment will now be described with reference to FIGS. 27 and 28.

Figure 27:
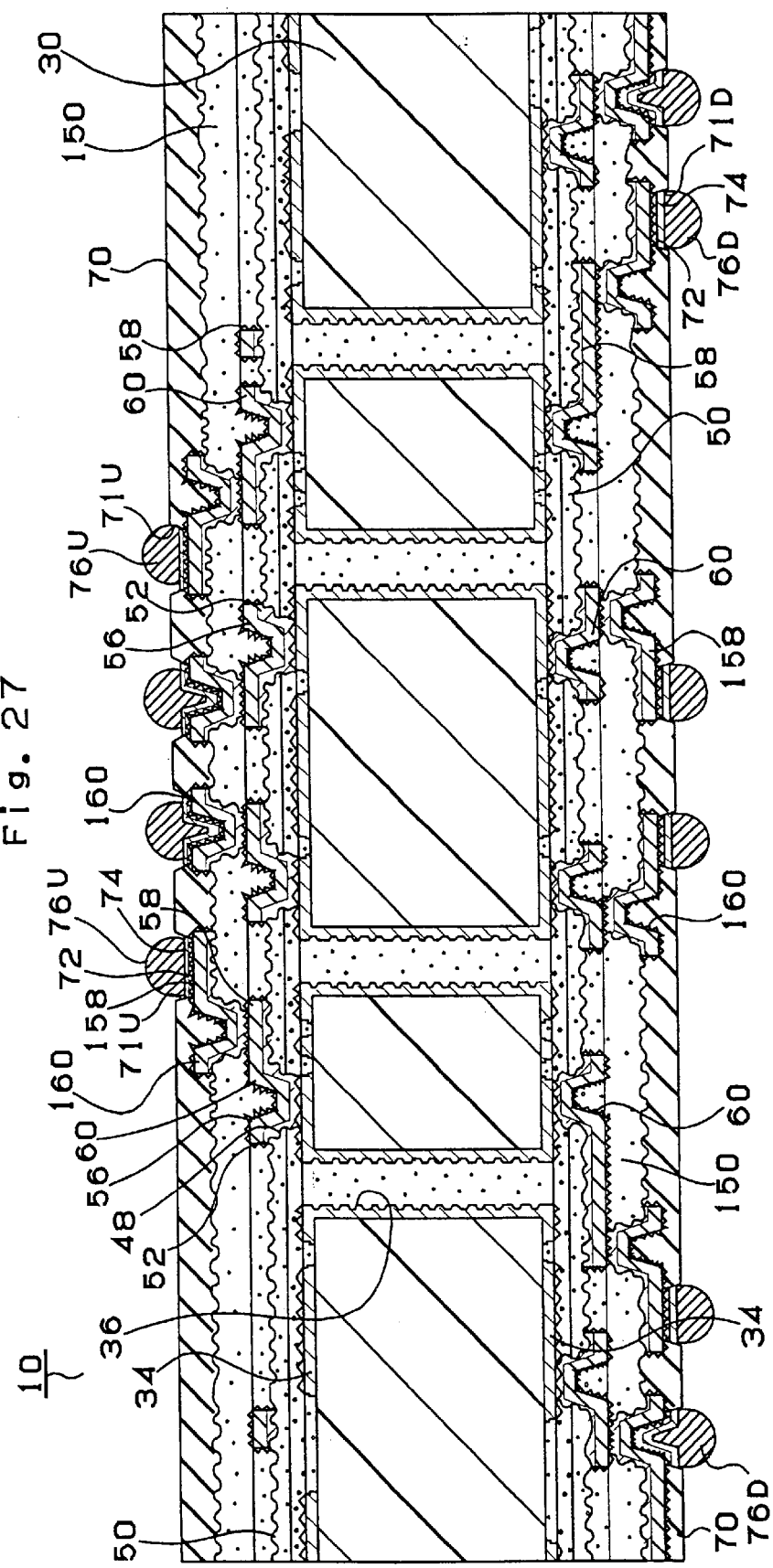
FIG. 27 is a cross sectional view showing the multilayered printed circuit board according to the fourth embodiment of the present invention.

FIG. 27 is a cross sectional view showing the multilayered printed circuit board 10 in a state in which the IC chip has not been mounted. FIG. 28 is a diagram showing a state in which an IC chip 90 has been mounted on the multilayered printed circuit board 10 and joined to a daughter board 94.

As shown in FIG. 27, the multilayered printed circuit board 10 incorporates a core substrate 30 in which a through hole 36 is formed. Moreover, a conductive circuit 34 is formed on each of the two sides of the core substrate 30. An interlayer insulating resin layer 50 having a via hole 60 and a conductive circuit 58 is formed on the core substrate 30. An upper interlayer insulating resin layer 150 having a via hole 160 and a conductive circuit 158 is formed on the interlayer insulating resin layer 50.

Figure 28:
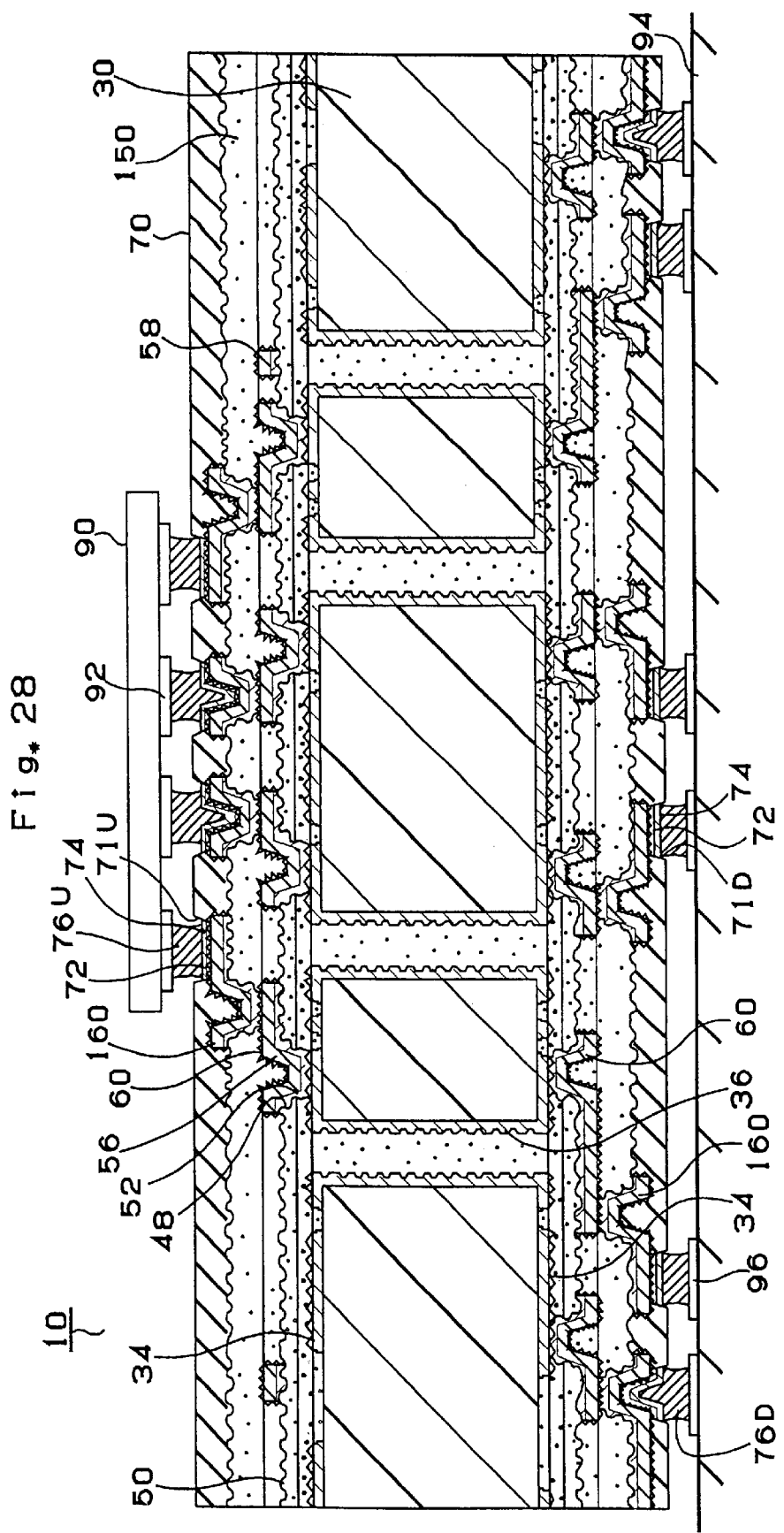
FIG. 28 is a cross sectional view showing the multilayered printed circuit board according to the fourth embodiment of the present invention.

As shown in FIG. 28, a solder bump 76U for establishing the connection with a land 92 of the IC chip 90 is disposed in an opening 71U of a solder-resist 70 on the upper surface of the multilayered printed circuit board. A solder bump 76D for establishing the connection with a land 96 of a daughter board 94 is formed in an opening 71D in the lower surface. The solder bump 76U is connected to a through hole 36 through a via hole 160 formed in an upper interlayer insulating resin layer 150 and a via hole 160 formed in the upper interlayer insulating resin layer 150. The solder bump 76D is connected to the through hole 36 through the via hole 160 formed in the upper interlayer insulating resin layer 150 and the via hole 60 formed in the interlayer insulating resin layer 50.

The via hole 60 is formed by forming a through hole 48 in the interlayer insulating resin layer 50 and by depositing an electroless plated film 52 and an electrolytic plated film 56 on the inner surface of the through hole 48. Since the fourth embodiment is arranged to form the through hole 48 by a carbon dioxide laser beam, a small diameter (60 µm) can be realized. Since the stripe pits and projections are formed on the side wall of the through hole 48 as described later owing to interference of laser beams when the through hole 48 is formed by using the laser beam, the electroless plated film 52 can make hermetic contact with the side wall. Thus, the reliability of the via hole can be improved.

On the other hand, the solder bumps 76U and 76D are, through a nickel-plated layer 72 and a gold-plated layer 74, formed in the conductive circuit 158 and the via hole 160 below the openings 71U and 71D formed in the solder-resist 70. The openings 71U and 71D of the solder-resist 70a reformed by laser beams. That is, the fourth embodiment is arranged such that the opening is formed in the solder-resist 70 by the laser beam. Therefore, the material is not limited to the photosensitive resin. Therefore, a variety of materials exhibiting an excellent electric characteristic can be employed as the solder resist. Since the stripe pits and projections are formed on the side walls of the through holes (openings) 71U and 71D by using the interference of the laser beams when the openings are formed by the laser beams, the nickel-plated layer 72 can be made to hermetically contact with the side walls. As a result, the reliability of the connection of each of the solder bumps 76U and 76D can be improved.

A method of manufacturing the multilayered printed circuit board according to the fourth embodiment will now be described with reference to the drawings.

The schematic structure of a carbon dioxide gas laser unit for forming a through hole in the interlayer insulating resin layer and the solder resist will now be described with reference to FIG. 34.

Figure 34:
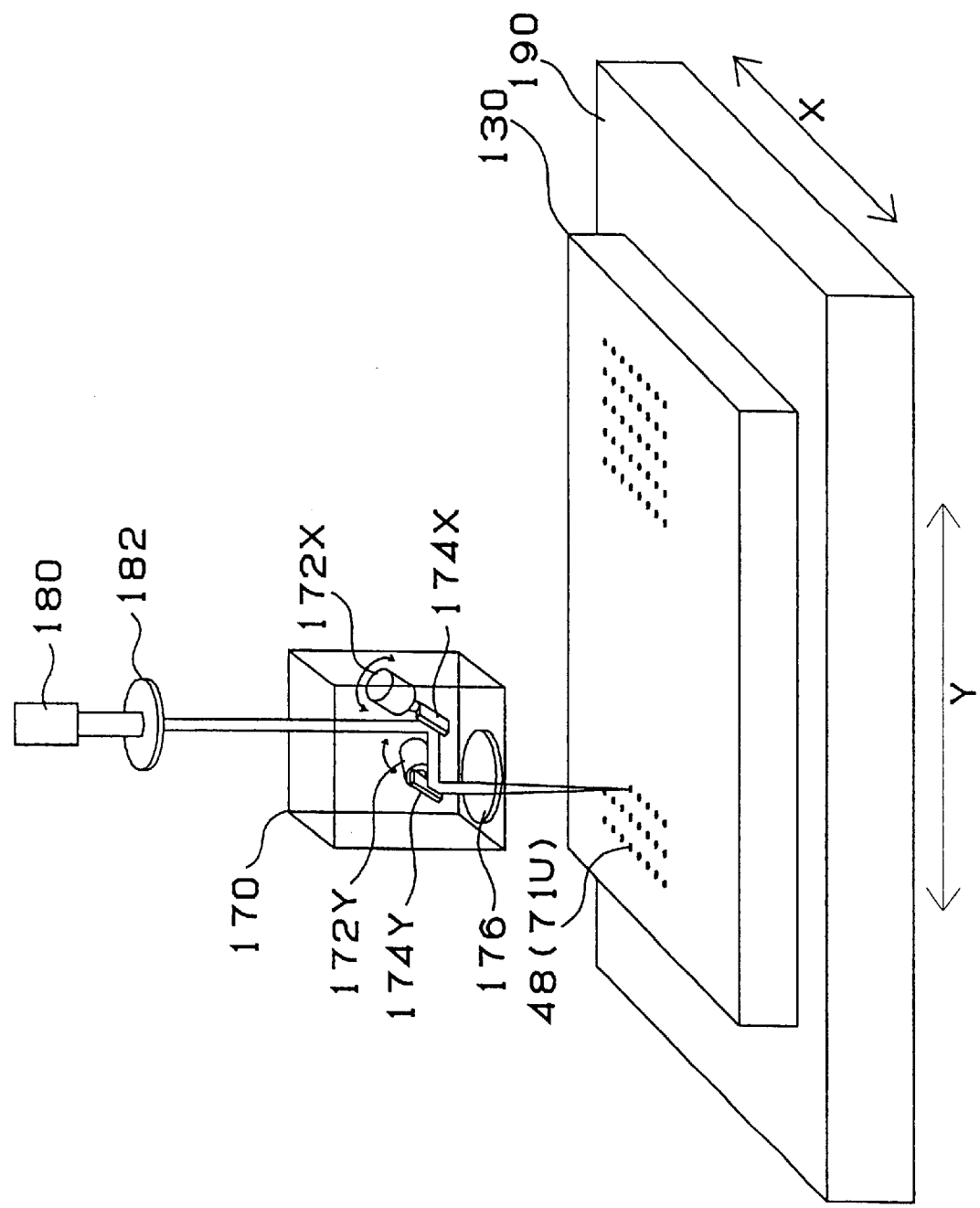
FIG. 34 is a diagram showing a laser unit for forming a through hole.
Figure 38:
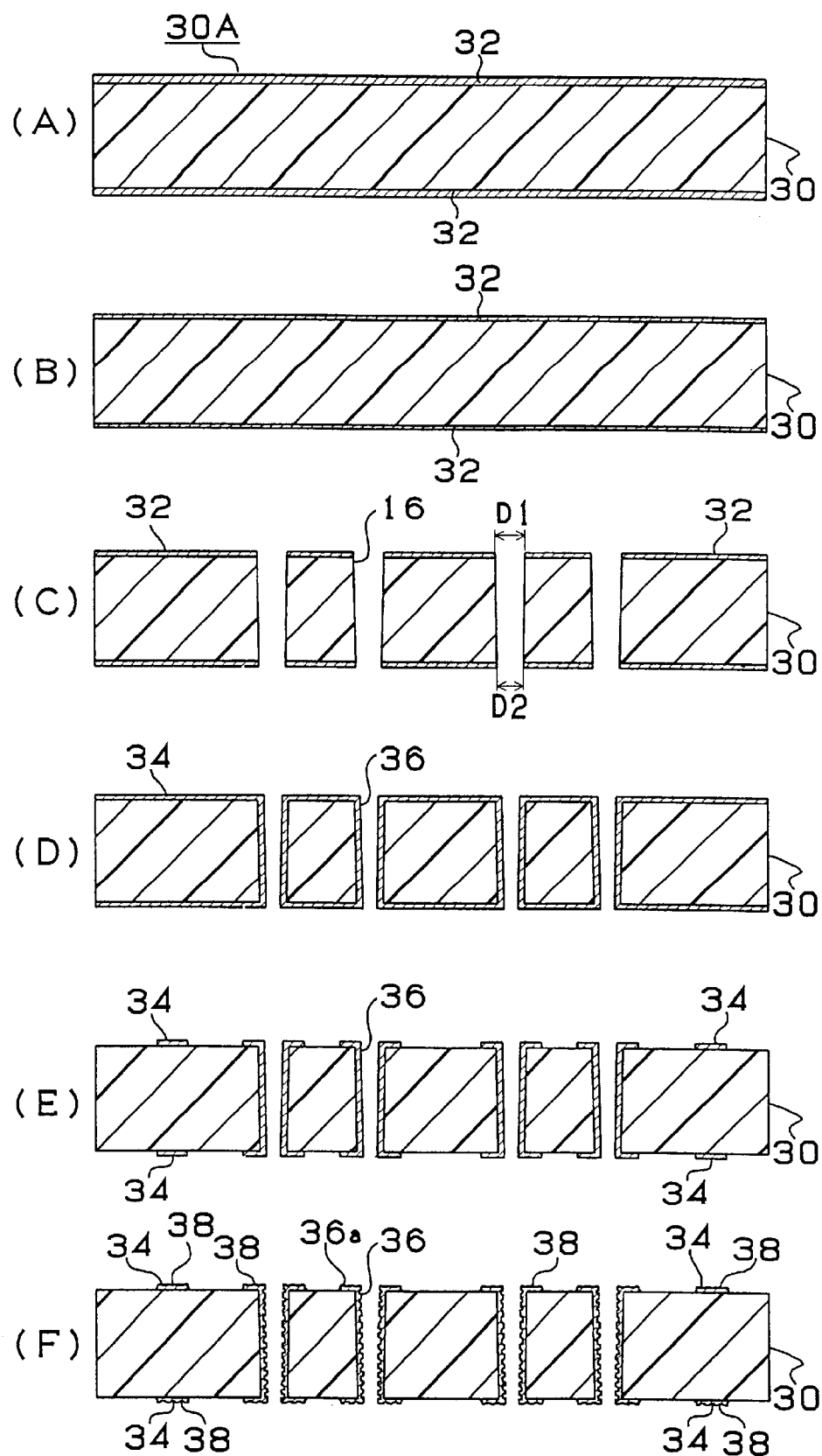
FIGS. 38(A), 38(B), 38(C), 38(D), 38(E) and 38(F) are diagrams showing a process for manufacturing a multilayered printed circuit board according to a fourth modification of the fifth embodiment.
Figure 39:
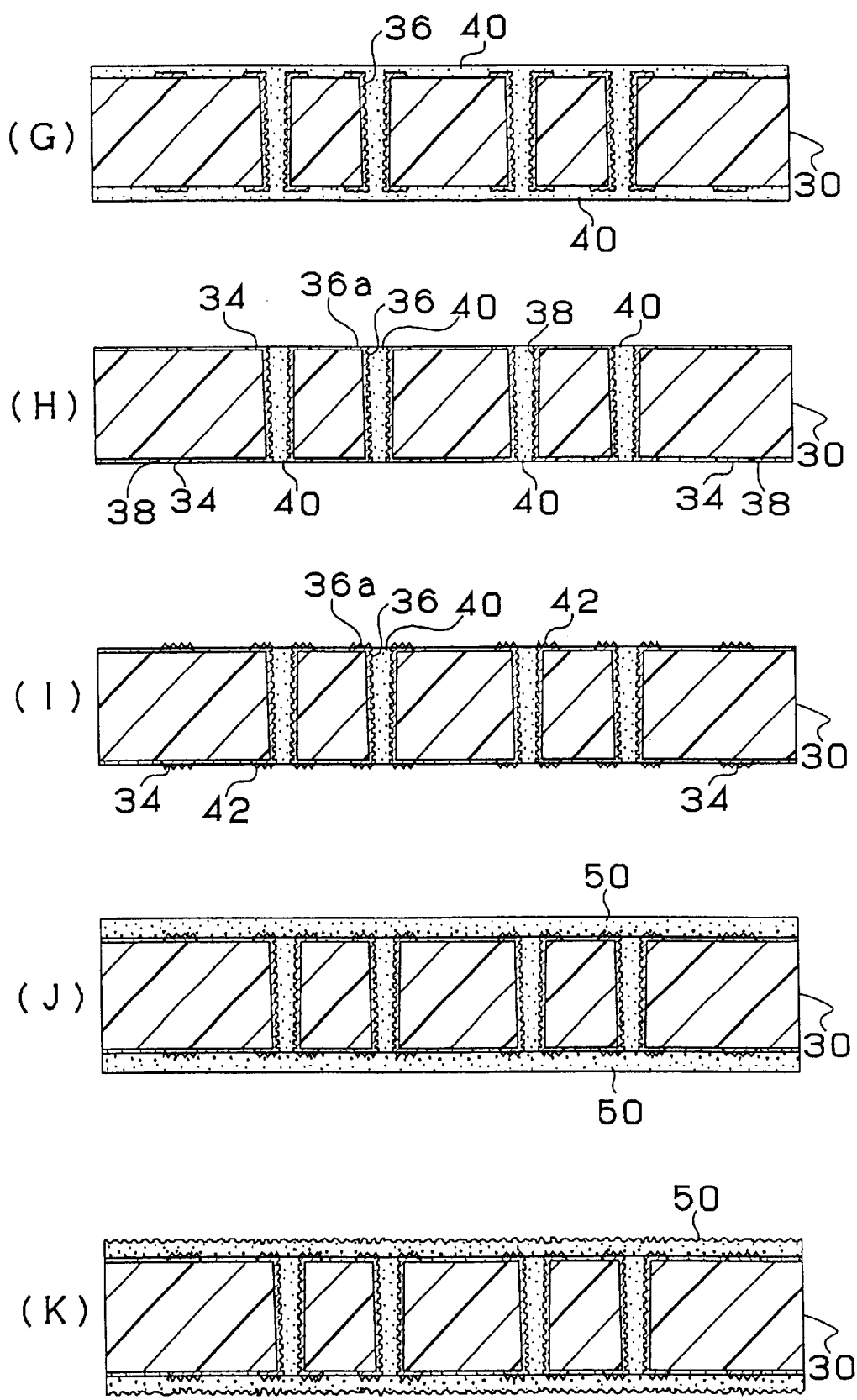
FIGS. 39(G), 39(H), 39(I), 39(J) and 39(K) are diagrams showing a process for manufacturing a multilayered printed circuit board according to a fourth modification of the fifth embodiment.
Figure 40:
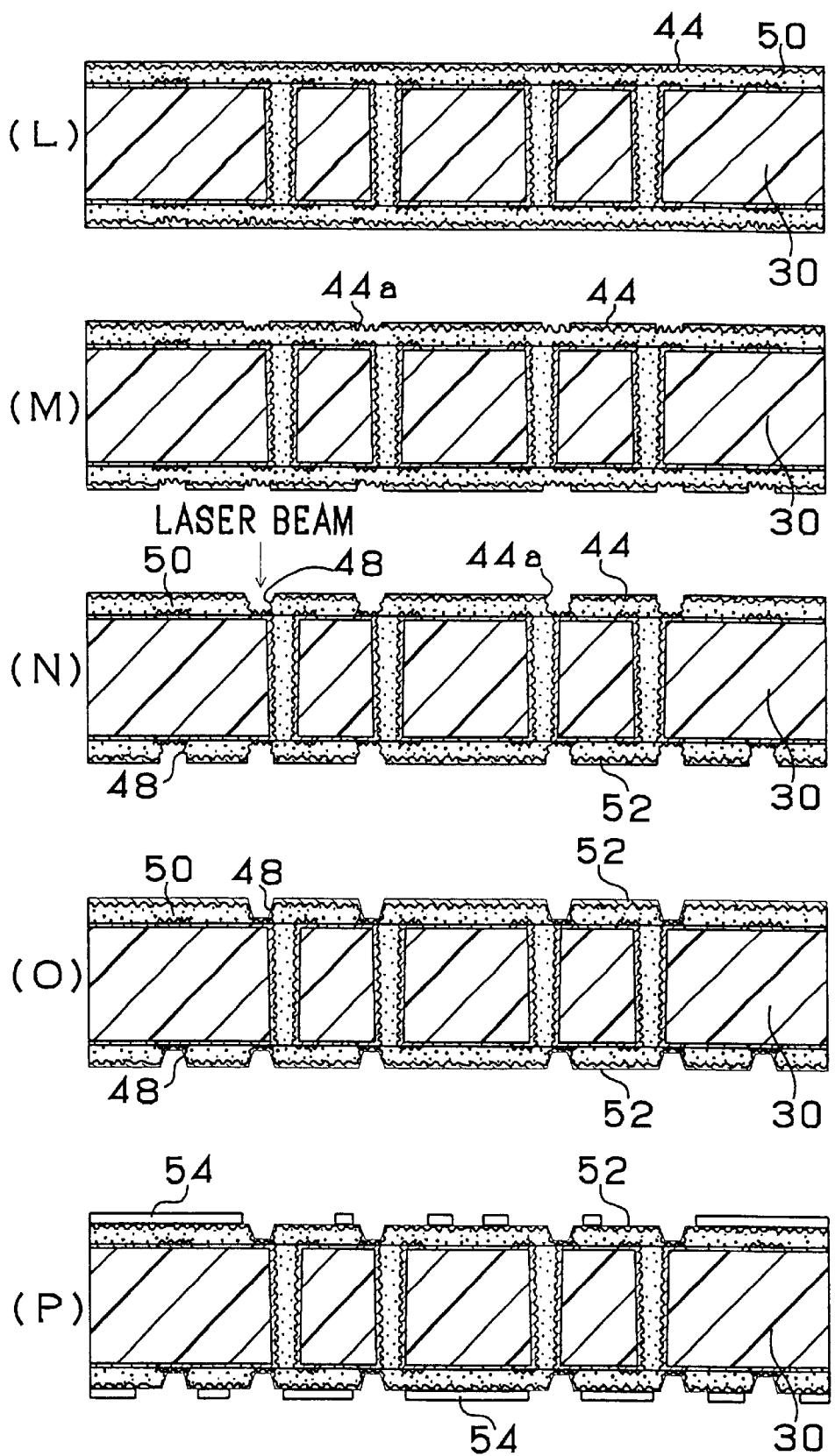
FIGS. 40(L), 40(M), 40(N), 40(O) and 40(P) are diagrams showing a process for manufacturing a multilayered printed circuit board according to the fourth modification of the fifth embodiment.
Figure 41:
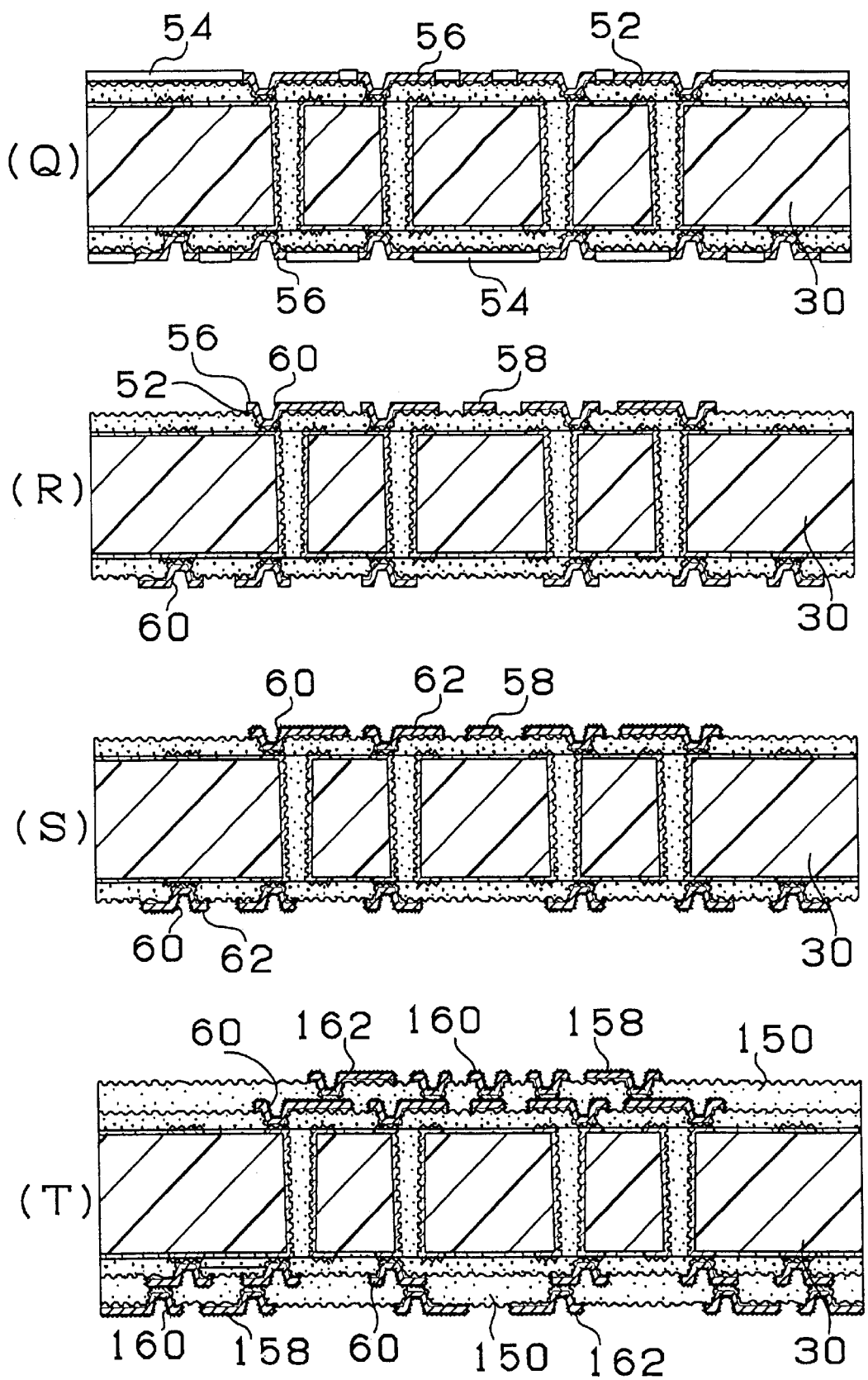
FIGS. 41(Q), 41(R), 41(S) and 41(T) are diagrams showing a process for manufacturing a multilayered printed circuit board according to the fourth modification of the fifth embodiment.

FIG. 34 schematically shows the structure of the laser unit for forming the through hole in the multilayered printed circuit board according to the fourth embodiment. The laser unit is ML505GT manufactured by Mitsubishi Electric. As a CO2-laser emitting unit 180, ML5003D manufactured by Mitsubishi Electric when the through hole (60 µm) 48 is formed in the interlayer insulating resin layer and a through hole (133 µm) 71U for connecting the IC chip is formed in the upper portion of the solder resist. When the through hole (650 µm) 71D for connecting the motherboard is formed in the lower portion of the solder resist, ML5003D2 manufactured by Mitsubishi Electric is employed.

Light emitted from the laser emitting unit 180 is made incident on a galvano head 170 through a transferring mask 182 for making a focal point on the substrate to be clear. The galvano head 170 is composed of a pair of galvano mirrors consisting of a galvano mirror 174X for scanning the laser beam into the direction X and a galvano mirror 174Y for scanning the laser beam into the direction Y. The mirrors 174X and 174Y are operated by control motors 172X and 172Y. In accordance with a control command issued from a control unit (not shown), the motors 172X and 172Y adjust the angles of the mirrors 174X and 174Y. Moreover, the motors 172X and 172Y transmits, to the computer, a detection signal obtained from encoders included therein.

The laser beam is allowed to pass through the mirrors 174X and 174Y so as to be scanned into the direction X-Y, and then allowed to pass through a f-θ lens 176. Then, the laser beam is impinged on an interlayer insulating resin layer of the core substrate 30 to be described later. Thus, an opening (a through hole) 48 for forming the via hole is formed. Similarly, the openings (through holes) 71U and 71D for the solder bump are formed in the solder-resist 70. The core substrate 30 is placed on an X-Y table 190 which is capable of moving in the direction X-Y.

Here, the explanation is made with respect to compositions of A. an adhesive for electroless plating, B. an interlayer resin insulating agent C. a resin filling agent, and D. Solder Resist Composition used in the manufacturing method of the multilayer printed wiring board in accordance with the fourth embodiment.

A. Raw Material composition Substance for Adjusting and Manufacturing an Adhesive for Electroless Plating (an Adhesive for an Upper Layer)

Resin Composition Substance ①

A resin composition substance is obtained by stirring and mixing 35 weight parts of a resin liquid, 3.15 weight parts of a photosensitive monomer (manufactured by TO-A GOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration are dissolved to DMDG. A polyhydric acrylic-system monomer (manufactured by NIHON KAYAKU, R604) can be used as a photosensitive monomer.

Resin Composition Substance ②

A resin composition substance is obtained by mixing 12 weight parts of polyether sulfone (PES), 7.2 weight parts of epoxy resin particles (manufactured by SANYO KASEI, polymer pole) having an average particle diameter of 1.0 $\mu$m, and 3.09 weight parts of epoxy resin particles having an average particle diameter of 0.5 $\mu$m, and then adding 30 weight parts of NMP to the mixed material and stirring and mixing these materials by a beads mill.

Hardening Agent Composition Substance ③

A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

B. Raw Material Composition Substance for Adjusting and Manufacturing an Interlayer Resin Insulating Agent (an Adhesive for a Lower Layer)

Resin Composition Substance ①

A resin composition substance is obtained by stirring and mixing 35 weight parts of a resin liquid, 4 weight parts of a photosensitive monomer (manufactured by TO-A GOSEI, Alonix M315), 0.5 weight part of an antifoaming agent (manufactured by SAN-NOPUKO, S-65) and 3.6 weight parts of NMP. In the resin liquid, 25% of a cresol novolak type epoxy resin (manufactured by NIHON KAYAKU, molecular weight 2500) and 80 wt % of an acrylic substance in concentration are dissolved to DMDG.

Resin Composition Substance ②

A resin composition substance is obtained by mixing 12 weight parts of polyether sulfone (PES) and 14.49 weight parts of epoxy resin particles (manufactured by SANYO KASEI, polymer pole) having an average particle diameter of 0.5 $\mu$m, and then adding 30 weight parts of NMP to the mixed material and stirring and mixing these materials by a beads mill.

Hardening Agent Composition Substance ③

A hardening agent composition substance is obtained by stirring and mixing 2 weight parts of an imidazole hardening agent (manufactured by SHIKOKU KASEI, 2E4MZ-CN), 2 weight parts of an optical starting agent (manufactured by CHIBAGAIGI, Irugacure I-907), 0.2 weight part of a photosensitizer (manufactured by NIHON KAYAKU, DETX-S), and 1.5 weight parts of NMP.

C. Raw Material Composition Substance for Adjusting and Manufacturing a Resin Filling Agent Use same as the composition substance according to the second embodiment.

D. Raw Material Composition Substance for Adjusting and Manufacturing Solder Resist Composition Solder resist composition is obtained by mixing 46.67 g of photosensitive oligomer (molecular weight 4000) obtained by acrylic-modifying 50% of epoxy groups of 60 percentage by weight of cresol novolac dissolved into DMDG of 50% epoxy resin (Nippon Kayaku); 15.0 g of 80 percentage by weight of bisphenol A type epoxy resin (Yuka Shell, Epikote 1001) dissolved into methyl ethyl ketone; 1.6 g of imidazole hardener (Shikoku Chemicals, 2E4MZ-CN); 3 g of multivalent acrylic monomer (Nippon Kayaku, R604) which is photo receptive monomer; 1.5 g of the same multivalent acrylic monomer (KYOEISHA CHEMICAL, DPE6A); 0.71 g of a scattering anti-foaming agent (SANNOPCO, S-65); then adding 2 g of benzophenone (KANTO CHEMICAL) used as a photo-initiator; and 0.2 g of Michler's ketone (KANTO CHEMICAL) used as a photosensitizer to the mixture and adjusting the viscosity to 2.0 Pa·s at 25° C.

The viscosity is measured by B-type measurement (TOKYO measurement DVL-B type). A rotator No. 4 was used in 60 rpm, and a rotator No. 3 was used in 6 rpm.

Description of a process for manufacturing the multilayered printed circuit board according to the fourth embodiment will be continued with reference to FIGS. 22 to 27. In the fourth embodiment, the multilayered printed circuit board is formed by a semi-additive method.

(1) As shown in FIG. 22(A), a copper-plated laminated board 30A was employed as the start material, the copper-plated laminated board 30A incorporating a substrate 30 having a thickness of 0.8 mm and made of glass epoxy resin or BT (bis maleimide-triazine) resin. Copper foil 32 having a thickness of 12 $\mu$m is laminated on the substrate 30. Initially, an opening is formed in the copper-plated laminated board 30A by drilling, and then electroless plating is performed. Then, etching in accordance with a pattern is performed so that the through hole 36 and the conductive circuit 34 are formed. Thus, a core substrate 30 shown in FIG. 22(B) is formed.

(2) The substrate 30 having a plane layer 34 and a through hole 36 have been formed was cleaned with water, and then dried. Then, the oxidizing and reducing process was performed by using an oxidizing bath composed of NaOH (10 g/l), NaClO$_2$ (40 g/l) and Na$_3$PO$_4$ (6 g/l) and a reducing bath composed of NaOH (10 g/l) and NaBH$_4$ (6 g/l) so that a coarsened layer 38 was formed on the surface of each of the inner-layer copper pattern 34 and the through hole 36 (see FIG. 22(C)).

(3) The raw material composition for preparing the resin filler shown in FIG. 22(C) was mixed and kneaded so that the resin filler was obtained.

(4) The resin filler 40 obtained in the process (3) was applied to the two sides of the substrate 30 by using a roll coater within 24 hours after preparation of the resin filler 40. Thus, the resin filler 40 was enclosed between the conductive circuits 34 and in the through hole 36. Then, the resin filler 40 was dried at 70° C. for 20 minutes. Another side is similarly processed. Thus, the resin filler 40 was enclosed between the conductive circuits 34 or in the through hole 36, and then heated and dried at 70° C. for 20 minutes (see FIG. 22(D)).

(5) Either side of the substrate 30 subjected to the process (4) was belt-sander-polished by using #600 belt polishing paper (manufactured by Sankyo). Thus, polishing was performed such that the resin filler 40 was not left on the surface of the conductive circuit 34 and the surfaces of lands 36*a* of the through hole 36. Then, flaws caused from the belt-sander-polishing were removed by performing buff polishing. The foregoing sequential polishing process was performed for another surface (see FIG. 23(E)).

Then, heat treatment was performed at 100° C. for 1 hour, 120° C. for 3 hours, 150° C. for 1 hour and 180° C. for 7 hours. Thus, the resin filler 40 was hardened.

The surface layer portion of the resin filler 40 enclosed into the through hole 36 and so forth and the coarsened layer 38 on the upper surface of the conductive circuit 34 are removed so that the two sides of the core substrate 30 were flattened. Then, the resin filler 40 and the side surface of the conductive circuit 34 were strongly brought into contact with each other through the coarsened layer 38. The surface of the inner wall of the through hole 36 and the resin filler 40 are brought into strong contact with each other through the coarsened layer 38. Thus, the circuit board was obtained. As a result of the foregoing process, the surface of the resin filler 40 and that of the conductive circuit 34 are made to be flush with each other.

(6) The substrate 30 having the conductive circuit 34 was degreased by using alkali material, and soft etching was performed. Then, a process using a catalyst composed of palladium chloride and organic acid was performed so that a Pd catalyst was imparted. Then, the catalyst was activated, and then the substrate was immersed in electroless plating solution having PH=9 and composed of $3.2 \times 10^{-2}$ mol/l copper sulfate, $3.9 \times 10^{-3}$ mol/l nickel sulfate, $5.4 \times 10^{-2}$ mol/l completing agent, $3.3 \times 10^{-1}$ mol/l sodium hypophosphite, $5.0 \times 10^{-1}$ mol/l boric acid and a surface active agent (Surfil 465 manufactured by Nissin Chemical Industry). After a lapse of one minute from the immersion, the substrate was vertically and laterally vibrated one time at intervals of four seconds. Thus, a coating layer made of a needle alloy composed of Cu—Ni—P and a coarsened layer 42 were formed on the surface of the conductive circuit 34 and the land 36*a* of the through hole 36 (see FIG. 23(F)).

Then, 0.1 mol/l tin borofluoride and 1.0 mol/l thiourea were used at a temperature of 35° C. and PH=1.2 so that Cu—Sn substitution reactions were performed. Thus, a Sn layer (not shown) having a thickness of 0.3 μm was formed on the surface of the coarsened layer.

(7) The raw material composition for preparing interlayer resin insulating material B was stirred and mixed to adjust the viscosity to be 1.5 Pa·s so that the interlayer resin insulating material (for the lower layer) was obtained.

Then, the raw material composition for preparing interlayer resin insulating material A was stirred and mixed to adjust the viscosity to be 7 Pa·s so that the interlayer resin insulating material (for the upper layer) was obtained.

(8) The interlayer resin insulating material (for the lower layer) 44 obtained in the process (7) and having the viscosity of 1.5 Pa·s was applied to the two sides of the substrate obtained in the process (6) by using a roll coater within 24 hours from the preparation. The substrate was allowed to stand in a horizontal state for 20 minutes, and then, the substrate was dried (pre-baked) at 60° C. for 30 minutes. Then, the photosensitive adhesive-agent solution (for the upper layer) 46 obtained in the process (7) and having the viscosity of 7 Pa·s was applied within 24 hours after the preparation. Then, the substrate was allowed to stand for 20 minutes in a horizontal state, and then the substrate was dried (dry to touch) at 60° C. for 30 minutes. Thus, an adhesive-material layer 50α having a thickness of 35 μm was formed (see FIG. 23(G)).

(9) A PET film 51 was brought into hermetic contact with each of the two sides of the substrate 30 having the adhesive-agent layer (see FIG. 24(H)). Then, exposure was performed by operating an extra high tension mercury lamp with 500 mJ/cm$^2$. Then, the substrate 30 was exposed to the extra high tension mercury lamp with 3000 mJ/cm$^2$. Then, heating was performed at 100° C. for 1 hour, 120° C. for 1 hour and 150° C. for 3 hours (post-baking). Thus, an interlayer insulating resin layer (two-layer structure) 50 having a thickness of 35 μm was manufactured. Then, the PET film 51 was separated.

(10) Then, the substrate 30 having the interlayer insulating resin layer 50 was placed on the X-Y table 190 described with reference to FIG. 34. Then, the carbon-dioxide gas laser beam was applied so that the through hole 48 was formed (see FIG. 24(I)). Note that the tin-plated layer (not shown) was partially exposed to the through hole 48 which would be formed into the via hole.

To form the through hole having a diameter of 60 μm, ML5003D was employed as the laser oscillator of the laser unit. The irradiation was performed such that the energy of one pulse was 0.3 mJ, the pulse width was 50 sec, the diameter of the mask was 0.5 mm, the pulse mode was a burst and multi-mode, the wavelength was 10.6 μm and the number of shots was three.

Figure 29:
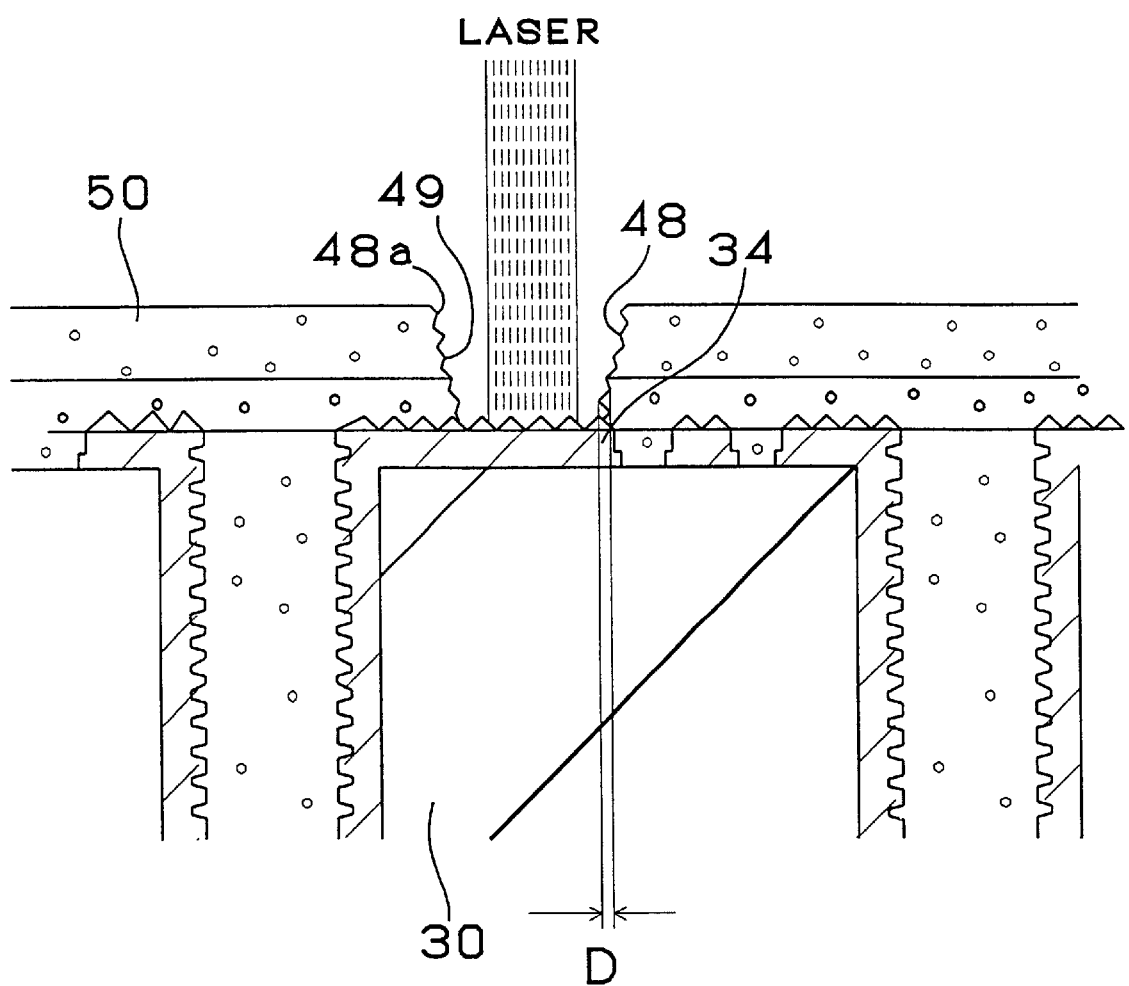
FIG. 29 is an enlarged view showing a portion (C) shown in FIG. 24(I)

FIG. 29 is an enlarged view of the portion C shown in FIG. 24(I). The multilayered printed circuit board according to the fourth embodiment is arranged such that the carbon-dioxide gas laser beam is vertically applied to the conductive circuit 34 below the interlayer insulating resin layer 50 to cause the reflected wave and incident wave from the conductive circuit to interfere with each other. Thus, the stripe pits and projections 49 are formed on the side wall 48*a* of the through hole 48 by electroless plating 49. That is, a portion in which the widths of the waves superimpose with each other are created for each half wavelength (5 μm) of the carbon-dioxide gas laser beam. In the foregoing portion, relatively great heat is produced, causing the side wall 48*a* to be annually scooped out. The depth D of the scooped portion is about 0.1 μm to about 5 μm.

FIGS. 30(A) and 30(B) show sketches of the through hole 48 formed in the interlayer insulating resin layer 50 by the carbon-dioxide gas laser beam. FIG. 30(A) shows a state in which the through hole is viewed from a diagonally upper position, while FIG. 30(B) shows a state in which the through hole is viewed from a position directly above the through hole.

It is preferable that the Interlayer insulating resin layer is made of thermosetting resin or a composite material of the thermosetting resin and thermoplastic resin. The reason for this lies in that the stripe pits and projections can easily be formed by the interference of the laser beams. It is preferable that the thermosetting resin or the composite material of the thermosetting resin and the thermoplastic resin contains acrylic monomer. When the acrylic monomer is contained, plasma formation can easily be performed. Thus, occurrence of residues of the resin in the through hole can be prevented.

(11) Then, the substrate 30 having the through hole 48 therein was immersed in chromic acid for 19 minutes to dissolve and remove epoxy resin particles existing on the surface of the interlayer insulating resin layer 50. Thus, the surface of the interlayer insulating resin layer 50 was coarsened (see FIG. 24(J)). Then, the substrate was immersed in neutral solution (manufactured by Sypray), and then the substrate was cleaned with water.

(12) A palladium catalyst (manufactured by Atotech) was attached to the surface of the substrate 30, the surface of which has been coarsened in the process (10) so that catalyst cores are attached to the surface of the interlayer insulating resin layer 50. Then, the substrate 30 is immersed in electroless copper plating solution under similar conditions to those of the first embodiment. Thus, an electroless plated film 52 having a thickness of 0.6 $\mu$m is formed on the overall surface (see FIG. 24(K)).

In the fourth embodiment, the stripe pits and projections are formed on the side wall 48a of the through hole 48 of the interlayer insulating resin layer 50 by using interference of the laser beams. Therefore, the electroless plated film 52 can be brought into hermetic contact with the side wall 48a.

(13) A commercial photosensitive dry film was applied to the electroless plated film 52 formed in the process (11), and then a mask was placed. Then, exposure was performed with 100 mJ/cm$^2$, and development was performed by using 0.8% sodium carbonate. Thus, a plating resist 54 having a thickness of 15 $\mu$m was formed (see FIG. 24(L)).

(14) Then, a portion in which the resist was not formed was electrolytic-copper-plated, under conditions similar to those of the first embodiment. Thus, an electrolytic plated film 56 having a thickness of 15 $\mu$m was formed (see FIG. 25(M)).

(15) The plating resist 54 was separated and removed by 5% KOH, and then the electroless plated film 52 below the plating resist was dissolved and removed by performing an etching process using mixed solution of sulfuric acid and hydrogen peroxide. Thus, a conductive circuit 58 and a via hole 60 composed of the electroless plated film 52 and the electrolytic plated film 56 and having a thickness of 18 $\mu$m were formed (see FIG. 25(N)).

(16) A process similar to the process (6) was performed so that a coarsened surface 62 made of Cu—Ni—P was formed on the surface of the conductive circuit 58 and that of the via hole 60. Then, the surface was Sn-substitute (see FIG. 25(O)).

(17) The processes (7) to (16) were repeated so that the upper interlayer insulating resin layer 150, the via hole 160 and the conductive circuit 158 are formed. Thus, the multilayered printed circuit board is manufactured (see FIG. 25(P)). The substitution of Sn was omitted in the process for forming the upper conductive circuit. Note that Rj was 3 $\mu$m.

(18) Then, solder bumps are formed on the foregoing multilayered printed circuit board. The solder-resist composition described in D is applied to each of the two sides of the substrate 30 obtained in the process (16) such that the thickness of the solder-resist composition is 45 $\mu$m. Then, the substrate is dried (dry to touch) at 70° C. for 20 minutes and 70° C. for 30 minutes. Then, the PET film was brought into hermetic contact, and then exposed with ultraviolet rays of 1000 mJ/cm$^2$. Then, heat treatment is performed under conditions of 80° C. for one hour, 100° C. for one hour, 120° C. for one hour and 150° C. for three hours. Then, the PET film was separated so that the solder-resist layer (thickness: 20 $\mu$m) 70 is formed (see FIG. 26(Q)).

(19) Then, the substrate 30 having the solder-resist 70 was placed on the X-Y table 190 of the laser unit described with reference to FIG. 34. Then, the carbon-dioxide gas laser beam was applied to the substrate 30 so that the through holes (openings) 71U and 71D were formed (see FIG. 26(R)).

To form the through hole 71 having a diameter of 133 $\mu$m in the upper surface (the surface which is connected to the IC chip), a laser oscillator ML5003D was employed in the laser unit (ML505GT) was employed. The irradiation was performed such that the energy of one pulse was 2.0 mJ, the pulse width was 50 $\mu$sec, the diameter of the mask was 2.0 mm, the pulse mode was a burst and multi-mode, the wavelength was 10.6 $\mu$m and the number of shots were two.

FIG. 31(A) is an enlarged view of the portion A shown in FIG. 26(R), that is, the through hole 71U in the portion which is connected to the IC chip. The multilayered printed circuit board according to the fourth embodiment is arranged such that the carbon-dioxide gas laser beam is vertically applied to the conductive circuit 158 below the solder-resist 70 to cause the reflected wave and incident wave from the conductive circuit to interfere with each other. Thus, the stripe pits and projections are formed on the side wall 71a of the through hole 71U in a direction of the opening. That is, a portion in which the widths of the waves superimpose with each other are created for each half wavelength (5 $\mu$m) of the carbon-dioxide gas laser beam. In the foregoing portion, relatively great heat is produced, causing the side wall 71a to be annually scooped out. The depth D of the scooped portion is about 0.1 $\mu$m to about 5 $\mu$m. As can be understood from the sketch of the photograph, the intervals of pits and projections (the distance between projections) are about 5.5 $\mu$m. Since the multi-mode laser beam, the diameter of which can be reduced, is applied in the fourth embodiment, a through hole having a relatively small diameter (50 $\mu$m to 300 $\mu$m) for forming the bump for establishing the connection with the IC chip can be formed.

FIGS. 32(A) and 32(B) show sketches of an enlarged photograph of the through hole (upper) 71U formed in the solder-resist 70 by the carbon-dioxide gas laser beam. FIG. 32(A) shows a state in which the through hole is viewed from a diagonally upper position, while FIG. 32(B) shows a state in which the through hole is viewed from a position directly above the through hole.

FIG. 31(B) is an enlarged view of the portion B shown in FIG. 26(R), that is, the lower (a portion which is connected to the mother board) through hole 71D; To form the through hole 71D having a diameter of 650 $\mu$m in the lower surface, a laser oscillator ML5003D2 in the laser unit (ML505GT) was employed. Their radiation was performed such that the energy of one pulse was 14 mJ, the pulse width was 16 $\mu$sec, the diameter of the mask was 10.0 mm, the pulse mode was a burst and single-mode, the wavelength was 10.6 $\mu$m and the number of shots were five.

The multilayered printed circuit board according to the fourth embodiment is arranged such that the carbon-dioxide gas laser beam is vertically applied to the conductive circuit 158 below the solder-resist 70. Thus, the reflected wave and incident wave from the conductive circuit are caused to interfere with each other. Therefore, the stripe pits and projections (hereinafter called "interference fringes" are formed on the side wall 71a of the through hole 71D owing to the interference. The depth of the scooped portion of the interference fringes is about 0.1 $\mu$m to about 5 $\mu$m. Since the laser beam in the single mode with which the diameter of the laser beam can be enlarged is employed in the fourth embodiment, a through hole having a relatively large diameter (300 μm to 650 μm) for forming the connection bump with the mother board can be formed.

FIGS. 33(A), 33(B) and 33(C) show sketches of an enlarged photograph of the through hole (lower) 71D formed in the solder-resist 70 by the carbon-dioxide gas laser beam. FIG. 33(A) shows a state in which the through hole is viewed from a position directly above the through hole, FIG. 33(B) shows a state in which the side wall of the through hole is viewed from a side position and FIG. 33(C) shows a state in which the through hole is viewed from a diagonally upper position.

In the fourth embodiment, the through hole is formed in the solder-resist layer by the laser beam. Therefore, a variety of materials may be employed to manufacture the solder-resist. The conventional technique uses photolithography to form the through hole. Therefore, only the photosensitive resin is permitted as the material for the solder-resist. Since the laser beam is used in the fourth embodiment, a variety of materials having an excellent electric characteristic can be employed to manufacture the solder-resist. Since the through hole can be formed by using the laser unit which is the same used to form the interlayer insulating resin layer, the multilayered printed circuit board can be manufactured at a low cost. It is preferable that the solder-resist layer is made of the thermosetting resin or a composite material of the thermosetting resin and the thermoplastic resin. The reason for this lies in that the stripe pits and projections can easily be formed by using the interference of the laser beams.

(20) Next, the substrate 30 is dipped for 20 minutes -into an electroless nickel plating liquid of pH=4.5 constructed by nickel chloride $2.31 \times 10^{-1}$ mol/l, sodium hypophosphite $2.8 \times 10^{-1}$ mol/l and sodium citrate $1.85 \times 10^{-1}$ mol/l. Thus, a nickel plating layer 72 having 5 μm in thickness is formed in the opening portions 71U, 71D. Further, this substrate is dipped for 7 minutes and 20 seconds into an electroless gold plating liquid constructed by potassium gold cyanide $4.1 \times 10^{-2}$ mol/l, ammonium chloride $1.87 \times 10^{-1}$ mol/l, sodium citrate $1.16 \times 10^{-1}$ mol/l and sodium hypophosphite $1.7 \times 10^{-1}$ mol/l in a condition of 80° C. Thus, a gold plating layer 74 having 0.03 μm in thickness is formed on the nickel plating layer so that a soldering pad 75 is formed in the via hole 160 and the conducting circuit 158 (refer FIG. 26(S)).

(21) Then, solder paste, which is metal having a low melting point was printed to the openings 71U and 71D of the solder-resist 70, and then reflowing was performed at 200° C. Thus, solder bumps (solder) 76U and 76D were formed. As a result, the multilayered printed circuit board 10 was manufactured (see FIG. 27). In the fourth embodiment, solder is enclosed through the nickel-plated layer 72 and the gold-plated layer 74 to form the solder bumps 76U and 76D. Therefore, the nickel-plated layer 72 and the gold-plated layer 74 are brought into hermetic contact with the openings 71U and 71D each having the stripe pits and projections. Thus, the solder-bumps 76U and 76D can strongly be connected to the conductive circuit 158.

Then, a pad 92 of the IC chip 90 is located to correspond to the solder bump 76U of the multilayered printed circuit board 10, followed by performing reflowing. Thus, the IC chip 90 is mounted. The multilayered printed circuit board 10, on which the IC chip 90 has been mounted, is placed to correspond to the bump 96 adjacent to the daughter board 94, followed by performing reflowing. Thus, multilayered printed circuit board 10 is joined to the daughter board 94 (see FIG. 28).

The obtained printed circuit board was subjected to a heating test (heated at a temperature of 121° C. for 48 hours) to examine the change rate of the resistance of the via hole portion.

The IC chip was mounted so as to be subjected to a TS test (in this test, the mounted IC chip was allowed to stand at −125° C. for 30 minutes and 55° C. for 30 minutes). The test was repeated 1000 times to examine the change rate of the resistance in the via hole portion.

To make a comparison, a printed circuit was subjected to a similar test, the printed circuit being a printed circuit board having the solder-resist layer according to the embodiment and exposed to ultraviolet rays and the through hole formed by performing development using diethylene glycol dimethylether.

As a result, the printed circuit board according to the fourth embodiment resulted in a change rate of the resistance being 1% in both of the heating test and the TS test.

On the other hand, the change rate of the comparative example was 5%.

As described above, the printed circuit board according to the fourth embodiment exhibits excellent reliability of the connection between precise via holes.

The IC chip was mounted on the printed circuit board so as to be subjected to a HAST test (relative humidity was 100%, applied voltage was 1.3 V and the board was allowed to stand at 121° C. for 48 hours). Moreover, cross cuts were examined by a fluorescent X-ray analyzer (Rigaku RIX2100) to confirm Pb dispersed in the solder-resist layer.

Moreover, the TS test (the sample was allowed to stand at −125° C. for 30 minutes and 55° C. for 30 minutes) was repeated 1000 times to examine separation of the Ni layer and the Au layer and occurrence of a crack in the solder-resist layer.

To make a comparison, a printed circuit was subjected to a similar test, the printed circuit being a printed circuit board having the solder-resist layer according to the embodiment and exposed to ultraviolet rays and the through hole formed by performing development using diethylene glycol dimethylether.

As a result, the printed circuit board according to the fourth embodiment was substantially free from migration of Pb.

On the other hand, the printed circuit board according to the comparative example encountered migration of Pb in spite of prevention of a short circuit. In the TS test, the embodiment was free from separation and a crack. On the other hand, the comparative example encountered separation of the bump in each Ni layer and a crack of the solder-resist layer.

As described above, the printed circuit board according to the fourth embodiment is able to prevent separation of the Ni-plated film, dispersion of metal ions from the bump and a crack of the solder-resist layer.

Fifth Embodiment

A multilayered printed circuit board according to a fifth embodiment of the present invention will now be described.

First Modification (1) A double-side copper-plated laminated board (R5715 manufactured by Matsushita Electric Works) 130A which incorporated a substrate 130 to which copper foil 132 having a thickness of 12 μm was applied and having a thickness of 0.6 mm was prepared (see FIG. 35(A)).

(2) The copper foil 132 was etched by solution of sulfuric acid and hydrogen peroxide to make the thickness to be 5 μm (see FIG. 35(B)).

(3) The double-side copper-plated laminated board 130A was irradiated with carbon-dioxide gas laser beam (ML605GTL manufactured by Mitsubishi Electric) under pulse conditions of 30 mJ, 52×10$^{-6}$ second and 10 shots. Thus, an opening 116 having a diameter of 150 μm (tapered such that upper diameter D1: 160 μm and lower diameter D2: 140 μm) was formed (see FIG. 35(C)). Thus, the opening can be formed in the substrate 130 through the copper foil 132 having the thickness of 5 μm by using the laser beam.

(3) The inner surface of the opening 116 was electroless-plated so that a plated through hole 136 was formed (see FIG. 35(D)).

Second Modification (1) A double-side copper-plated laminated board (R5715 manufactured by Matsushita Electric Works) 230A which incorporated a substrate 230 to which copper foil 232 having a thickness of 12 μm was applied and having a thickness of 0.6 mm was prepared (see FIG. 36(A)).

(2) The copper foil 232 was etched by solution of sulfuric acid and hydrogen peroxide to make the thickness to be 9 μm (see FIG. 36(B)).

(3) The double-side copper-plated laminated board 230A was irradiated with carbon-dioxide gas laser beam (ML605GTL manufactured by Mitsubishi Electric) under pulse conditions of 30 mJ, 52×10$^{-6}$ second and 15 shots. Thus, an opening 116 having a diameter of 150 μm (tapered such that upper diameter D1: 160 μm and lower diameter D2: 140 μm) was formed (see FIG. 36 (C)). Thus, the opening can be formed in the substrate 130 through the copper foil 132 having the thickness of 9 μm by using the laser beam.

(4) Electroless plating was performed similarly to the first modification so that a plated through hole 236 was formed (see FIG. 36(D)).

Third Modification (1) A double-side copper-plated laminated board (R5715 manufactured by Matsushita Electric Works) 330A which incorporated a substrate 330 to which copper foil 332 having a thickness of 12 mm was applied and having a thickness of 0.6 mm was prepared (see FIG. 37(A)).

(2) The copper foil 332 was etched by solution of sulfuric acid and hydrogen peroxide to make the thickness to be 5 μm (see FIG. 37(B)).

(3) The double-side copper-plated laminated board 330A was irradiated with carbon-dioxide gas laser beam (ML605GTL manufactured by Mitsubishi Electric) under pulse conditions of 30 mJ, 52×10$^{-6}$ second and 15 shots. Thus, an opening 316 having a diameter of 150 μm (tapered such that maximum upper diameter D3: 160 μm and minimum diameter D4: 140 μm) was formed. The cross section of the opening 316 was a concave shape (see FIG. 37(C)).

(4) Electroless plating was performed similarly to the first modification so that a plated through hole 336 was formed (see FIG. 37(D)). In the fourth modification, the laser beams are applied from both of the right side and reverse side. Therefore, the through hole can be formed if the thickness of the substrate is large.

Comparative Example 7

(1) A double-side copper-plated laminated board (R5715 manufactured by Matsushita ElectricWorks) to which copper foil having a thickness of 12 μm was applied and which had a thickness of 0.6 mm was prepared.

(2) The double-side copper-plated laminated board was irradiated with carbon-dioxide gas laser beam (ML605GTL manufactured by Mitsubishi Electric) under pulse conditions of 30 mJ, 52×10$^{-6}$ second and 15 shots. However, formation of an opening was impossible. Thus, formation of a through hole cannot be performed if the thickness of the copper foil is larger than 12 μm.

Fourth Modification

The fourth embodiment for manufacturing a multilayered printed circuit board by forming a through hole by using a laser beam will now be described with reference to FIGS. 38 to 44.

Figure 43:
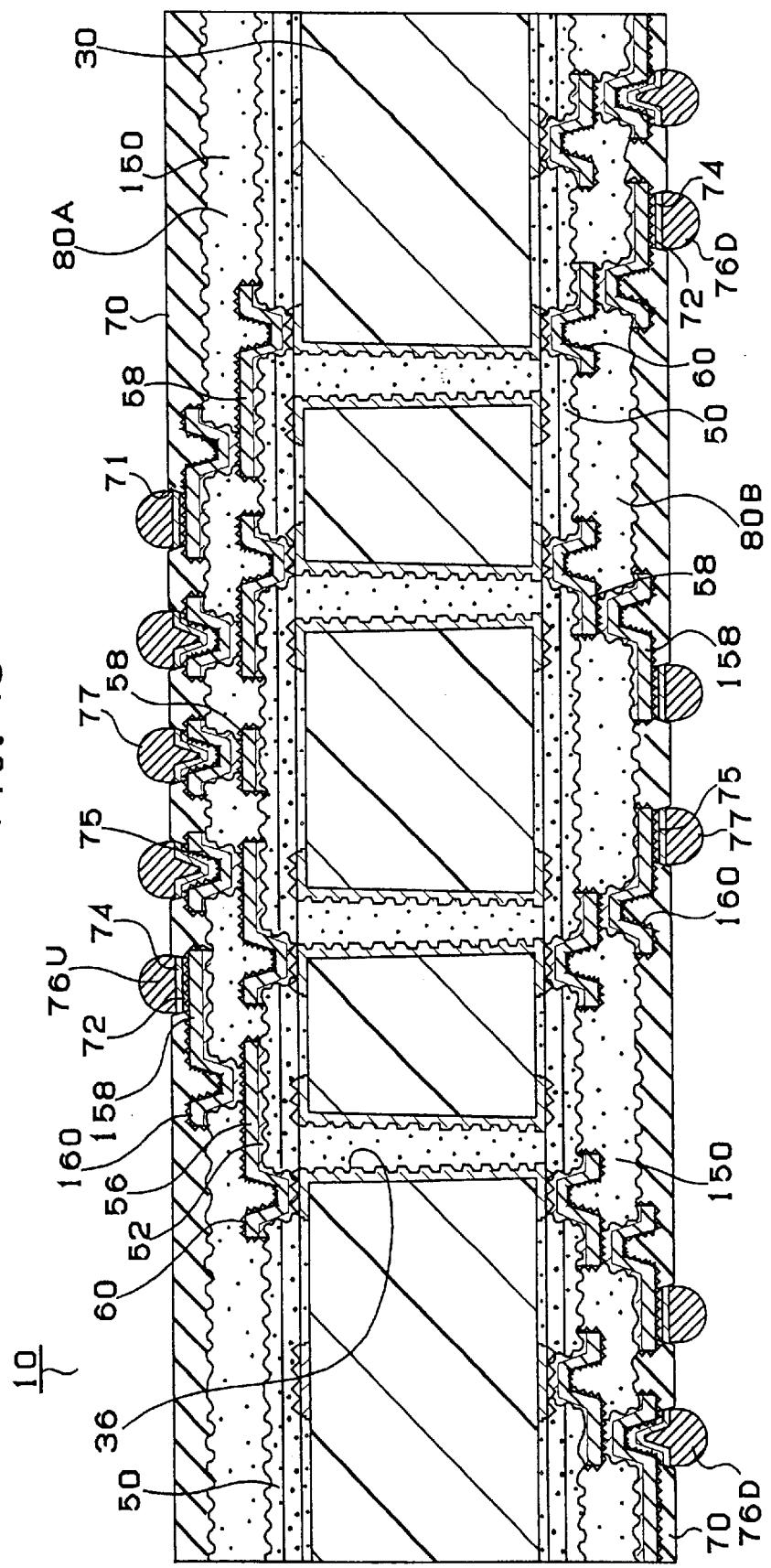
FIG. 43 is a cross sectional view showing the multilayered printed circuit board according to the fourth modification of the fifth embodiment.

The structure of a multilayered printed circuit board 10 according to a fourth modification will now be described with reference to FIG. 43. The multilayered printed circuit board 10 incorporates a core substrate 30 having built-up circuit layers 80A and 80B formed on the right side and reverse side thereof. The built-up circuit layer 80A incorporates an interlayer insulating resin layer 50 having a via hole 60 and a conductive circuit 58; and an upper interlayer insulating resin layer 150 having a via hole 160 and a conductive circuit 158. The built-up circuit layer 80B incorporates an interlayer insulating resin layer 50 having the via hole 60 and the conductive circuit 58; and an upper interlayer insulating resin layer 150 having the via hole 160 and the conductive circuit 158.

A solder bump 76U for establishing the connection with a land (not shown) of the IC chip is formed on the upper surface of the multilayered printed circuit board 10. The solder bump 76U is connected to the through hole 36 through the via hole 160 and the via hole 60. On the other hand, a solder bump 76D for establishing the connection with a land (not shown) of the daughter board is formed on the lower surface. The solder bump 76D is connected to the through hole 36 through the via hole 160 and the via hole 60. The description of the method of manufacturing the multilayered printed circuit board 10 will be continued.

Manufacturing of Printed Circuit Board (1) A copper-plated laminated board 30A having the core substrate 30 which had a thickness of 0.6 mm, which was made of glass epoxy resin and to which copper foil 32 having a thickness of 12 μm was laminated to each of the two sides thereof was employed as the start material (see FIG. 38(A)) Then, the copper-plated laminated board 30A was etched to have the thickness to be 5 μm (see FIG. 38(B)).

(2) The copper-plated laminated board 30A was irradiated with a carbon-dioxide gas laser beam (ML605GTL manufactured by Mitsubishi Electric) under pulse conditions of 30 mJ, 52×10$^{-6}$ second and 15 shots. However, formation of an opening was impossible. Thus, a through hole 16 was formed which had a thickness of 100 μm (tapered such that upper diameter D1: 110 μm and lower diameter D2: 90 μm) (see FIG. 38(C))

Then, electroless plating and electrolytic plating were performed (see FIG. 38(D)). Then, the copper foil was etched in accordance with a pattern by a usual method so that an inner-layer copper pattern (the lower conductive circuit ) 34 having a thickness of 15 μm and the through hole 36 were formed on the two sides of the substrate (see FIG. 38(E)).

Then, the coarsened surface 38 was formed on each of the surface of the inner-layer copper pattern 34, the surface of the land 36A of the through hole 36 and the inner wall. Thus, a printed circuit board was manufactured (see FIG. 38 (F)).

The coarsened surface 38 was formed by cleaning the foregoing substrate 30 with water, followed by drying the substrate 30. Then, etching solution was sprayed to the two sides of the substrate to etch the surface of the inner-layer copper pattern 34, the surface of the land 36a of the through hole 36 and the inner wall. The etching solution was a mixture of 10 parts by weight imidazole copper (II) complex, 7 parts by weight of glycollic acid, 5 parts by weight of potassium chloride and 78 parts by weight of ion exchange water.

(3) Then, resin layer 40 was formed between the inner-layer copper patterns 34 and in the through hole 36 of the printed circuit board (see FIG. 39(G)). The resin layer 40 was formed by applying the resin filler which was previously prepared and which was similar to that according to the fourth embodiment to the two sides of the printed circuit board by a roll coater so as to be enclosed between the inner-layer copper patterns and in the through hole, followed by heating and hardening the resin filler.

(4) Either side of the substrate 30 obtained in the process (3) was belt-sander-polished. The polishing operation was performed by using #600 belt sander paper (manufactured by Sankyo) such that leaving of the resin filler 40 on the coarsened layer 38 of the inner-layer copper pattern 34 and the surface of the land 36a of the through hole 36 was prevented (see FIG. 39(H)). Then, flaws caused from the belt-sander-polishing were removed by performing buff-polishing. The foregoing sequential polishing operation was performed for another side.

(5) Then, the exposed inner-layer copper pattern 34 and the upper surface of the land 36a of the through hole 36 were coarsened by performing an etching process in (2) Thus, a coarsened layer 42 having a depth of 3 μm was formed (see FIG. 39(I)).

The coarsened layer 42 was Sn-substituted so that an Sn layer (not shown) having a thickness of 0.3 μm was formed. The substitutional plating was performed under conditions that 0.1 mol/l tin borofluoride and 1.0 mol/l thiourea were used, the temperature was 50° C. and pH was 1.2. Thus, the coarsened surface was Cu—Sn-substituted.

(6) The two sides of the Obtained printed circuit board 30 were coated with the adhesive agent for electroless plating similar to that used in the fourth embodiment by using a roll coater. The adhesive agent was dried at 60° C. for 30 minutes after the substrate was allowed to stand for 20 minutes in a horizontal state. Thus, an adhesive-agent layer 50 having a thickness of 35 μm was formed (see FIG. 39(J)).

(7) The two sides of the obtained printed circuit board 30 were exposed with 500 mJ/cm² by operating an extra high tension mercury lamp so as to be heated at 150° C. for 5 hours.

(8) The obtained printed circuit board 30 was immersed in chromic acid for one minute so that epoxy resin particles existing on the surface of the adhesive layer 50 were dissolved and removed. As a result of the foregoing process, a coarsened surface was formed on the surface of the adhesive layer 50. Then, the obtained substrate 30 was immersed in neutral solution (manufactured by Syplay), followed by cleaning the same with water (see FIG. 39(K)).

(9) Then, the overall surface of the substrate 30 was electroless-plated 44 having a thickness of 0.6 mm (see FIG. 40(L)).

(10) An etching resist (not shown) was provided for the obtained substrate, and etching was performed by using sulfuric acid-hydrogen peroxide solution. Thus, an opening 44a having a diameter of 50 μm was formed in a portion of the electroless copper plating 44 in which via hole will be formed (see FIG. 40(M)).

(11) The electroless copper plating 44 was used as a conformal mask to irradiate short-pulse ($10^{-4}$ second) laser beam (ML605GTL manufactured by Mitsubishi Electronics). Thus, the adhesive-agent layer 50 below the opening 44a was removed so that an opening 48 for forming the via hole was formed (see FIG. 40(N)).

Then, a palladium catalyst (manufactured by Atotech) was attached to the surface of the circuit board 30 so that a catalyst core was added to the surface of the electroless-plated film 44 and the coarsened surface of the opening 48 for forming the via hole.

(12) The obtained substrate 30 was immersed in the electroless copper plating bath. Thus, an electroless copper plated film 52 having a thickness of 1.6 μm was formed on the overall surface of the substrate 30 (see FIG. 40(O)).

(13) Then, a commercial photosensitive dry film (not shown) was applied to the electroless copper plated film 52. Then, a mask film (not shown) having a pattern printed thereon was placed. The substrate 30 was exposed to light with 100 mJ/cm², and then a development process was performed by using 0.8% sodium carbonate. Thus, a resist 54 having a thickness of 15 μm was formed (see FIG. 40(P)).

(14) The obtained substrate was electrolytic copper plated so that an electrolytic copper plated film 56 having a thickness of 15 μm was formed (see FIG. 41(Q)).

(15) The plating resist 54 was removed by using 5% KOH, and then mixed solution of sulfuric acid and hydrogen peroxide was used to perform etching so that the electroless copper plated film 52 below the plating resist was dissolved and removed. Thus, a conductive circuit 58 and the via hole 60 composed of the copper foil 32, the electroless plating 44, the electroless plated film 52 and the electrolytic copper plated film 56 and having a thickness of 18 μm (10 μm to 30 μm) were obtained (see FIG. 41(R)). The thickness was made to be 10 μm to 30 μm to simultaneously realize a fine pitch and reliability of the connection.

Then, the substrate was immersed in 80 g/L chromic acid at 70° C. to etch the surface of the adhesive-agent layer 50 for the electroless plating between the conductive circuits 58 by a depth opening 1 μm so as to remove the palladium catalyst on the surface.

(16) A process similar to the process (5) was performed so that a coarsened surface 62 made of Cu—Ni—P was formed on each of the surface of the conductive circuit 58 and that of the via hole 60. Then, the surface was Sn-substituted (see FIG. 41(S)).

(17) The processes (6) to (16) are repeated so that the upper interlayer insulating resin layer 160, the via hole 160 and the conductive circuit 158 are formed. Then, the coarsened layer 162 is formed on the surface of the via hole 160 and that of the conductive circuit 158. Thus, the multilayered printed circuit board is manufactured (see FIG. 40(T). Note that the Sn substitution was not performed in the process for forming the upper conductive circuit.

(18) Then, a solder bump is formed on the above-mentioned multilayered printed circuit board. The two sides of the substrate 30 obtained in the process (17) are coated with a solder-resist composition similar to that according to the fourth embodiment, the thickness of the solder-resist layer composition being 45 mm. Then, a drying process was performed at 70° C. for 20 minutes and at 70° C. for 30 minutes. Then, a photomask film (not shown) on which a circle pattern (a mask pattern) has been drawn and which has a thickness of 5 mm was hermetically placed. Then, exposure is performed with ultraviolet rays with 1000 mJ/cm² so that a DMTG development process is performed. Then, heating is performed at 80° C. for one hour, 100° C. for one hour, 120° C. for one hour and 150° C. for three hours. Thus, a solder-resist layer (having a thickness of 20 μm) 70 is formed which has an opening (having a diameter of 200 μm) 71 in the solder pad portion (including the via hole and its land portion) (see FIG. 42(U)).

(19) Then, the nickel-plated layer 72 was formed. Then, the gold-plated layer 74 having a thickness of 0.03 μm is formed on the nickel-plated layer so that the solder pad 75 is formed on the via hole 160 and the conductive circuit 158 (see FIG. 42(V))

(22) Solder paste was printed on an opening 71 of the solder-resist layer 70, followed by performing reflowing at 200° C. Thus, solder bumps (solder) 76U and 76D were formed. As a result, the multilayered printed circuit board 10 was formed (see FIG. 42(W)).

Fifth Modification

The fifth modification is similarly to the fourth modification. Note that a substrate 330 having a through hole was employed as the core substrate, the substrate 330 having a concave through hole 336 obtained in the third modification.

Sixth Modification

Figure 44:
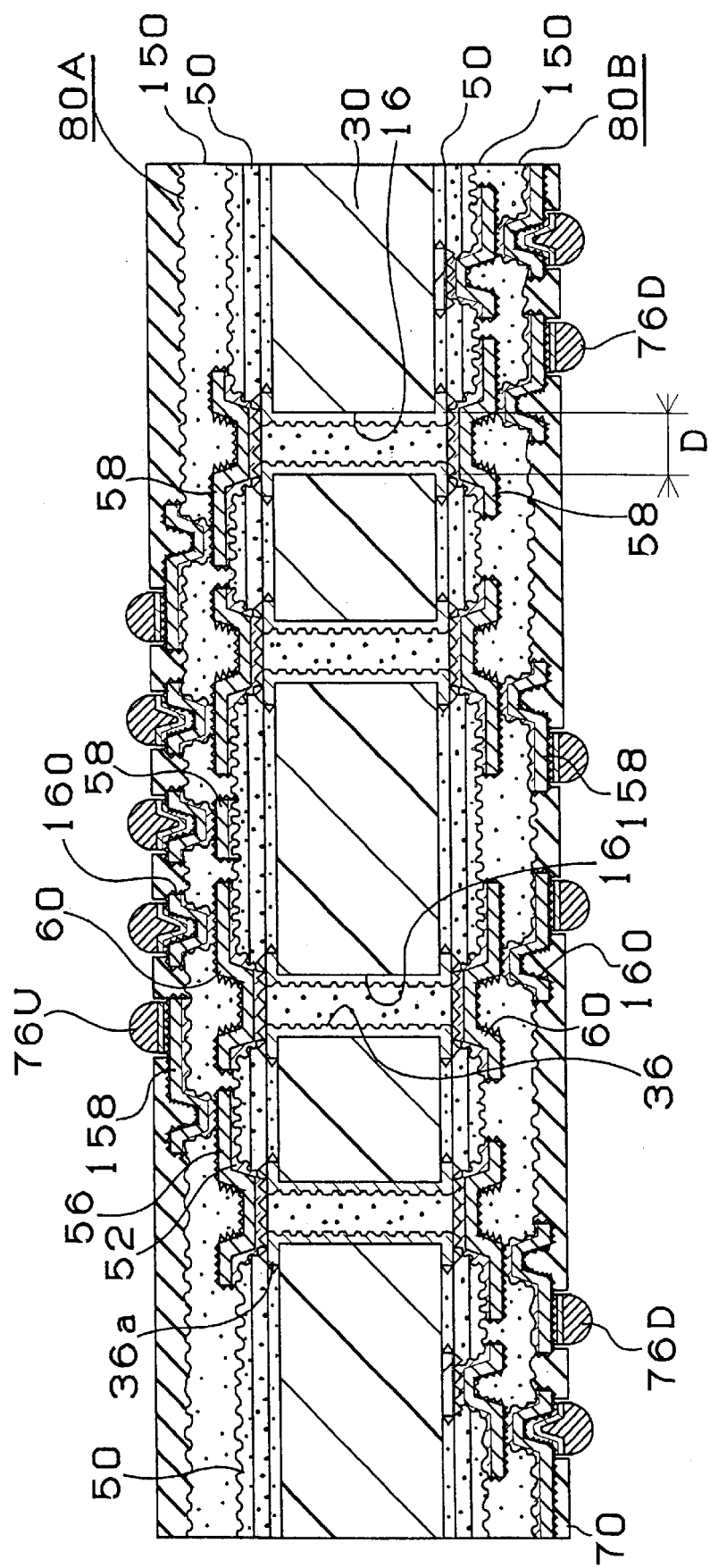
FIG. 44 is a cross sectional view showing a multilayered printed circuit board according to a sixth embodiment of the fifth embodiment.

FIG. 44 shows the structure of a multilayered printed circuit board according to a sixth modification. The foregoing printed circuit board has the structure that the diameter D of the communication hole 16 of the through hole 36 formed by a laser beam is 100 mm to 200 mm. In this modification, the communication hole 16 is not tapered. The multilayered printed circuit board 10 has the via hole 60 which is so formed as to close the communication hole 16 of the through hole 36 formed in the core substrate 30. Thus, the via hole 60 is formed at a position directly above the through hole 36. Therefore, the length of the circuit in the multilayered printed circuit board can be minimized. Therefore, the operation speed of the IC chip can be raised.

The region directly above the through hole 36 is made to serve as the inner pad so that dead space is eliminated. Since a necessity of wiring the inner pad for establishing the connection from the through hole 36 to the via hole 60 can be eliminated, the shape of the land 36a of the through hole 36 can be made to be true round. As a result, the density at which the through holes 36 are formed in the multilayered core substrate 30 can be raised. If 20% to 50% of the surface of the bottom of the through hole 36 formed in the multilayered core substrate 30 is made contact with the land 36a of the through hole 36, satisfactory electric connection can be realized in this embodiment.

As described above, the fifth embodiment is able to form an operation in the copper-plated laminated board by the carbon-dioxide gas laser beam. Therefore, a small through hole can be formed at a low cost.

Sixth Embodiment

A multilayered printed circuit board according to a sixth embodiment of the present invention will now be described.

Manufacturing of Printed Circuit Board (1) A copper-plated laminated board 30A having the core substrate 30 (R5715 (Tg:190° C.) manufactured by Matsushita ElectricWorks) which had a thickness of 0.6 mm, which was made of glass epoxy resin and to which copper foil 32 having a thickness of 12 μm was laminated to each of the two sides thereof was employed as the start material (see FIG. 45(A)). Then, the copper-plated laminated board 30A was etched to have the thickness to be 5 μm (see FIG. 45(B)).

(2) The copper-plated laminated board 30A was irradiated with a carbon-dioxide gas laser beam (ML605GTL manufactured by Mitsubishi Electric) under pulse conditions of 30 mJ, 52×10⁻⁶ second and 15 shots. Thus, a through hole 16 having a diameter D of 100 μm was formed (see FIG. 45(C)) The through hole 16 was not tapered.

Then, electroless plating and electrolytic plating were performed (see FIG. 45(D)). Then, the copper foil was etched in accordance with a pattern by a usual method so that an inner-layer copper pattern (the lower conductive circuit ) 34 having a thickness of 15 μm and the through hole 36 were formed on the two sides of the substrate (see FIG. 45(E)).

Figure 46:
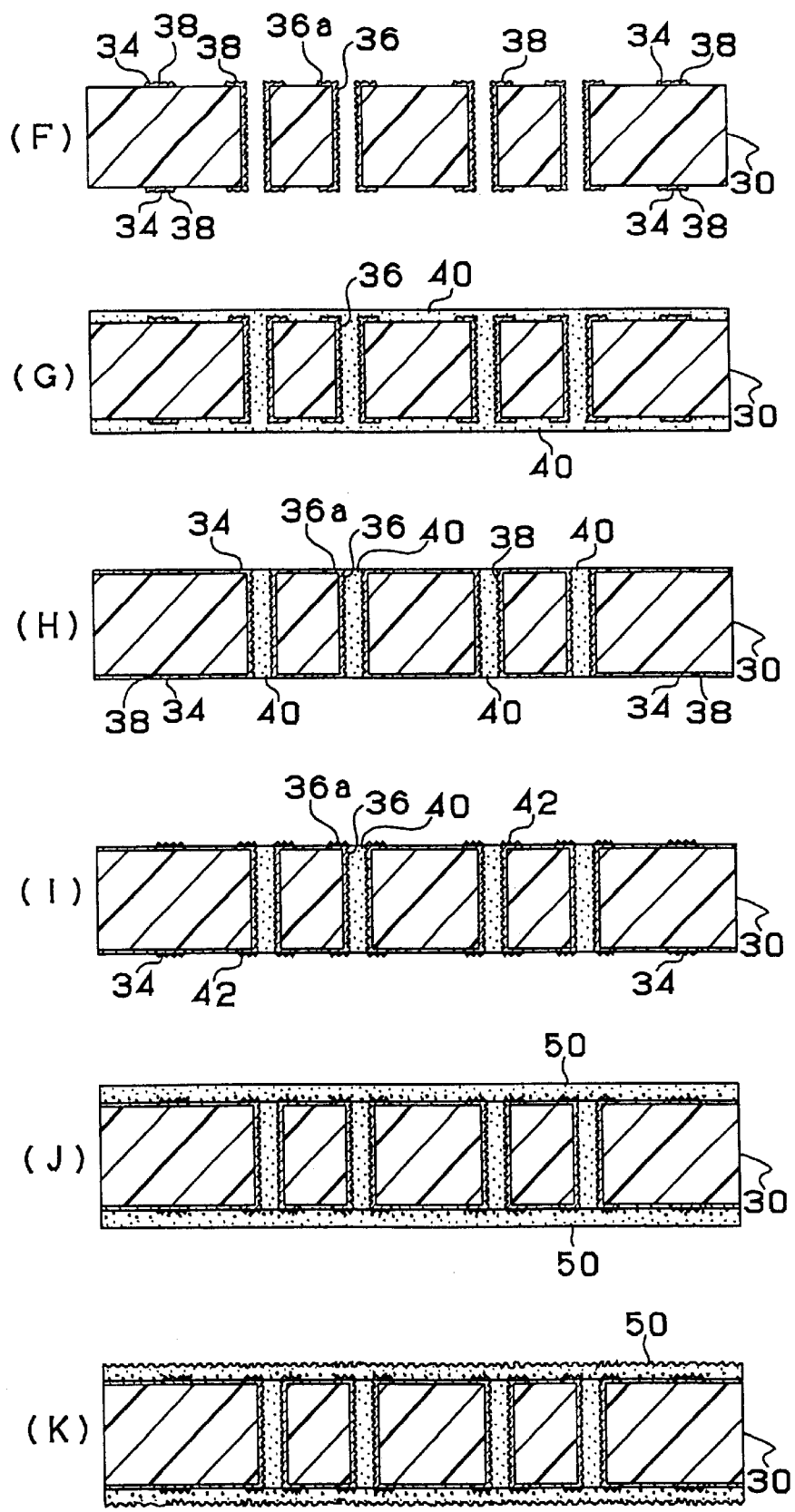
FIGS. 46(F), 46(G), 46(H), 46(I), 46(J) and 46(K) are diagrams showing a process for manufacturing the multilayered printed circuit board according to the sixth embodiment of the present invention.

Then, the coarsened surface 38 was formed on each of the surface of the inner-layer copper pattern 34, the surface of the land 36A of the through hole 36 and the inner wall. Thus, a printed circuit board was manufactured (see FIG. 46 (F)). The coarsened surface 38 was formed by cleaning the foregoing substrate 30 with water, followed by drying the substrate 30. Then, etching solution was sprayed to the two sides of the substrate to etch the surface of the inner-layer copper pattern 34, the surface of the land 36a of the through hole 36 and the inner wall. The etching solution was a mixture of 10 parts by weight imidazole copper (II) complex, 7 parts by weight of glycollic acid, 5 parts by weight of potassium chloride and 78 parts by weight of ion exchange water.

(3) Then, resin layer 40 was formed between the inner-layer copper patterns 34 and in the through hole 36 of the printed circuit board (see FIG. 46(G)). The resin layer 40 was formed by applying the resin filler which was previously prepared and which was similar to that according to the fourth embodiment to the two sides of the printed circuit board by a roll coater so as to be enclosed between the inner-layer copper patterns and in the through hole, followed by heating and hardening the resin filler at 100° C. for one hour, 120° C. for three hours, 150° C. for one hour and 180° C. for 7 hours.

(4) Either side of the substrate 30 obtained in the process (3) was belt-sander-polished. The polishing operation was performed by using #600 belt sander paper (manufactured by Sankyo) such that leaving of the resin filler 40 on the coarsened layer 38 of the inner-layer copper pattern 34 and the surface of the land 36a of the through hole 36 was prevented (see FIG. 46(H)). Then, flaws caused from the belt-sander-polishing were removed by performing buff-polishing. The foregoing sequential polishing operation was performed for another side.

(5) Then, the exposed inner-layer copper pattern 34 and the upper surface of the land 36a of the through hole 36 were coarsened by performing an etching process in (2). Thus, a coarsened layer 42 having a depth of 3 μm was formed (see FIG. 46(I)).

The coarsened layer 42 was Sn-substituted so that an Sn layer (not shown) having a thickness of 0.3 μm was formed. The substitutional plating was performed under conditions that 0.1 mol/L tin borofluoride and 1.0 mol/L thiourea were used, the temperature was 50° C. and pH was 1.2. Thus, the coarsened surface was Cu—Sn-substituted.

(6) The two sides of the obtained printed circuit board 30 were coated with the adhesive agent for electroless plating similar to that used in the fourth embodiment by using a roll coater. The adhesive agent was dried at 60° C. for 30 minutes after the substrate was allowed to stand for 20 minutes in a horizontal state. Thus, an adhesive-agent layer 50 having a thickness of 35 μm was formed (see FIG. 46(J)).

(7) The two sides of the obtained printed circuit board 30 were exposed with 500 mJ/cm$^2$ by operating an extra high tension mercury lamp so as to be heated at 150° C. for 5 hours.

(8) The obtained printed circuit board 30 was immersed in chromic acid for one minute so that epoxy resin particles existing on the surface of the adhesive layer 50 were dissolved and removed. As a result of the foregoing process, a coarsened surface was formed on the surface of the adhesive layer 50. Then, the obtained substrate 30 was immersed in neutral solution (manufactured by Syplay), followed by cleaning the same with water (see FIG. 46(K)).

Figure 47:
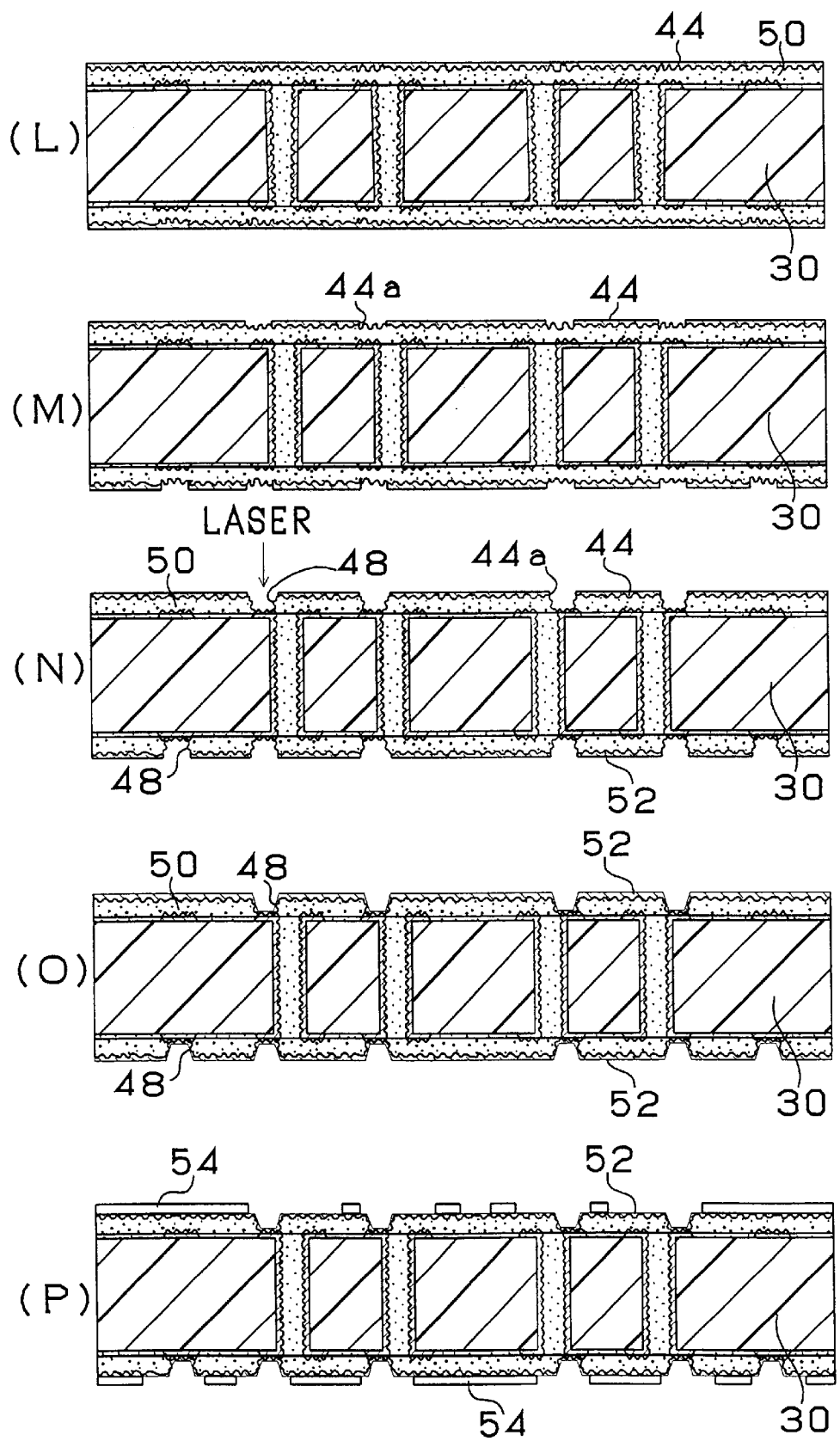
FIGS. 47(L), 47(M), 47(N), 47(O) and 47(P) are diagrams showing a process for manufacturing the multilayered printed circuit board according to the sixth embodiment of the present invention.

(9) Then, the overall surface of the substrate 30 was electroless-plated 44 having a thickness of 0.6 μm (see FIG. 47(L)).

(10) An etching resist (not shown) was provided for the obtained substrate, and etching was performed by using sulfuric acid-hydrogen peroxide solution. Thus, an opening 44a having a diameter of 50 μm was formed in a portion of the electroless copper plating 44 in which via hole would be formed (see FIG. 47(M)).

(11) The electroless copper plating 44 was used as a conformal mask to irradiate short-pulse ($10^{-4}$ second) laser beam (ML605GTL manufactured by Mitsubishi Electric). Thus, the adhesive-agent layer 50 below the opening 44a was removed so that an opening 48 for forming the via hole was formed (see FIG. 47(N))

Then, a palladium catalyst (manufactured by Atotech) was attached to the surface of the circuit board 30 so that a catalyst core was added to the surface of the electroless-plated film 44 and the coarsened surface of the opening 48 for forming the via hole.

(12) The obtained substrate 30 was immersed in the electroless copper plating bath. Thus, an electroless copper plated film 52 having a thickness of 1.6 μm was formed on the overall surface of the substrate 30 (see FIG. 47(O)).

(13) Then, a commercial photosensitive dry film (not shown) was applied to the electroless copper plated film 52. Then, a mask film (not shown) having a pattern printed thereon was placed. The substrate 30 was exposed to light with 100 mJ/cm$^2$, and then a development process was performed by using 0.8% sodium carbonate. Thus, a resist 54 having a thickness of 15 μm was formed (see FIG. 47(P)).

Figure 48:
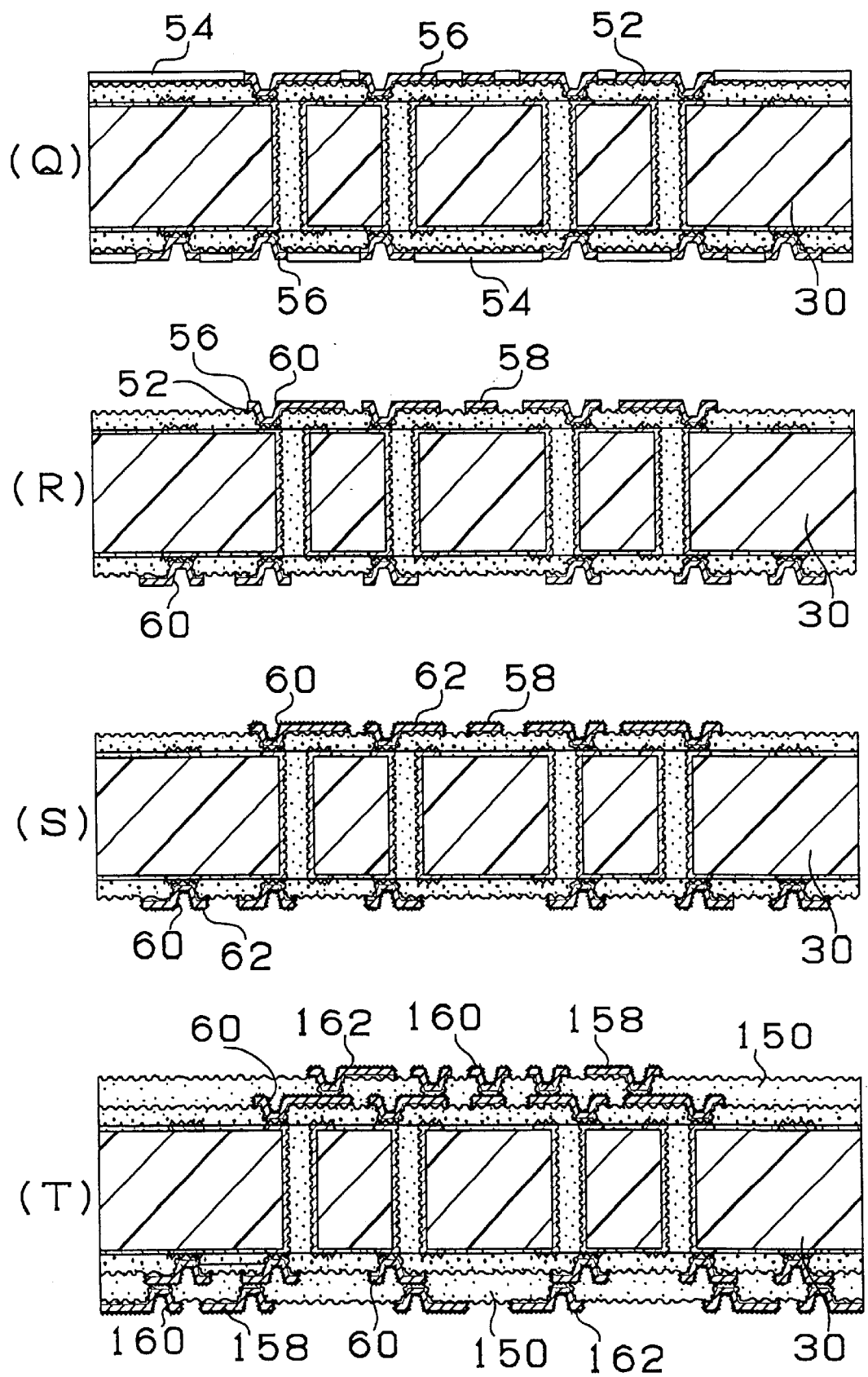
FIGS. 48(Q), 48(R), 48(S) and 48(T) are diagrams showing a process for manufacturing the multilayered printed circuit board according to the sixth embodiment of the present invention.

(14) The obtained substrate was electrolytic copper plated so that an electrolytic copper plated film 56 having a thickness of 15 μm was formed (see FIG. 48(Q)).

(15) The plating resist 54 was removed by using 5% KOH, and then mixed solution of sulfuric acid and hydrogen peroxide was used to perform etching so that the electroless copper plated film 52 below the plating resist was dissolved and removed. Thus, a conductive circuit 58 and the via hole 60 composed of the copper foil 32, the electroless plating 44, the electroless plated film 52 and the electrolytic copper plated film 56 and having a thickness of 18 μm (10 μm to 30 μm) were obtained (see FIG. 48(R)). The thickness was made to be 10 μm to 30 μm to simultaneously realize a fine pitch and reliability of the connection.

Then, the substrate was immersed in 80 g/L chromic acid at 70° C. for 3 minutes to etch the surface of the adhesive-agent layer 50 for the electroless plating between the conductive circuits 58 by a depth opening 1 μm so as to remove the palladium catalyst on the surface.

(16) A process similar to the process (5) was performed so that a coarsened surface 62 made of Cu—Ni—P was formed on each of the surface of the conductive circuit 58 and that of the via hole 60. Then, the surface was Sn-substituted (see FIG. 48(S)).

(17) The processes (6) to (16) are repeated so that the upper interlayer insulating resin layer 160, the via hole 160 and the conductive circuit 158 are formed. Then, the coarsened layer 162 is formed on the surface of the via hole 160 and that of the conductive circuit 158. Thus, the multilayered printed circuit board is manufactured (see FIG. 47(T)). Note that the Sn substitution was not performed in the process for forming the upper conductive circuit.

(18) Then, a solder bump is formed on the above-mentioned multilayered printed circuit board. The two sides of the substrate 30 obtained in the process (17) are coated with a solder-resist composition similar to that according to the fourth embodiment, the thickness of the solder-resist layer composition being 45 μm. Then, exposure is performed so that a solder-resist layer (having a thickness of 20 μm) 70 is formed which has an opening (having a diameter of 200 μm) 71 in the solder pad portion (including the via hole and its land portion) (see FIG. 49(U)).

(19) Then, the nickel-plated layer 72 having a thickness of 5 μm was formed in the opening 71. Then, the gold-plated layer 74 having a thickness of 0.03 μm is formed on the nickel-plated layer so that the solder pad 75 is formed on the via hole 160 and the conductive circuit 158 (see FIG. 49(V)).

Figure 50:
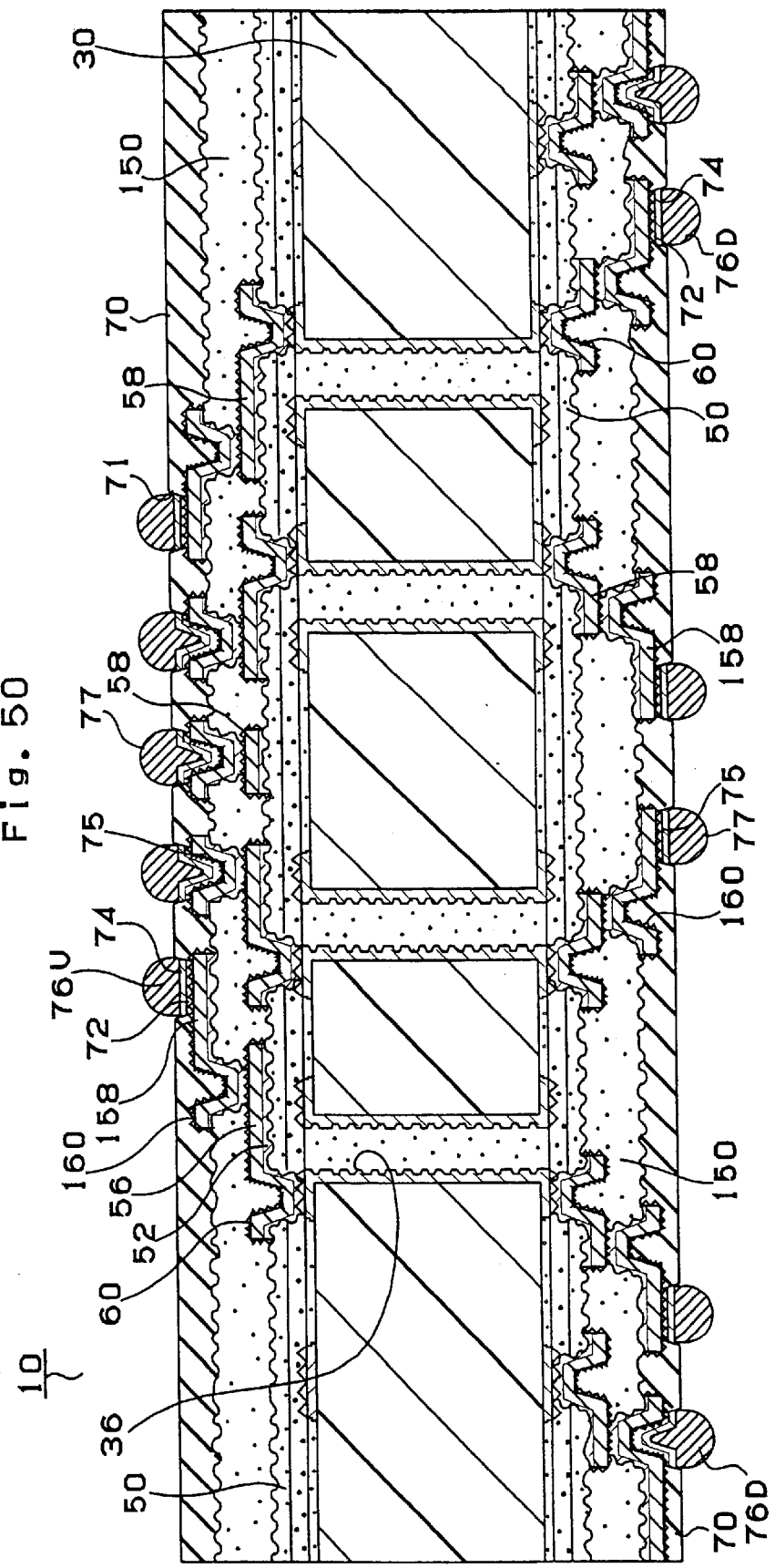
FIG. 50 is a cross sectional view showing the multilayered printed circuit board according to the sixth embodiment of the present invention.

(22) Solder paste was printed on an opening 71 of the solder-resist layer 70, followed by performing reflowing at 200° C. Thus, solder bumps (solder) 76U and 76D were formed. As a result, the multilayered printed circuit board 10 was formed (see FIG. 50).

Comparative Example 8

As a start material for the core substrate, a double-side copper-plated laminated board which was R-1705(FR-4 grade: Tg point: 165° C.) manufactured by Matsushita Electrics Works was employed. Similarly to the sixth embodiment, a multilayered printed circuit board was manufactured.

The multilayered printed circuit board according to the sixth embodiment and a multilayered printed circuit board according to a comparative example were subjected to the HAST, STEAM and TS tests. Results were shown in a table shown in FIG. 58.

The HAST test was performed such that 10 multilayered printed circuit boards were used under conditions of 130° C., 85% RH, 1.3 atm, 1.8 V applied. The foregoing state was maintained for 10 hours, and then insulation resistance between plated through holes was measured.

On the other hand, the STEAM test was performed such that 10 multilayered printed circuit boards were used such that a state that the temperature is 121° C. and 100% RH and 2.1 atm was maintained for 336 hours to measure the insulation resistance between the plated through holes.

Figure 45:
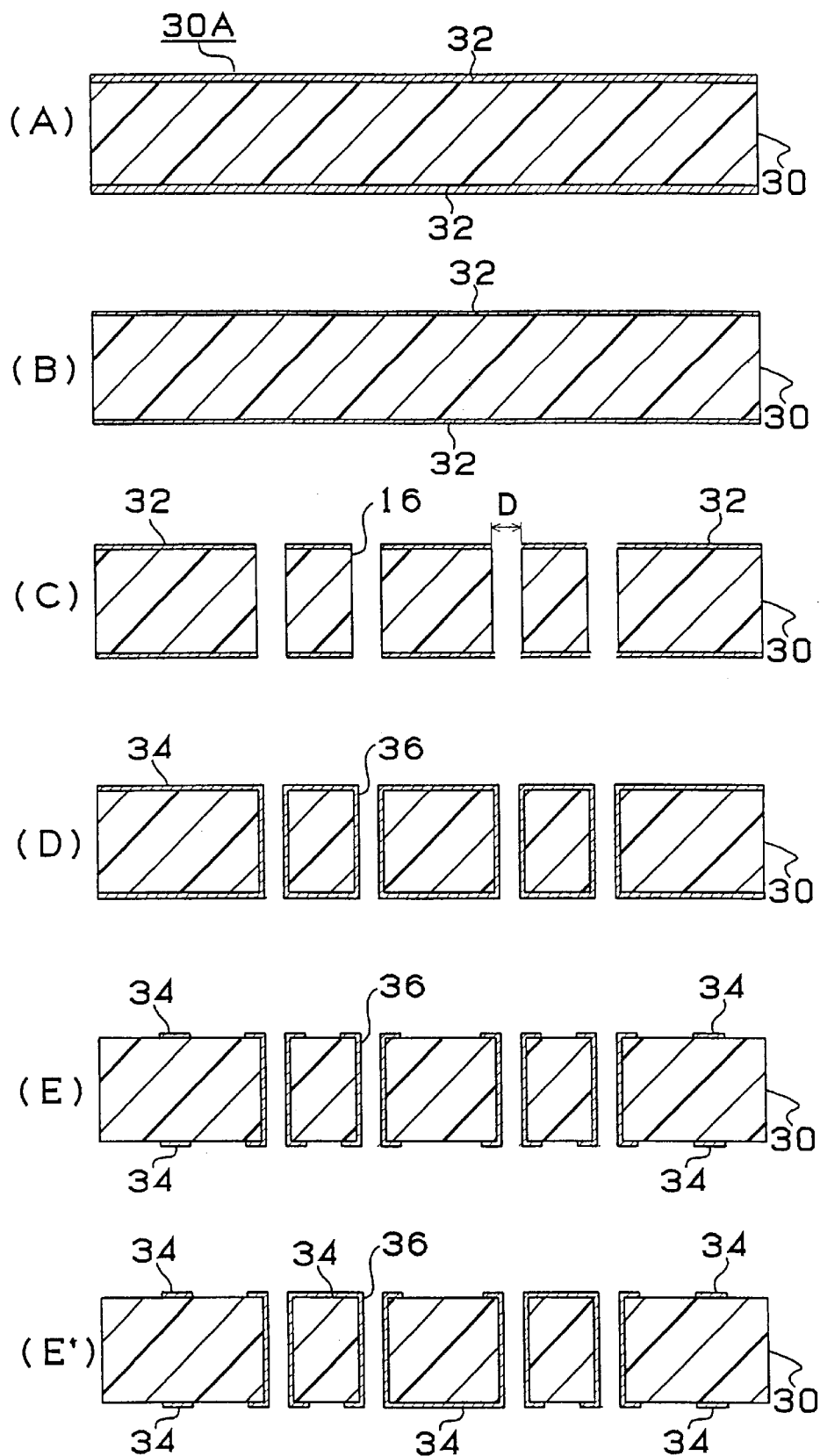

The TS test was performed such that 10 multilayered printed circuit boards were used such that heating and cooling at −55° C. for three minutes and 125° C. for three minutes were repeated 1000 times. Thus, change in the resistance in the plated through hole chain was measured. The plated through hole chain is called a chain formed by adjacent through holes 36 are electrically connected to one another by the conductive circuits 34 on the right side of the core substrate and the conductive circuits 34 on the reverse side, as shown in FIG. 45(E').

As can be understood from the results shown in the table shown in FIG. 58, the multilayered printed circuit board according to the comparative example encountered considerable deterioration in the insulation characteristic.

In the sixth embodiment, the substrate 30 was the R5715 (Tg: 190° C.) manufactured by Matsushita Electrics Works so that the reliability required as the multilayered printed circuit board was satisfied. Similarly to the sixth embodiment, the following glass epoxy resin substrates (1) to (4) having Tg point not lower than 190° C. were subject to the HAST, STEAM and TS tests. As a result, reliability similar to that obtainable from the sixth embodiment was realized. As can be understood from the foregoing results, use of the glass epoxy resin substrate having Tg point not lower than 190° C. enables the required reliability to be realized.

(1) Mitsubishi Gas Chemical HL830 (Tg point: 217° C.)

(2) Mitsubishi Gas Chemical HL830FC (Tg point: 212° C.)

(3) Hitachi Chemical MCL-E-679LD (Tg point 205° C. to 215° C.)

(4) Hitachi Chemical MCL-E-679F (Tg point 205° C. to 217° C.)

As described above, the sixth embodiment is structured such that the core material constituted by a low-cost glass epoxy resin substrate was employed as the core substrate. In this embodiment, satisfactory insulation resistance between the plated through holes and heat cycle characteristic can be realized.

Seventh Embodiment

A printed circuit board and a manufacturing method therefor according to a seventh embodiment will now be described with reference to the drawings.

As shown in FIG. 53(B), a printed circuit board 701 according to the seventh embodiment is a so-called double-side board incorporating an insulation substrate 704 which has, on the right side and reverse side thereof, a conductor pattern 702 and a plated through hole 703 formed by the subtractive method. That is, the printed circuit board 701 has two conductor layers. The insulation substrate 704 is structured such that a glass cloth substrate is impregnated with, for example, epoxy resin, polyimide resin or BT (bis maleimide-triazine) resin. In the seventh embodiment, a substrate (a so-called glass epoxy resin substrate) impregnated with a relatively low-cost epoxy resin is selected. Note that the insulation substrate 704 is caused from a copper-plated laminated member 705 which is a metal-plated laminated plate.

The conductor pattern 702 formed on each of the two sides of the insulation substrate 704 incorporates a copper ground layer 706 having a thickness of 0.2 $\mu$m to 3.0 $\mu$m and serving as a ground layer; a thin copper-plated layer 707 formed on the copper ground layer 706; and a thick copper-plated layer 708 formed on the thin copper-plated layer 707. That is, the conductor pattern 702 has a three-layered structure. Note that the copper ground layer 706 is caused from a very-thin copper foil 709 which is very thin conductive metal foil. The space between the adjacent conductor patterns 702 is made to be about 35 $\mu$m. The width (the width of the top portion) of the line of the conductor pattern 702 is made to be about 70 $\mu$m.

The conductor patterns 702 formed on the two sides of the insulation substrate 704 are electrically connected to each other through the plated through hole 703 formed to penetrate the insulation substrate 704. The conductor layer in the plated through hole 703 incorporates a thin copper-plated layer 707 formed on the inner wall of an opening 710 for forming the through hole and a thick copper-plated layer 708 formed on the thin copper-plated layer 707. That is, the conductor layer in the plated through hole 703 is formed into a two-layer structure. A land 3a of the plated through hole 703 has the same structure as that of the conductor pattern 702, that is, the three-layer structure.

The procedure for manufacturing the printed circuit board 701 according to the seventh embodiment will now be described.

Figure 51:
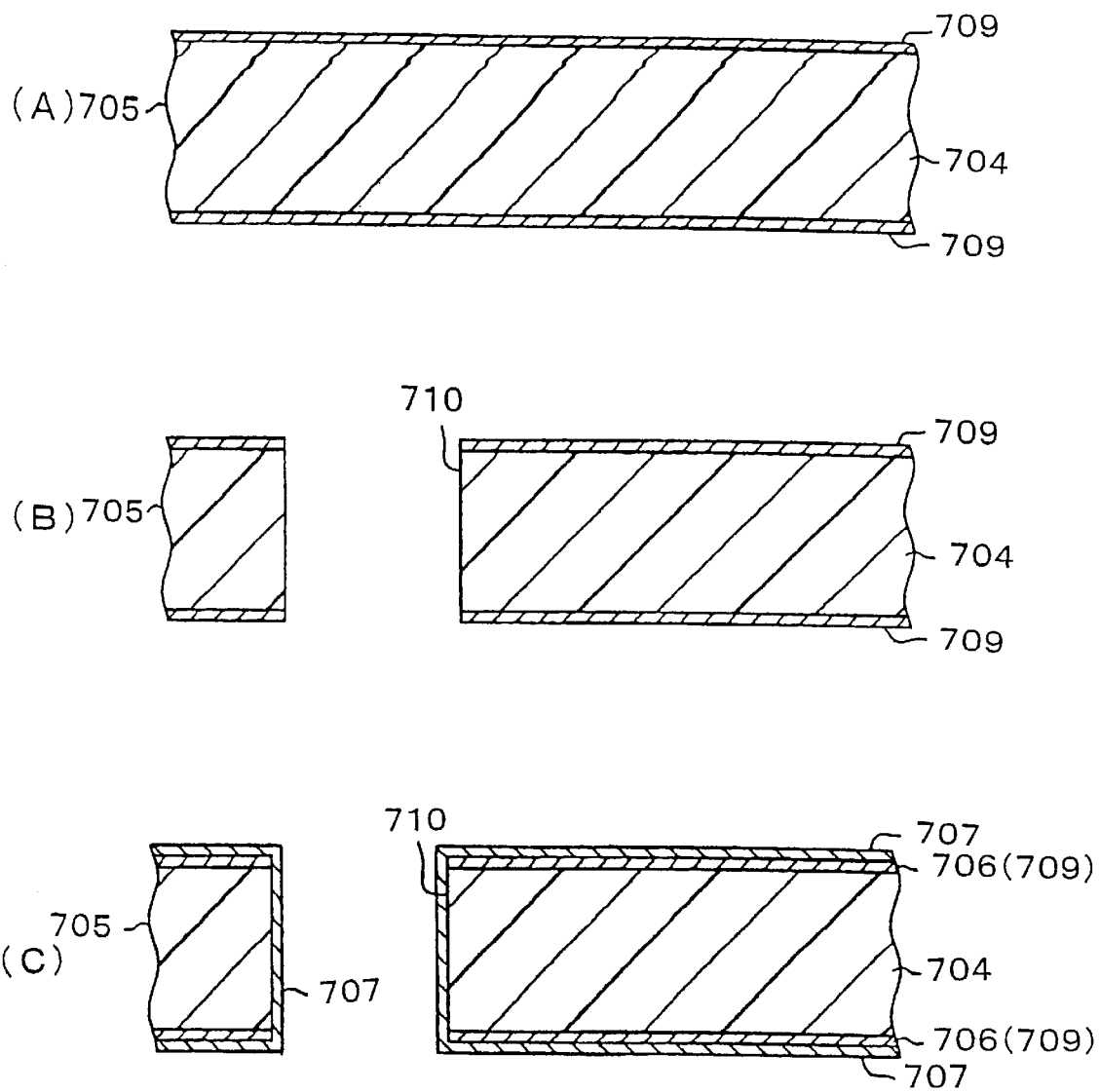
FIGS. 51(A), 51(B) and 51(C) are partial and schematic cross sectional views showing a copper-plated laminated board for use to manufacture a printed circuit board according to a seventh embodiment.

Initially, the copper-plated laminated member 705 which is the metal-plated laminated board is prepared. As shown in FIG. 51(A), very thin copper foil 709 is applied to each of the two sides of the insulation substrate 704 of the copper-plated laminated member 705. It is preferable that the thickness of the copper foil 709 is 0.5 $\mu$m to 7.0 $\mu$m, more preferably 1.0 $\mu$m to 3.0 $\mu$m. If the thickness of the copper foil 709 is too small, handling of the foil deteriorates. Thus, the bonding work cannot easily be completed. If the thickness of the copper foil 709 is too large, a portion of the thickness which must be removed by etching in a conductor pattern dividing process cannot sufficiently be reduced. Therefore, this embodiment has the structure that the copper foil 709 (electrolytic copper foil having a purity of 99.8% or higher) has the thickness of 3.0 $\mu$m.

As an alternative to the copper foil 709, metal foil, such as aluminum foil, tin foil, gold foil, silver foil, platinum foil or nickel foil may be employed. From a viewpoint of cost reduction and easy etching, it is preferable that the copper foil 709 is employed similarly to the seventh embodiment.

Then, a drilling process is performed so that an opening 710 for forming the through hole having a diameter of 0.1 mm to 0.2 $\mu$m is formed at a predetermined position of the prepared copper-plated laminated member 705 by drilling (see FIG. 51(B)). When an opening 710 for forming the through hole having a smaller diameter is attempted to be formed, a laser work may be performed in place of the drilling work.

When the foregoing opening forming process is performed, smear occurs in the opening 710 for forming the through hole owing to produced heat. To dissolve and remove produced smear, desmear solution is used to process the copper-plated laminated member 705. Note that the desmear process may be performed by a plasma method.

It is preferable that the desmear process is performed under conditions that the very thin copper foil 709 does not disappear. Specifically, the desmear process is performed under condition that the initial thickness of the copper foil 709 is reduced from 1/10 to 1/2. In the foregoing case, the desmear solution is solution of sulfuric acid, chromic acid or alkali permanganate. In the seventh embodiment, sodium permanganate solution having somewhat weak oxidizing power was processed at 30° C. to 70° C. for 5 minutes to 20 minutes. The foregoing desmear process has completely removed the smear and reduced the initial thickness of the copper foil 709 to about 1/3. As a result, as shown in FIG. 51(B), the copper ground layer 706 caused from the very thin copper foil 709 and having a thickness of about 1.0 $\mu$m was formed. It is preferable that the thickness of the copper ground layer 706 satisfies a range from 0.2 $\mu$m to 3.0 $\mu$m.

After the desmear process has been completed, a catalyst core is added to cause plating to be deposited on the surface of the inner wall of the opening 710 for forming the through hole. Then, the catalyst core is activated. To add the catalyst core, noble metal ions or noble metal colloid is employed. In general, palladium chloride or palladium colloid is employed.

After addition of the catalyst core and the process for activating the catalyst core have been completed, electroless copper plating is performed to form the thin copper-plated layer 707 on the overall surface of the copper ground layer 706 and the surface of the inner wall of the opening 710 for forming the through hole (see FIG. 51(C)).

In a first plating process, an electroless copper plating bath which is one of electroless plating baths is employed so that the thin copper-plated layer 707 having a thickness of 0.5 $\mu$m to 2.5 $\mu$m is formed. In the seventh embodiment, the thickness of the thin copper-plated layer 707 is made to be about 1.0 $\mu$m. If the thickness of the thin copper-plated layer 707 is too small, there is apprehension that the electrolytic plating cannot reliably be deposited on the overall surface of the inner wall of the opening 710 for forming the through hole in the following plating process. Therefore, there is apprehension that defective conduction of the plated through hole 703 occurs and a satisfactory improvement in the reliability cannot be realized. If the thickness of the thin copper-plated layer 707 is too large, the productivity deteriorates or the cost is raised. Moreover, there is apprehension that a sufficiently large portion corresponding to the thickness which must be reduced in the conductor pattern dividing process cannot be reduced.

After the first plating process has been completed, a predetermined mask 711 which serves as the plating resist is formed on the thin copper-plated layer 707. In the foregoing case, it is preferable that the mask 711 is formed by using a commercial dry film photoresist. The reason for this lies in that use of the photosensitive material will contribute to an improvement in the accuracy of formation of the pattern. The foregoing dry film photoresist is laminated, and then exposure and development are performed by usual methods. As a result, as shown in FIG. 52(A), the mask 711 having the opening 712 at a predetermined position thereof and a thickness of 35 $\mu$m is formed.

After the process for forming the mask has been completed, electrolytic copper plating bath which is one of the electrolytic plating is used to form the thick copper-plated layer 708 in the portion exposed over the opening 712 (see FIG. 52(B)). When the foregoing thick copper-plated layer 708 is formed, only the portion which will be formed into the conductor pattern 702 is selectively thickened. As the electrolytic copper plating bath, a copper sulfate plating bath is employed in the seventh embodiment. As a result of the second plating process, the thick copper-plated layer 708 having a thickness of about 15 $\mu$mm to about 50 $\mu$m is formed on the thin copper-plated layer 707 positioned at the exposed position. If the thickness of the thick copper-plated layer 708 is too small, a required thickness of the conductor pattern 702 which will finally be obtained cannot be maintained. If the thickness of the thick copper-plated layer 708 is too large, there is apprehension that the productivity deteriorates and the cost is raised excessively. In the seventh embodiment, the thickness of the thick copper-plated layer 708 is made to be about 20 $\mu$m.

After the second plating process has been completed, the mask 711 which has been made to be unnecessary is separated. Thus, the thin copper-plated layer 707 positioned below the mask 711 is exposed (see FIG. 53(A)). An etchant which is capable of dissolving copper is used to perform an etching process so that the thin copper-plated layer 707 and the copper ground layer 706 are completely removed. In this embodiment, the process is performed such that no etching resist is provided on the thick copper-plated layer 708. Therefore, the uppermost layer of the thick copper-plated layer 708 is also etched by about 2 $\mu$m. As a result of the foregoing process, the conductor pattern 702 is divided so that the printed circuit board 701 shown in FIG. 53(B) is manufactured.

Therefore, the seventh embodiment attains the following effects.

(1) Both of the thicknesses of the thin copper-plated layer 707 and the copper ground layer 706 can considerably be reduced. Therefore, the thickness which must be removed by etching in the conductor pattern dividing process can considerably be reduced to about 2 $\mu$m as compared with the conventional technique. Therefore, the conductor pattern 702 formed owing to the dividing process is not formed into the divergent shape. As a result, a fine pattern having a satisfactory shape can accurately be formed.

(2) The electroless copper plating bath is employed in the first plating process and the electrolytic copper plating bath is employed in the second plating process so that the printed circuit board 701 is manufactured. Namely, the electroless copper plating bath is employed only when plating is deposited on the surface of the inner wall of the opening 710 for forming the through hole. Then, very low-cost electrolytic copper plating bath with which the depositing speed can be raised is employed. As a result, the cost reduction and improvement in the productivity can be realized.

Since the very thin copper-plated layer 707 can be formed, the thickness which must be removed in the process for dividing the conductor pattern can considerably be reduced. Therefore, the foregoing selection of the plating bath reliably contributes to furthermore the accurate formation of a fine pattern having a satisfactory shape.

(3) The process for dividing the conductor pattern in the seventh embodiment is performed by etching which is performed such that no etching resist is disposed on the thick copper-plated layer 708. Therefore, the process for forming and separating the etching resist in the foregoing process can basically be omitted. As a result, the number of processes can be reduced, causing the productivity to furthermore be improved. Moreover, the thickness of the thick copper-plated layer 708 which must be reduced by etching is considerably reduced to about 2 $\mu$m. Multilayered printed circuit boards result, if the etching process is performed, no adverse influence is exerted on the accuracy of the formed pattern and cost reduction.

(4) The printed circuit board 701 obtained by the foregoing manufacturing method incorporates the conductor pattern 702 which incorporates the copper ground layer 706 caused from the copper foil 709 and having the thickness of about 1.0 $\mu$m, the thick copper-plated layer 708 having the thickness of about 1.0 $\mu$m and the thick copper-plated layer 708 having the thickness of 20 $\mu$m. The metal materials which constitute the three layers are the same (that is, copper ) The foregoing conductor pattern 702, serving as the conductor portion, has a sufficiently large thickness, an excellent shape and satisfactory conduction characteristic. Moreover, another advantage can be realized in that satisfactory reliability is obtained.

(5) In the seventh embodiment, the copper-plated laminated member 705 incorporates the insulation substrate 704 to which the copper foil 709 having a thickness of 0.5 $\mu$m to 7.0 $\mu$m is bonded to each side thereof. Thus, the printed circuit board 701 is manufactured. When the foregoing copper-plated laminated member 705 is employed, the soft desmear process is able to completely remove the smear. Moreover, the copper ground layer 706 having a preferred thickness can easily and reliably be formed. Therefore, the copper-plated laminated member 705 is a satisfactory material when an excellent printed circuit board 701 is obtained by the foregoing method.

Note that the seventh embodiment may be changed as follows.

Figure 54:
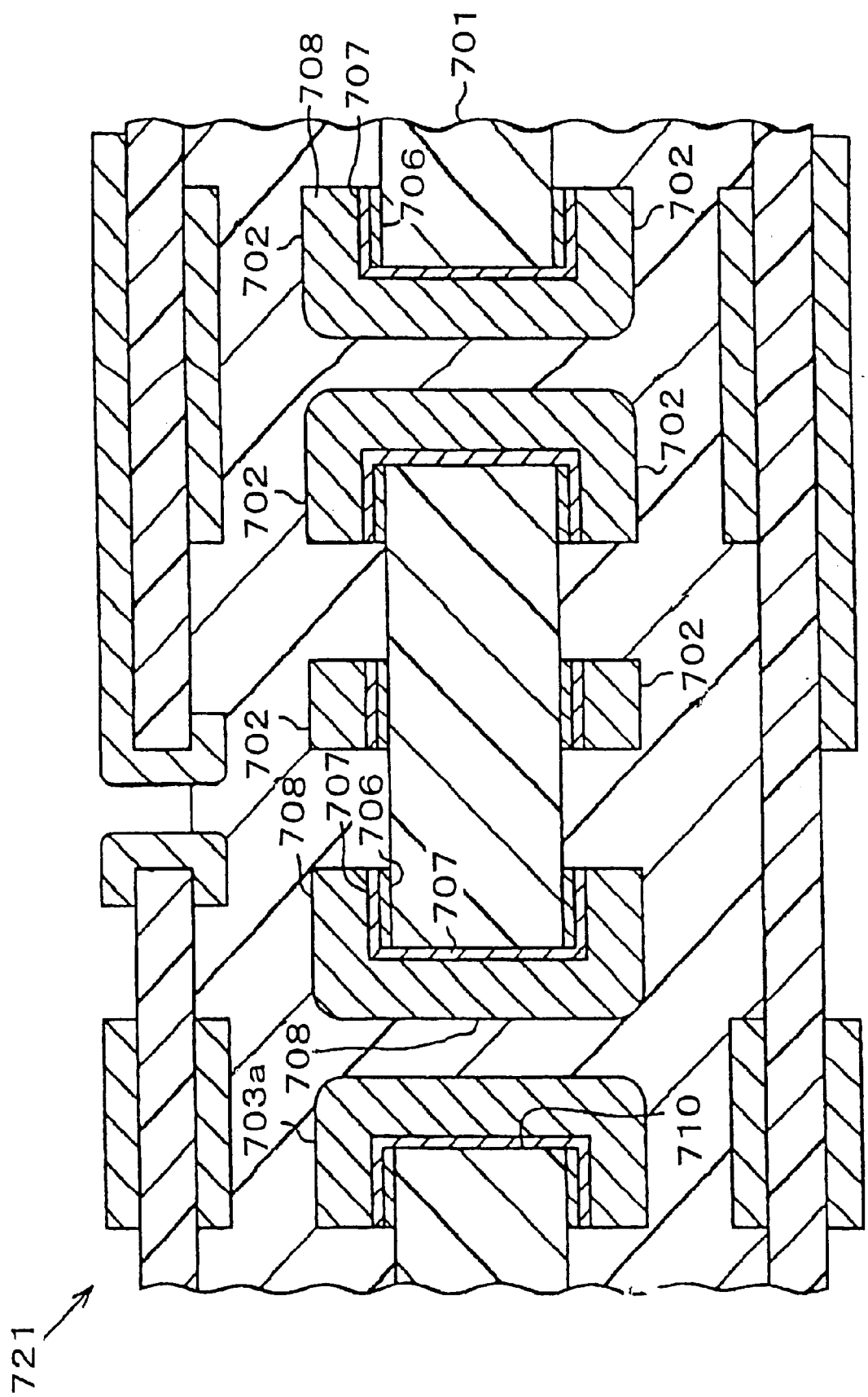
FIG. 54 is a partial and schematic cross sectional view showing a multilayered printed circuit board according to a first modification of the seventh embodiment.
Figure 55:
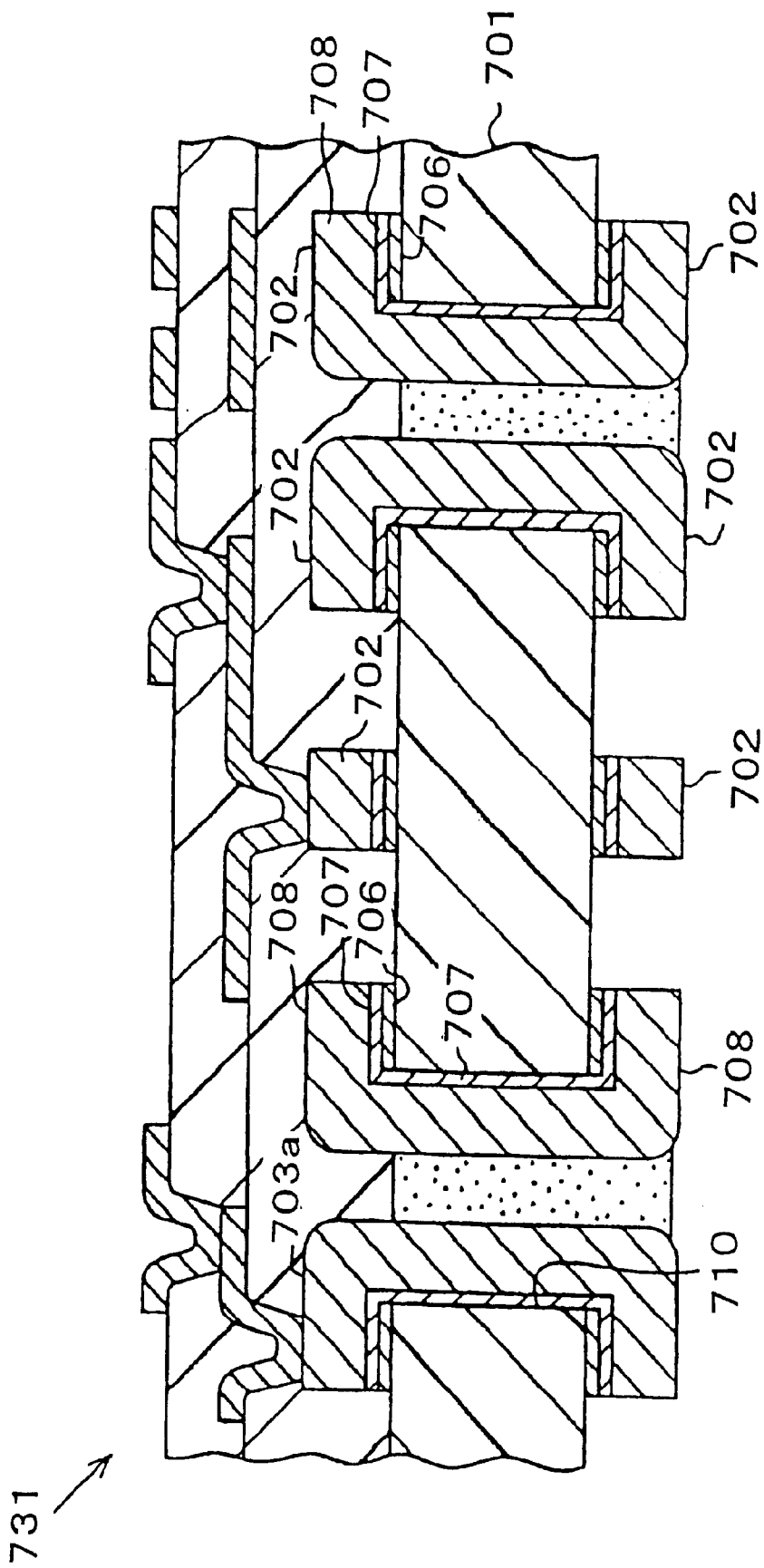
FIG. 55 is a partial and schematic cross sectional view showing the multilayered printed circuit board according to the first modification of the seventh embodiment.

The seventh embodiment is not limited to the foregoing double-side board. For example, the printed circuit board 701 according to the embodiment may be used as the core substrate to manufacture a multilayered printed circuit board 21 according to a first modification shown in FIG. 54. The printed circuit board 701 may be used as the base substrate to manufacture a built-up and multilayered printed circuit board 31 according to asecond modification shown in FIG. 9.

A variety of metal-plated laminated board to which, for example, aluminum foil, tin foil, gold foil, silver foil, platinum foil or nickel foil except for the copper-plated laminated member 705 is applied may be used to manufacture the printed circuit board 701.

As an alternative to the wet method according to the seventh embodiment, the desmear process may be performed by a dry method which is represented by, for example, a plasma method.

In the first plating process, the electroless plating bath except for the electroless copper plating bath may be employed to form a thin electroless solder plating layer, electroless gold plating layer or electroless palladium plating layer.

In thesecond embodiment, an electrolytic plating bath except for the electrolytic copper plating bath may be employed to form a thick electroless nickel plating layer, electroless plating chrome plating layer or electroless gold plating layer.

The thin electroless plating layer, the thick electrolytic plating layer and the ground layer are not always required to be made of the same metal material. Different metal materials may be combined with one another.

In addition to the technical ideas claimed in claims, technical ideas obtainable from the foregoing embodiments and attained effects will now be described if necessary.

(1) A printed circuit board having a conductor pattern (formed by, for example, the subtractive method or the like) incorporates a copper ground layer which is caused from copper foil bonded to an insulating substrate and having a thickness of 0.5 $\mu$m to 7.0 $\mu$m and which has a thickness of 0.2 $\mu$m to 2.5 $\mu$m; and a thick electrolytic copper-plated layer formed on the thin electroless copper plated layer and a thickness of 8.0 $\mu$m or greater. Therefore, the invention described in the technical idea 1 is able to provide a dense printed circuit board exhibiting excellent reliability, low cost and pattern formation accuracy.

(2) A multilayered printed circuit board incorporating a printed circuit board disclosed in any one of the technical idea 1 as a core substrate. Therefore, according to the invention described in the technical idea 2, a dense printed circuit board exhibiting excellent reliability, low cost, pattern formation accuracy and improved function can be provided.

(3) A built-up multilayered printed circuit board incorporating the printed circuit board described in any one of the technical idea 1 as the base substrate. Therefore, according to the invention described in the technical idea 3, a dense printed circuit board exhibiting excellent reliability, low cost, pattern formation accuracy and improved function can be provided.

(4) A copper-plated laminated board formed by bonding copper foil having a thickness of 0.5 $\mu$m to 7.0 $\mu$m to each of the two sides of an insulating substrate. Therefore, according to the inventions described in the technical idea 4, a preferred material for obtaining the excellent printed circuit board by the foregoing manufacturing method can be provided.

(5) A copper-plated laminated board formed by bonding copper foil having a thickness of 1.0 $\mu$m to 3.0 $\mu$m to each of the two sides of a glass cloth substrate impregnated with epoxy resin, polyimide resin or BT resin. Therefore, according to the invention described in the technical idea 5, a preferred material for obtaining the excellent printed circuit board by the foregoing manufacturing method can be provided.

(6) With either of the technical ideas 1 and 2, the desmear process is performed such that the desmear solution is processed under a condition that the conductive metal foil does not disappear.

(7) The desmear process is performed such that the desmear solution is processed under condition that the initial thickness of the conductive metal foil is reduced from $\frac{1}{10}$ to $\frac{1}{2}$.

(8) A printed circuit board having a conductor pattern formed by the subtractive method, wherein the conductor pattern incorporates a ground layer caused from very thin conductive metal foil, which is bonded to an insulating substrate, and having a thickness of 0.2 $\mu$m to 2.0 $\mu$m; and a plated layer formed on the ground layer.

(9) A printed circuit board having a conductor pattern formed by the subtractive method, wherein the conductor pattern incorporates a ground layer, which is caused from conductive metal foil bonded to an insulating substrate and which has a thickness of 0.5 $\mu$m to 5.0 $\mu$m, and which has a thickness of 0.2 $\mu$m to 2.0 $\mu$m; and a thick plated layer formed on the thin plated layer.

What is claimed is:

1. A method of manufacturing a multilayered printed circuit board comprising at least the steps (1) to (5):
   (1) pressing resin to form an interlayer insulating resin layer having a metal film formed thereon against a substrate for forming a conductor circuit;
   (2) reducing the thickness of a whole surface of the metal film by performing etching;
   (3) forming an opening in the metal film so as to expose the interlayer insulating resin layer;
   (4) applying a laser beam at the formed opening of the metal film to remove the resin forming the interlayer insulating resin layer exposed through the opening so as to provide an opening for a via hole; and
   (5) depositing a plating conductor in the opening for forming the via hole so as to form the via hole.

2. A method of manufacturing a multilayered printed circuit board, comprising at least the steps (1) to (8):
   (1) pressing resin to form an interlayer insulating resin layer having a metal film formed thereon against a substrate for forming a conductor circuit;
   (2) reducing the thickness of a whole surface of the metal film by etching;
   (3) forming an opening in the metal film so as to expose the interlayer insulating resin layer;

(4) applying a laser beam at the opening of the metal film side to remove the resin forming the interlayer insulating resin layer exposed through the opening so as to form an opening for a via hole;

(5) forming an electroless plated film on the substrate for forming the conductor circuit;

(6) forming a plating resist on the substrate for forming the conductor circuit;

(7) electrolytic-plating a portion in which the plating resist is not formed; and (8) removing the plating resist to remove the metal film and the electroless copper plated film below the plating resist by performing etching so as to form the via hole and the conductor circuit.

3. A method of manufacturing a multilayered printed circuit board according to claim 1 or 2, wherein the metal film is copper foil.

4. A method of manufacturing a multilayered printed circuit board according to claim 1 or 2, wherein the thickness of the metal film is made to be 5 $\mu$m to 0.5 $\mu$m in the step for reducing the thickness of the metal film by performing etching.

5. A method of manufacturing a multilayered printed circuit board comprising at least the steps (1) to (4):

(1) pressing resin to form an interlayer insulating resin layer having a metal film having a thickness of 5 $\mu$m to 0.5 $\mu$m against a substrate for forming a conductive circuit;

(2) forming an opening in the metal film so as to expose the interlayer insulating resin layer;

(3) applying a laser beam at the formed opening of the metal film side to remove the resin forming the interlayer insulating resin layer exposed through the opening so as to form an opening for forming a via hole; and (4) depositing a plating conductor in the opening for forming the via hole so as to form the via hole and the conductor circuit.

* * * * *